US012596303B2

(12) United States Patent
Hatakeyama et al.

(10) Patent No.: US 12,596,303 B2
(45) Date of Patent: *Apr. 7, 2026

(54) RESIST COMPOSITION AND PATTERN FORMING PROCESS

(71) Applicant: Shin-Etsu Chemical Co., Ltd., Tokyo (JP)

(72) Inventors: Jun Hatakeyama, Joetsu (JP); Masahiro Fukushima, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 550 days.

This patent is subject to a terminal disclaimer.

(21) Appl. No.: 18/103,813

(22) Filed: Jan. 31, 2023

(65) Prior Publication Data

US 2023/0324798 A1 Oct. 12, 2023

(30) Foreign Application Priority Data

Feb. 4, 2022 (JP) ................................ 2022-016260

(51) Int. Cl.
*G03F 7/039* (2006.01)
*G03F 7/20* (2006.01)

(52) U.S. Cl.
CPC .......... *G03F 7/0392* (2013.01); *G03F 7/2006* (2013.01)

(58) Field of Classification Search
CPC .... G03F 7/0392; G03F 7/2006; G03F 7/0045; G03F 7/0397; G03F 7/039; G03F 7/004; G03F 7/2004; G03F 7/12; G03F 7/14
USPC ........................ 430/311, 270.1, 271.1, 272.1
See application file for complete search history.

(56) References Cited

U.S. PATENT DOCUMENTS

| | | | |
|---|---|---|---|
| 7,482,108 B2 | 1/2009 | Matsumaru et al. | |
| 2010/0304296 A1 | 12/2010 | Ichikawa et al. | |
| 2014/0295347 A1 | 10/2014 | Aqad et al. | |
| 2023/0288800 A1 * | 9/2023 | Hatakeyama | C08F 220/22 |
| 2023/0305394 A1 | 9/2023 | Hatakeyama | |
| 2023/0324798 A1 | 10/2023 | Hatakeyama et al. | |

FOREIGN PATENT DOCUMENTS

| | | |
|---|---|---|
| JP | 2006-45311 A | 2/2006 |
| JP | 2006-178317 A | 7/2006 |
| JP | 2011-6400 A | 1/2011 |
| JP | 2014-224236 A | 12/2014 |
| JP | 2021-70692 A | 5/2021 |
| WO | 2021/200056 A1 | 10/2021 |

OTHER PUBLICATIONS

Kishikawa et al., "Assessment of trade-off between resist resolution and sensitivity for optimization of hyper-NA Immersion lithography", SPIE, 2007, vol. 6520, pp. 65203L-1-65203L-9, cited in Specification (9 pages).

Non-Final Office Action dated Sep. 25, 2025. issued in U.S. Appl. No. 18/124,947 (14 pages).

* cited by examiner

*Primary Examiner* — Caleen O Sullivan
(74) *Attorney, Agent, or Firm* — WHDA, LLP

(57) ABSTRACT

A resist composition comprising a base polymer comprising repeat units having a salt structure consisting of a sulfonic acid anion bonded to a polymer backbone and a sulfonium cation having an acid labile group of triple bond-bearing tertiary ester type as the acid generator exhibits a high sensitivity and reduced LWR or improved CDU.

8 Claims, No Drawings

RESIST COMPOSITION AND PATTERN FORMING PROCESS

CROSS-REFERENCE TO RELATED APPLICATION

This non-provisional application claims priority under 35 U.S.C. § 119(a) on Patent Application No. 2022-016260 filed in Japan on Feb. 4, 2022, the entire contents of which are hereby incorporated by reference.

TECHNICAL FIELD

This invention relates to a resist composition and a pattering process using the composition.

BACKGROUND ART

To meet the demand for higher integration density and operating speed of LSIs, the effort to reduce the pattern rule is in rapid progress. As the use of 5G high-speed communications and artificial intelligence (AI) is widely spreading, high-performance devices are needed for their processing. As the advanced miniaturization technology, manufacturing of microelectronic devices at the 5-nm node by the lithography using EUV of wavelength 13.5 nm has been implemented in a mass scale. Studies are made on the application of EUV lithography to 3-nm node devices of the next generation and 2-nm node devices of the next-but-one generation. IMEC in Belgium announced its successful development of 1-nm and 0.7-mn node devices.

As the feature size reduces, image blurs due to acid diffusion become a problem. To insure resolution for fine patterns of sub-45-nm size, not only an improvement in dissolution contrast is important as previously reported, but the control of acid diffusion is also important as reported in Non-Patent Document 1. Since chemically amplified resist compositions are designed such that sensitivity and contrast are enhanced by acid diffusion, an attempt to minimize acid diffusion by reducing the temperature and/or time of post-exposure bake (PEB) fails, resulting in drastic reductions of sensitivity and contrast.

A triangular tradeoff relationship among sensitivity, resolution, and edge roughness (LWR) has been pointed out. Specifically, a resolution improvement requires to suppress acid diffusion whereas a short acid diffusion distance leads to a decline of sensitivity.

The addition of an acid generator capable of generating a bulky acid is an effective means for suppressing acid diffusion. It was then proposed to incorporate repeat units derived from an onium salt having a polymerizable unsaturated bond in a polymer. Since this polymer functions as an acid generator, it is referred to as polymer-bound acid generator. Patent Document 1 discloses a sulfonium or iodonium salt having a polymerizable unsaturated bond, capable of generating a specific sulfonic acid. Patent Document 2 discloses a sulfonium salt having a sulfonic acid directly attached to the backbone.

For forming patterns of smaller size, it is necessary not only to suppress acid diffusion, but also to enhance dissolution contrast. For enhancing dissolution contrast, a base polymer of polarity switch type capable of generating a phenol or carboxy group through acid-catalyzed deprotection reaction is used. On use of a resist material containing this base polymer, it is possible to form both a positive pattern by alkaline development and a negative pattern by organic solvent development. The positive pattern is formed at a higher resolution because the alkaline development provides a higher dissolution contrast. The base polymer adapted to generate a carboxy group exhibits higher alkaline solubility and hence, a higher dissolution contrast than the base polymer adapted to generate a phenol group. For such reasons, the base polymer of carboxy generation type is often used.

There is known a non-chemically amplified resist material of backbone decomposition type comprising as the base polymer a copolymer of α-chloroacrylate with α-methylstyrene wherein the copolymer backbone is decomposed upon light exposure so that the copolymer reduces its molecular weight and turns more soluble in organic solvent developer. Although this resist material is devoid of the influence of acid diffusion, its dissolution contrast is low. The above-mentioned chemically amplified resist material having polarity switch function exhibits a higher resolution.

For further enhancing dissolution contrast, it is proposed to add an acid generator having a polarity switch function as well as the base polymer having a polarity switch function to the resist material. Patent Documents 3 and 4 disclose a resist material comprising a sulfonium salt having an acid labile group of tertiary ester type in the cation moiety. Patent Document 5 discloses a resist material comprising a polymer having a sulfonic acid anion bonded to a polymer backbone and a sulfonium cation having an acid labile group. However, the acid labile groups of alicyclic structure and dimethylphenylcarbinol type described in these patent documents are still insufficient in dissolution contrast enhancement and swell suppression.

CITATION LIST

Patent Document 1: JP-A 2006-045311 (U.S. Pat. No. 7,482,108)

Patent Document 2: JP-A 2006-178317

Patent Document 3: JP-A 2011-006400

Patent Document 4: JP-A 2021-070692

Patent Document 5: JP-A 2014-224236

Non-Patent Document 1: SPIE Vol. 6520 65203L-1 (2007)

SUMMARY OF INVENTION

For resist materials, it is desired to have an acid generator capable of improving the LWR of line patterns or the CDU of hole patterns and enhancing sensitivity. To this end, it is necessary to outstandingly improve the dissolution contrast during development.

An object of the present invention is to provide a resist composition, especially positive resist composition, which exhibits a higher sensitivity and improved LWR or CDU, and a patterning process using the resist composition.

The inventors have found that a resist composition comprising a base polymer comprising repeat units having a sulfonium salt structure consisting of a sulfonic acid anion bonded to a polymer backbone and a sulfonium cation having an acid labile group of triple bond-bearing tertiary ester type exhibits excellent properties such as reduced acid diffusion, high contrast and low swell by virtue of suppressed acid diffusion, effective acid-catalyzed elimination reaction and high affinity to alkaline developer. The resist composition is improved in LWR, CDU, and resolution, and has a wide process margin.

In one aspect, the invention provides a resist composition comprising a base polymer comprising repeat units (a)

having a salt structure consisting of a sulfonic acid anion bonded to a polymer backbone and a sulfonium cation having the formula (1).

(1)

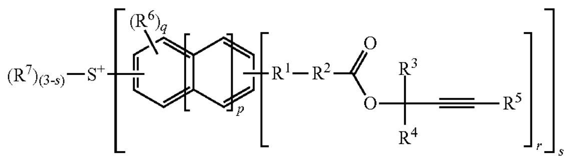

Herein p is 0 or 1, q is an integer of 0 to 4, r is 1 or 2, s is an integer of 1 to 3.

$R^1$ is a single bond, ether bond, thioether bond or ester bond, $R^2$ is a single bond or a $C_1$-$C_{20}$ alkanediyl group which may contain fluorine or hydroxy.

$R^3$ and $R^4$ are each independently a $C_1$-$C_{12}$ saturated hydrocarbyl group, $C_2$-$C_8$ alkenyl group, $C_2$-$C_8$ alkynyl group or $C_6$-$C_{12}$ aryl group, which may contain oxygen or sulfur, $R^3$ and $R^4$ may bond together to form a ring with the carbon atom to which they are attached, $R^5$ is hydrogen, or a $C_1$-$C_{12}$ saturated hydrocarbyl group or $C_6$-$C_{18}$ aryl group, which may contain at least one moiety selected from hydroxy, $C_1$-$C_6$ saturated hydrocarbyloxy, $C_2$-$C_6$ saturated hydrocarbyloxycarbonyl, nitro, cyano, fluorine, chlorine, bromine, iodine, amino, trifluoromethyl, trifluoromethoxy, and trifluoromethylthio, with the proviso that $R^5$ is not hydrogen when $R^3$ is substituted or unsubstituted phenyl, $R^6$ is hydroxy, carboxy, nitro, cyano, fluorine, chlorine, bromine, iodine, amino, or a $C_1$-$C_{20}$ saturated hydrocarbyl group, $C_1$-$C_{20}$ saturated hydrocarbyloxy group. $C_2$-$C_{20}$ saturated hydrocarbylcarbonyloxy group, $C_2$-$C_{20}$ saturated hydrocarbyloxycarbonyl group, or $C_1$-$C_4$ saturated hydrocarbylsulfonyloxy group, which may contain at least one moiety selected from fluorine, chlorine, bromine, iodine, hydroxy, amino and ether bond, and $R^7$ is a $C_1$-$C_{20}$ hydrocarbyl group which may contain a heteroatom, in case of s=1, two groups $R^7$ may be the same or different and may bond together to form a ring with the sulfur atom to which they are attached.

In a preferred embodiment, the repeat units (a) have the formula (a1) or (a2).

(a1)

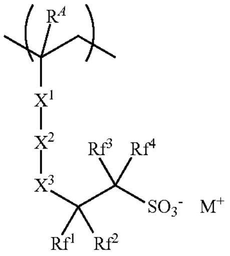

(a2)

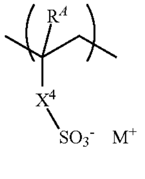

Herein $R^A$ is each independently hydrogen or methyl. $X^1$ is a single bond or ester bond. $X^2$ is a single bond, —$X^{13}$—C(═O)—O— or —$X^{21}$—O—, wherein $X^{21}$ is a $C_1$-$C_{12}$ hydrocarbylene group, phenylene group or a $C_7$-$C_{18}$ group obtained by combining the foregoing, which may contain carbonyl, ester bond, ether bond, iodine or bromine. $X^3$ is a single bond, methylene or ethylene. $X^4$ is a single bond, methylene, ethylene, phenylene, methylphenylene, dimethylphenylene, fluorinated phenylene, trifluoromethyl-substituted phenylene, —O—$X^{41}$—, —C(═O)—O—$X^{41}$— or —C(═O)—NH—$X^{41}$— wherein $X^{41}$ is a $C_1$-$C_6$ aliphatic hydrocarbylene group, phenylene group, methylphenylene group, dimethylphenylene group, fluorinated phenylene group or trifluoromethyl-substituted phenylene group, which may contain carbonyl, ester bond, ether bond, hydroxy or halogen. $Rf^1$ to $Rf^4$ are each independently hydrogen, fluorine or trifluoromethyl, at least one of $Rf^1$ to $Rf^4$ is fluorine or trifluoromethyl, $Rf^1$ and $Rf^4$ may together form a carbonyl group. $M^+$ is the sulfonium cation having formula (1).

The resist composition may further comprise an organic solvent and/or a surfactant.

In a preferred embodiment, the base polymer further comprises repeat units having the formula (b1) or repeat units having the formula (b2):

(b1)

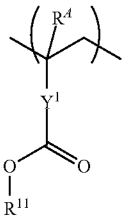

(b2)

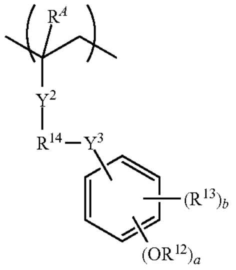

wherein $R^A$ is each independently hydrogen or methyl, $Y^1$ is a single bond, phenylene, naphthylene, or a $C_1$-$C_{12}$ linking group containing at least one moiety selected from an ester bond, ether bond and lactone ring, $Y^2$ is a single bond or ester bond, Y is a single bond, ether bond or ester bond, $R^{11}$ and $R^{12}$ are each independently an acid labile group, $R^{13}$ is fluorine, trifluoromethyl, cyano, a $C_1$-$C_6$ saturated hydrocarbyl group, $C_1$-$C_6$ saturated hydrocarbyloxy group, $C_2$-$C_7$ saturated hydrocarbylcarbonyl group, $C_2$-$C_7$ saturated hydrocarbylcarbonyloxy group, or $C_2$-$C_7$ saturated hydrocarbyloxycarbonyl group, $R^{14}$ is a single bond or a $C_1$-$C_6$ alkanediyl group in which some constituent —$CH_2$— may be replaced by an ether bond or ester bond, a is 1 or 2, b is an integer of 0 to 4, and a+b is from t to 5.

The resist composition is typically a chemically amplified positive resist composition.

In another aspect, the invention provides a pattern forming process comprising the steps of applying the resist composition defied herein onto a substrate to form a resist film thereon, exposing the resist film to high-energy radiation, and developing the exposed resist film in a developer.

Typically, the high-energy radiation is KrF excimer laser, ArF excimer laser, EB, or EUV of wavelength 3 to 15 nm.

Advantageous Effects of Invention

In the resist composition comprising a base polymer comprising repeat units (a), when the base polymer further contains an acid labile group, an acid is generated upon exposure, and a polarity switch occurs due to the acid-catalyzed reaction whereby the alkali dissolution rate is increased. In the unexposed region, the repeat unit (a) itself is not dissolved in the developer. In the exposed region, a carboxy group is generated under the action of the acid generated by the repeat unit (a) whereby the alkali dissolution rate is increased. Accordingly, a resist composition having improved LWR or CDU is constructed.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. In chemical formulae, the broken line designates a valence bond. As used herein, the term "fluorinated" refers to a fluorine-substituted or fluorine-containing compound or group. The terms "group" and "moiety" are interchangeable.

The abbreviations and acronyms have the following meaning.

EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LWR: line width roughness
CDU: critical dimension uniformity Resist Composition The resist composition of the invention comprises a base polymer comprising repeat units (a) having a salt structure consisting of a sulfonic acid anion bonded to a polymer backbone and a sulfonium cation having an acid labile group of triple bond-bearing tertiary ester type. Since the repeat unit (a) functions as an acid generator, the base polymer is a polymer-bound acid generator.

Base Polymer

The sulfonium cation having a tertiary ester type acid labile group containing a triple bond is represented by the formula (1).

(1)

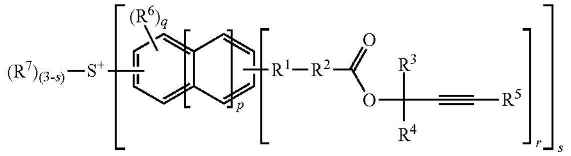

In formula (1), p is 0 or 1, q is an integer of 0 to 4, r is 1 or 2, and s is an integer of 1 to 3.

In formula (1), $R^1$ is a single bond, ether bond, thioether bond or ester bond, preferably an ether bond or ester bond In formula (1), $R_2$ is a single bond or a $C_1$-$C_{20}$ alkanediyl group which may contain fluorine or hydroxy. Examples of the alkanediyl group include methanediyl, ethane-1,1-diyl, ethane-1,2-diyl, propane-1,1-diyl, propane-1,2-diyl, propane-1,3-diyl, propane-2,2-diyl, butane-1,1-diyl, butane-1,2-diyl, butane-1,3-diyl, butane-2,3-diyl, butane-1,4-diyl, 1,1-dimethylethane-1,2-diyl, pentane-1,5-diyl, 2-methylbutane-1,2-diyl, hexane-1,6-diyl, heptane-1,7-diyl, octane-1,8-diyl, nonane-1,9-diyl, decane-1,10-diyl, undecane-1,11-diyl, and dodecane-1,12-diyl.

In formula (1) $R^3$ and $R^4$ are each independently a $C_1$-$C_{12}$ saturated hydrocarbyl group, $C_2$-$C_8$ alkenyl group, $C_2$-$C_8$ alkynyl group or $C_6$-$C_{12}$ aryl group, which may contain oxygen or sulfur. $R^3$ and $R^4$, taken together, may form a ring with the carbon atom to which they are attached.

Of the groups represented by $R^3$ and $R^4$, the $C_1$-$C_{12}$ saturated hydrocarbyl group may be straight, branched or cyclic. Examples thereof include $C_1$-$C_{12}$ alkyl groups such as methyl, ethyl, n-propyl, isopropyl, n-butyl, isobutyl, sec-butyl, tert-butyl, n-pentyl, neopentyl, and n-hexyl; and $C_3$-$C_{12}$ cyclic saturated hydrocarbyl groups such as cyclopropyl, cyclobutyl, cyclopentyl, and cyclohexyl, Examples of the $C_2$-$C_8$ allkenyl group include vinyl, 1-propenyl, 2-propenyl, butenyl and hexenyl. Examples of the $C_2$-$C_8$ alkynyl group include ethynyl and butynyl. Examples of the $C_6$-$C_{12}$ aryl group include phenyl and naphthyl.

In formula (1), $R^5$ is hydrogen, or a $C_1$-$C_{12}$ saturated hydrocarbyl group or $C_6$-$C_{18}$ aryl group, which may contain at least one moiety selected from hydroxy, $C_1$-$C_6$ saturated hydrocarbyloxy, $C_2$-$C_6$ saturated hydrocarbyloxycarbonyl, nitro, cyano, fluorine, chlorine, bromine, iodine, amino, trifluoromethyl, trifluoromethoxy, and trifluoromethylthio. It is noted that $R^5$ is not hydrogen when $R^3$ is substituted or unsubstituted phenyl.

Of the groups represented by $R^5$, the $C_1$-$C_{12}$ saturated hydrocarbyl group may be straight, branched or cyclic, and examples thereof are as exemplified above for the $C_1$-$C_{12}$ saturated hydrocarbyl groups $R^3$ and $R^4$. Examples of the $C_6$-$C_{18}$ aryl group include phenyl, 2-methylphenyl, 3-methylphenyl, 4-methylphenyl, 4-ethylphenyl, 4-tert-butylphenyl, 4-n-butylphenyl, 2,4-dimethylphenyl, 2,4,6-trimethylphenyl, naphthyl, anthryl, phenalenyl, pyrenyl, indanyl and fluorenyl.

In formula (1), $R^6$ is hydroxy, carboxy, nitro, cyano, fluorine, chlorine, bromine, iodine, amino, or a $C_1$-$C_{20}$ saturated hydrocarbyl group, $C_1$-$C_{20}$ saturated hydrocarbyloxy group, $C_2$-$C_{20}$ saturated hydrocarbylcarbonyloxy group, $C_2$-$C_{20}$ saturated hydrocarbyloxycarbonyl group, or $C_1$-$C_4$ saturated hydrocarbylsulfonyloxy group, which may contain at least one moiety selected from fluorine, chlorine, bromine, iodine, hydroxy, amino and ether bond.

The saturated hydrocarbyl group and saturated hydrocarbyl moiety of the saturated hydrocarbyloxy group, saturated hydrocarbylcarbonyloxy group, saturated hydrocarbyloxycarbonyl group, and saturated hydrocarbylsulfonyloxy group, represented by $R^6$, may be straight, branched or cyclic. Examples thereof include alkyl groups such as methyl, ethyl, n-propyl, isopropyl, n-butyl, isobutyl, sec-butyl, tert-butyl, n-pentyl, neopentyl, n-hexyl, n-heptyl, n-octyl, 2-ethylhexyl, n-nonyl, n-decyl, n-undecyl, n-dodecyl, n-tridecyl, n-pentadecyl, and n-hexadecyl; and cyclic saturated hydrocarbyl groups such as cyclopentyl and cyclohexyl.

In formula (1), $R^7$ is a $C_1$-$C_{20}$ hydrocarbyl group which may contain a heteroatom. The hydrocarbyl group may be saturated or unsaturated and straight, branched or cyclic. Examples thereof include $C_1$-$C_{20}$ saturated hydrocarbyl groups, $C_2$-$C_{20}$ unsaturated aliphatic hydrocarbyl groups, $C_6$-$C_{20}$ aryl groups, and $C_7$-$C_{20}$ aralkyl groups, and combinations thereof.

The saturated hydrocarbyl group may be straight, branched or cyclic. Examples thereof include alkyl groups such as methyl, ethyl, n-propyl, isopropyl, n-butyl, isobutyl, sec-butyl, tert-butyl, n-pentyl, neopentyl, n-hexyl, n-heptyl, n-octyl, 2-ethylhexyl, n-nonyl, n-decyl, n-undecyl, n-dodecyl, n-tridecyl, n-pentadecyl, and n-hexadecyl; and cyclic saturated hydrocarbyl groups such as cyclopentyl and cyclohexyl.

The unsaturated aliphatic hydrocarbyl group may be straight, branched or cyclic. Examples thereof include alkenyl groups such as vinyl, 1-propenyl, 2-propenyl, butenyl, and hexenyl: alkynyl groups such as ethynyl, propynyl and butynyl; and cyclic unsaturated hydrocarbyl groups such as cyclohexenyl.

Examples of the aryl group include phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, and tert-butylnaphthyl.

Exemplary of the aralkyl group are benzyl and phenethyl.

In the foregoing hydrocarbyl groups, some or all of the hydrogen atoms may be substituted by a moiety containing a heteroatom such as oxygen, sulfur, nitrogen or halogen, and some constituent —$CH_2$— may be replaced by a moiety containing a heteroatom such as oxygen, sulfur or nitrogen, so that the group may contain a hydroxy, carboxy, halogen, cyano, amino, nitro, sultone ring, sulfo, sulfonium salt-containing moiety, ether bond, ester bond, carbonyl, sulfide bond, sulfonyl, or amide bond.

In case of s=1, two groups $R^7$ may be the same or different and may bond together to form a ring with the sulfur atom to which they are attached. Examples of the ring are shown below.

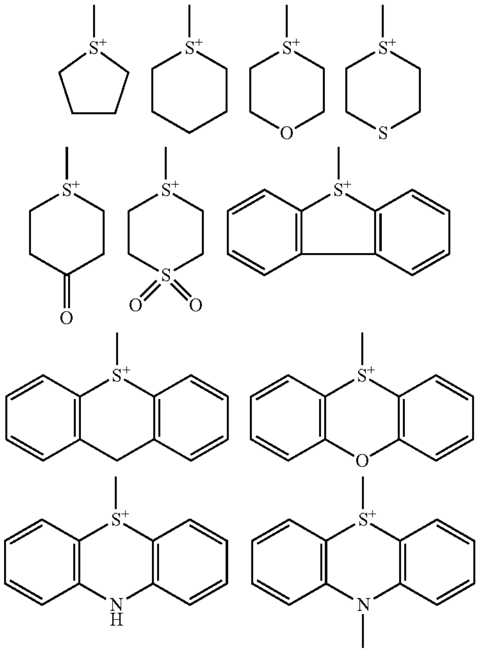

-continued

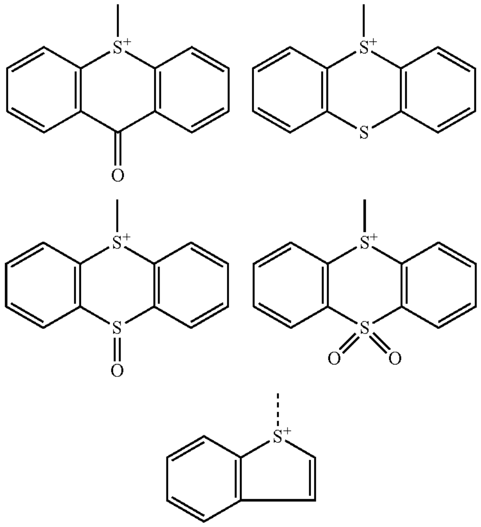

Herein the broken line designates a point of attachment to the aromatic ring in formula (1).

Examples of the cation of the sulfonium salt having formula (1) are shown below, but not limited thereto.

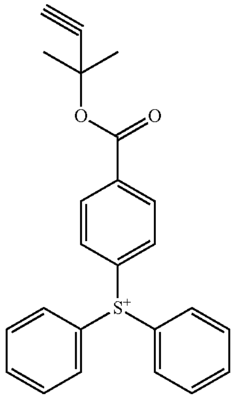

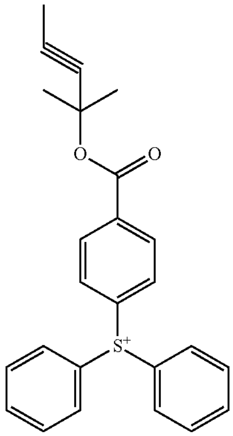

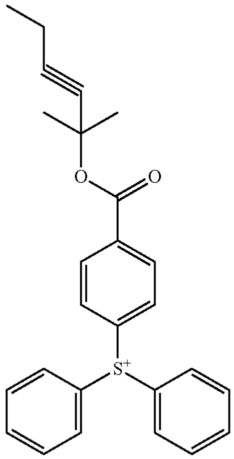

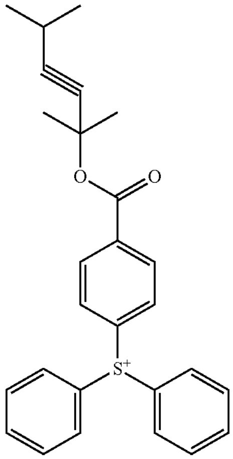

-continued
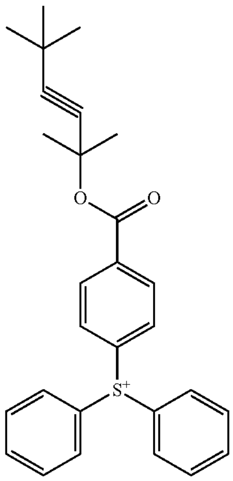
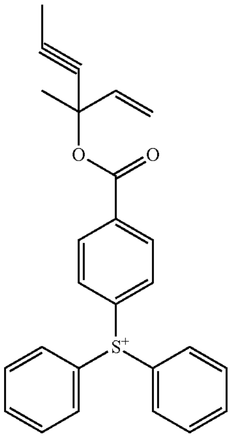
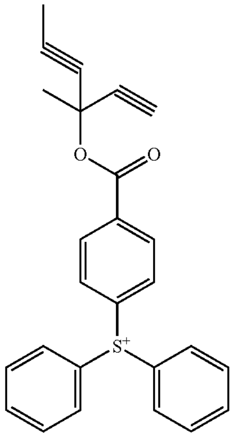
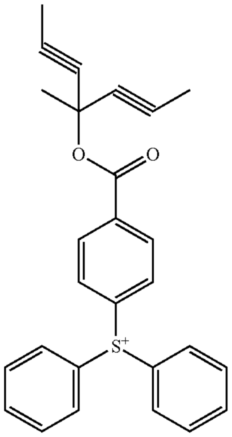
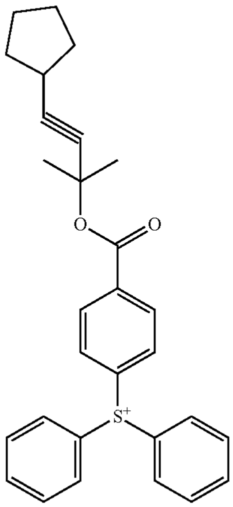
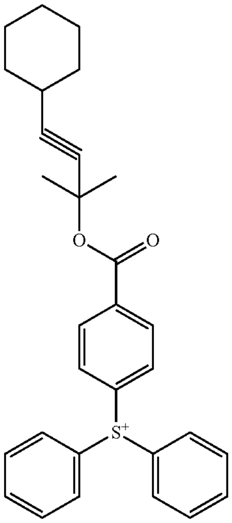
-continued
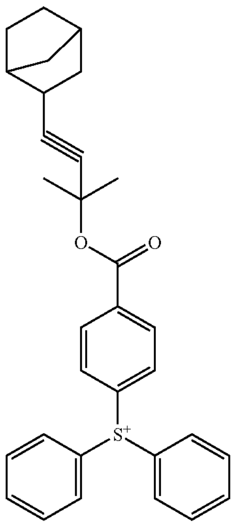
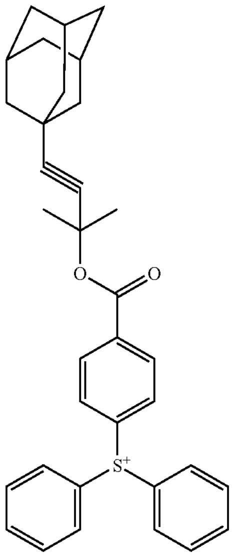
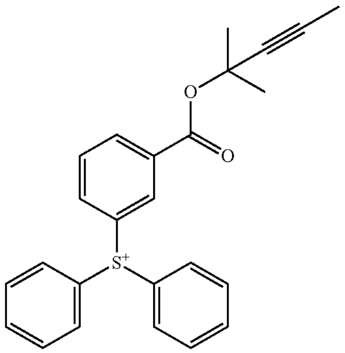
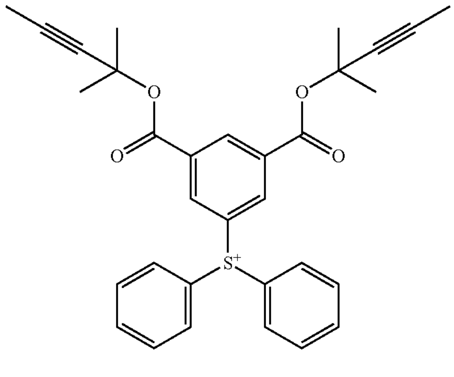

-continued
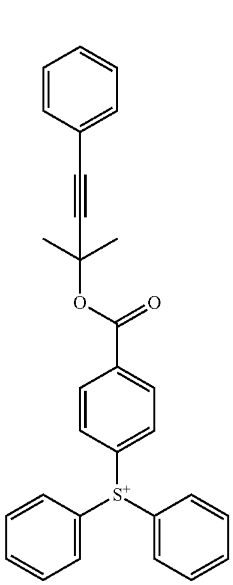
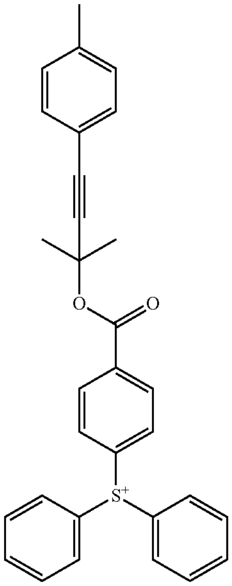
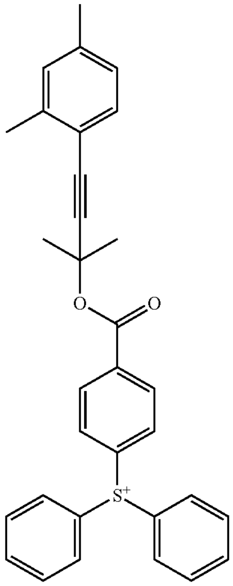
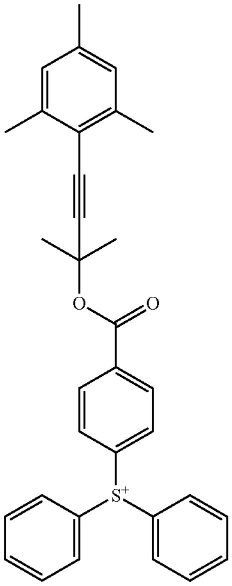
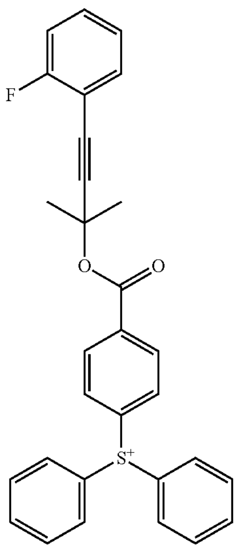
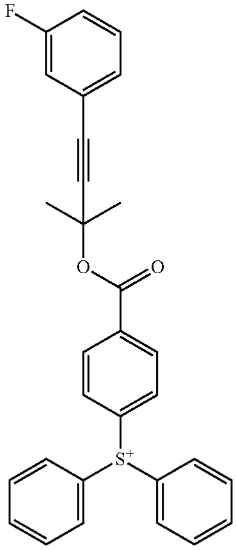
-continued
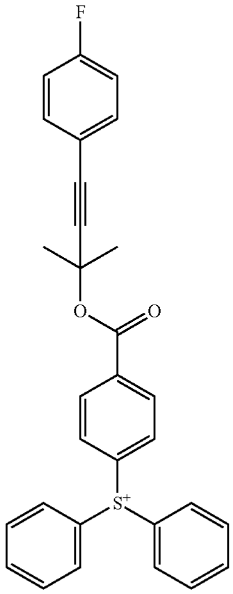
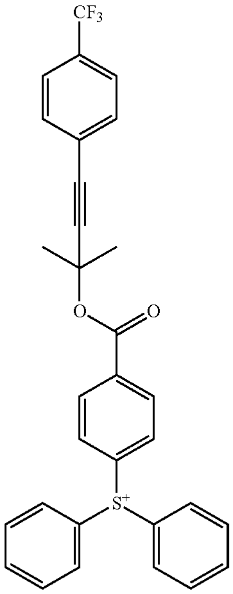
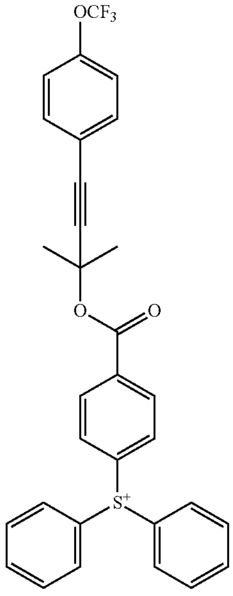
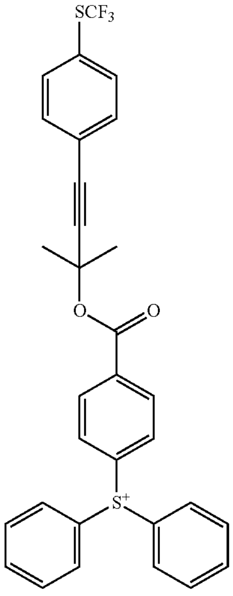

-continued
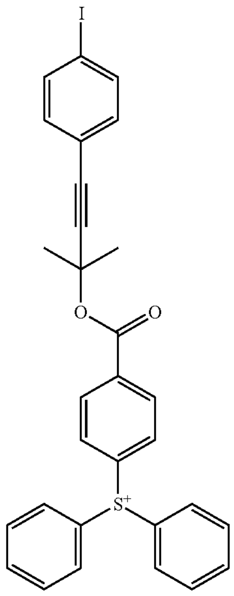
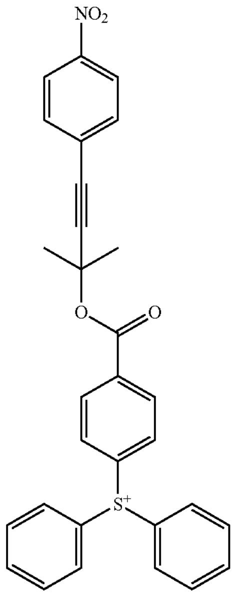
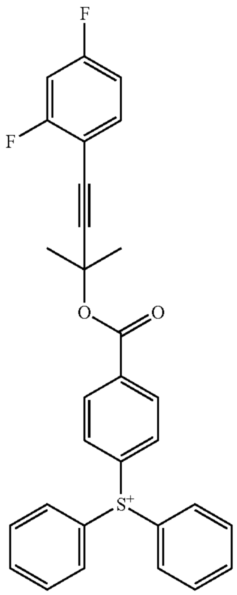
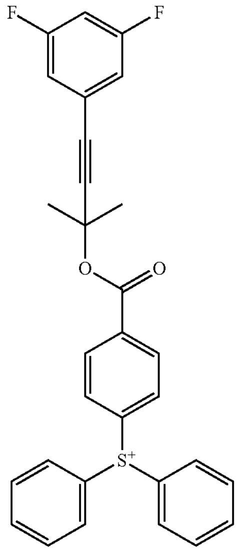
-continued
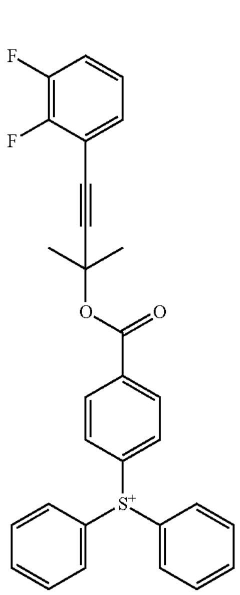
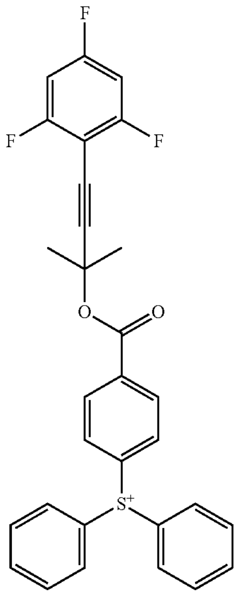
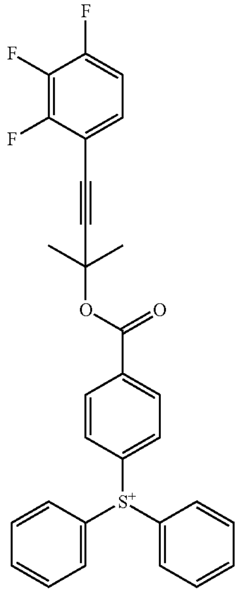
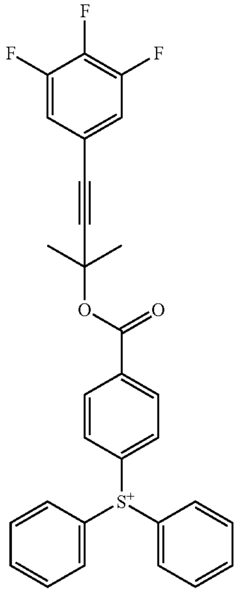

-continued
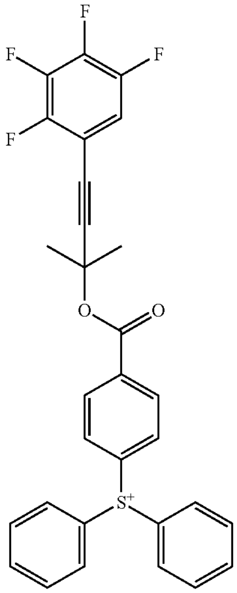
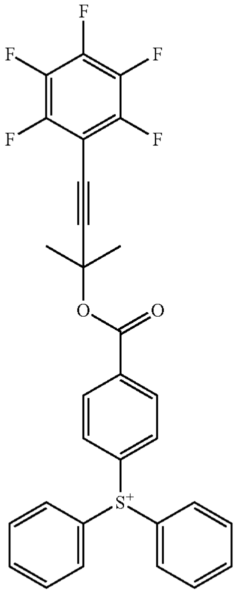
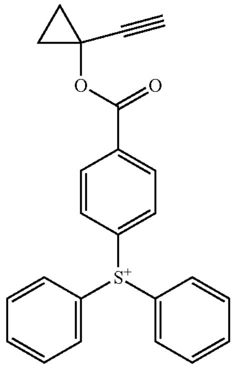
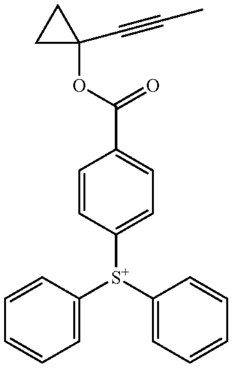
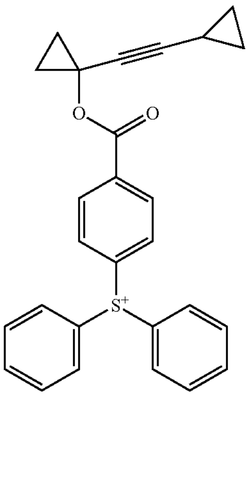
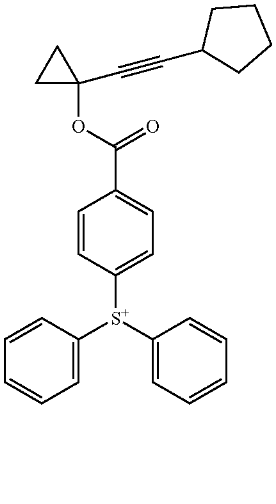
-continued
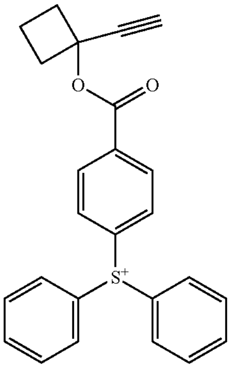
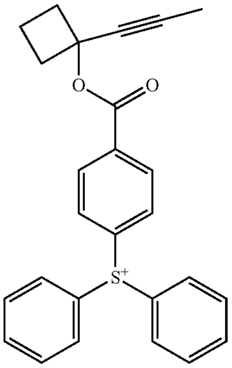
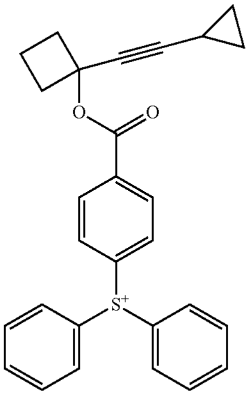
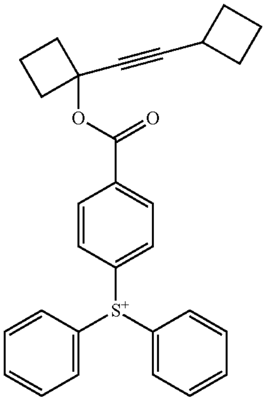
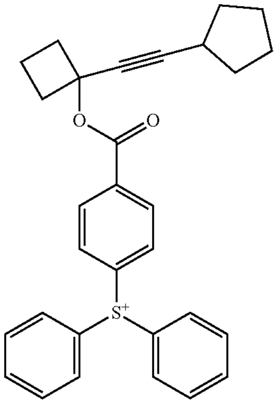
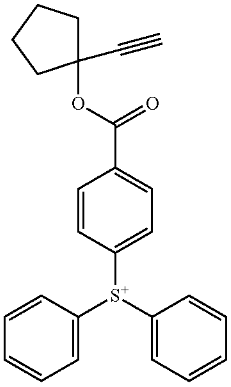
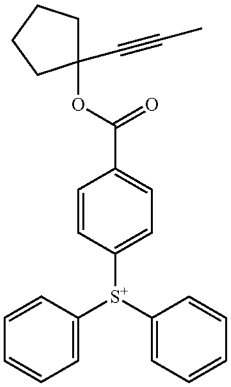
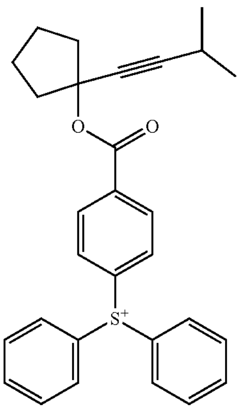

-continued
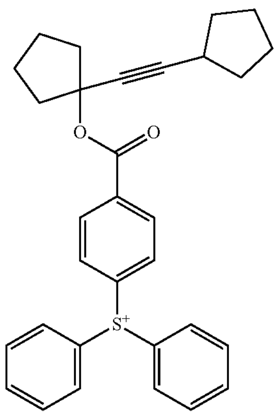
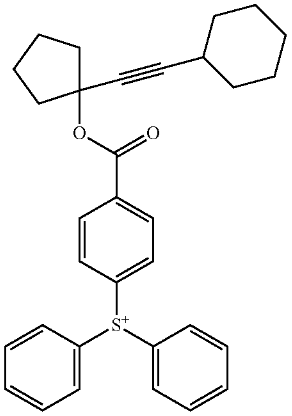
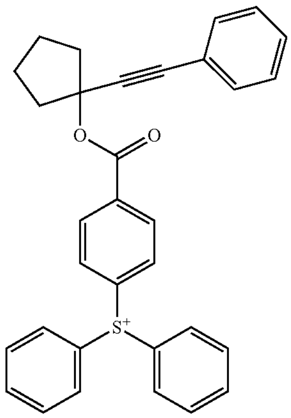
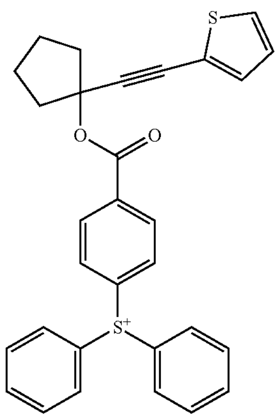
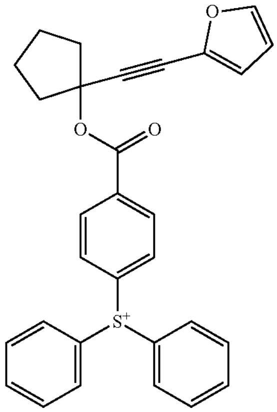
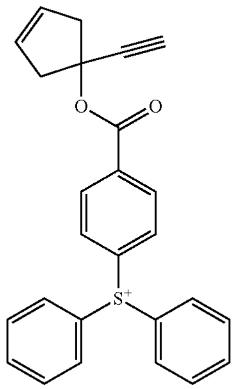
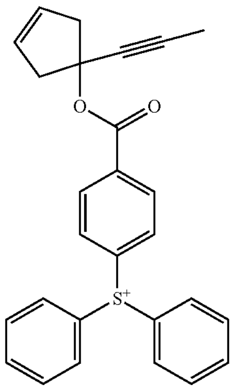
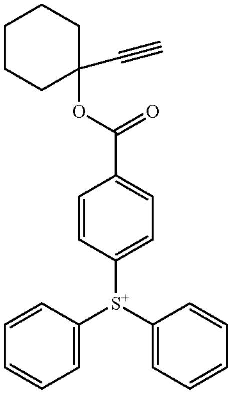
-continued
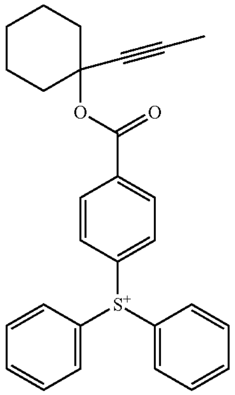
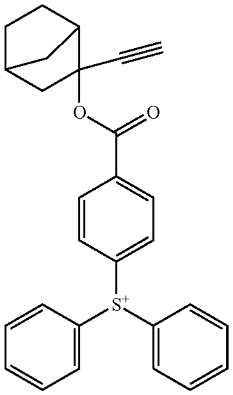
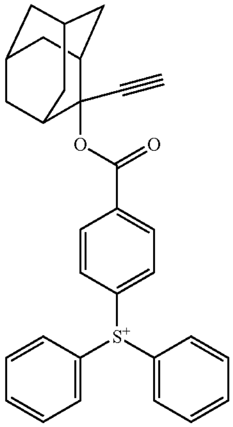
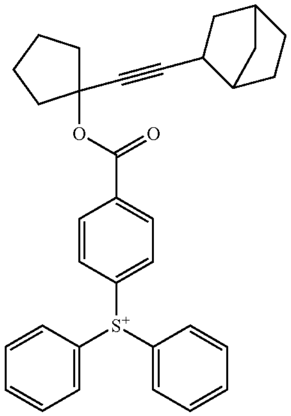
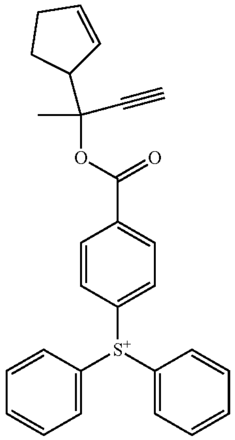
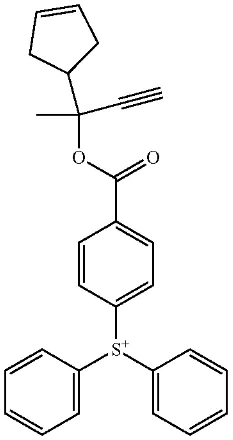
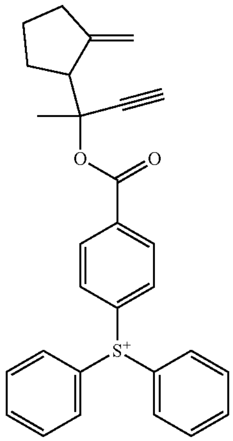
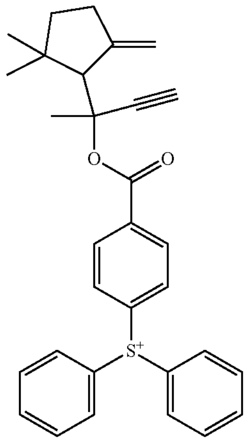

-continued
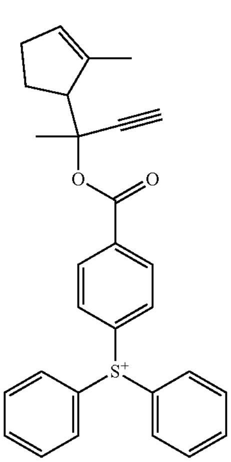
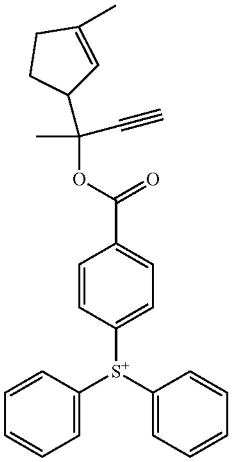
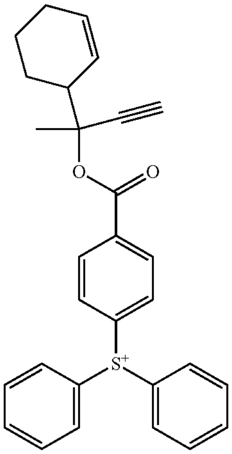
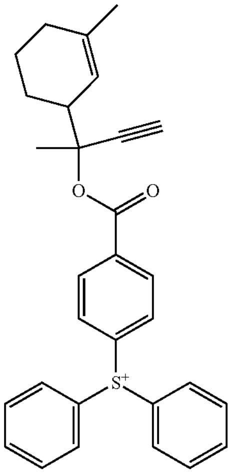
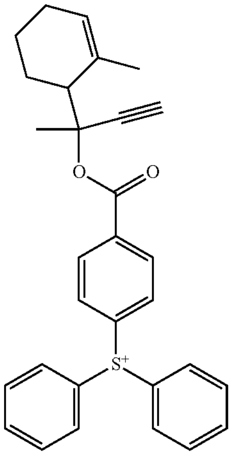
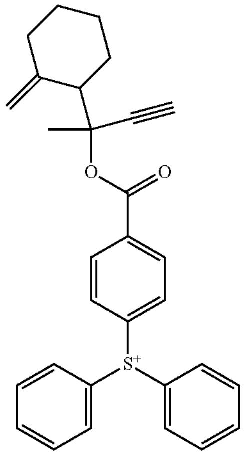
-continued
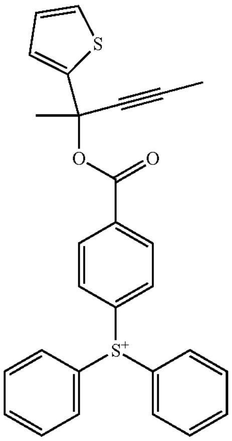
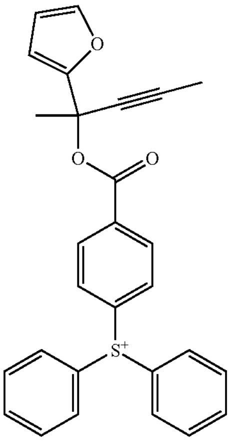
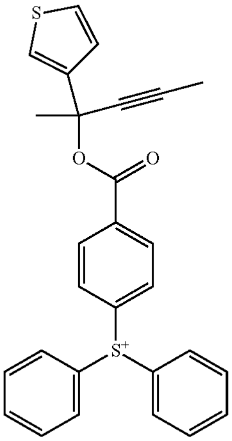
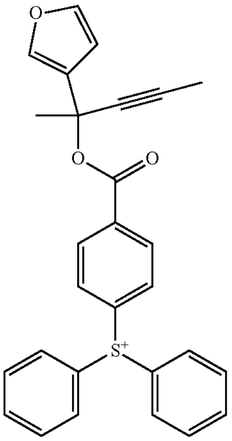
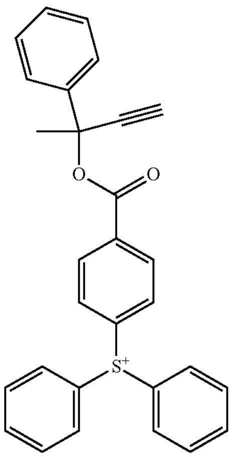
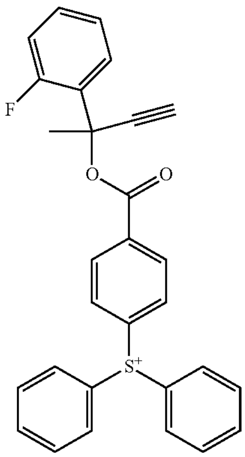

-continued
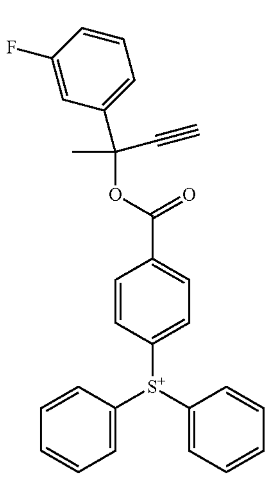
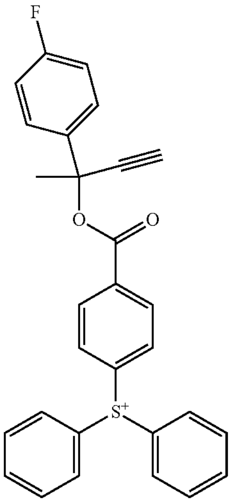
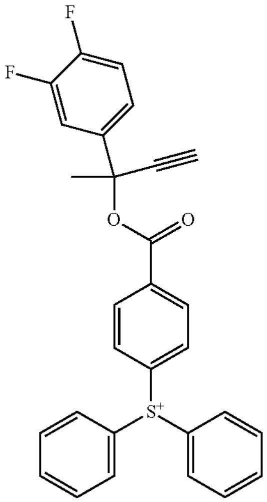
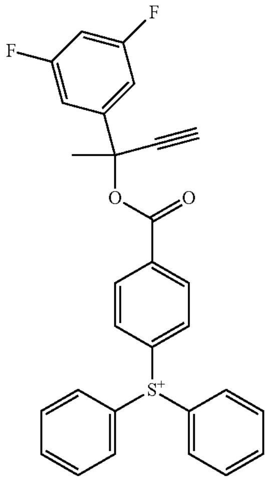
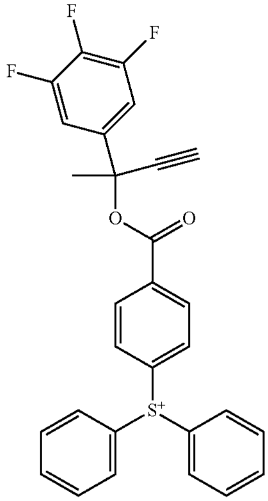
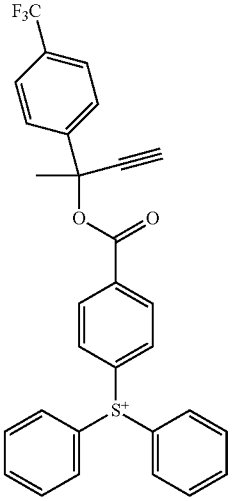
-continued
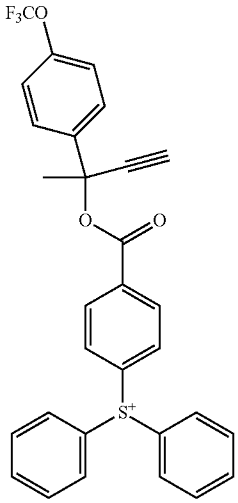
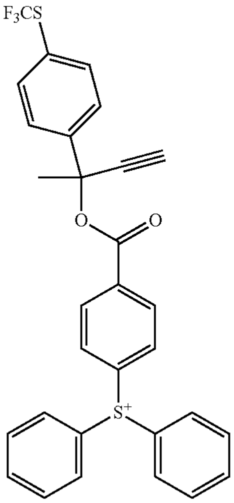
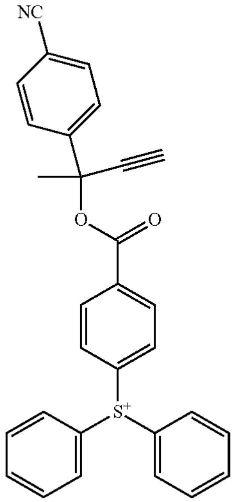
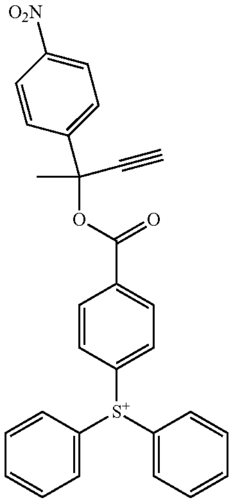
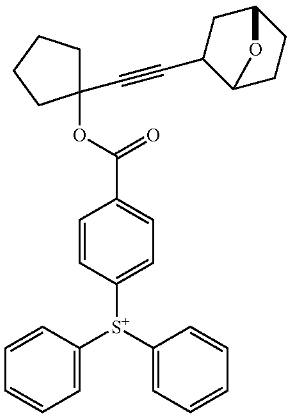
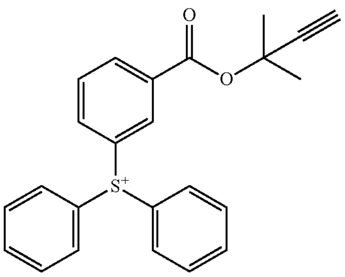

-continued
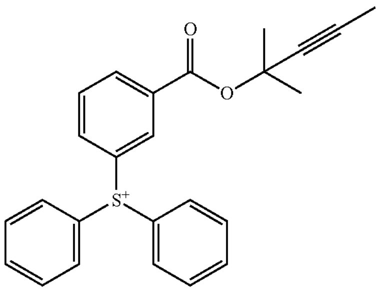
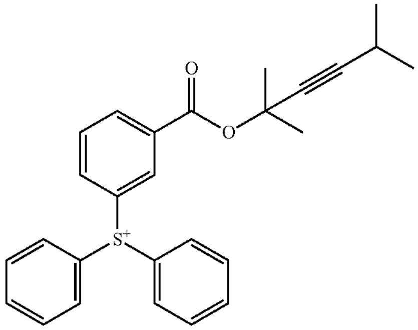
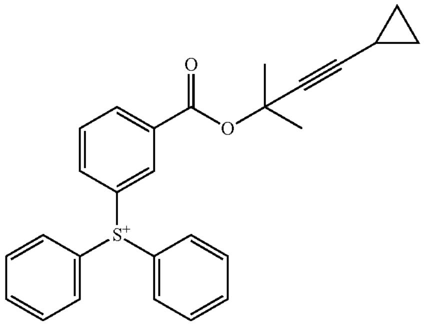
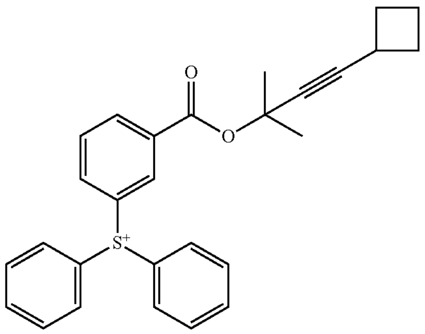
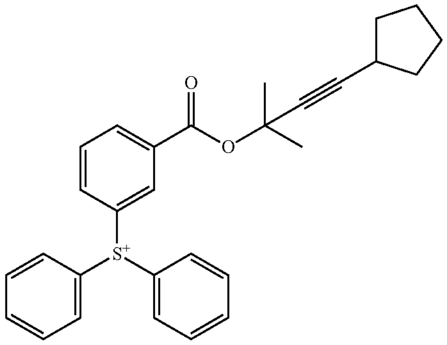
-continued
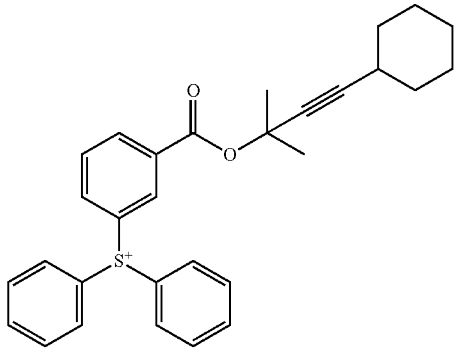
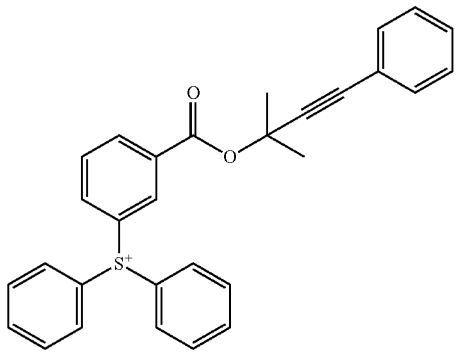
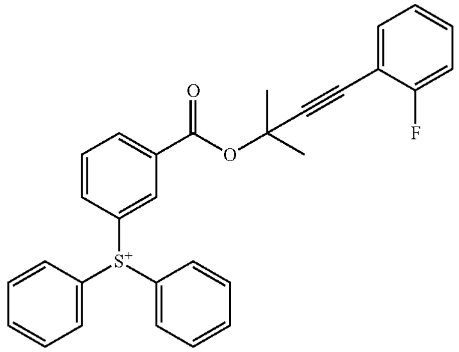
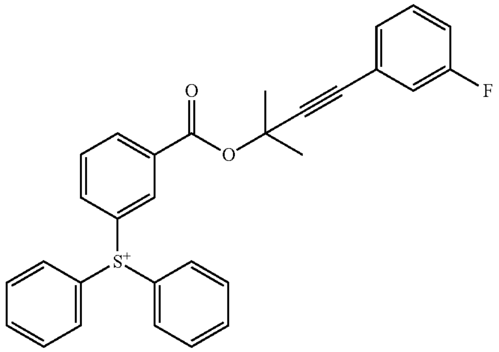

-continued
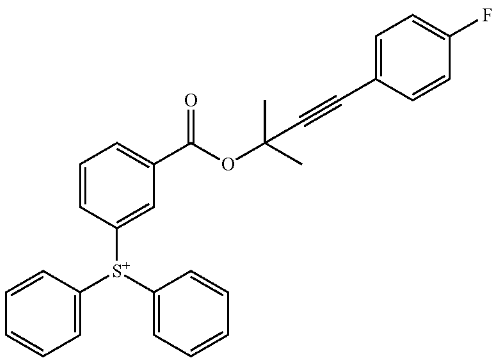
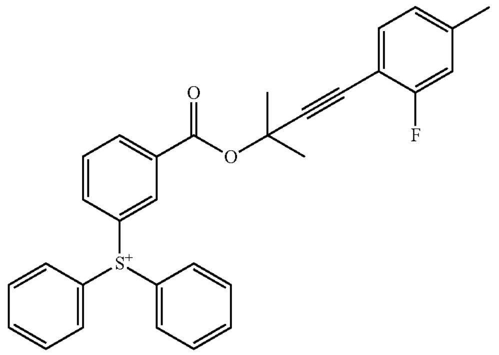
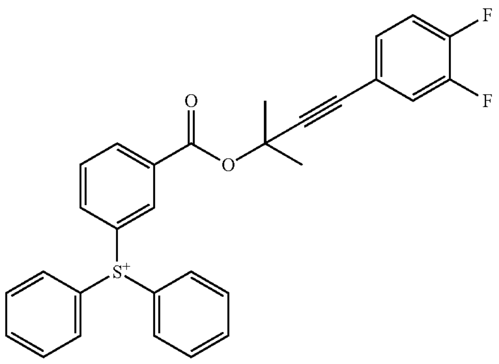
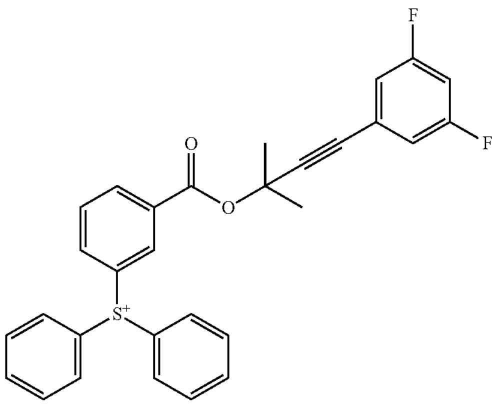
-continued
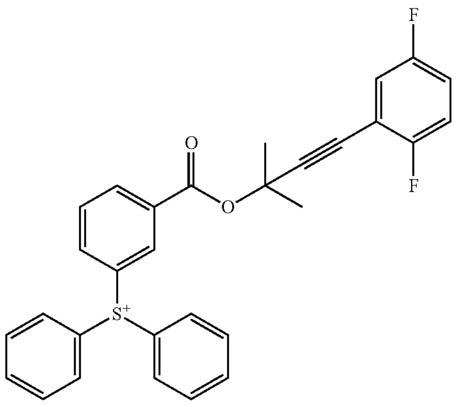 [SMILES: CC(C)(C#Cc1cc(F)ccc1F)OC(=O)c1cccc([S+](c2ccccc2)c2ccccc2)c1]
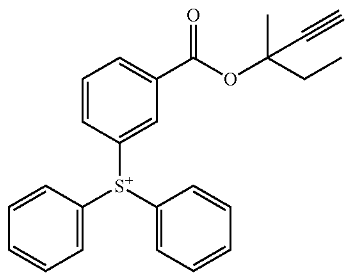
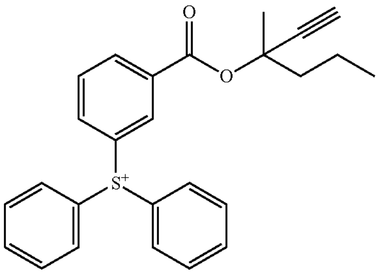
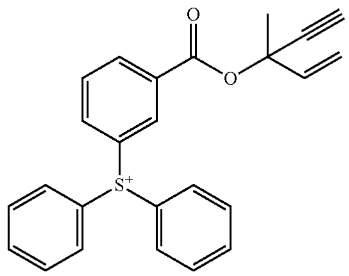
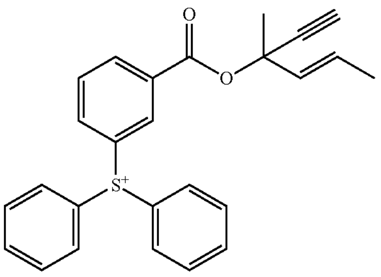

-continued
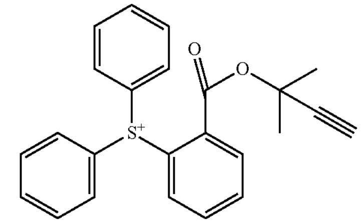
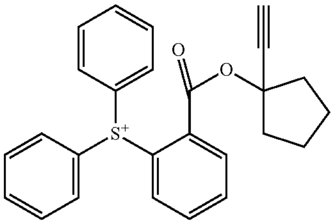
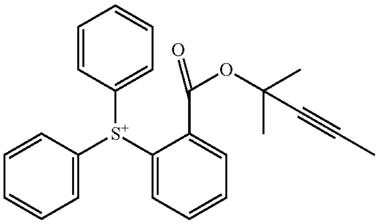
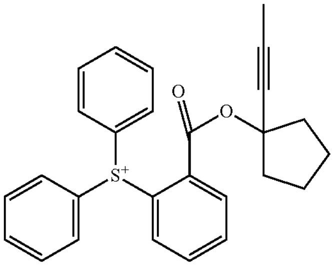
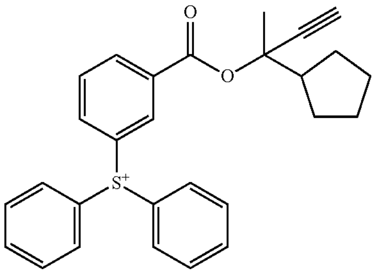
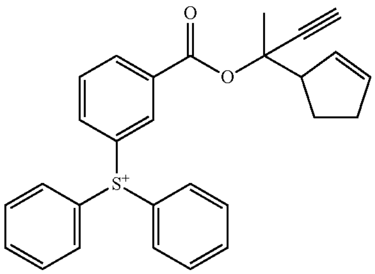
-continued
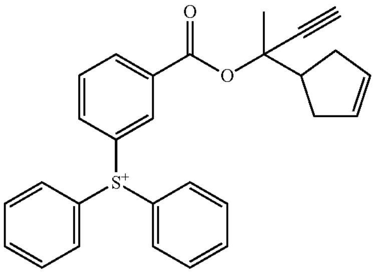
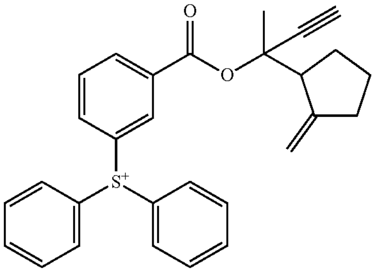
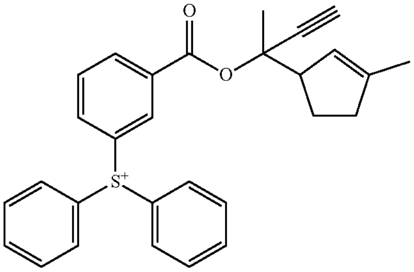
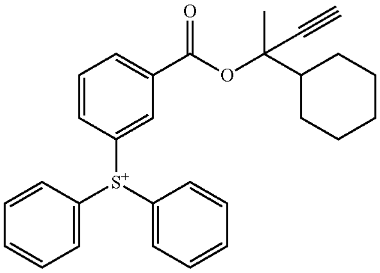
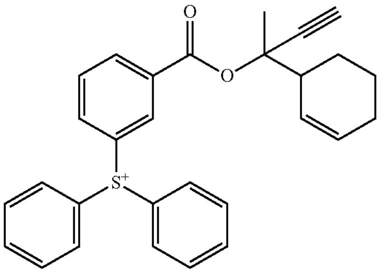
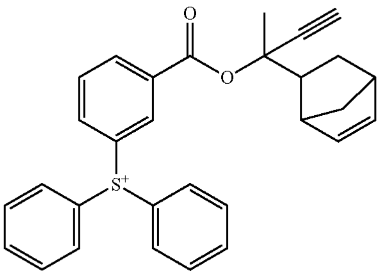

-continued
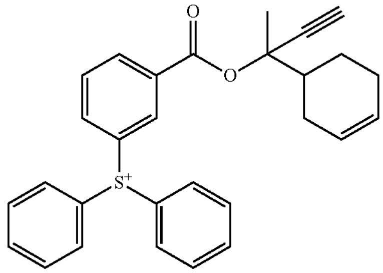
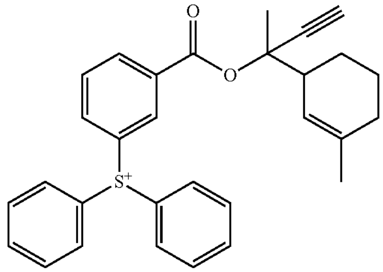
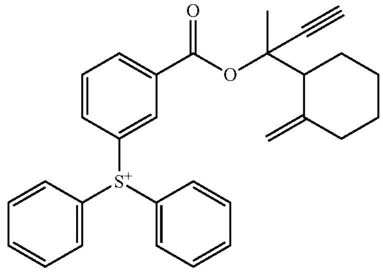
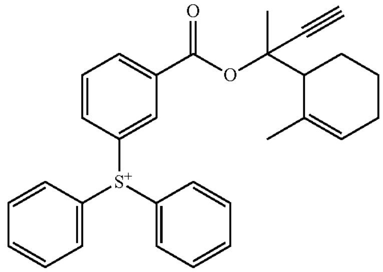
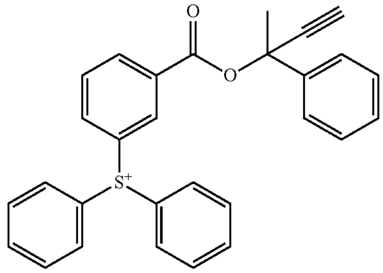
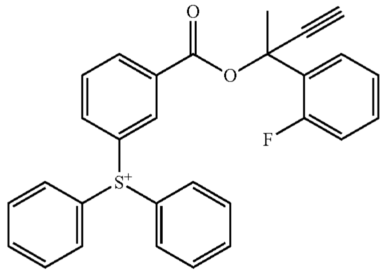
-continued
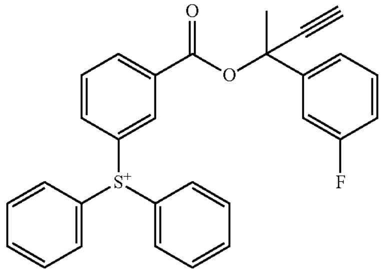
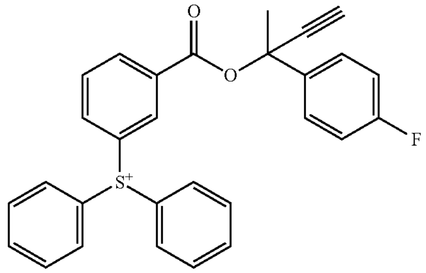
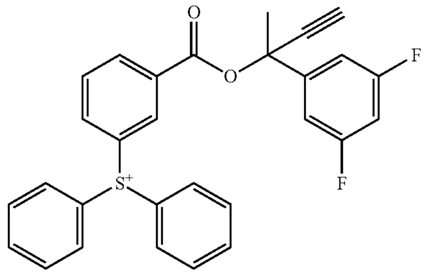
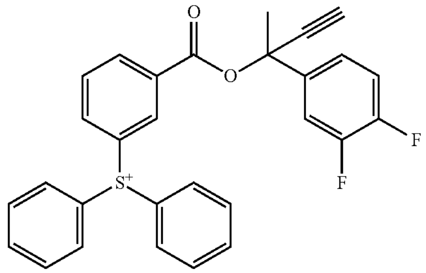
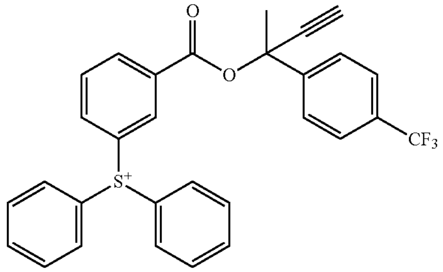
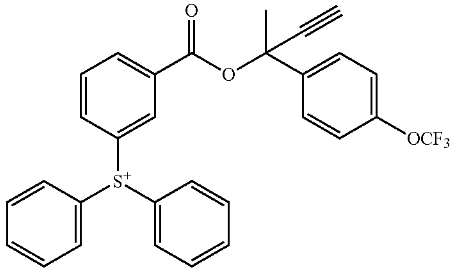

-continued
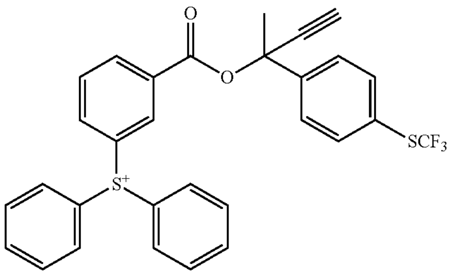
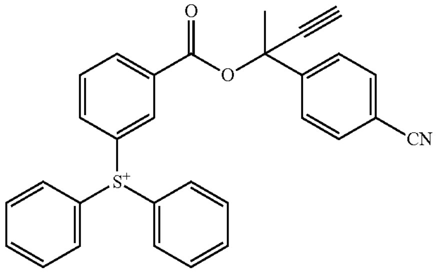
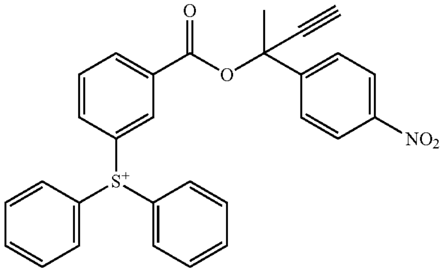
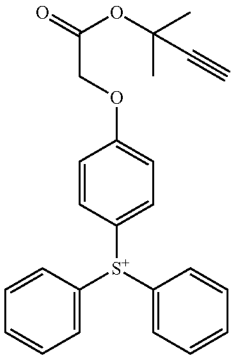
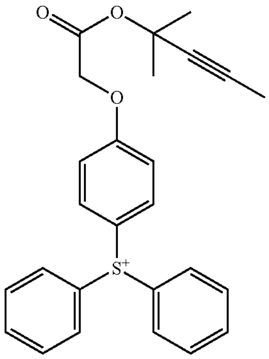
-continued
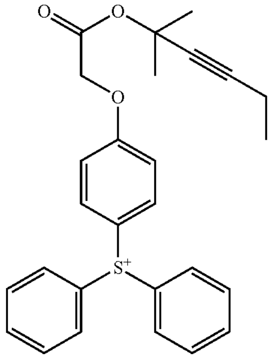
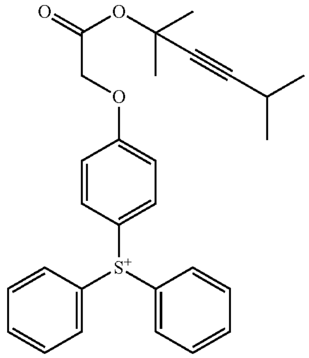
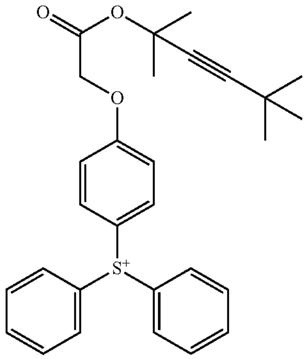
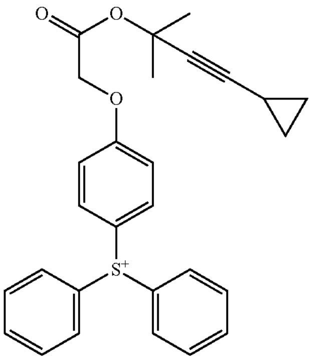

-continued
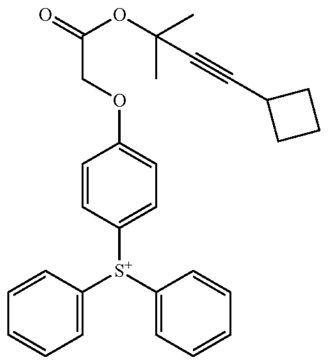
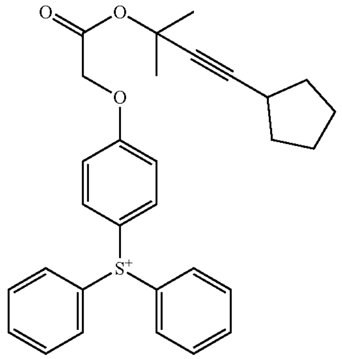
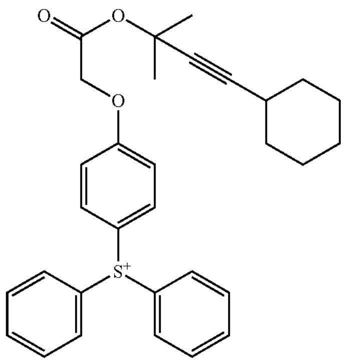
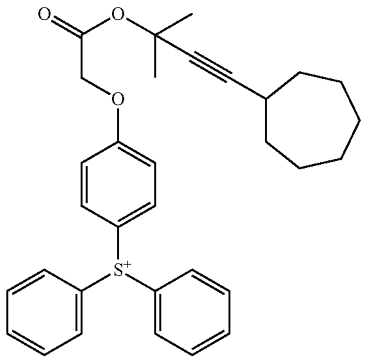
-continued
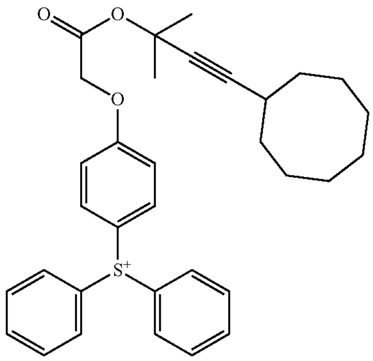
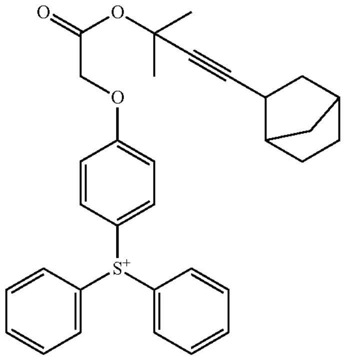
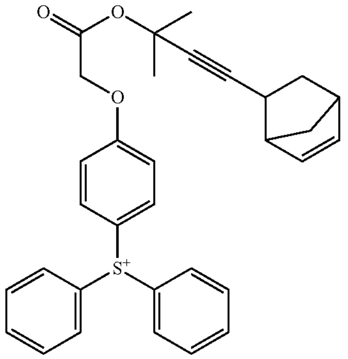
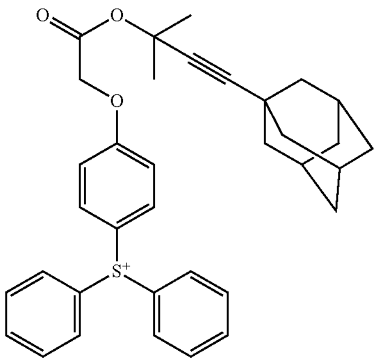

-continued
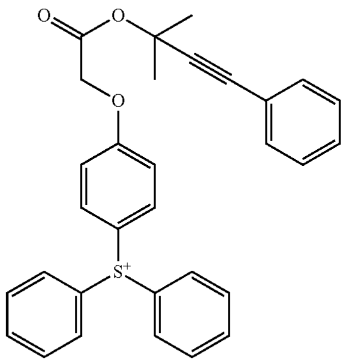
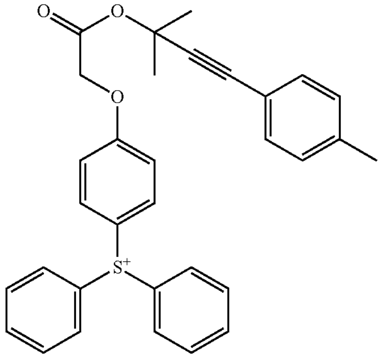
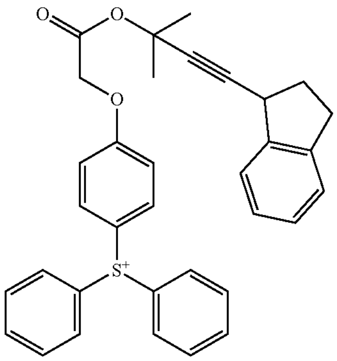
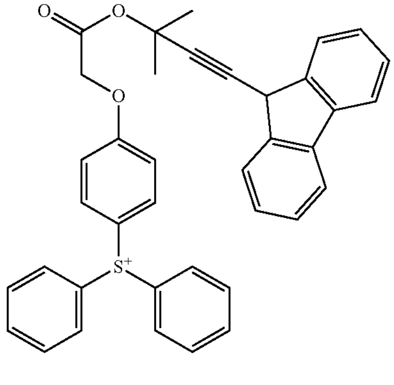
-continued
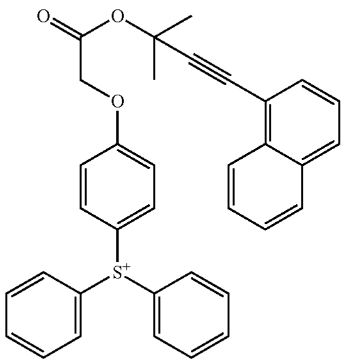
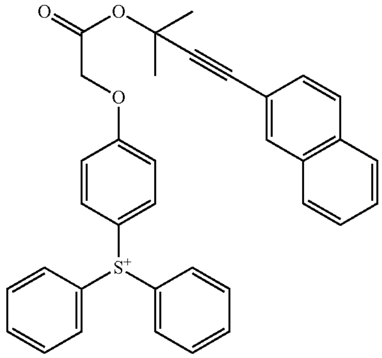
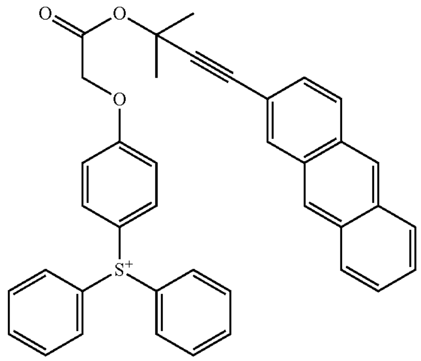
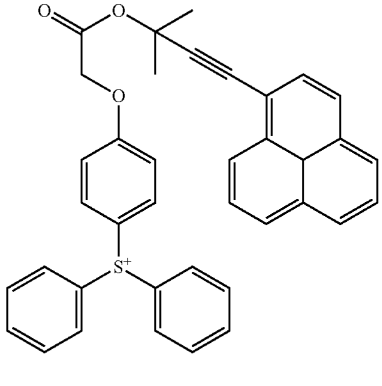

-continued
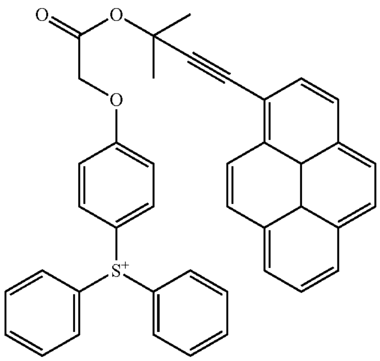
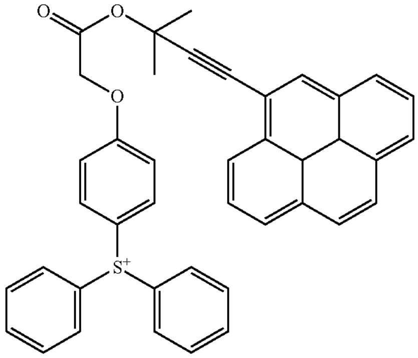
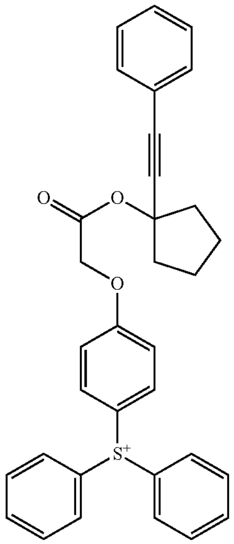
-continued
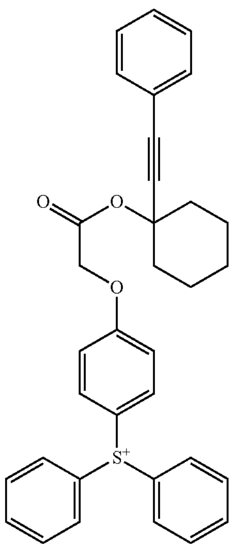
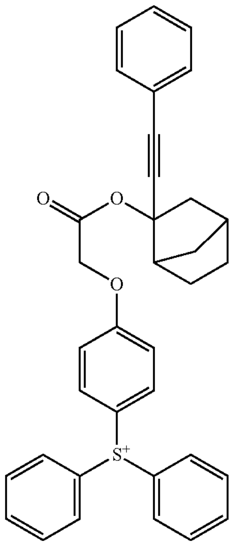
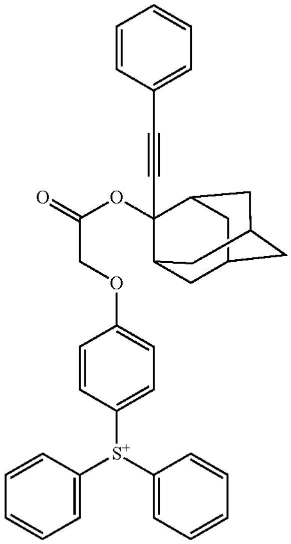

-continued
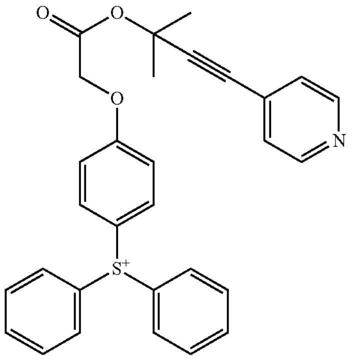
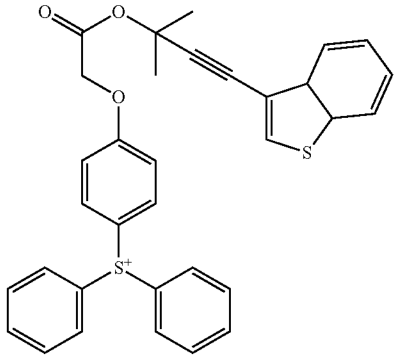
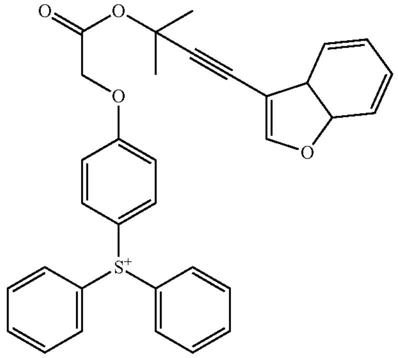
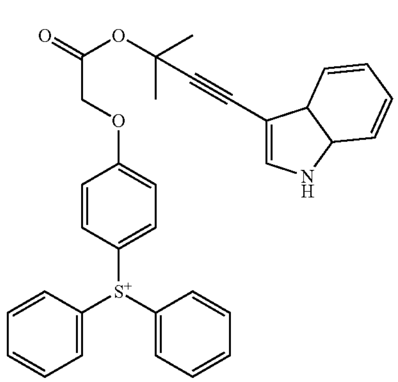
-continued
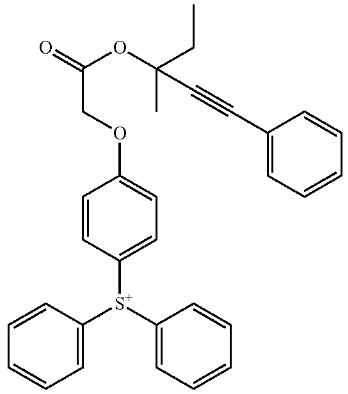
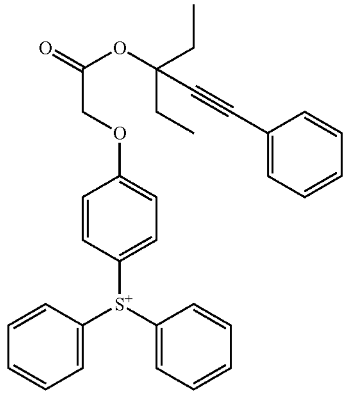
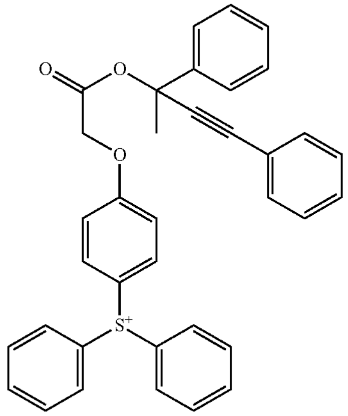
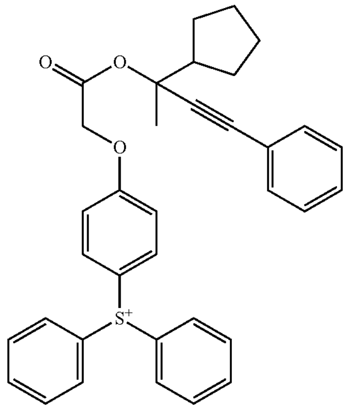

-continued
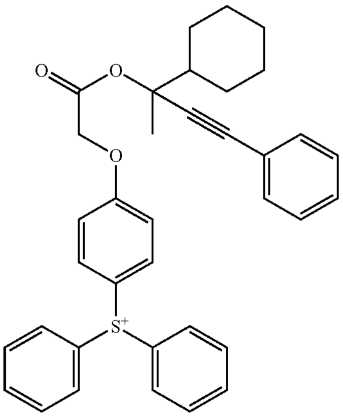
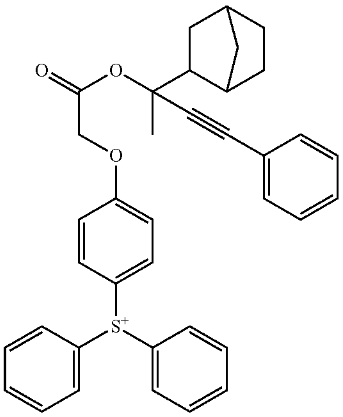
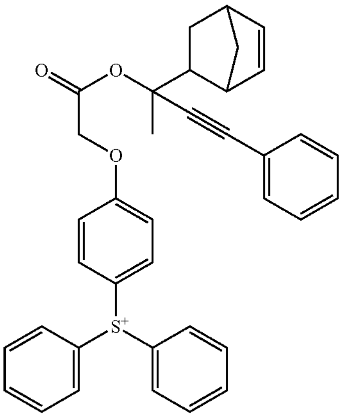
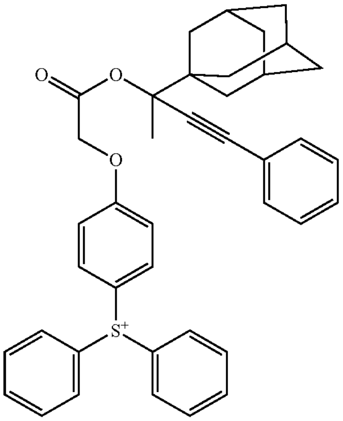
-continued
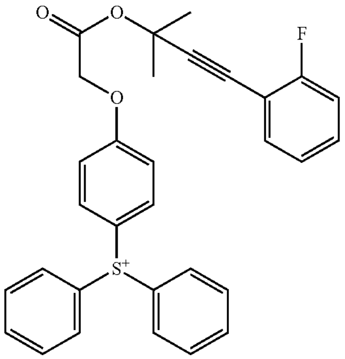
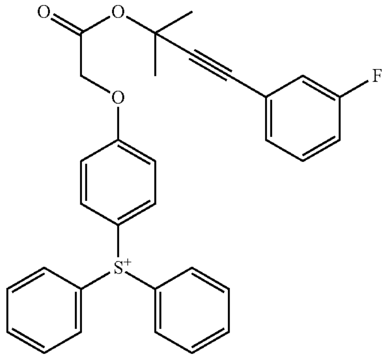
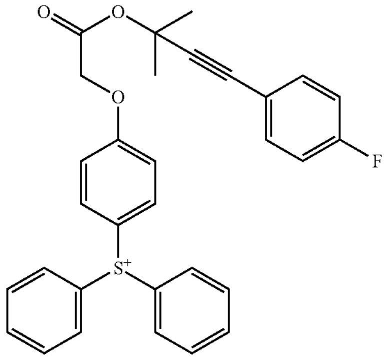
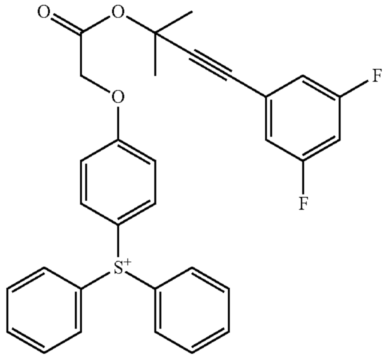

-continued
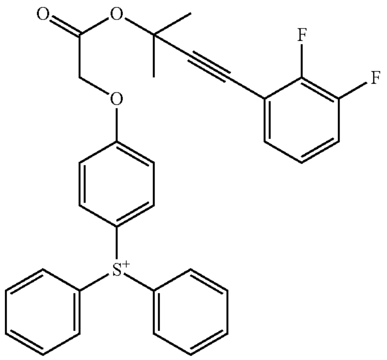
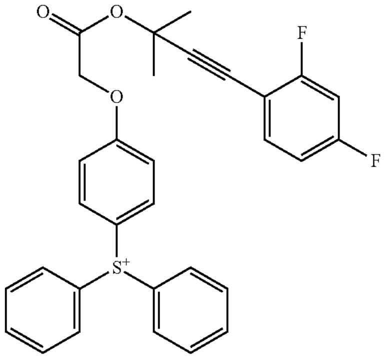
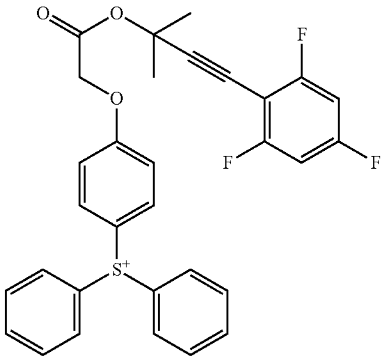
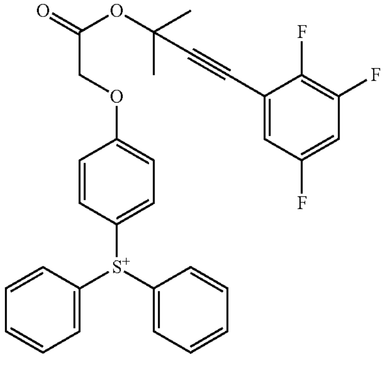
-continued
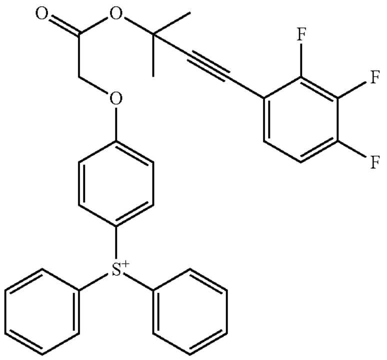
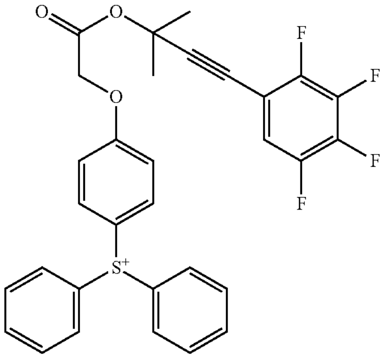
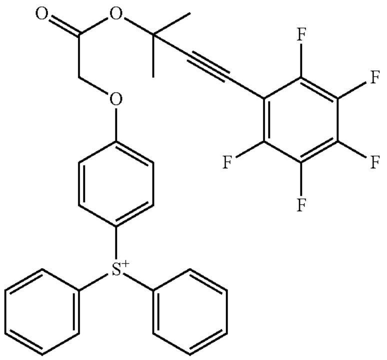
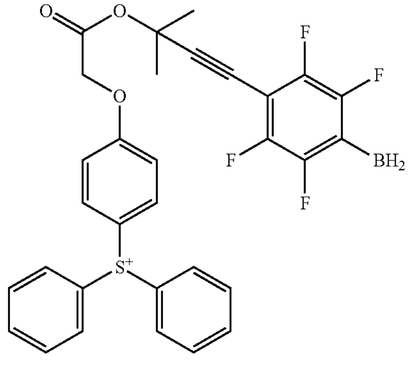

-continued
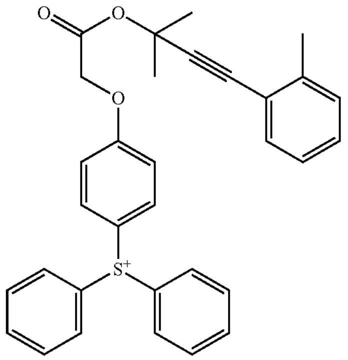
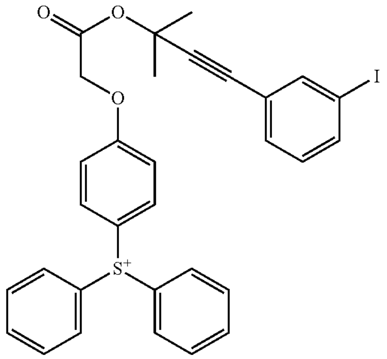
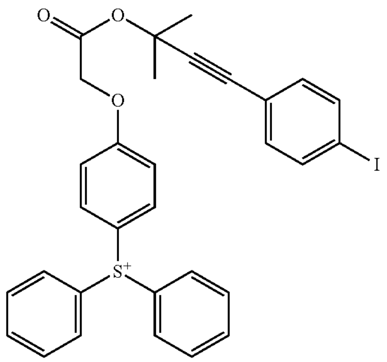
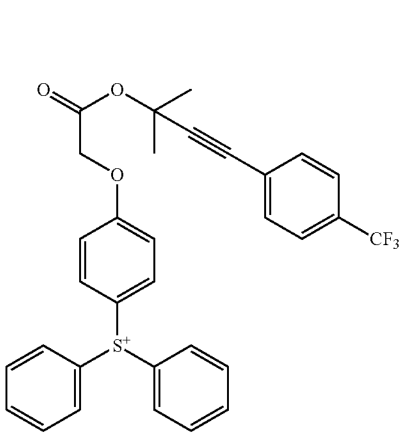
-continued
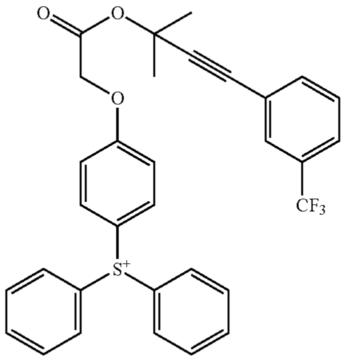
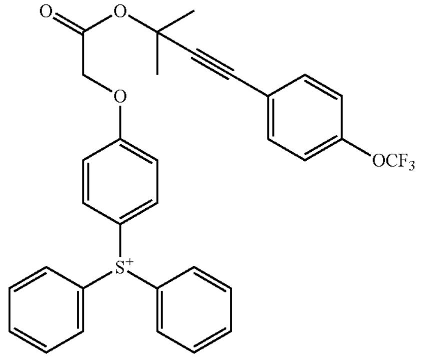
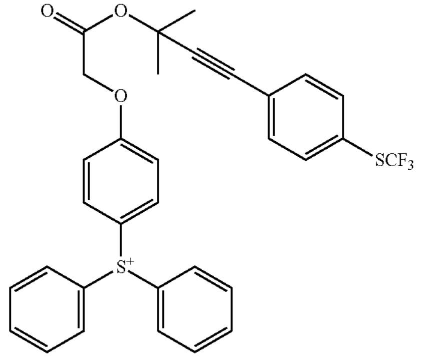
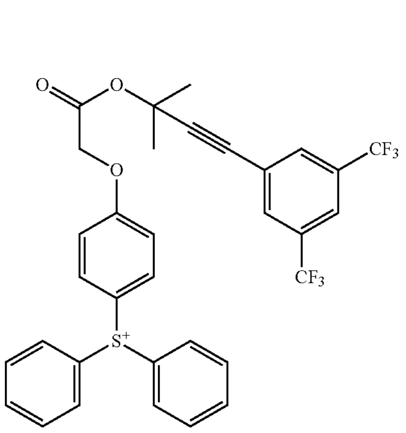

-continued
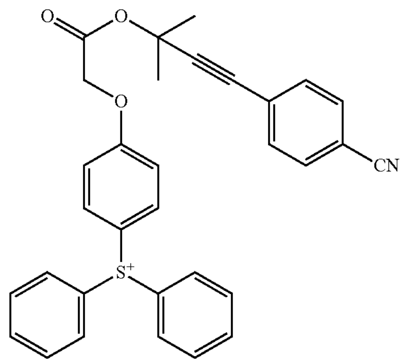
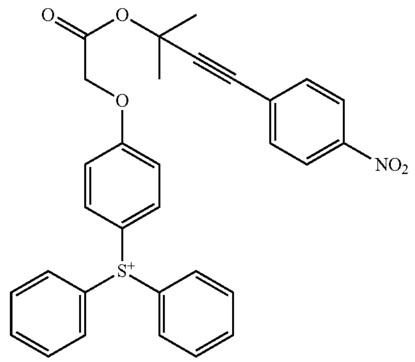
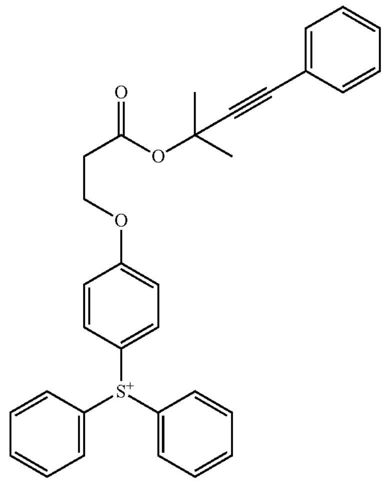
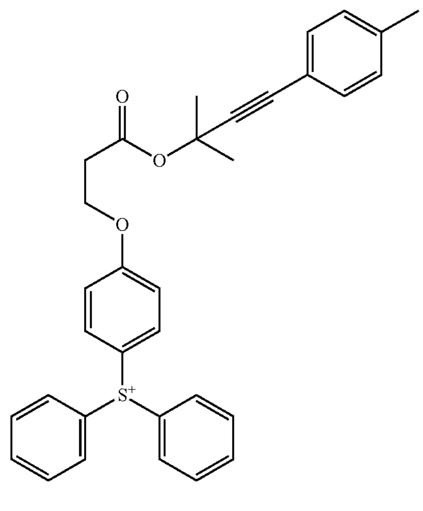
-continued
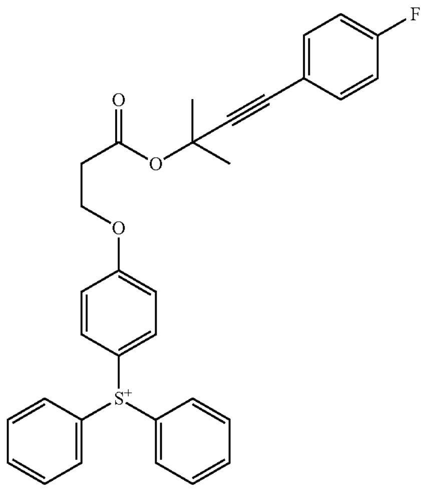
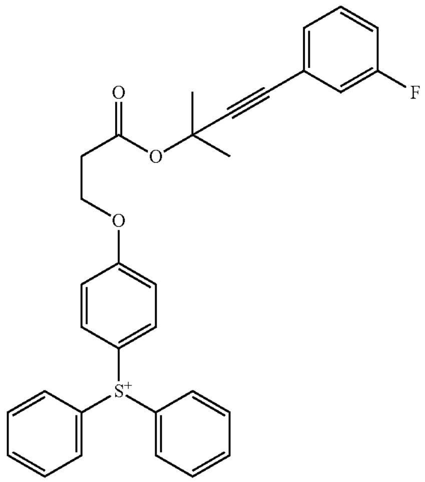
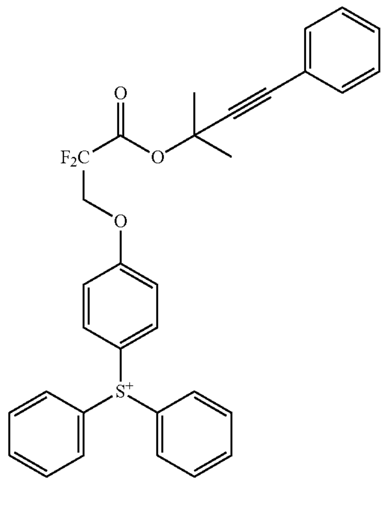

-continued
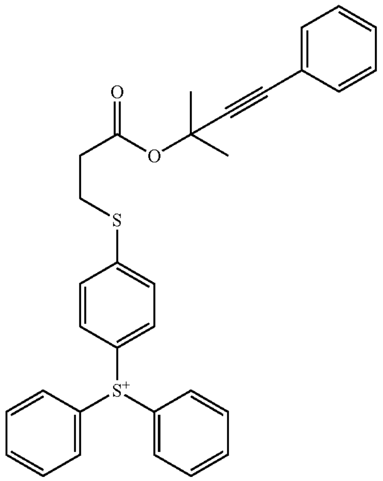
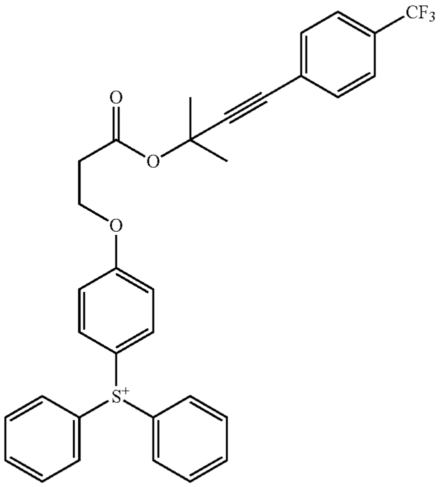
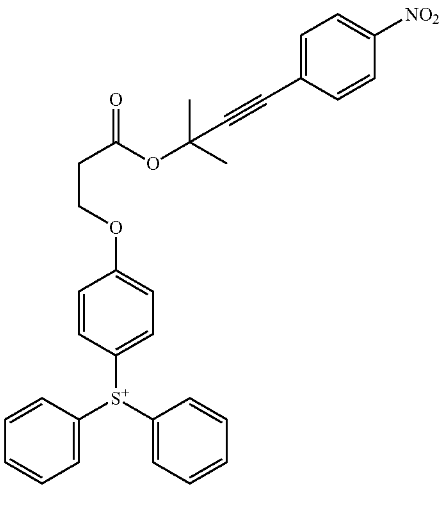
-continued
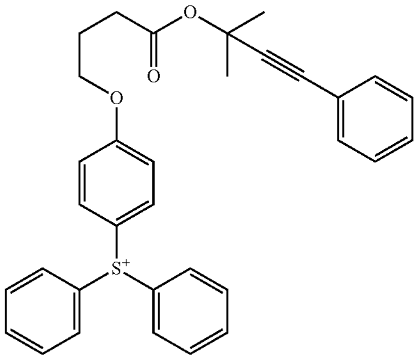
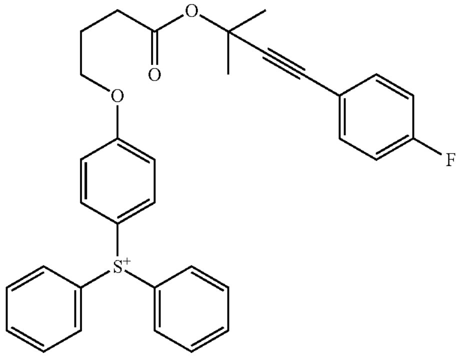
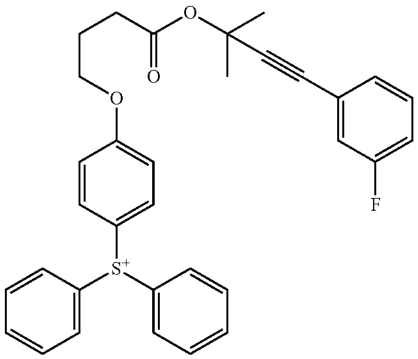
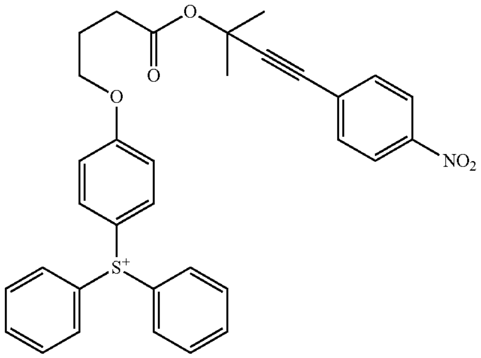

-continued
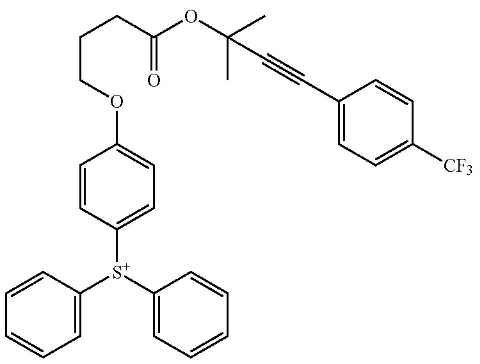
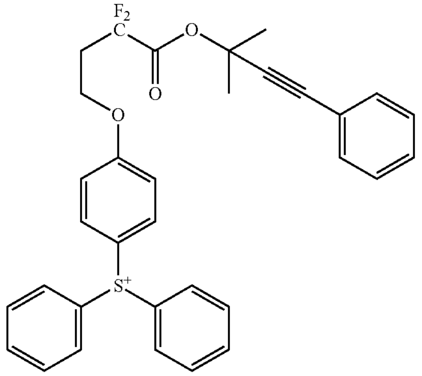
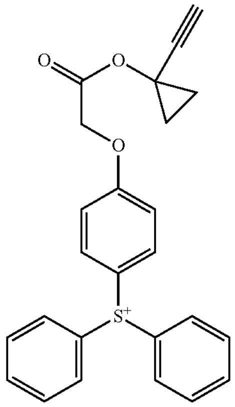
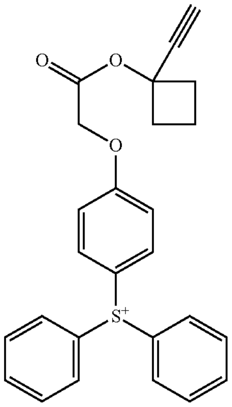
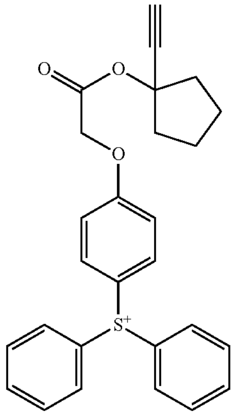
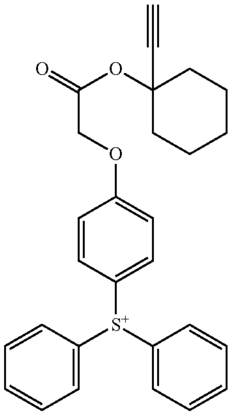
-continued
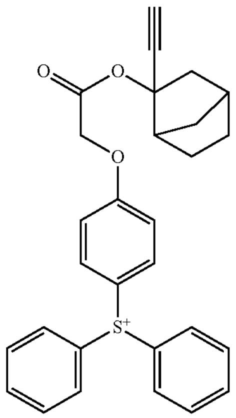
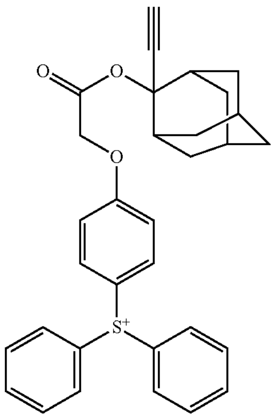
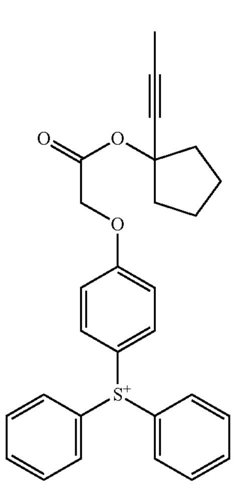
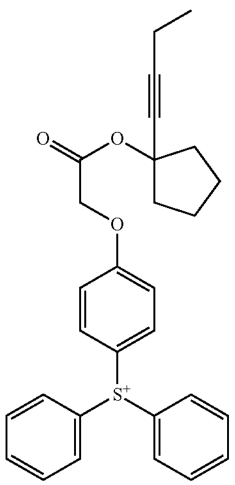
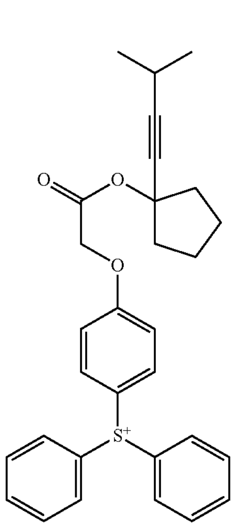
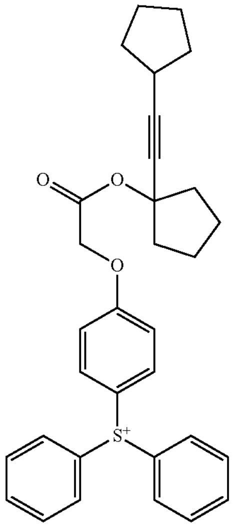

-continued
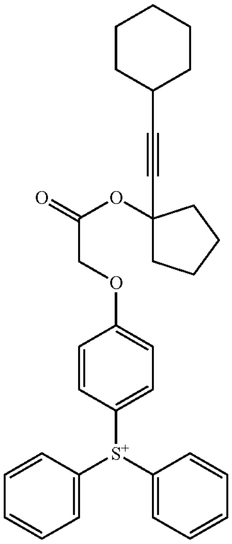
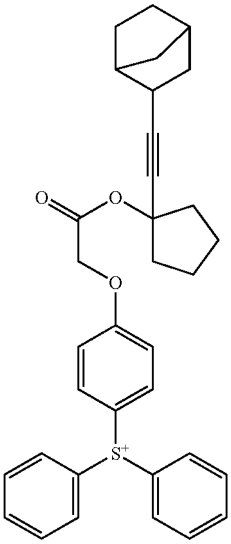
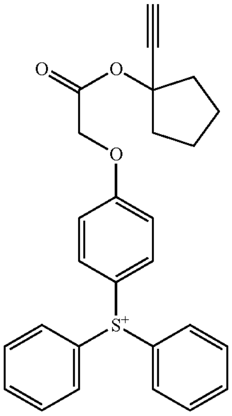
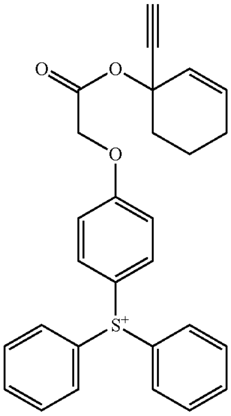
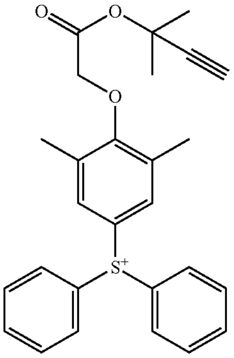
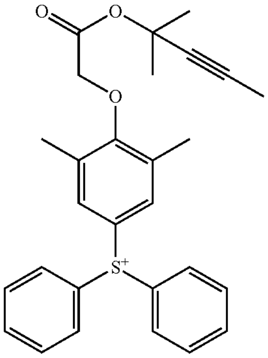
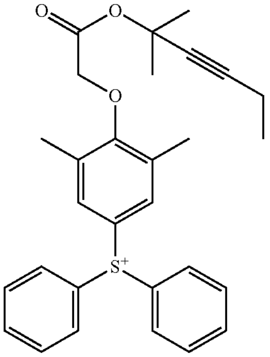
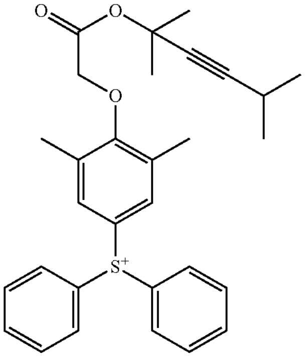
-continued
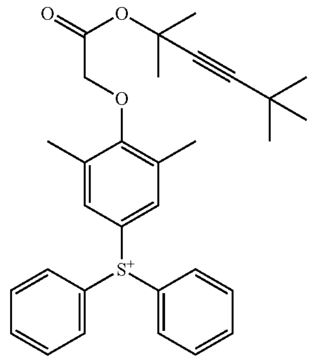
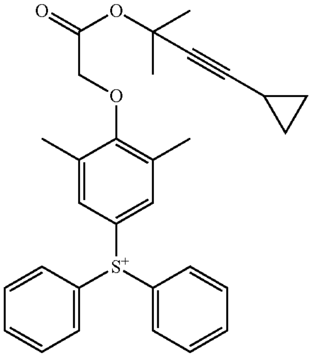
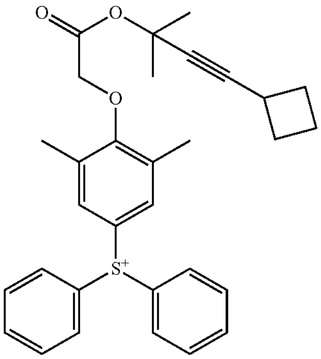
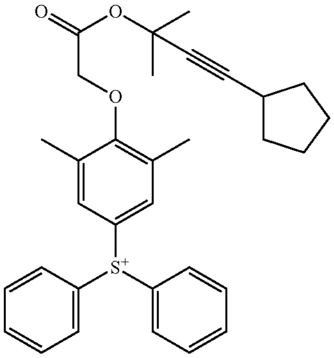

-continued
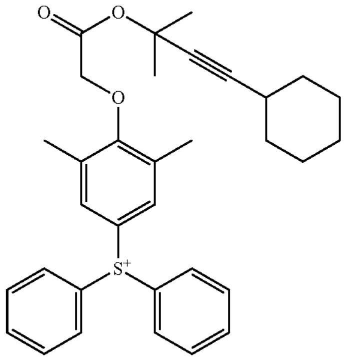
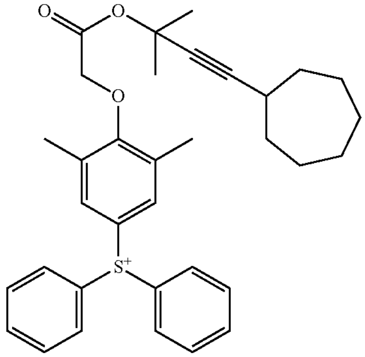
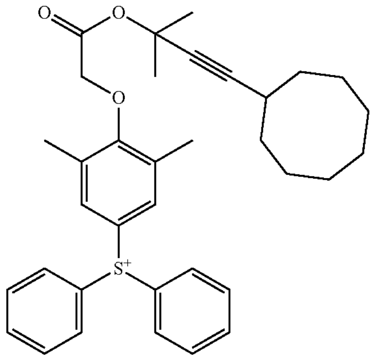
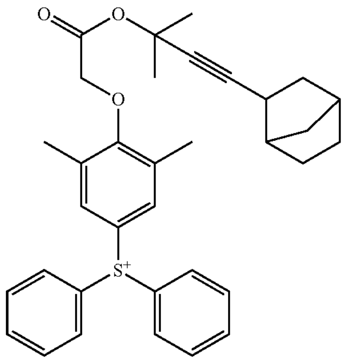
-continued
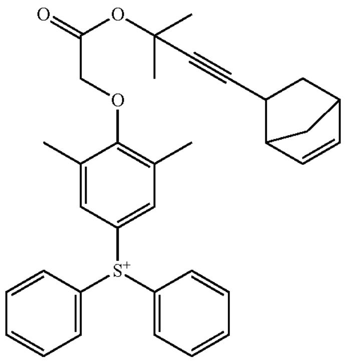
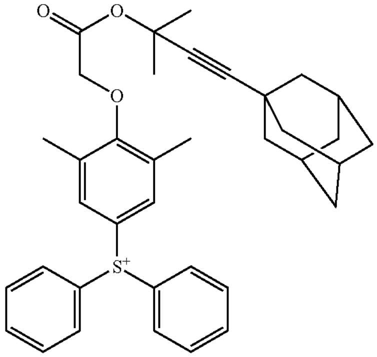
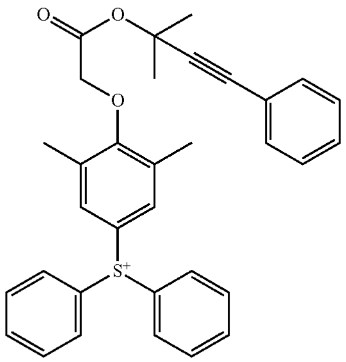
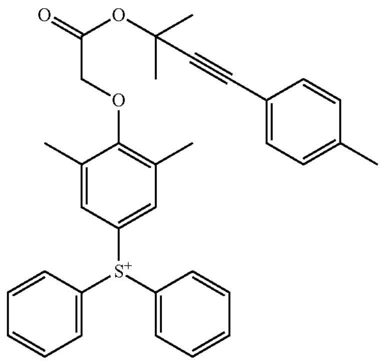

-continued
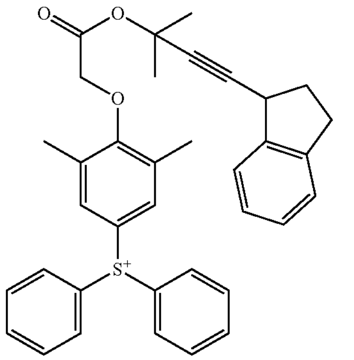
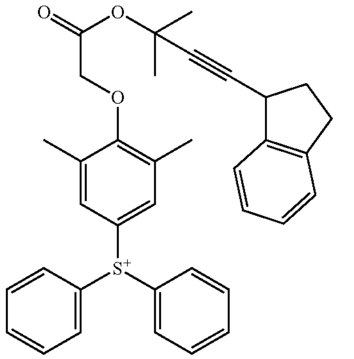
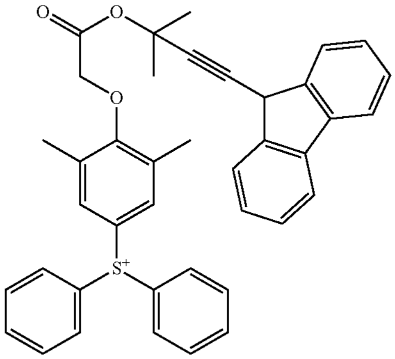
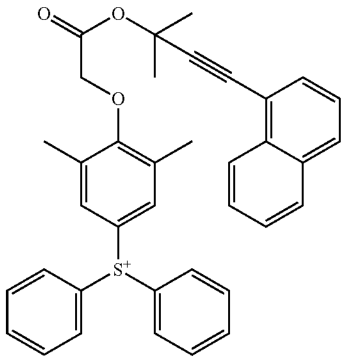
-continued
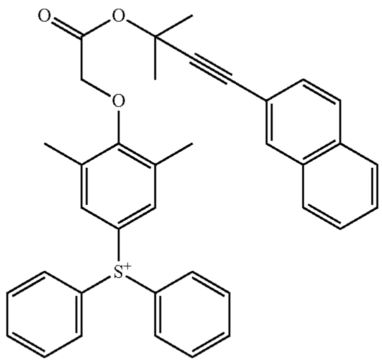
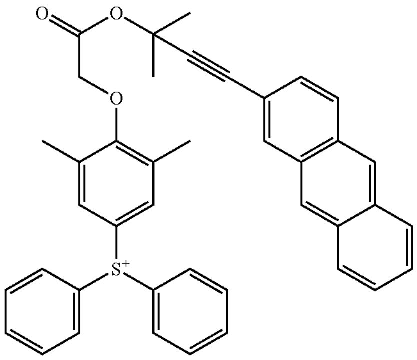
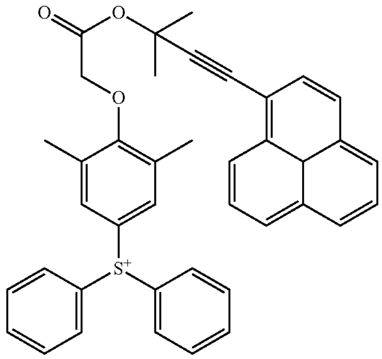
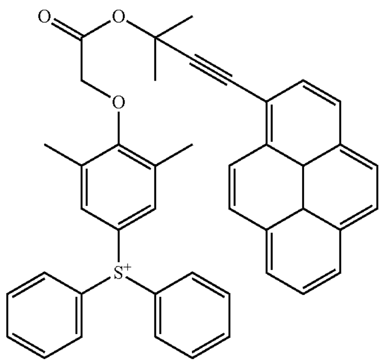

-continued
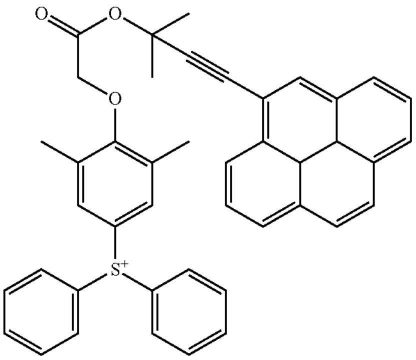
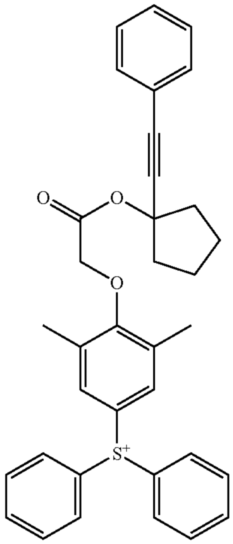
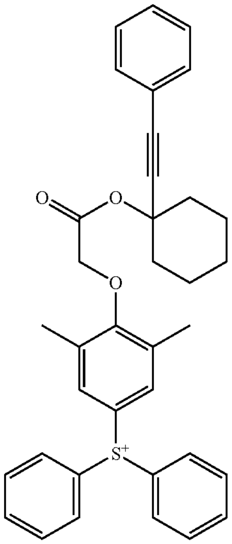
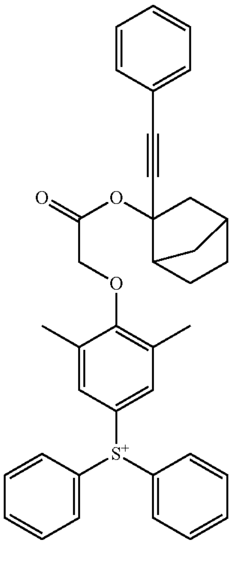
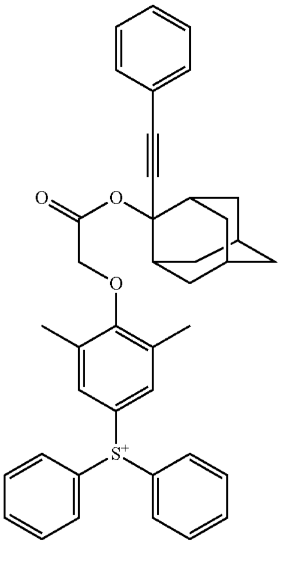
-continued
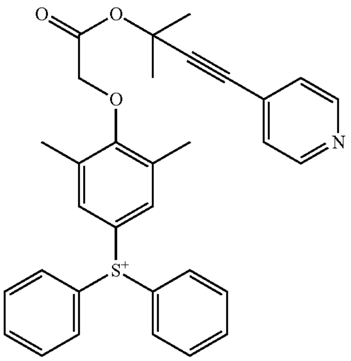
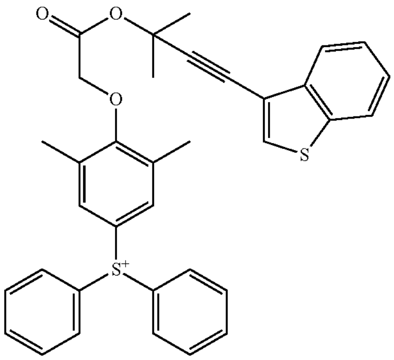
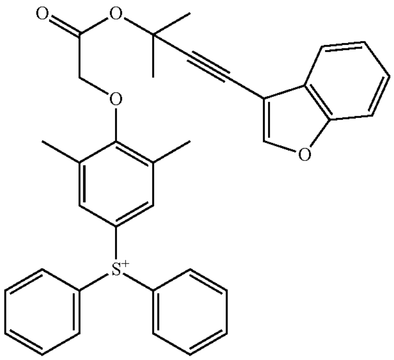
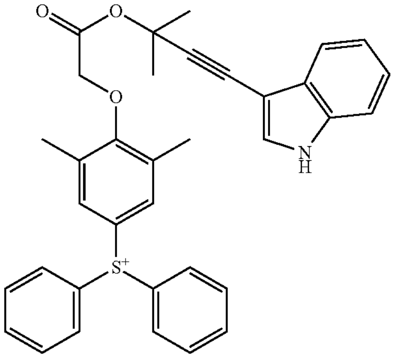

-continued
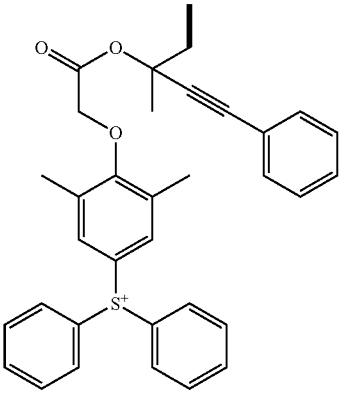
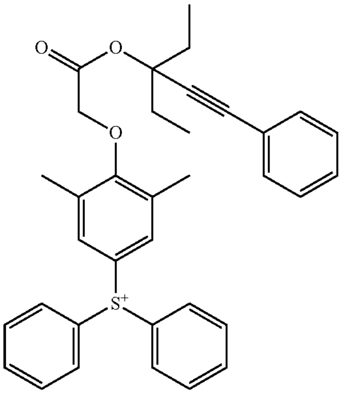
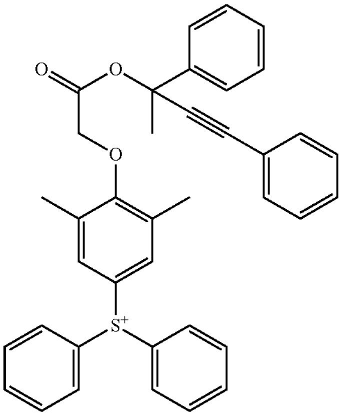
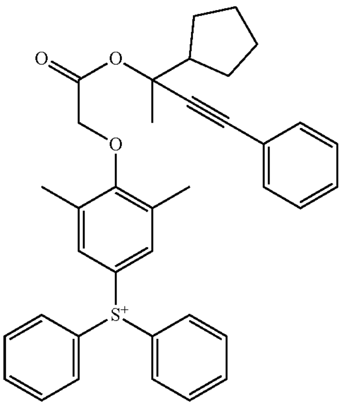
-continued
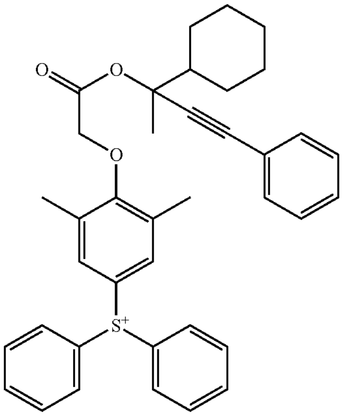
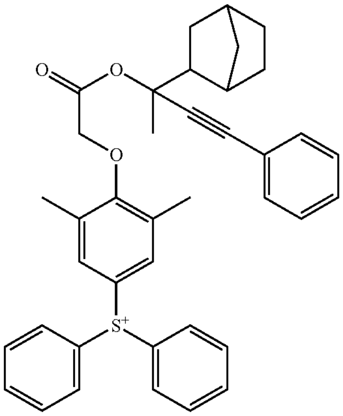
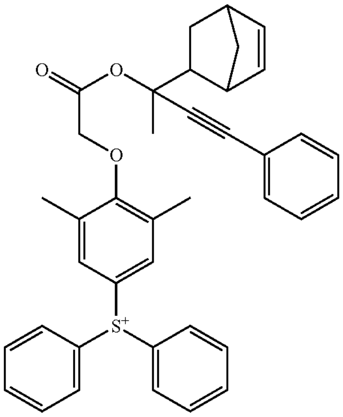
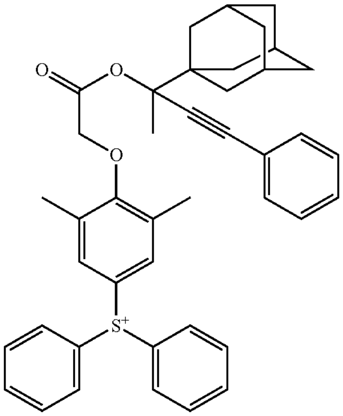

-continued
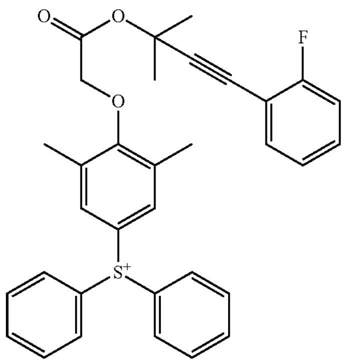
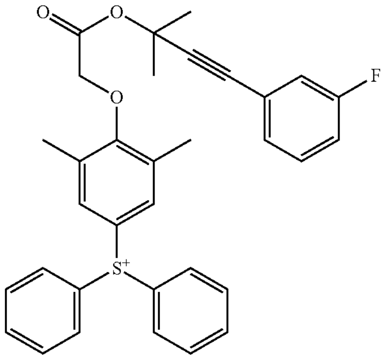
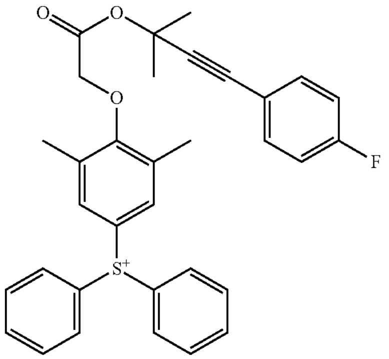
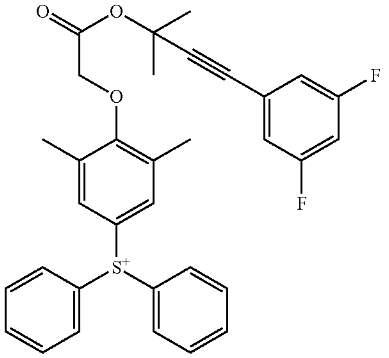
-continued
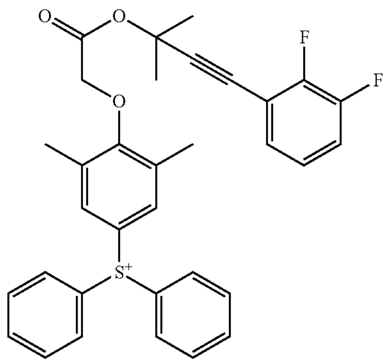
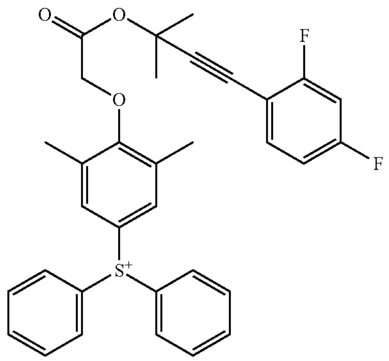
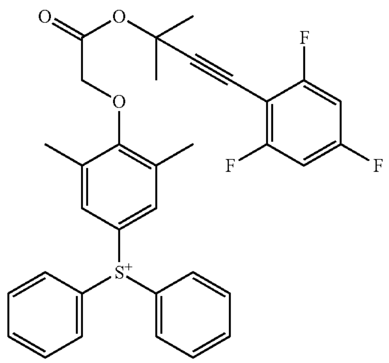
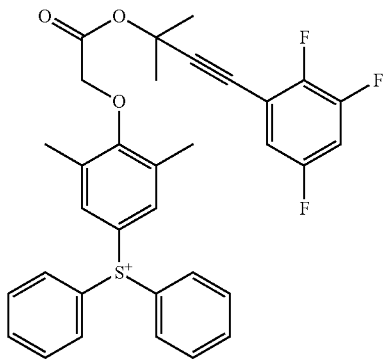

-continued
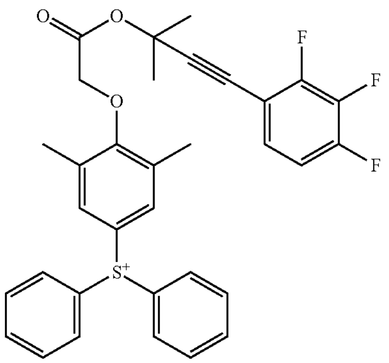
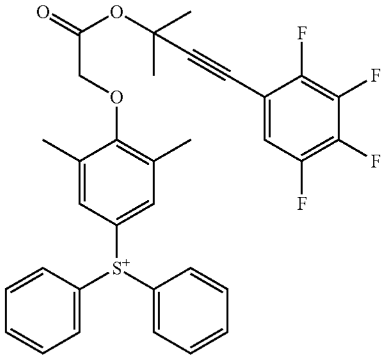
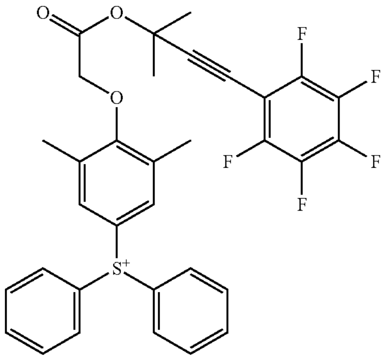
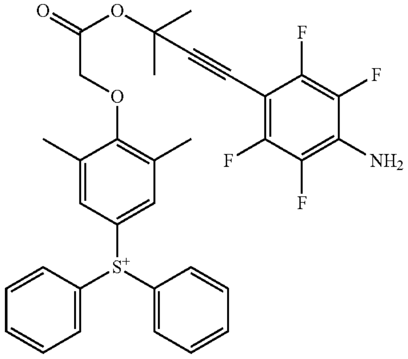
-continued
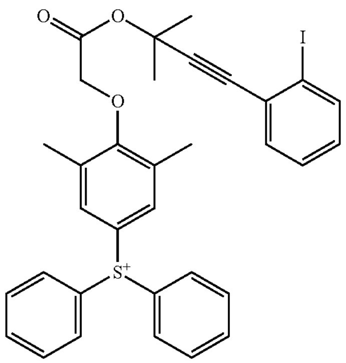
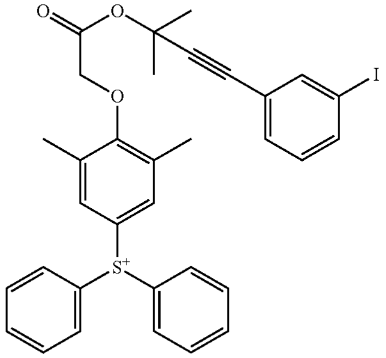
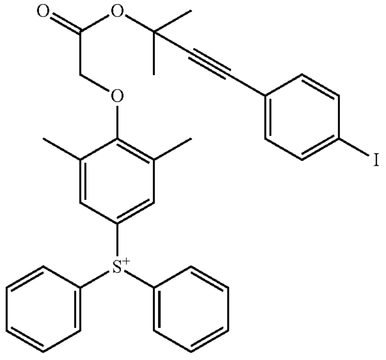
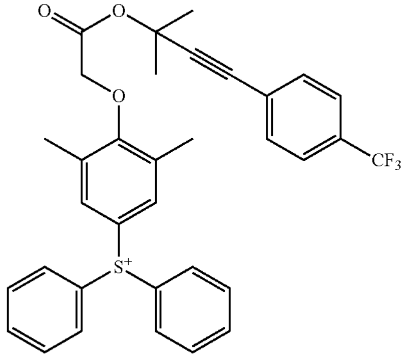

-continued
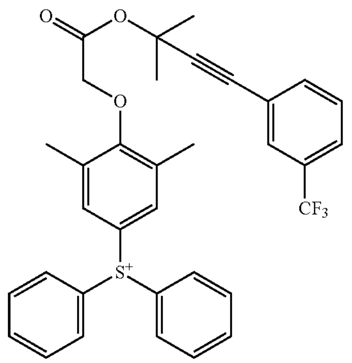
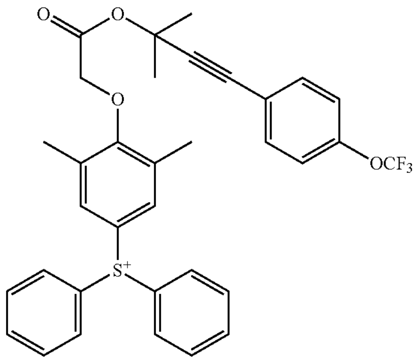
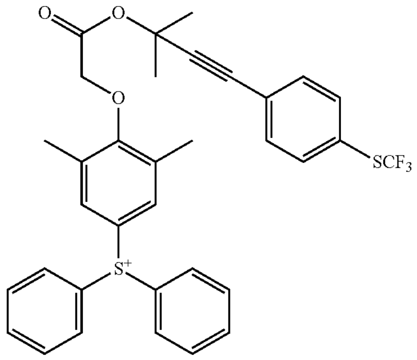
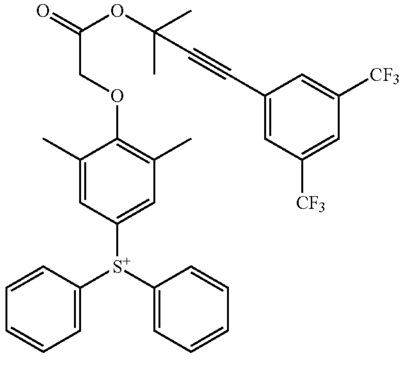
-continued
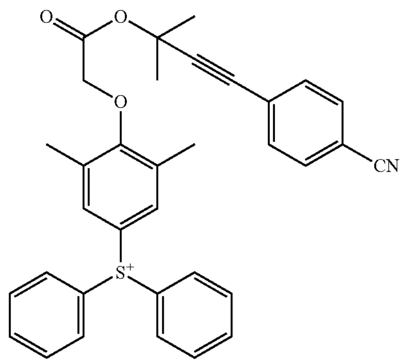
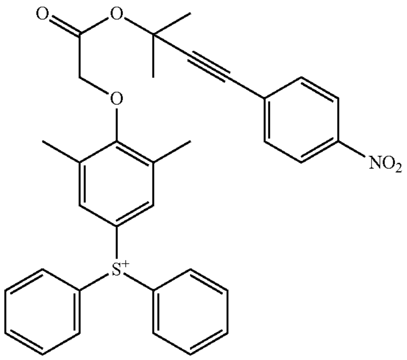
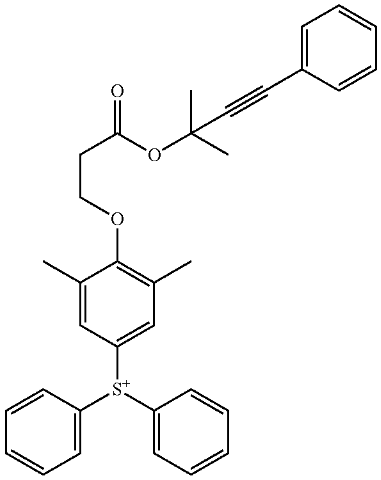
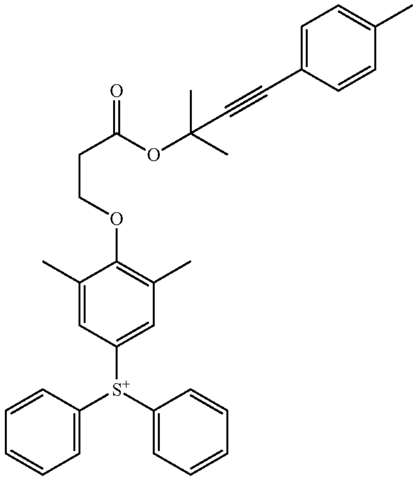

-continued
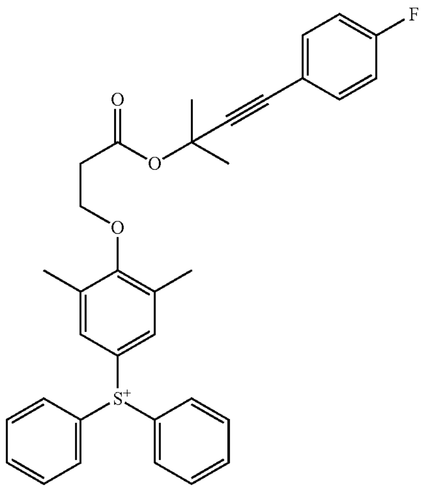
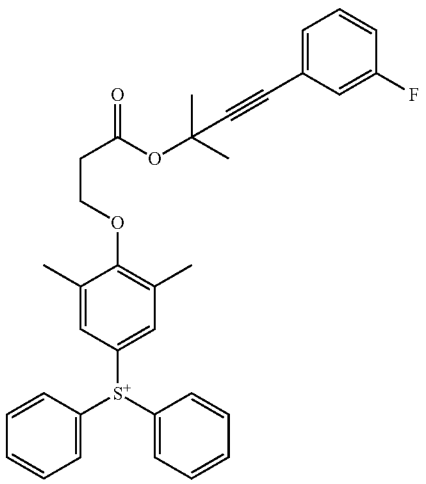
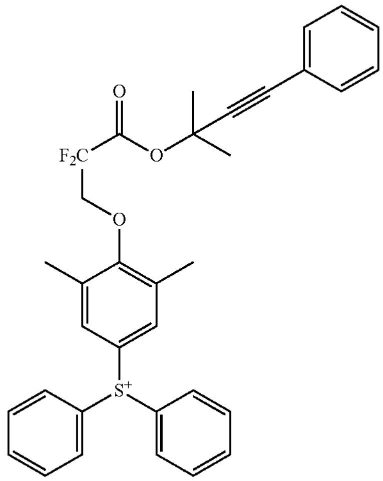
-continued
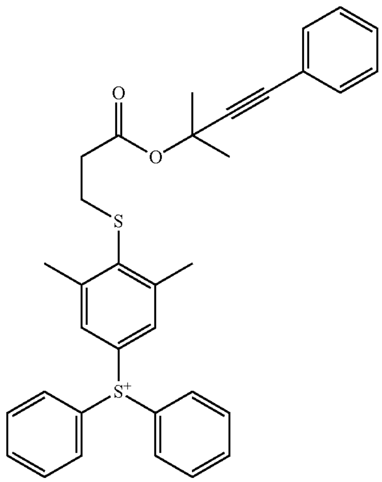
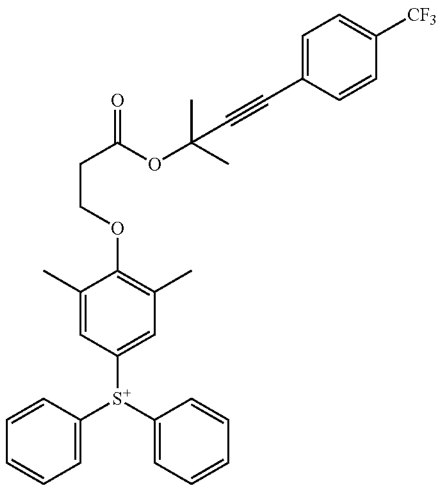
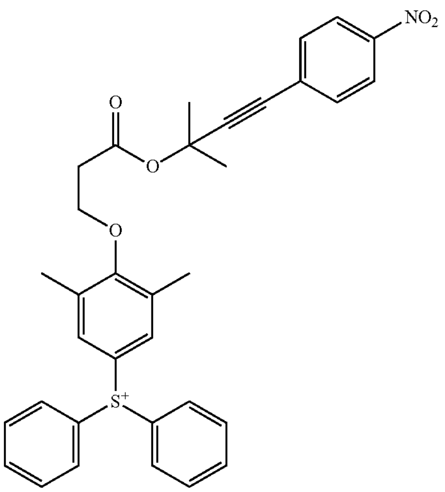

-continued
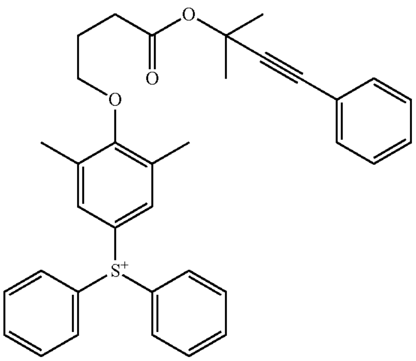
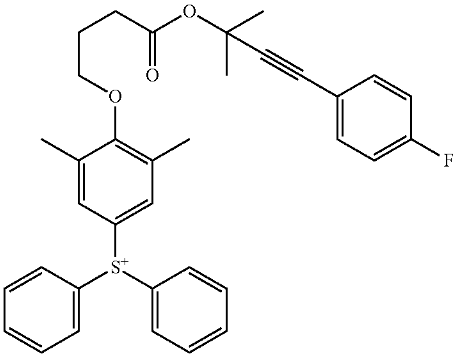
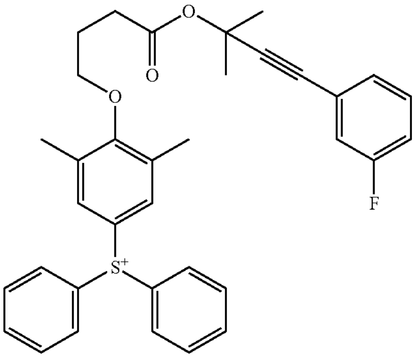
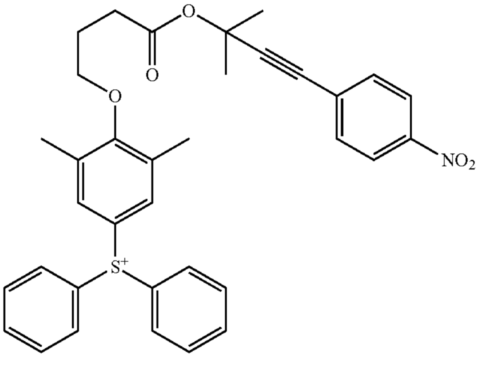
-continued
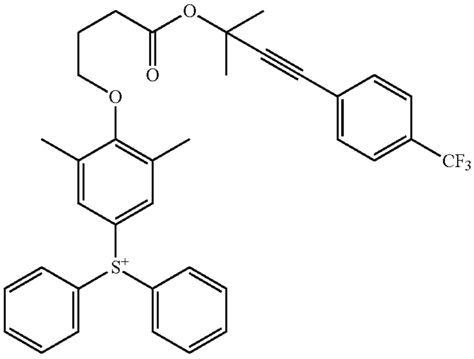
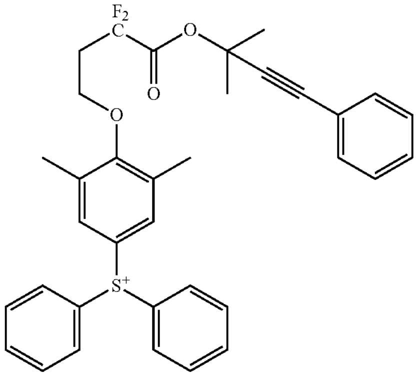 [SMILES: Cc1cc([S+](c2ccccc2)c2ccccc2)cc(C)c1OCCC(F)(F)C(=O)OC(C)(C)C#Cc1ccccc1]
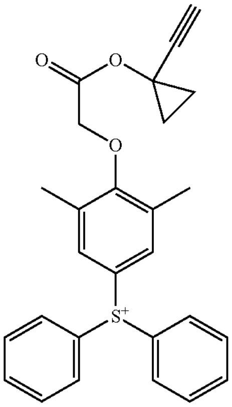
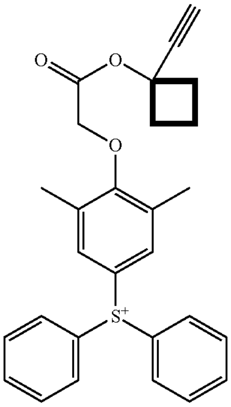
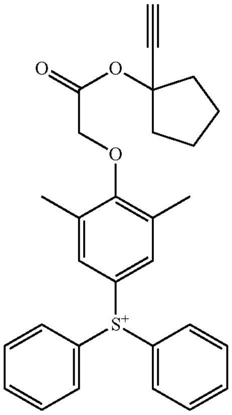
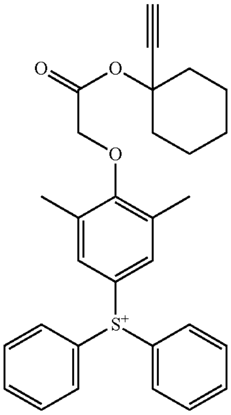

-continued
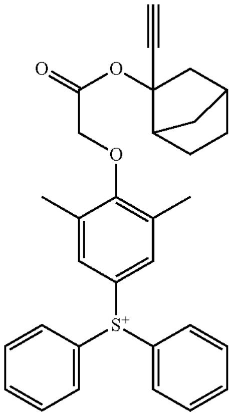
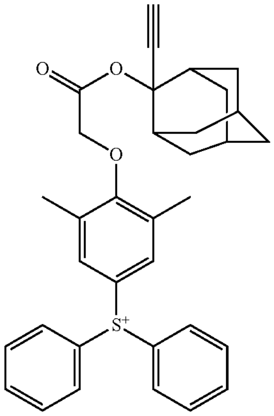
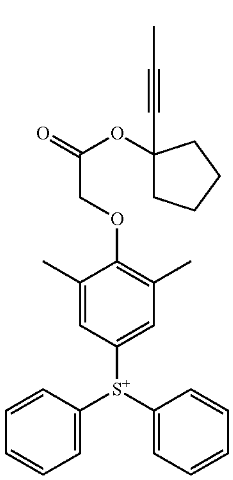
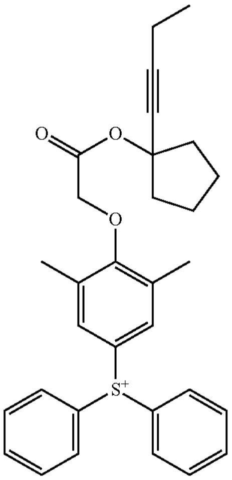
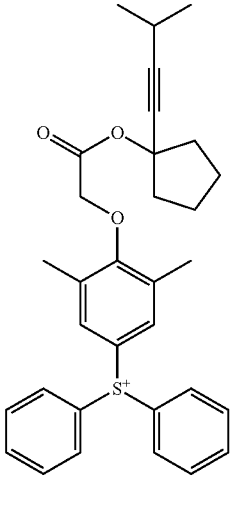
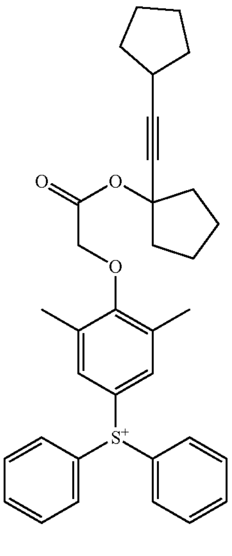
-continued
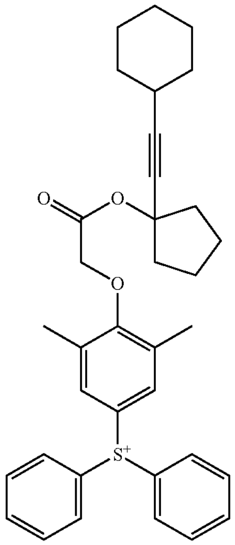
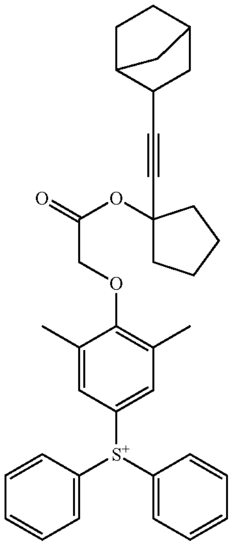
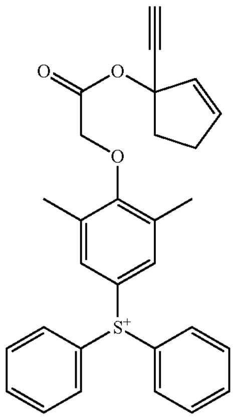
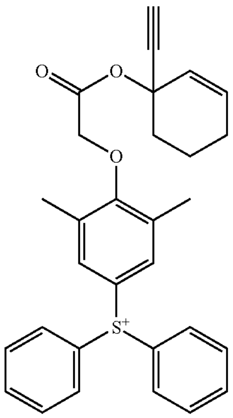
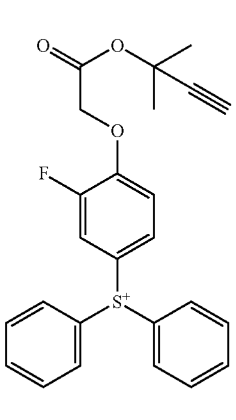
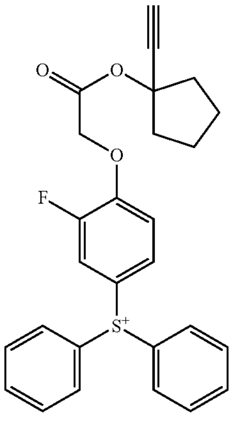

-continued
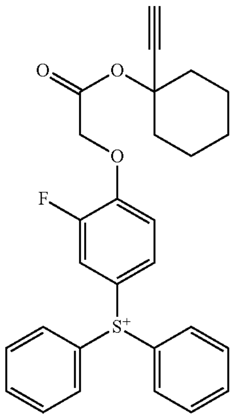
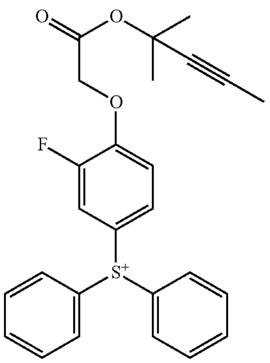
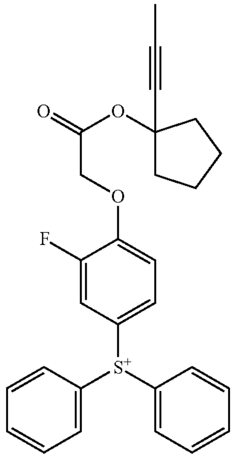
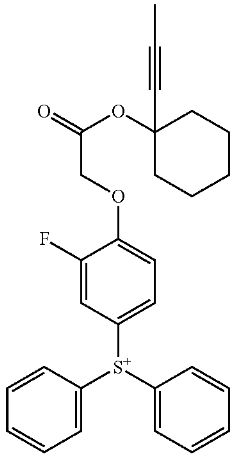
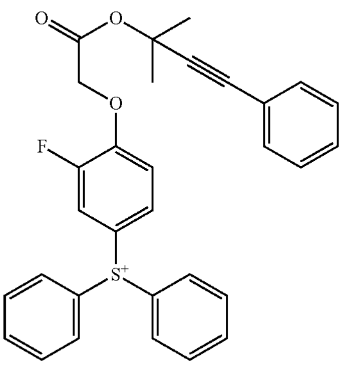
-continued
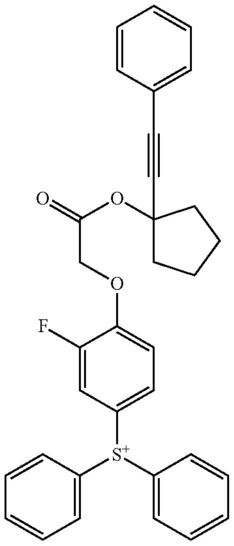
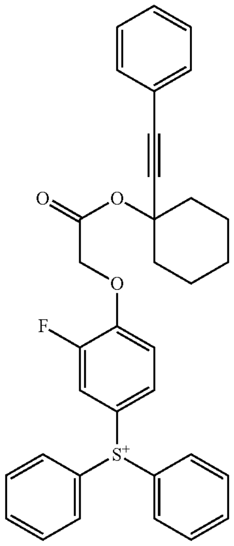
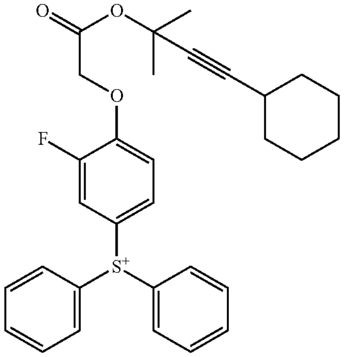
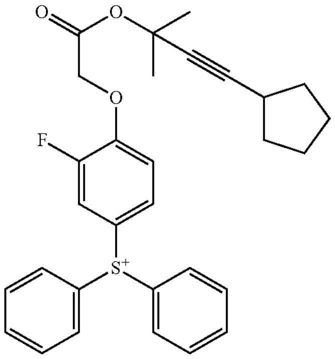
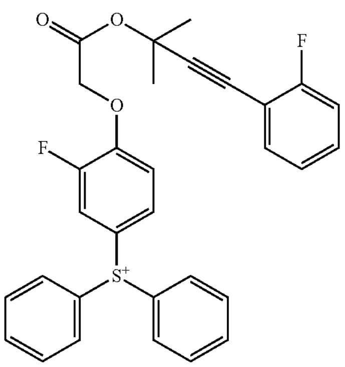

-continued
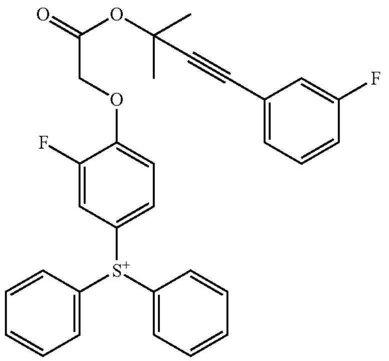
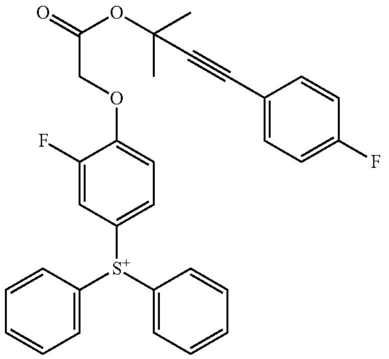
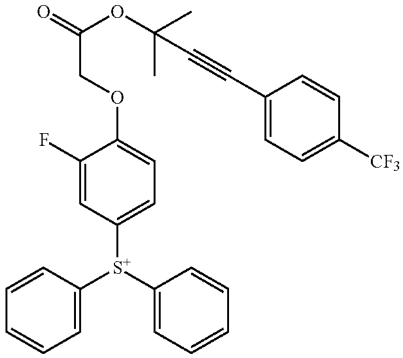
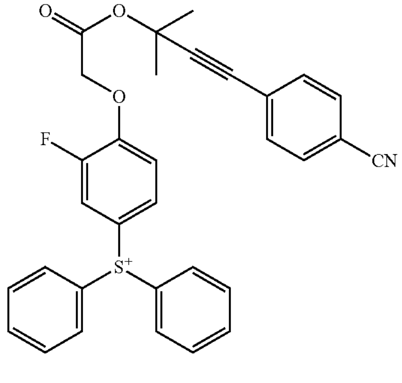
-continued
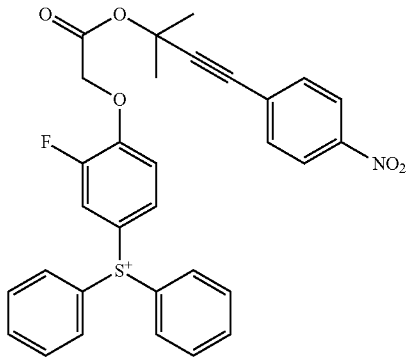
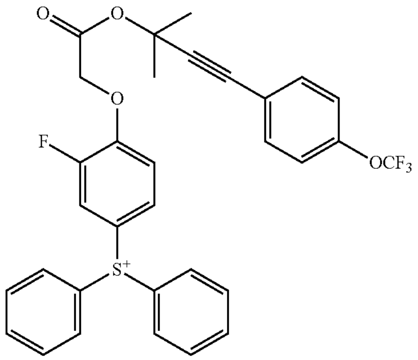
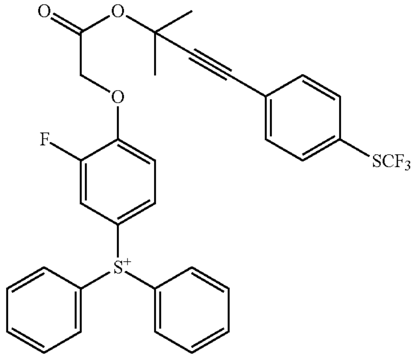
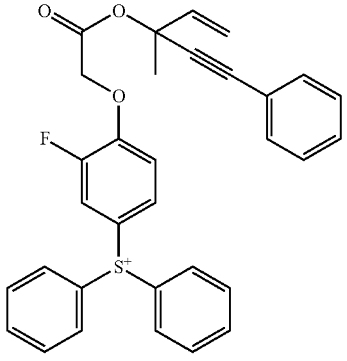

-continued
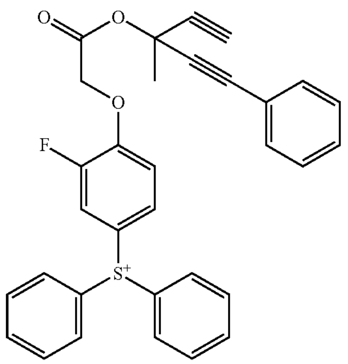
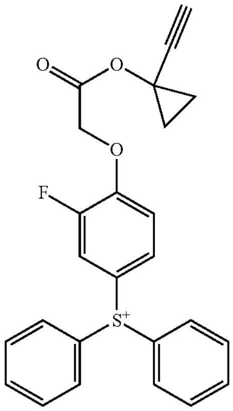
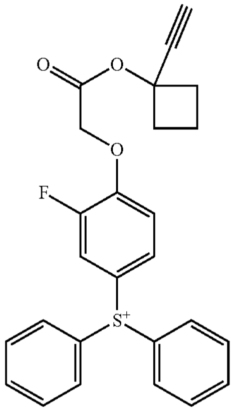
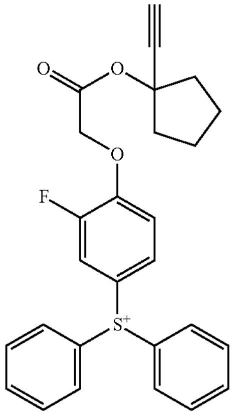
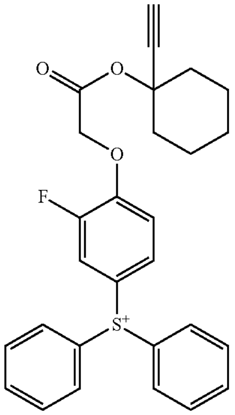
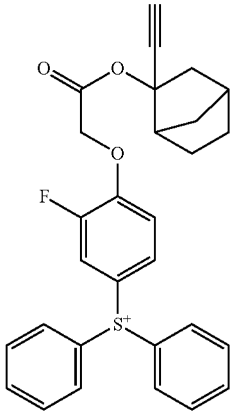
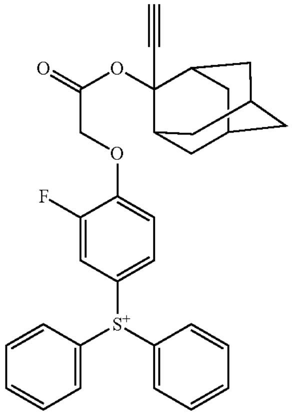
-continued
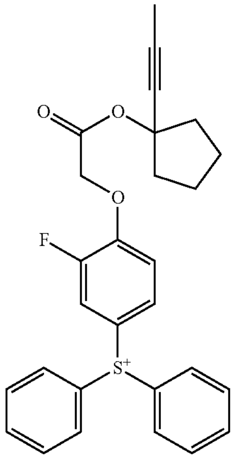
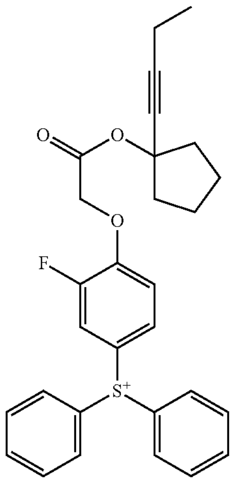
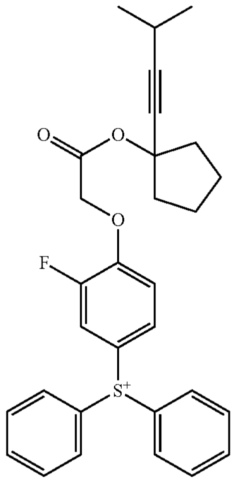
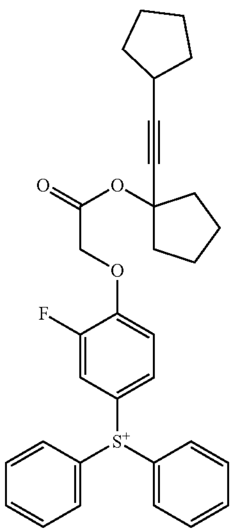
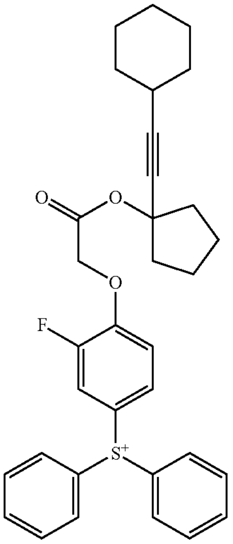

-continued
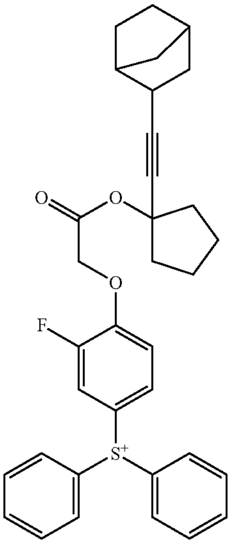
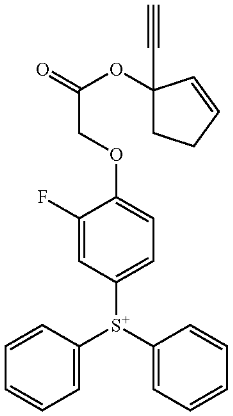
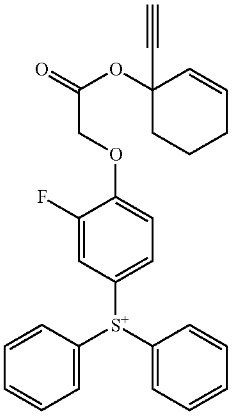
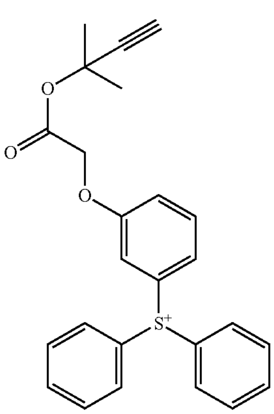
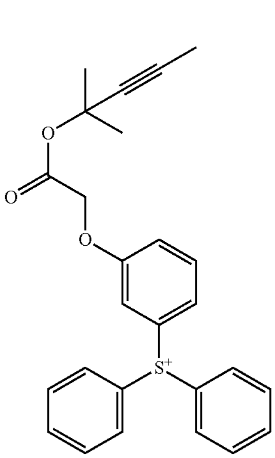
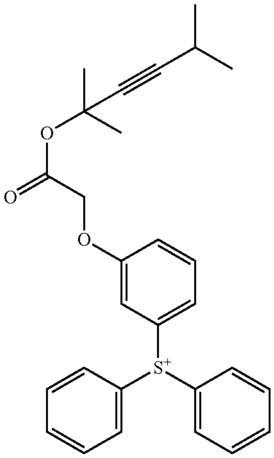
-continued
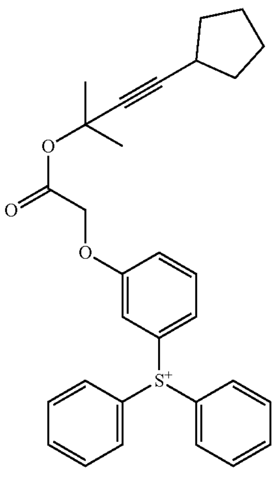
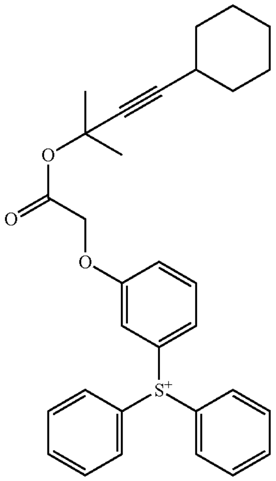
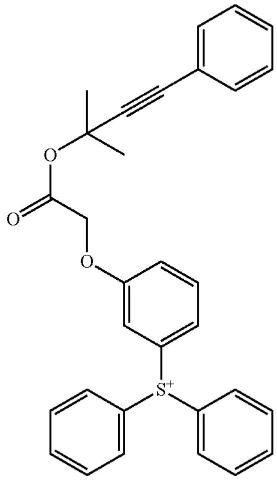
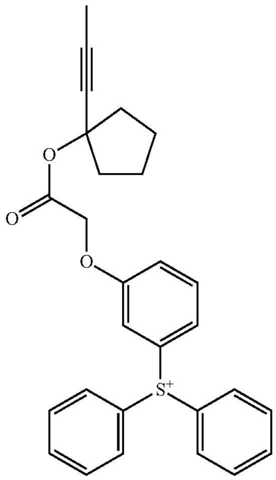
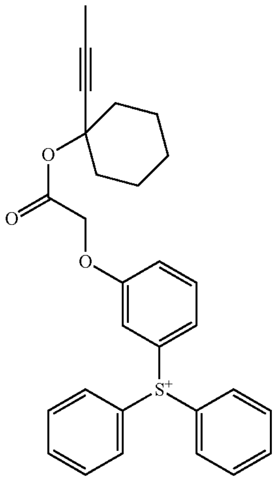

-continued
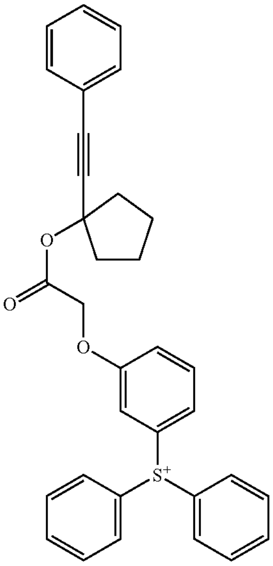
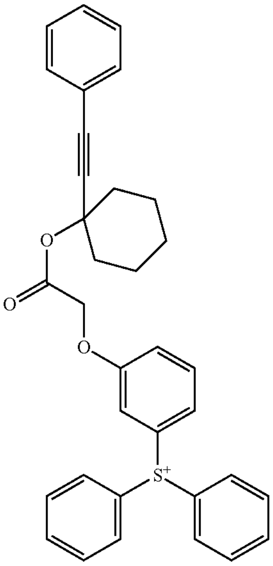
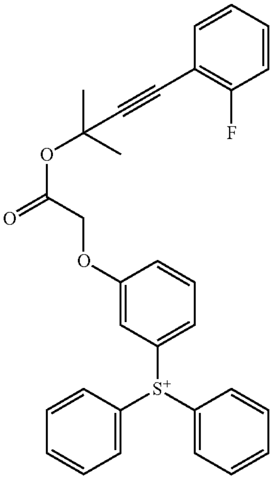
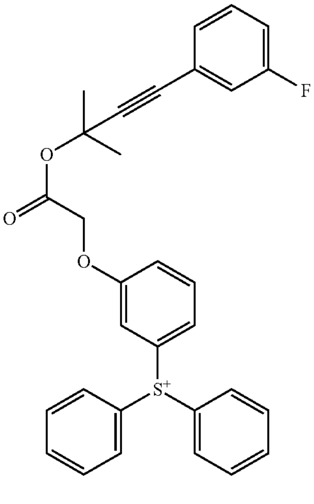
-continued
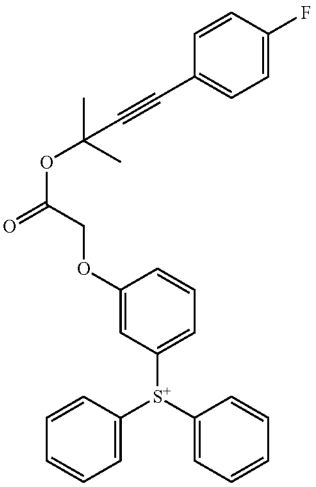
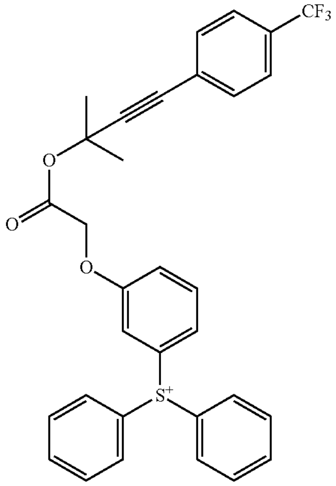
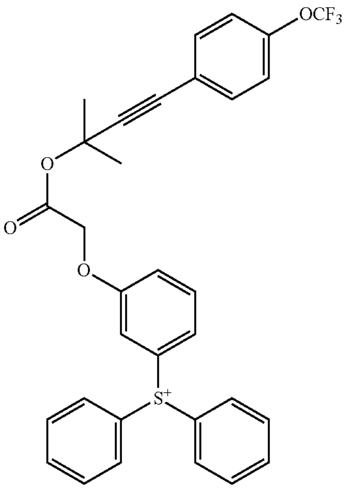

-continued
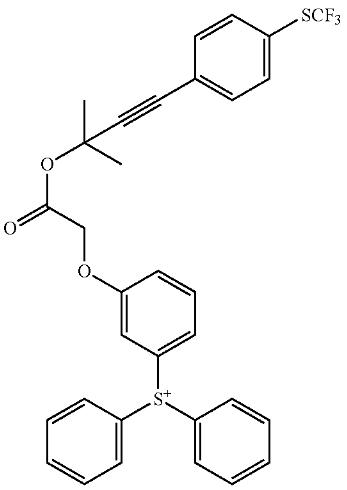
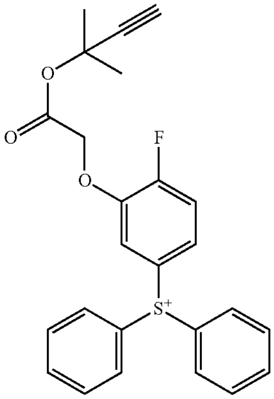
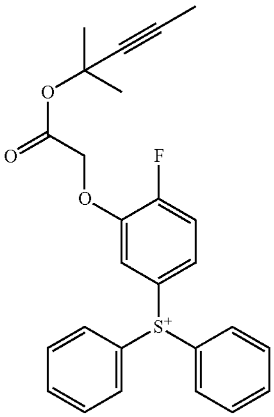
-continued
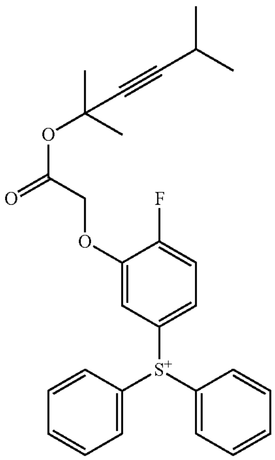
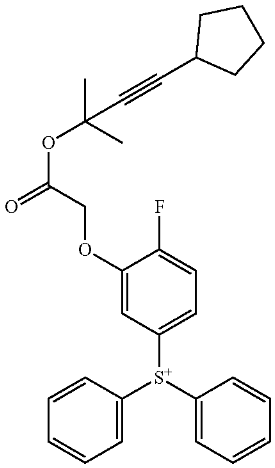
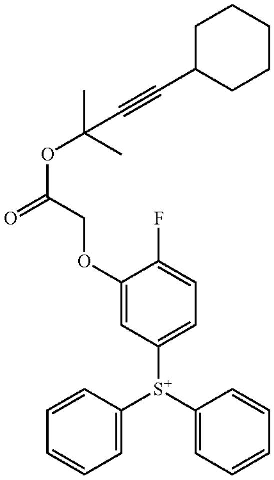
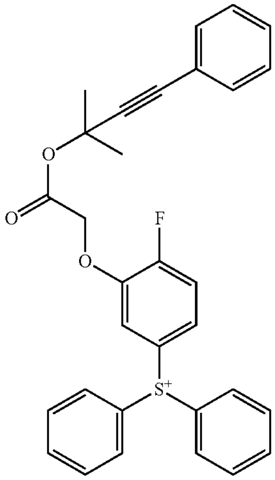

-continued
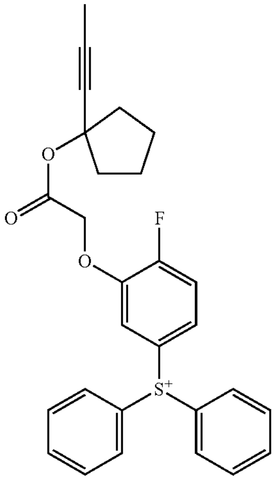
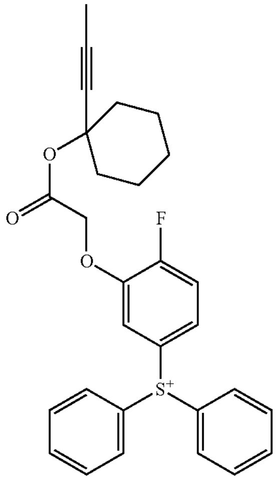
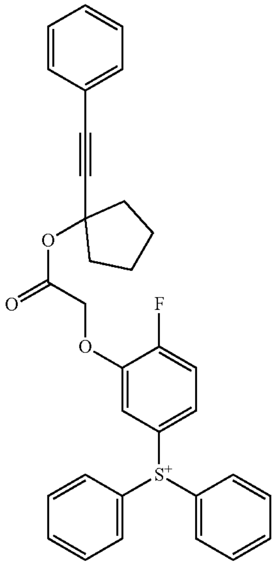
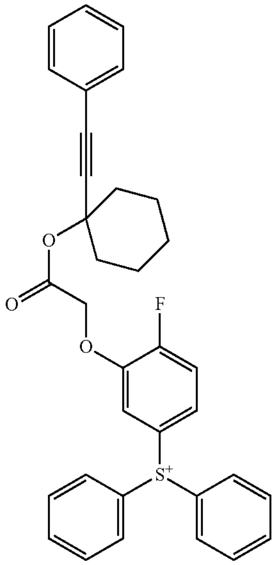
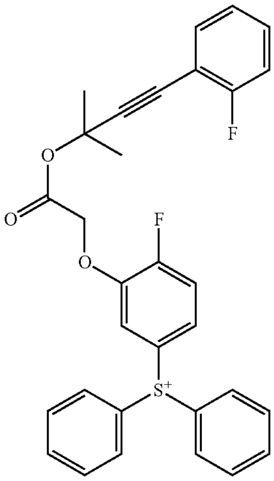
-continued
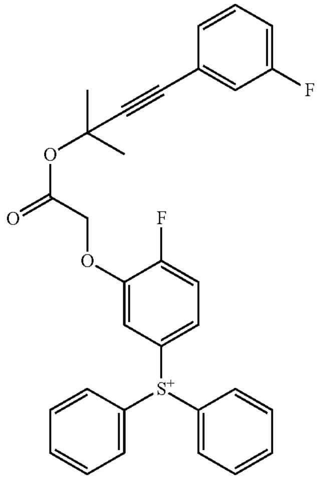
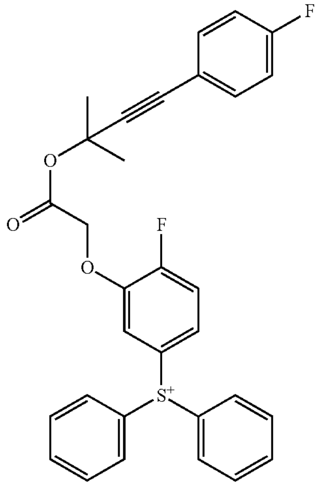
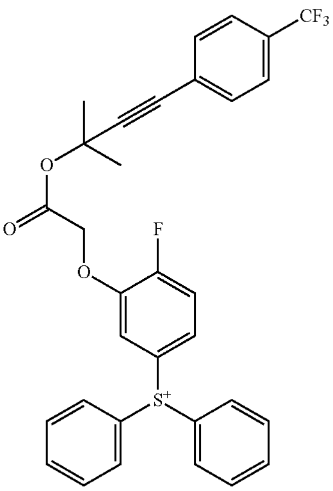

-continued
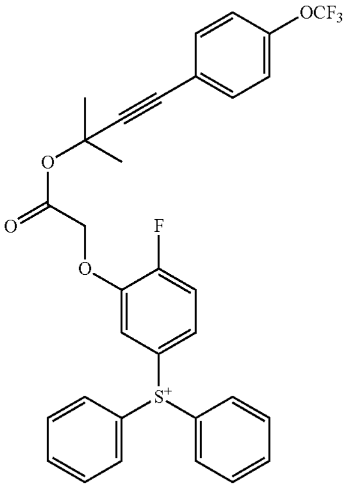
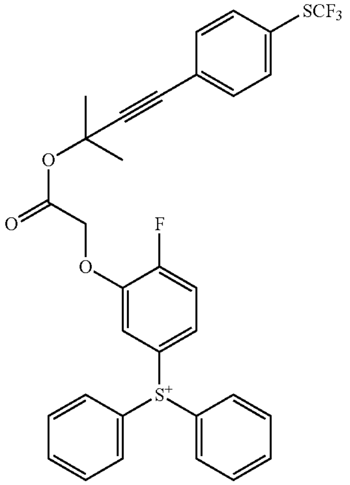
-continued
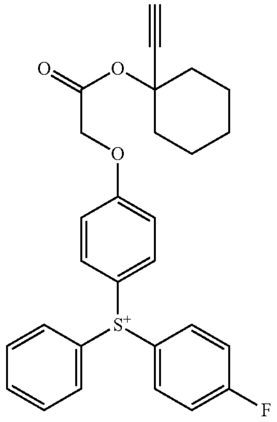
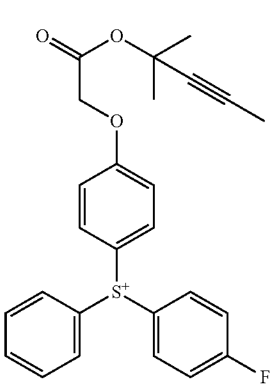
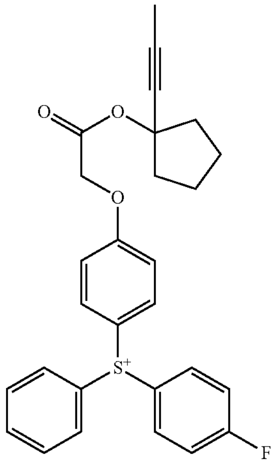
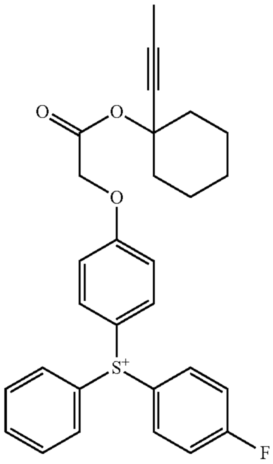
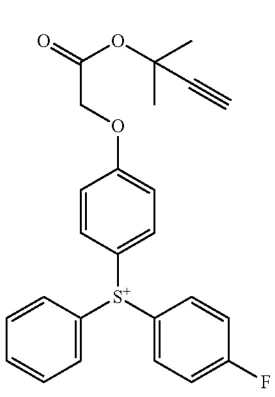
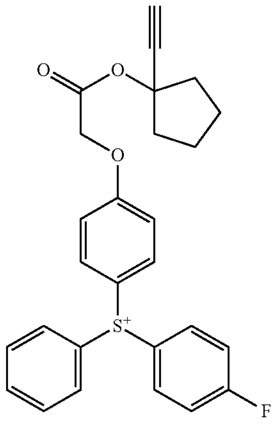
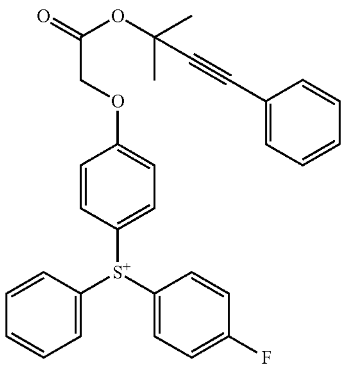

-continued
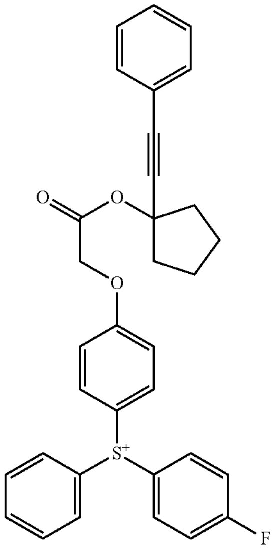
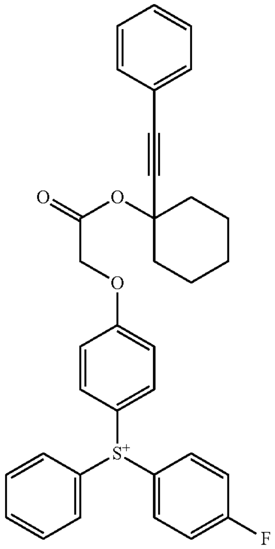
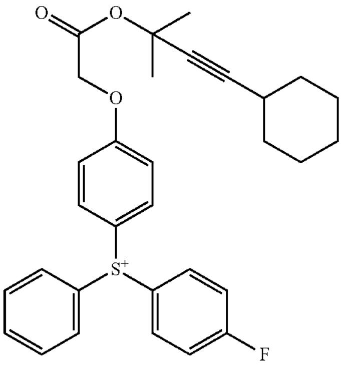
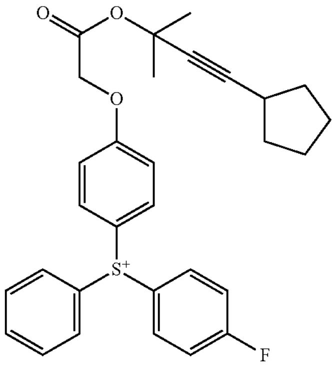
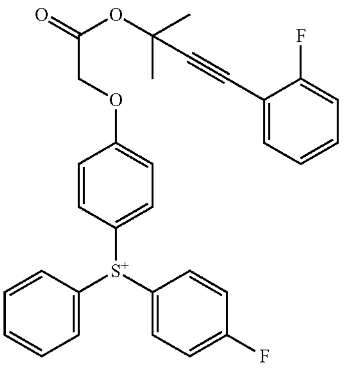
-continued
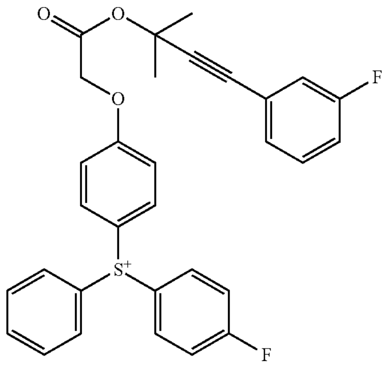
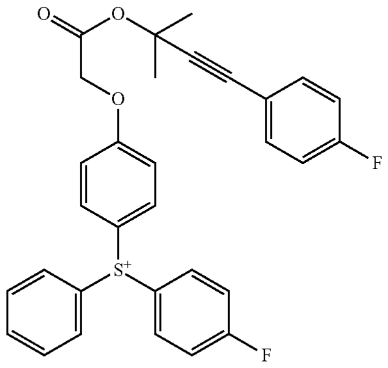
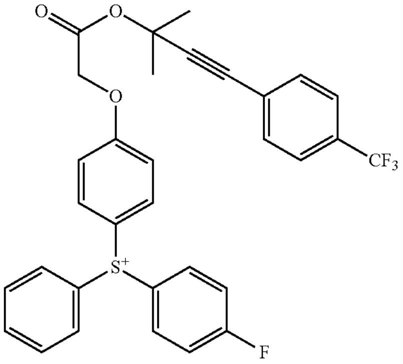
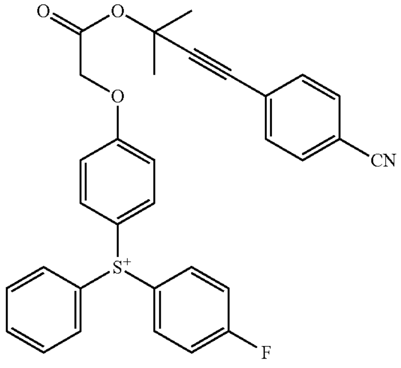

-continued
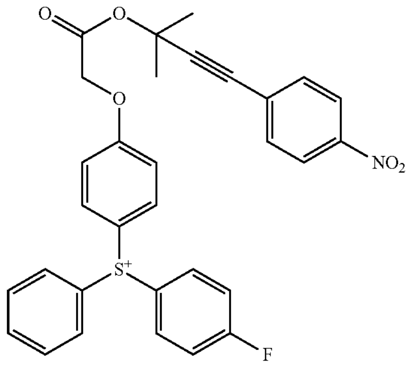
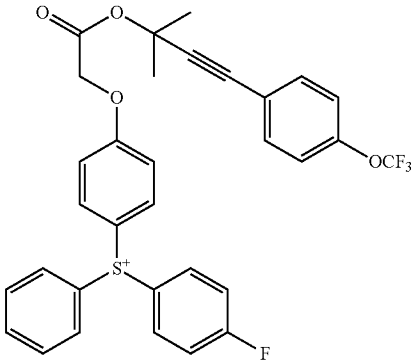
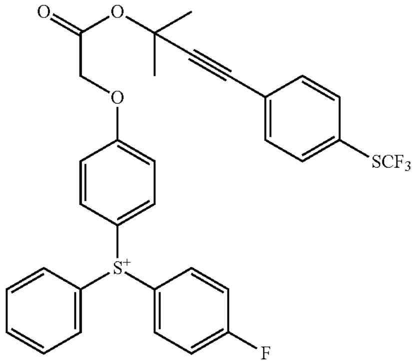
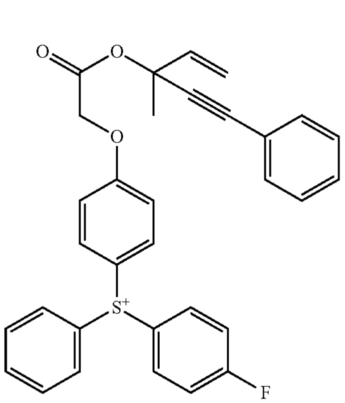
-continued
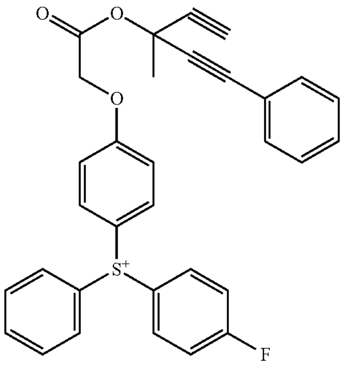
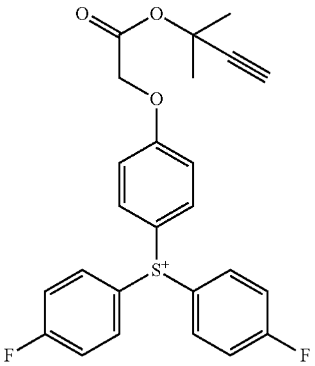
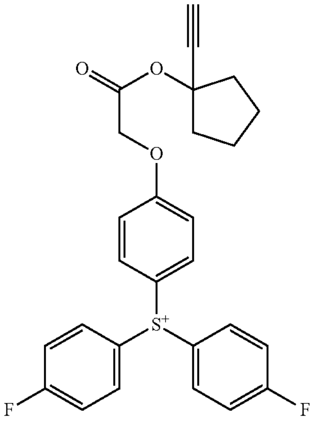
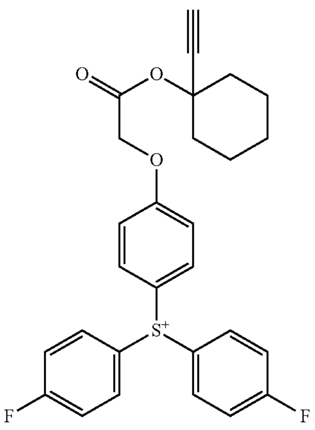

-continued
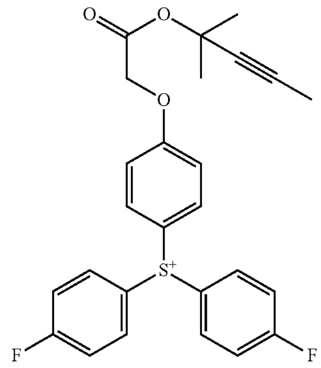
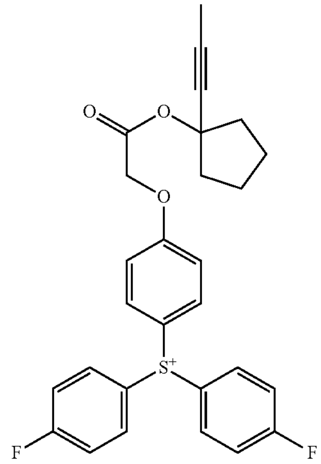
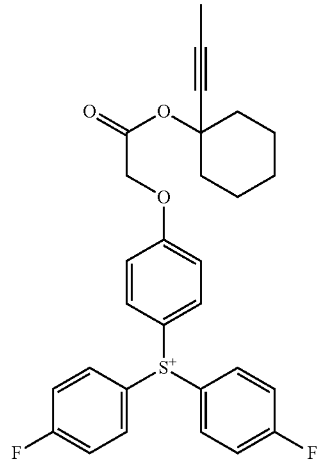
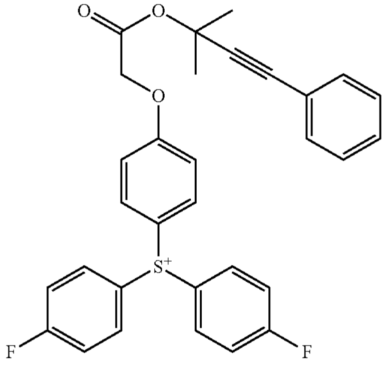
-continued
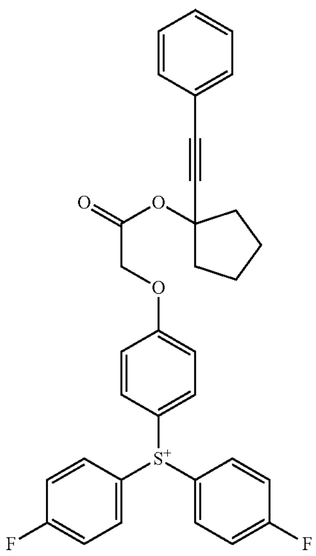
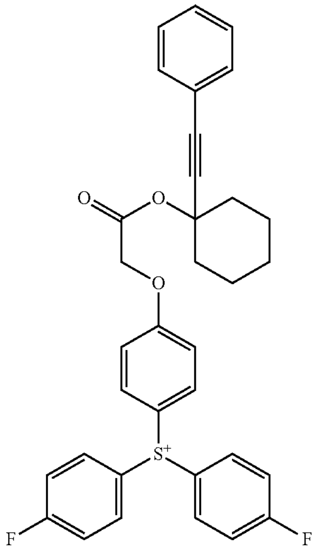
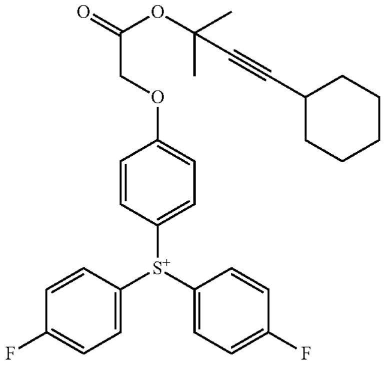

-continued
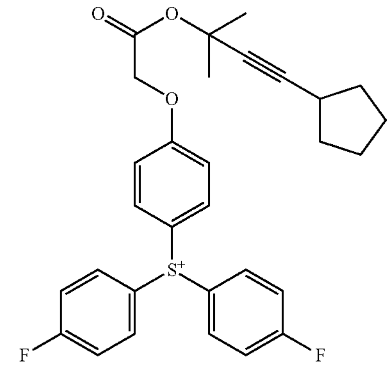
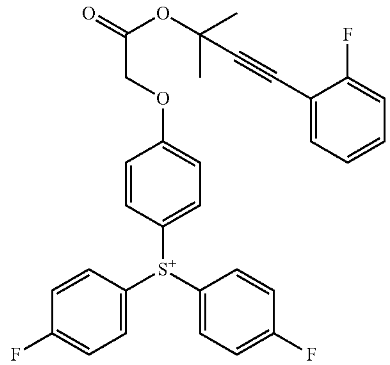
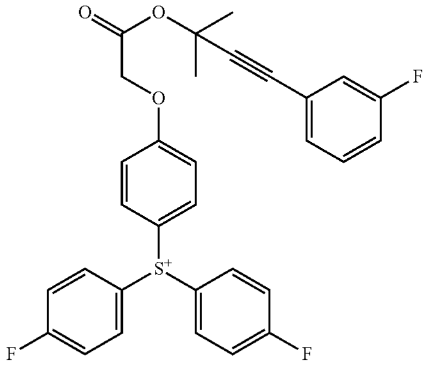
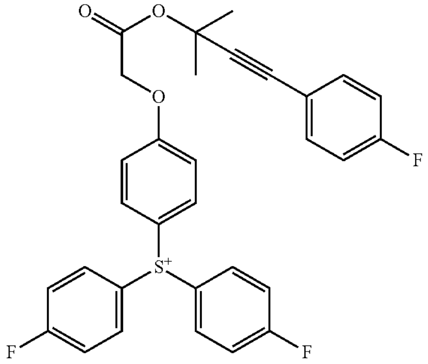
-continued
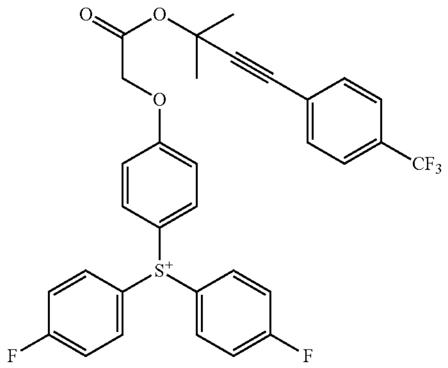
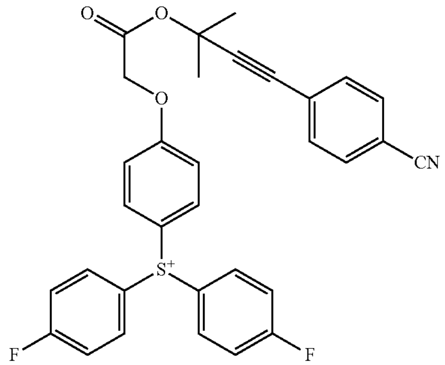
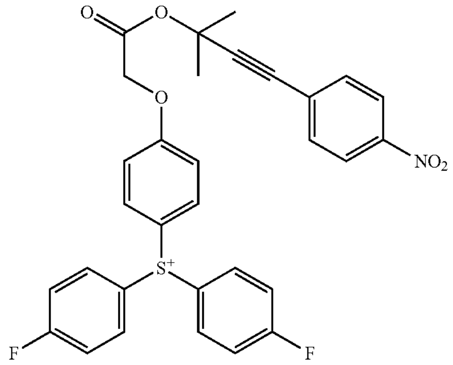
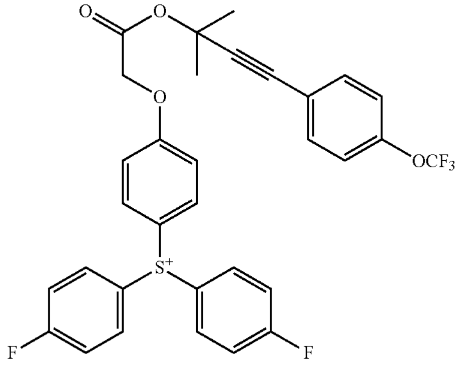

-continued
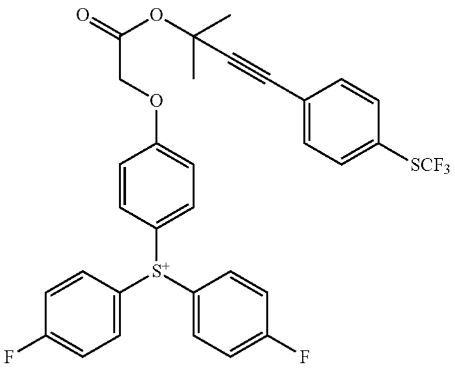
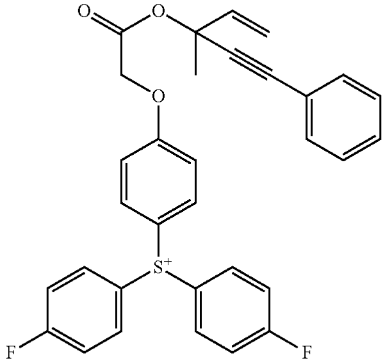
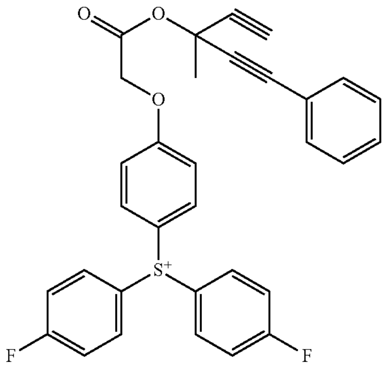
-continued
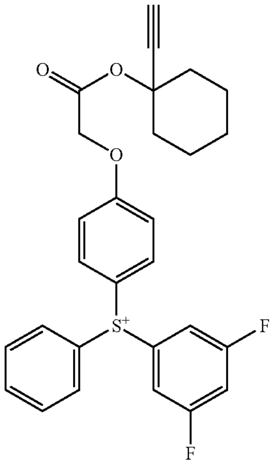
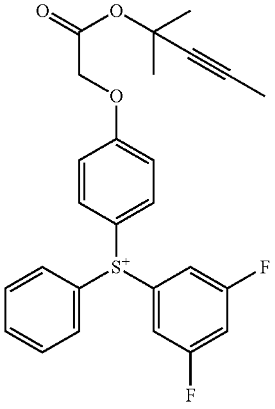
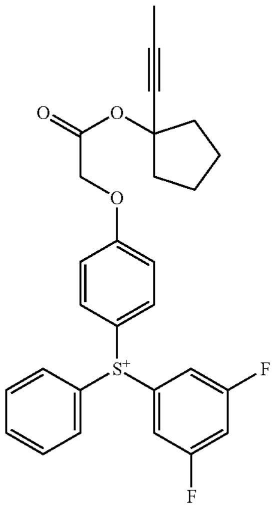
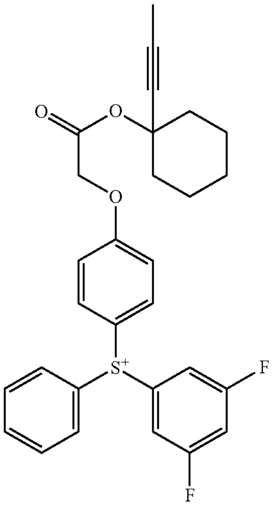
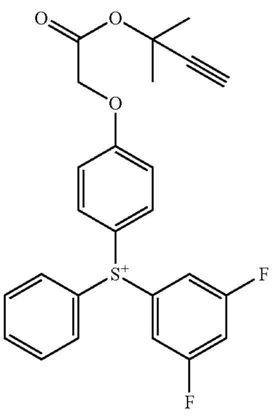
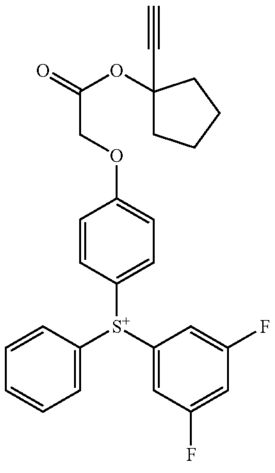
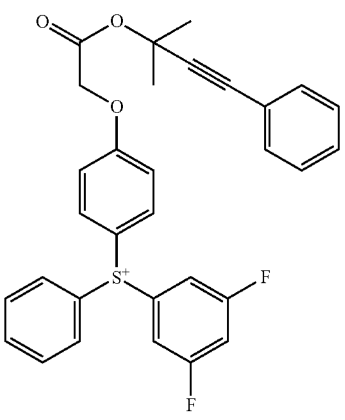

-continued
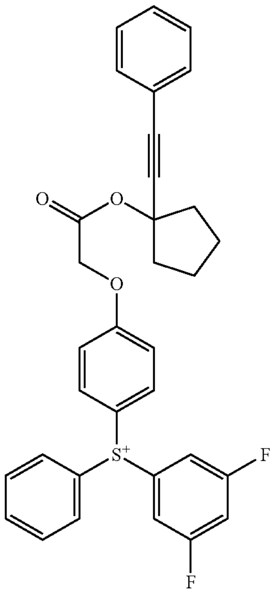
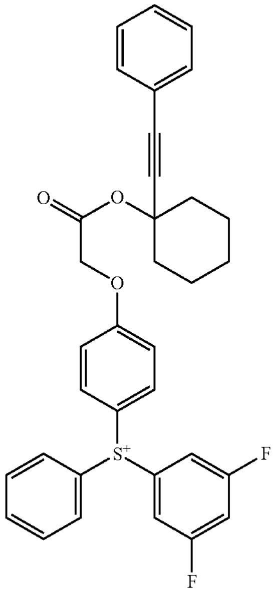
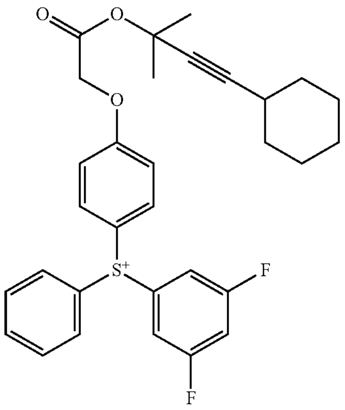
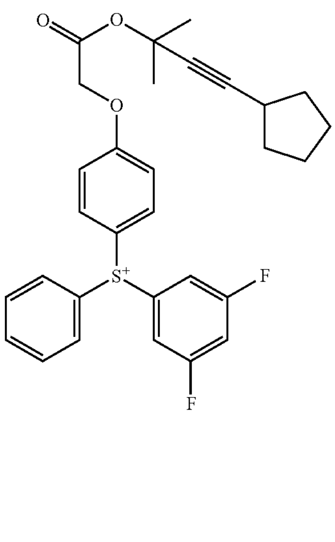
-continued
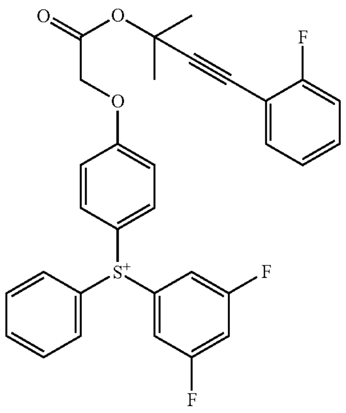
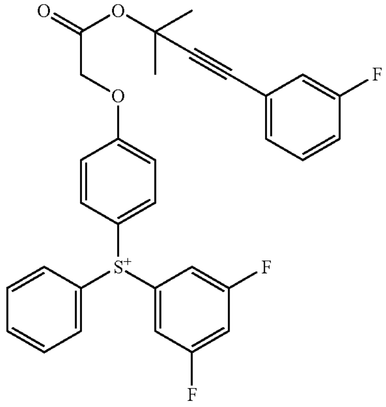
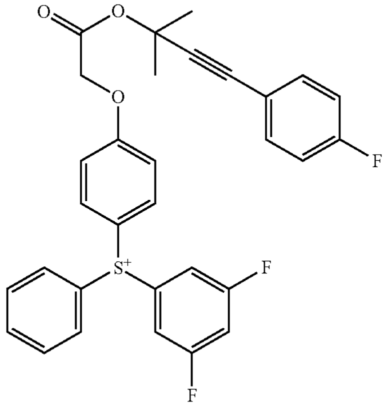
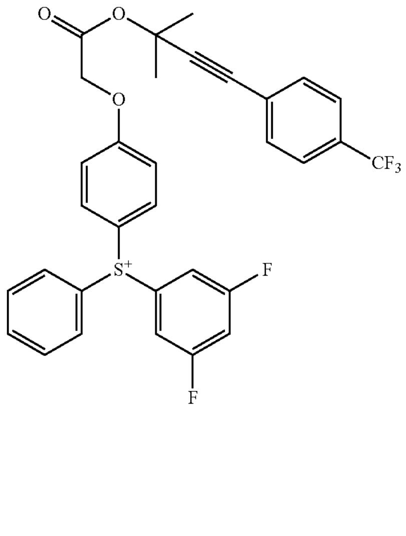

-continued
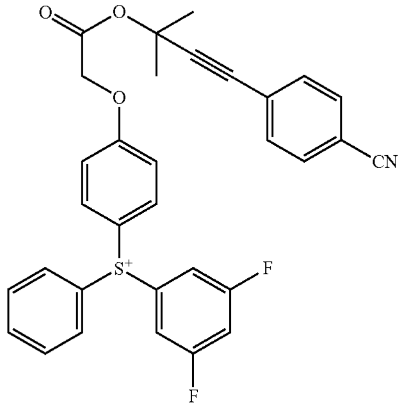
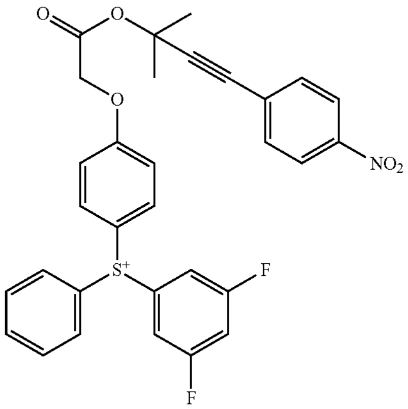
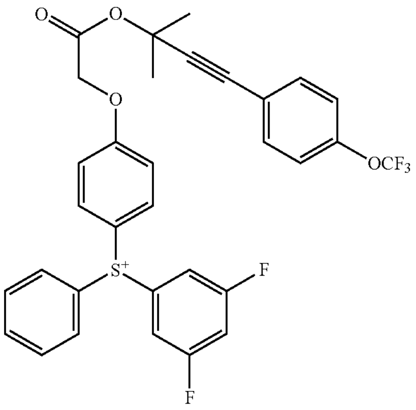
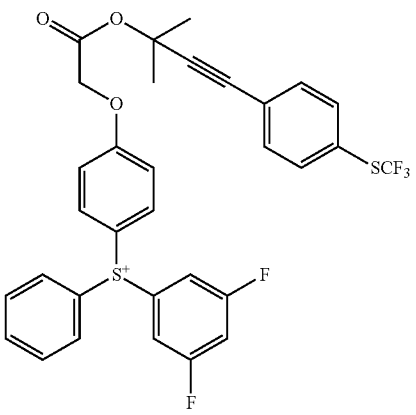
-continued
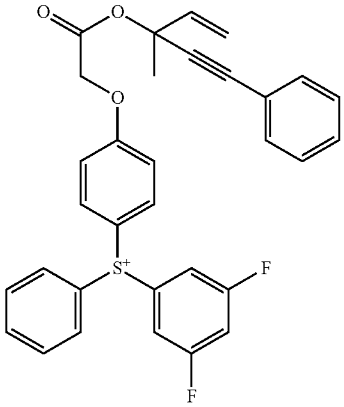
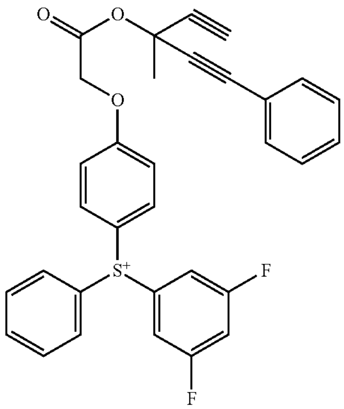
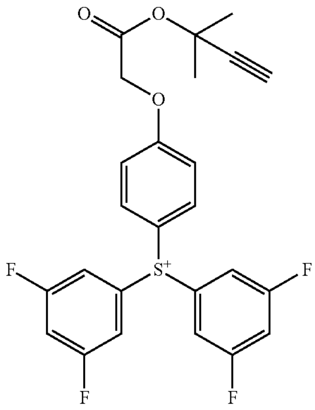
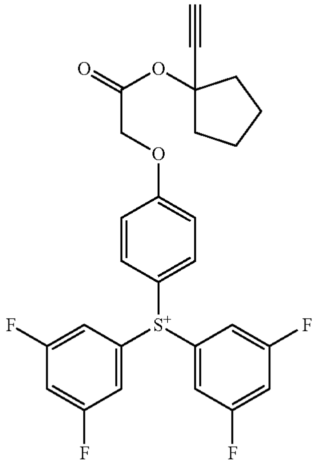

-continued
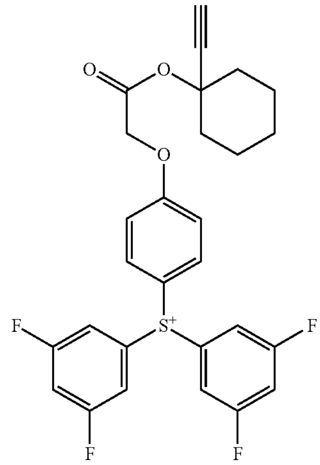
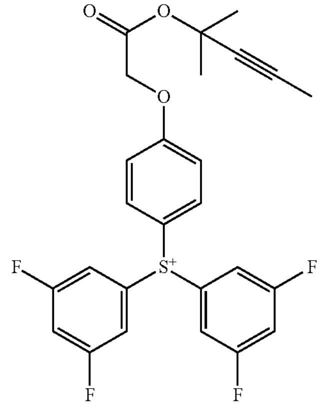
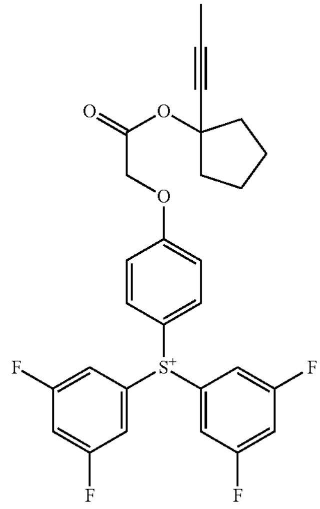
-continued
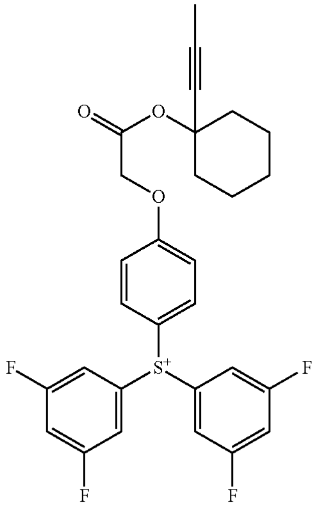
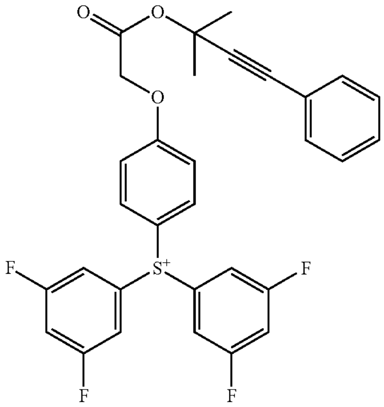
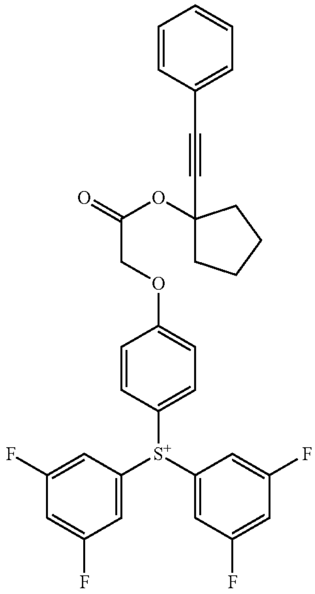

-continued
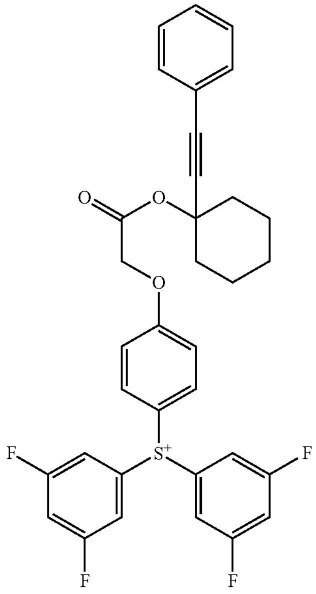
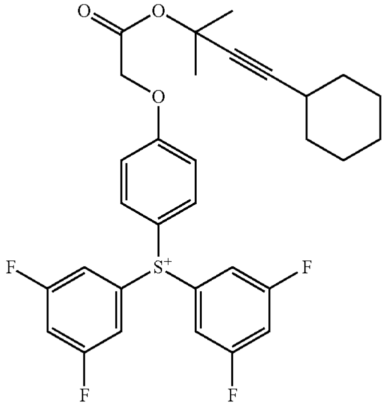
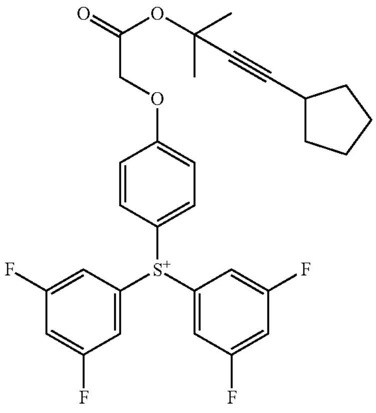
-continued
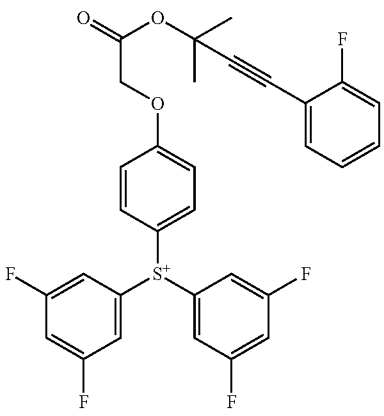
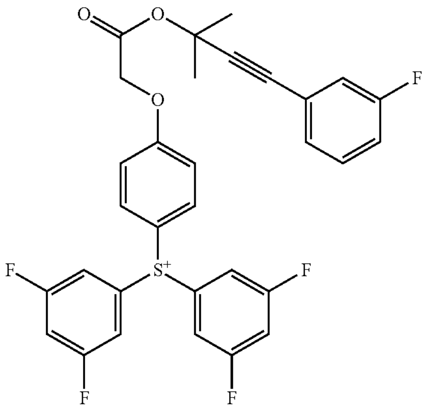
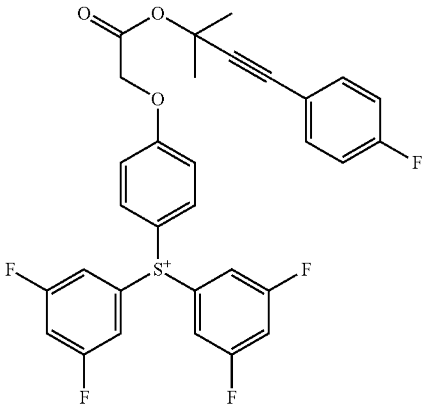
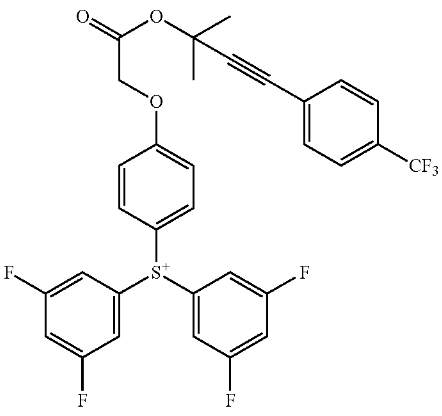

-continued
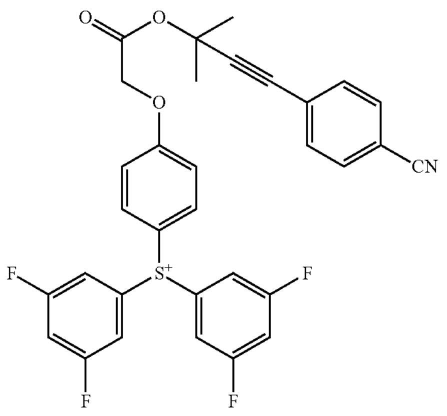
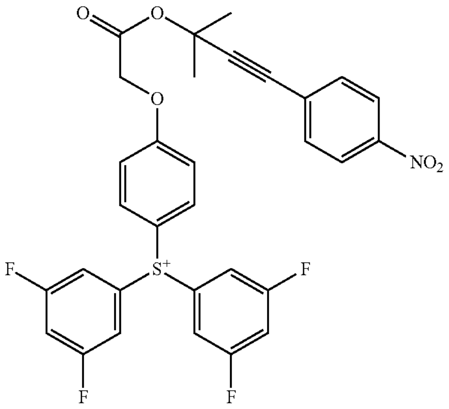
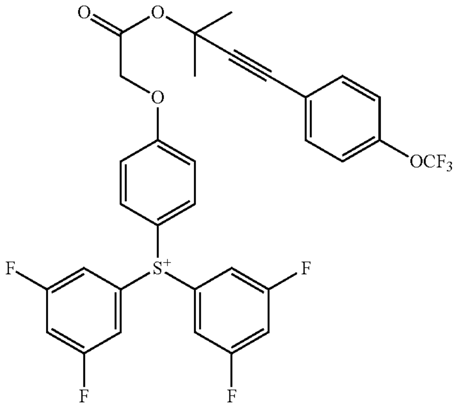
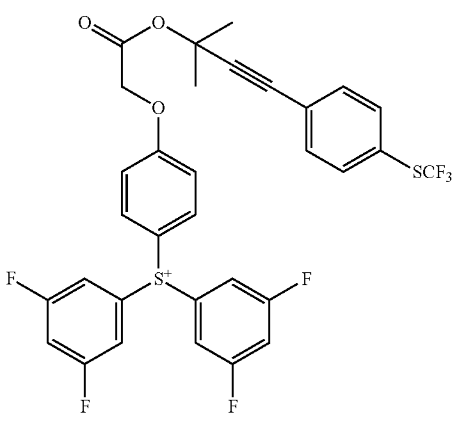
-continued
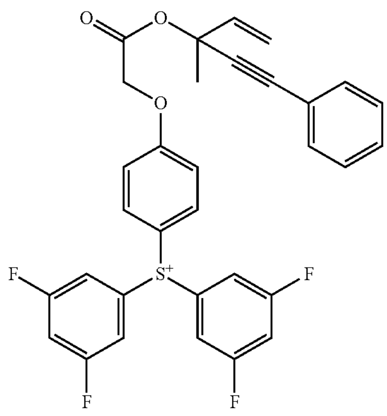
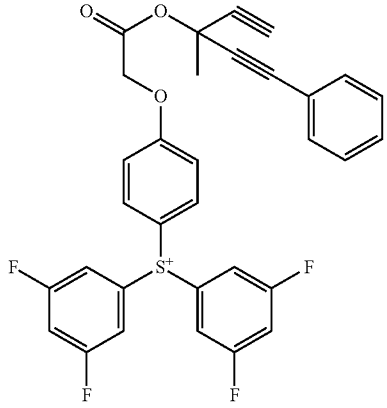
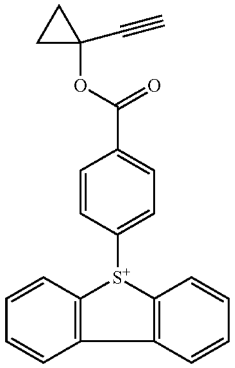
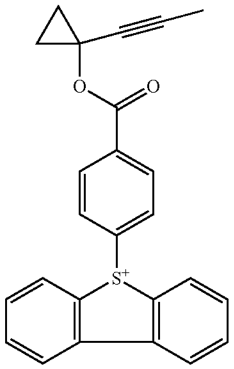
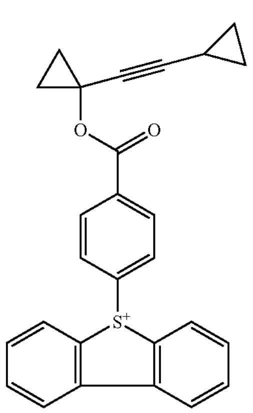
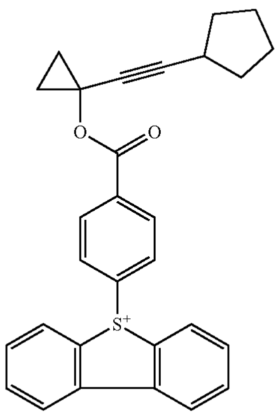

-continued
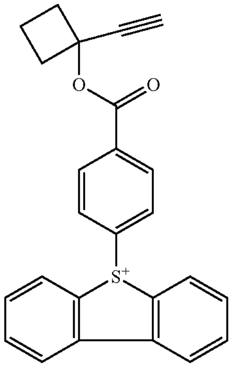
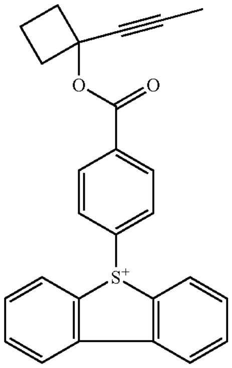
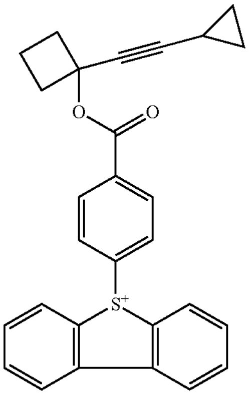
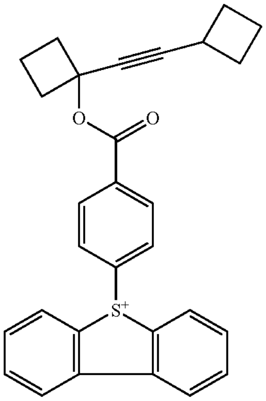
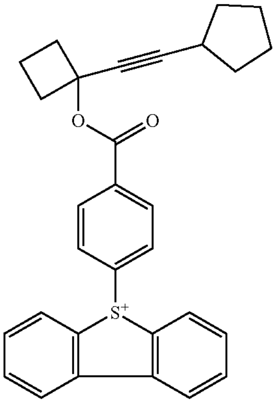
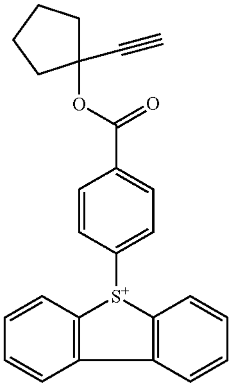
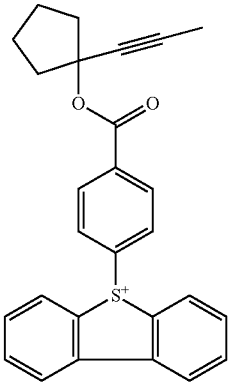
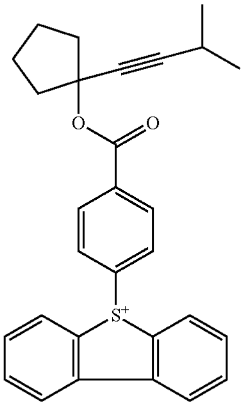
-continued
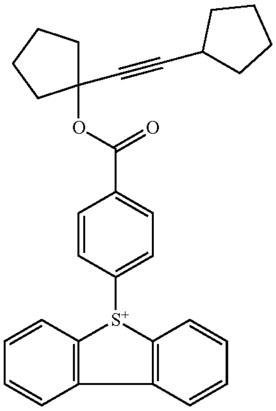
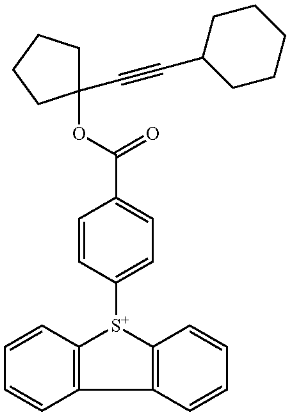
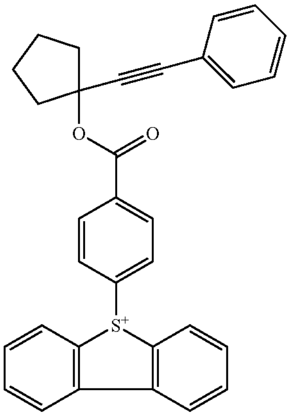
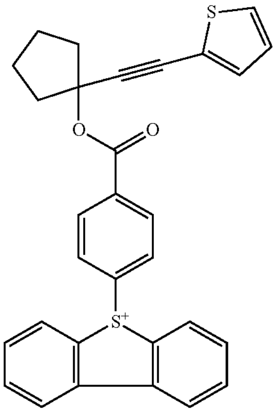

-continued
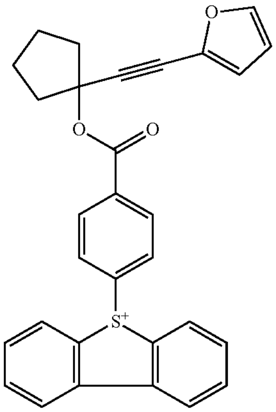
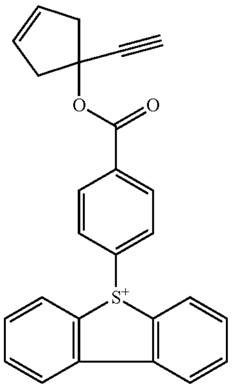
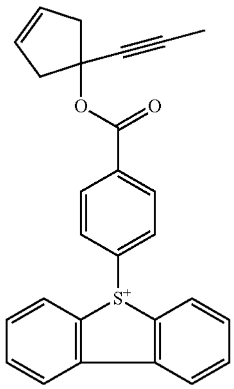
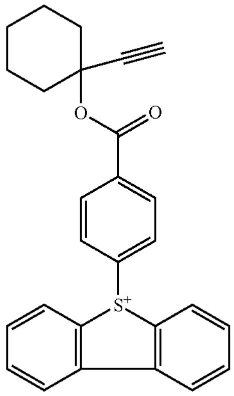
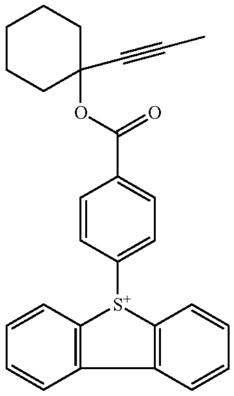
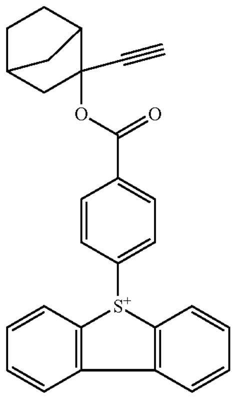
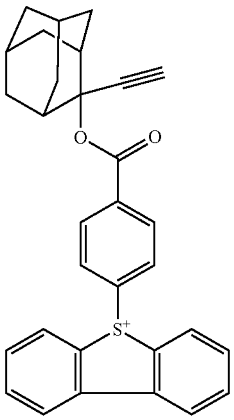
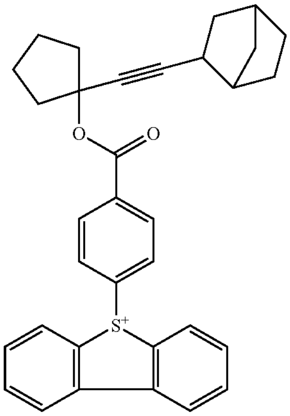
-continued
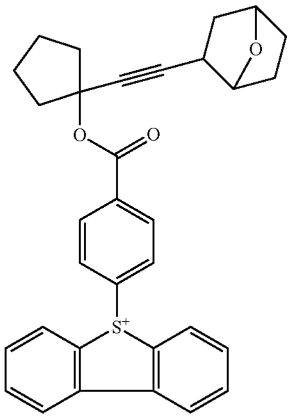
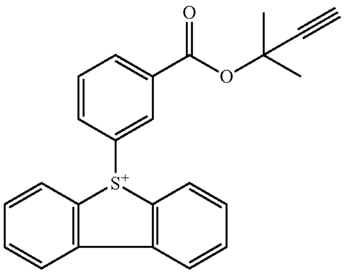
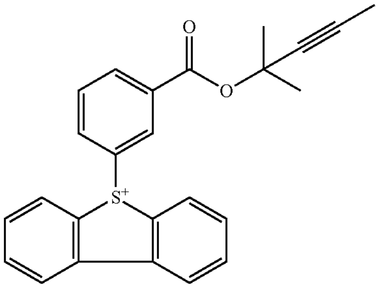
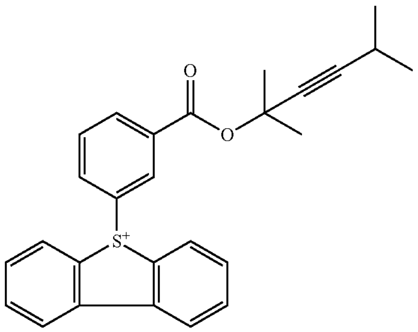
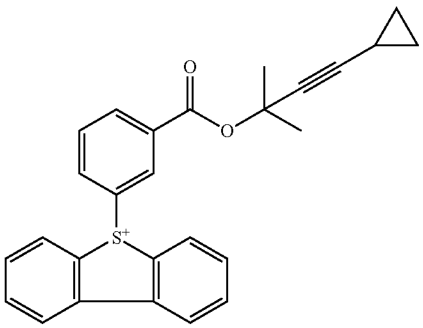

-continued
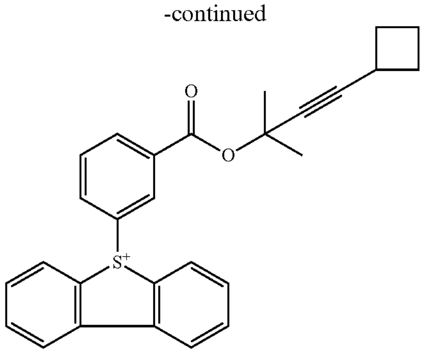
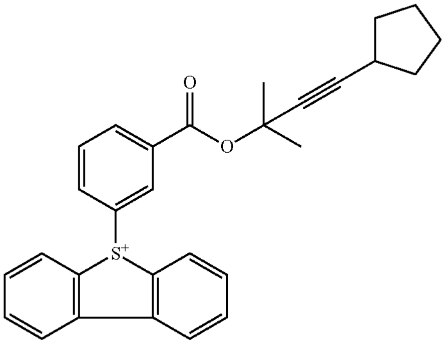
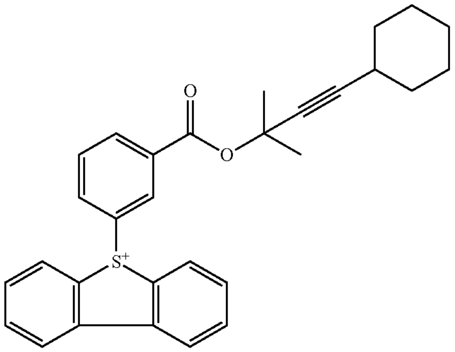
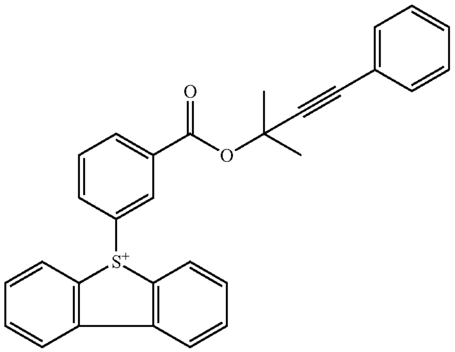
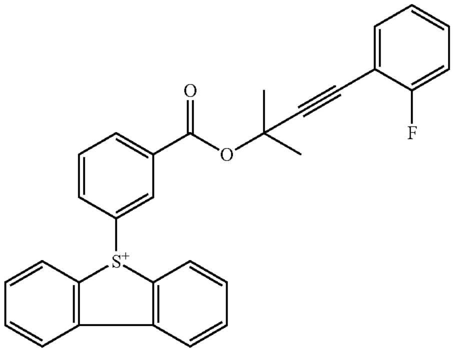
-continued
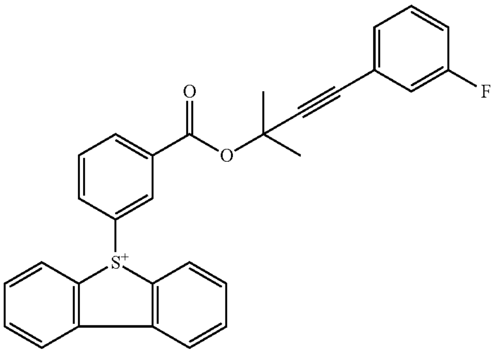
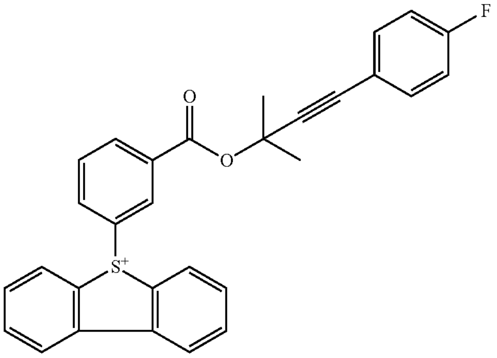
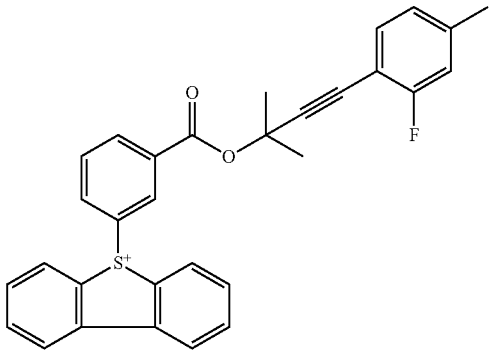
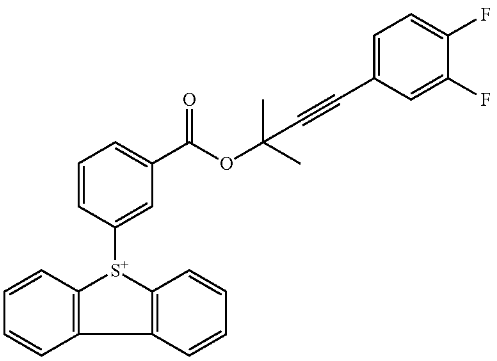

-continued
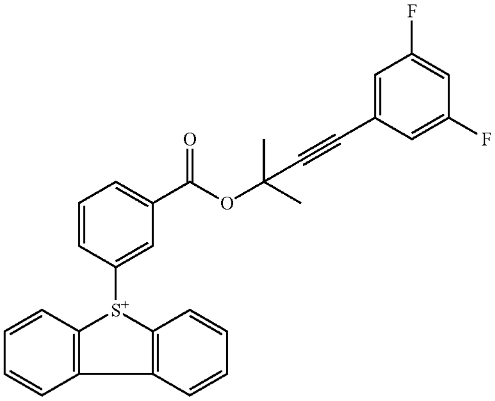
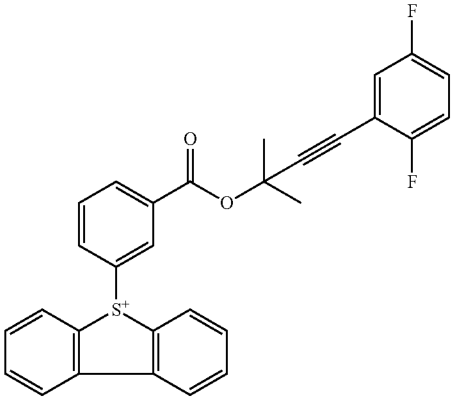
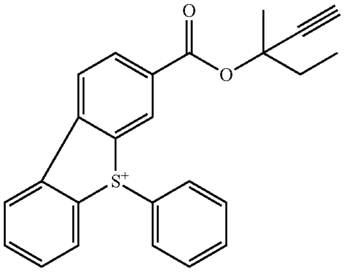
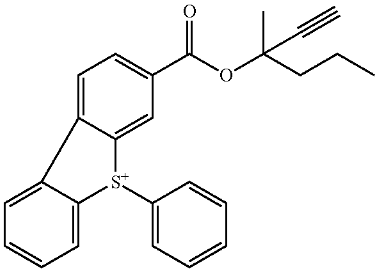
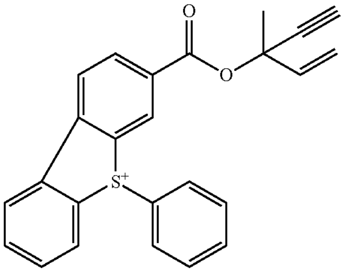
-continued
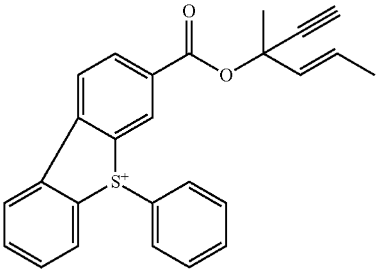
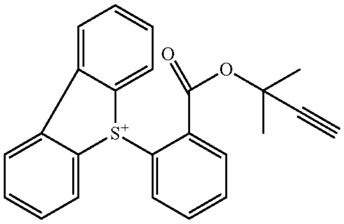
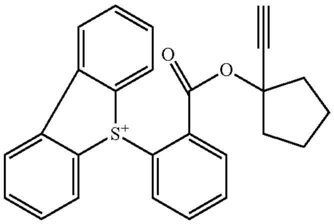
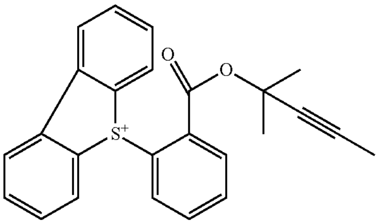
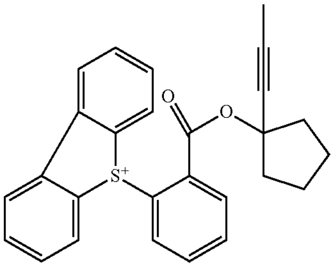
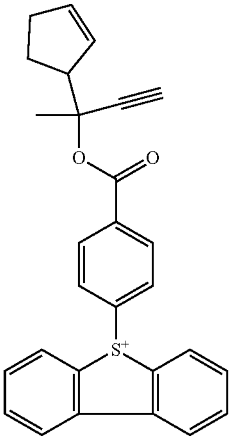
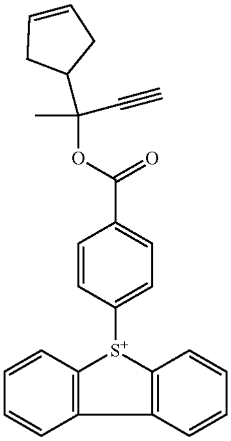

-continued
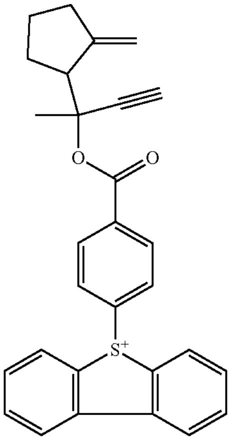
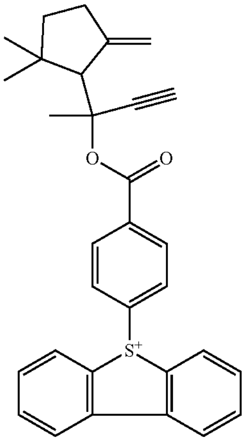
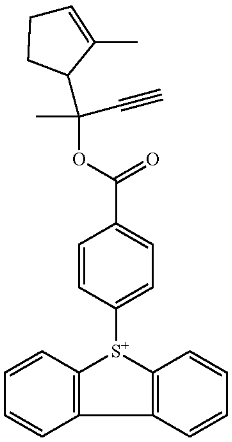
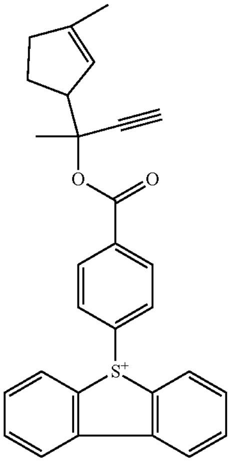
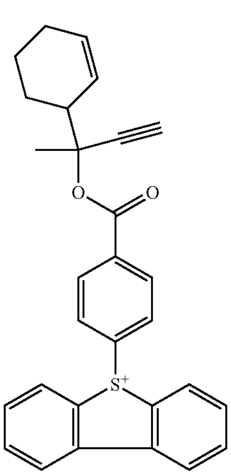
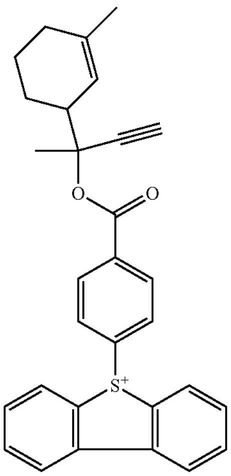
-continued
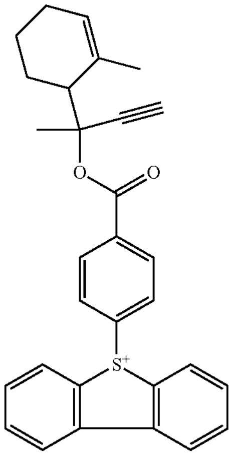
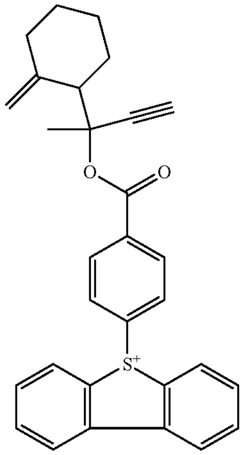
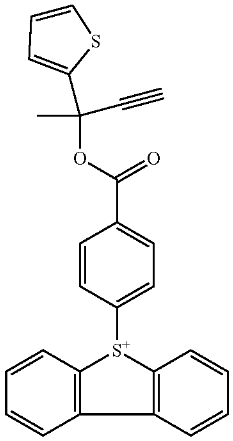
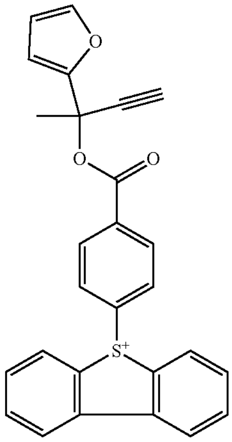
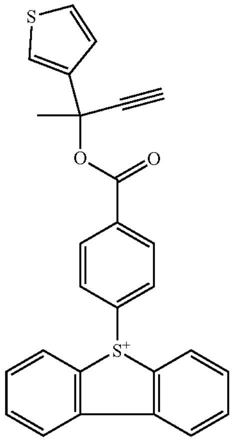
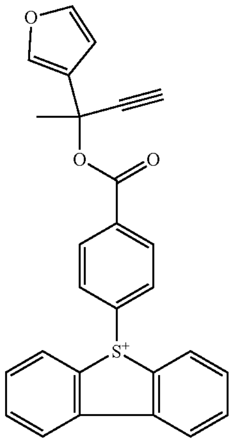

-continued
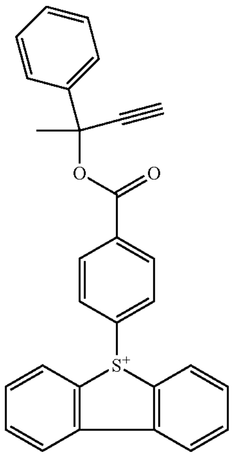
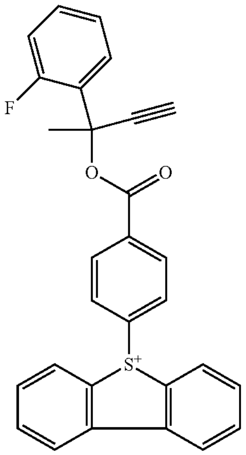
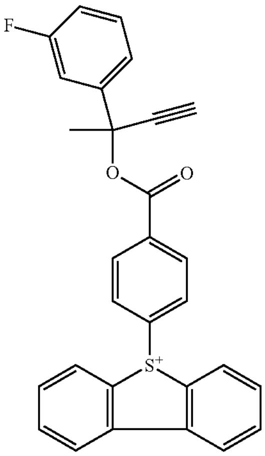
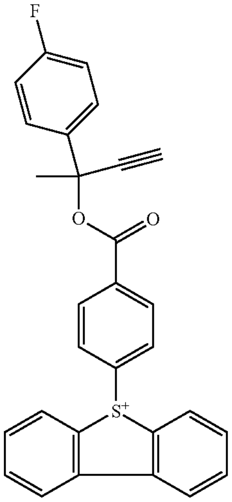
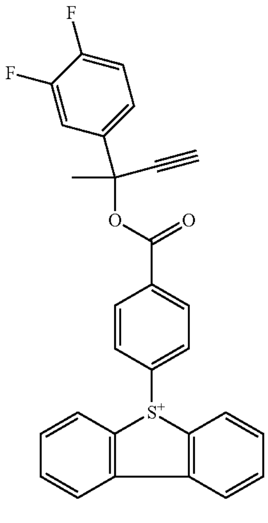
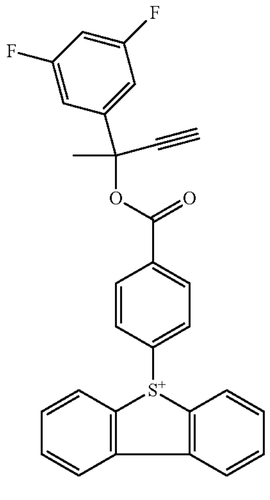
-continued
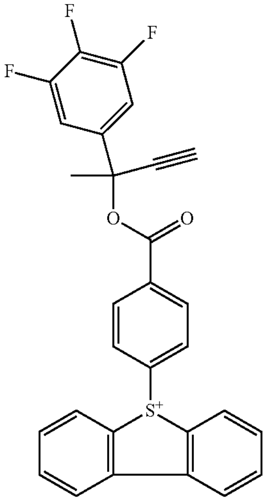
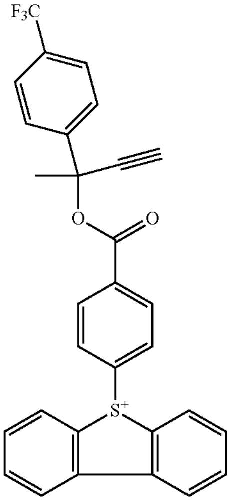
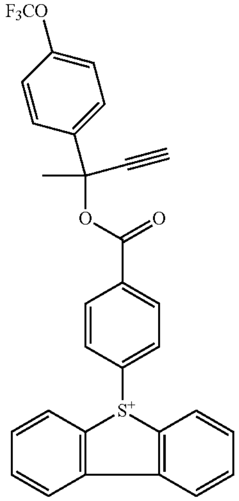
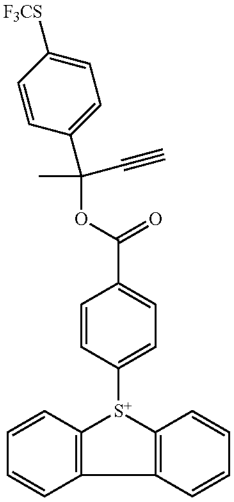
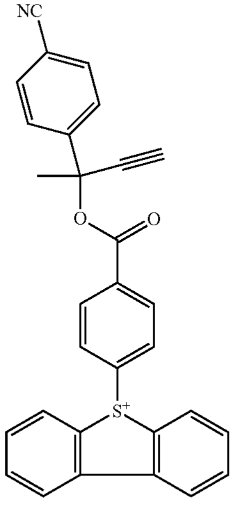
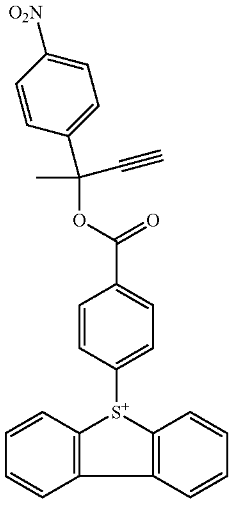

-continued
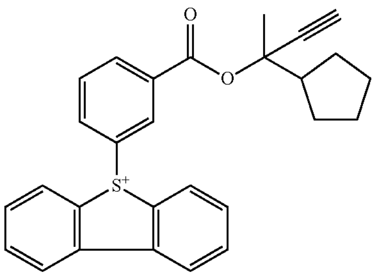
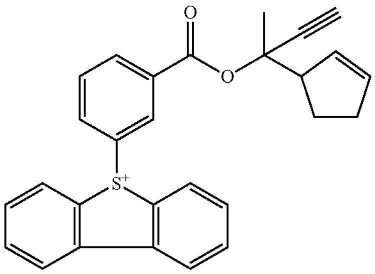
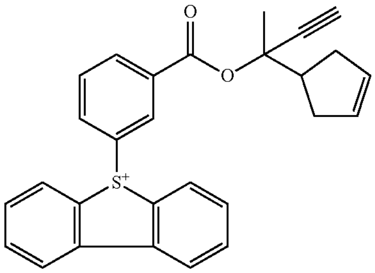
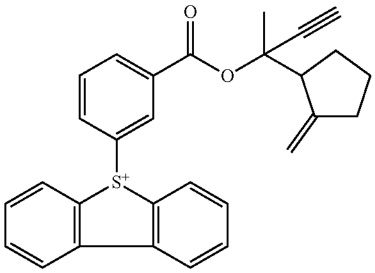
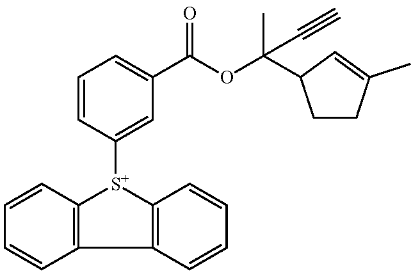
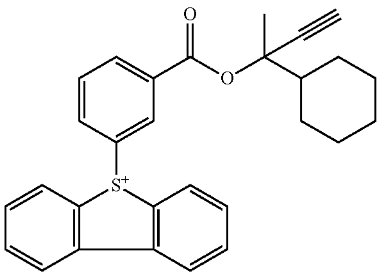
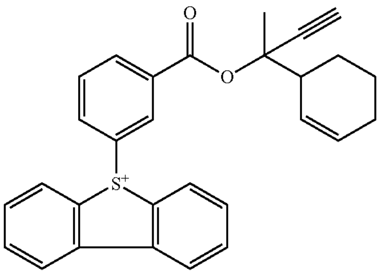
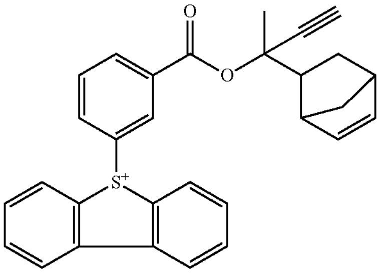
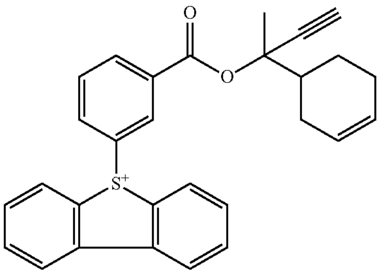
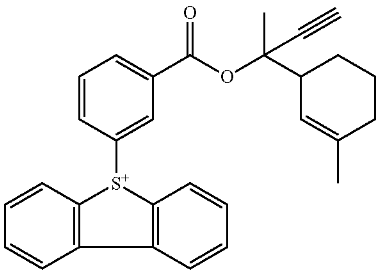
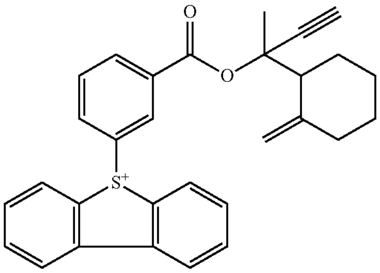
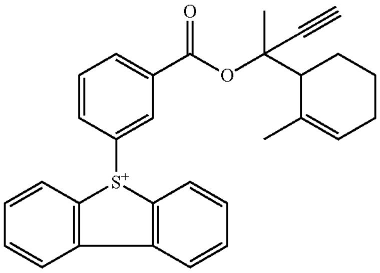

-continued
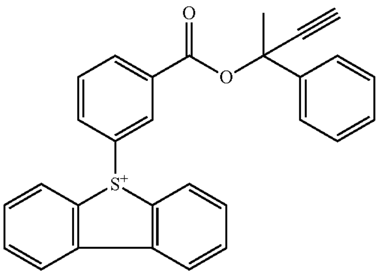
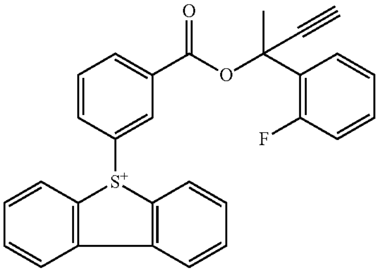
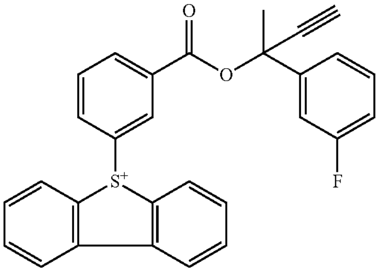
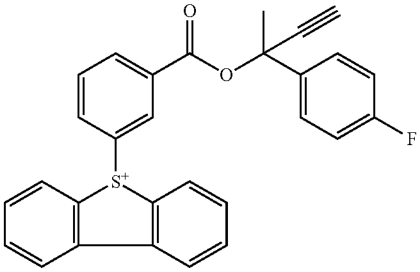
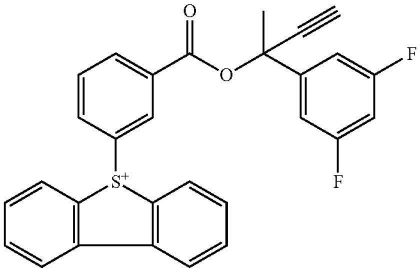
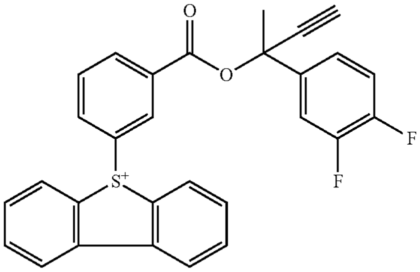
-continued
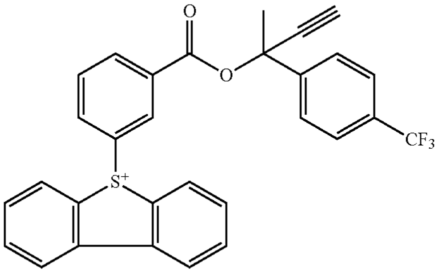
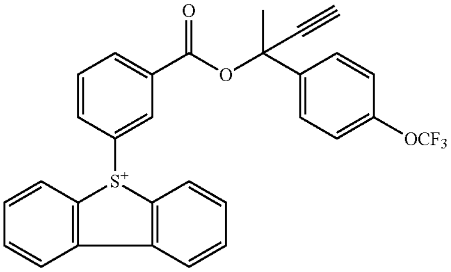
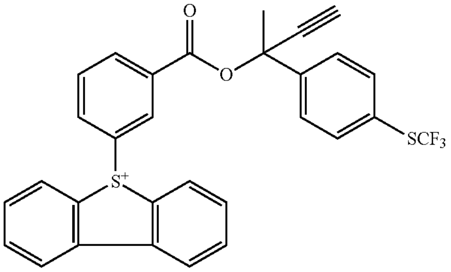
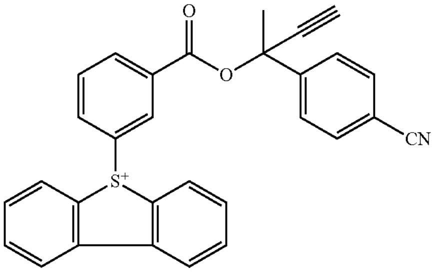
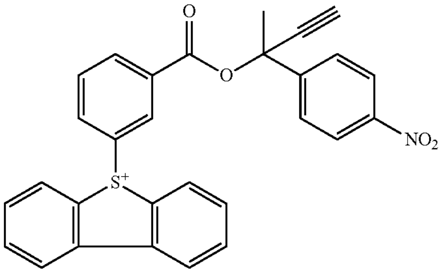
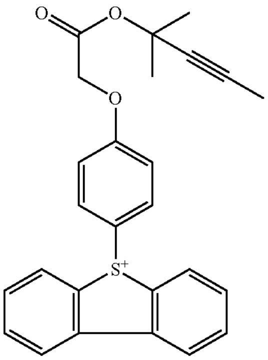

-continued
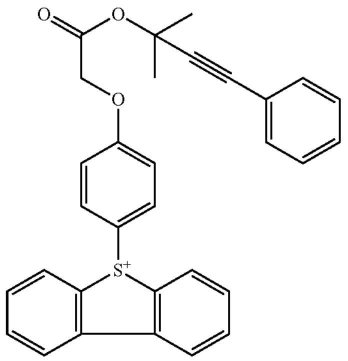
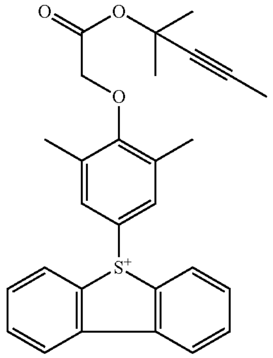
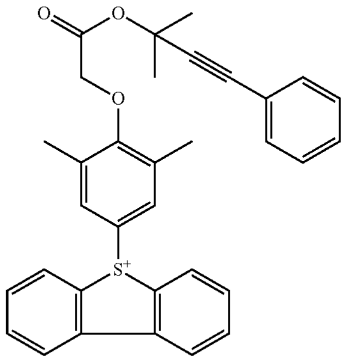
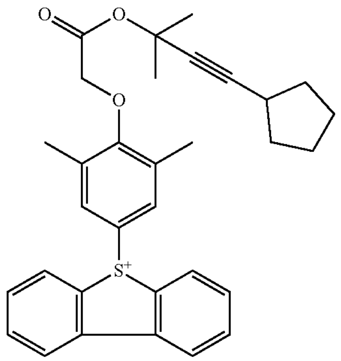
-continued
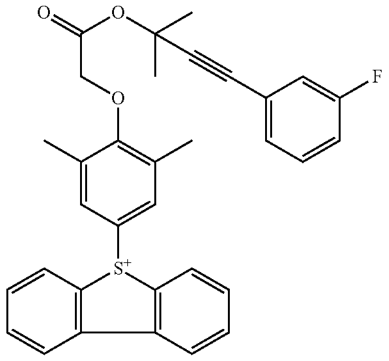
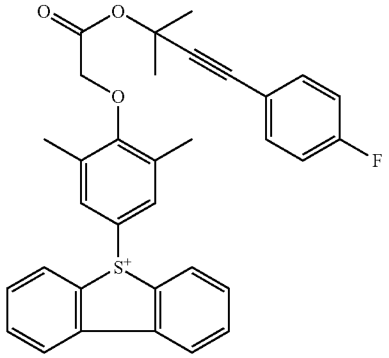
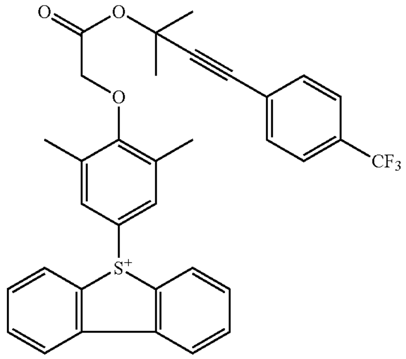
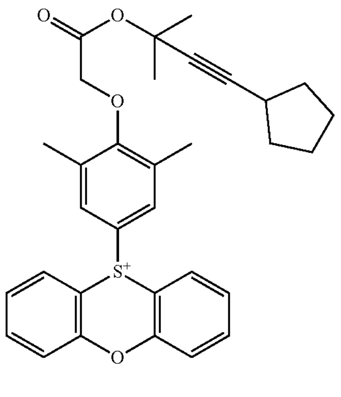

-continued
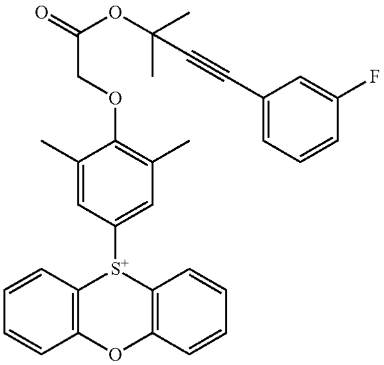
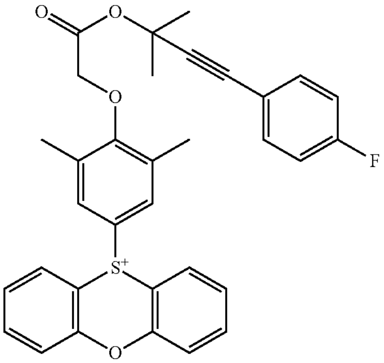
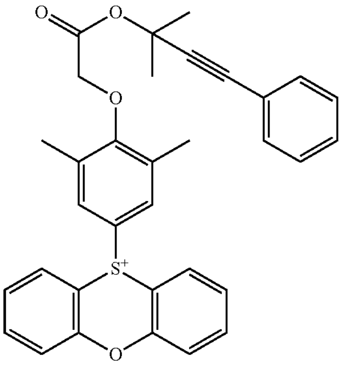
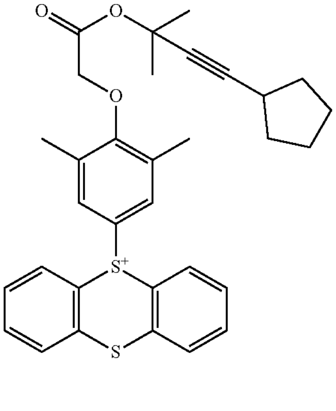
-continued
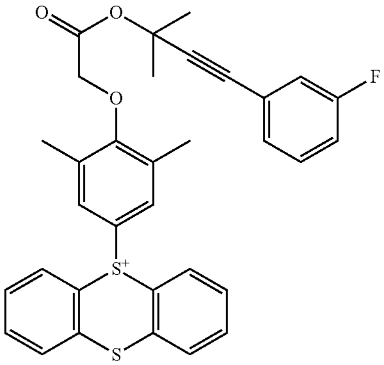
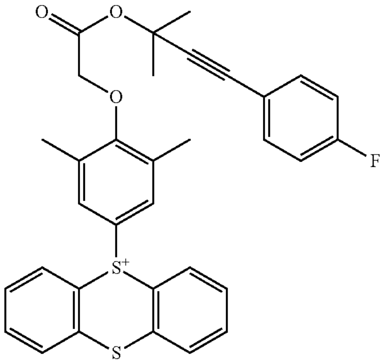
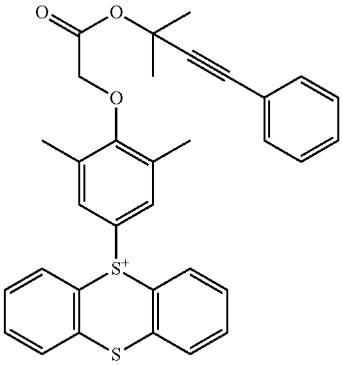
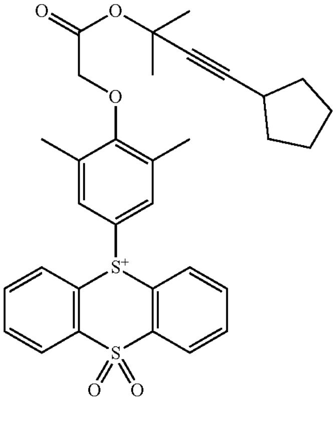

-continued
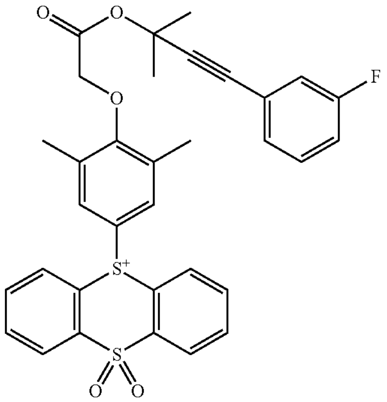
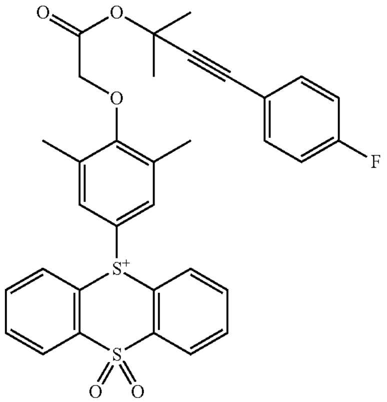
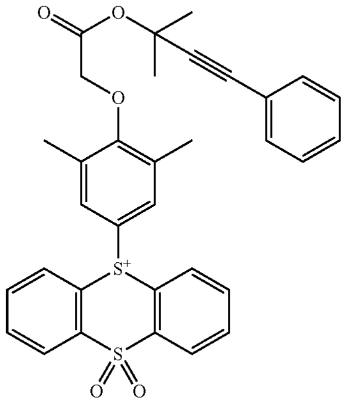
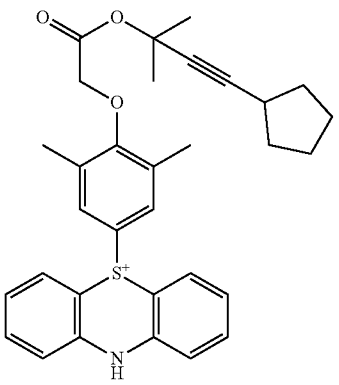
-continued
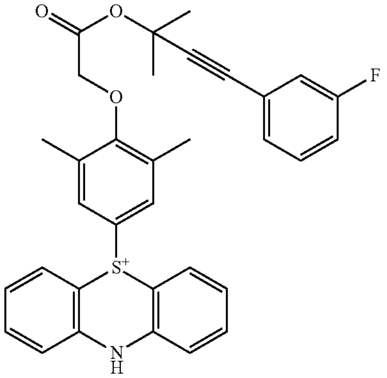
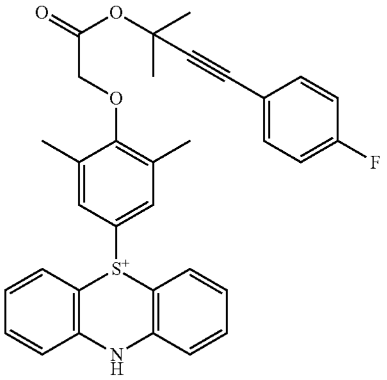
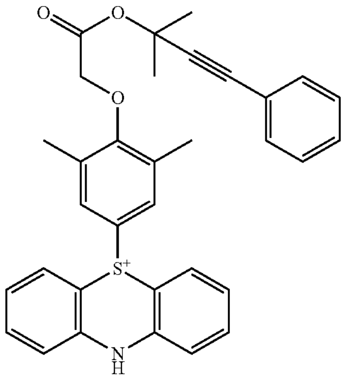
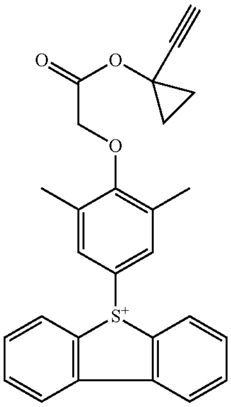

-continued
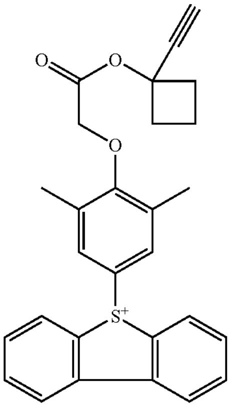
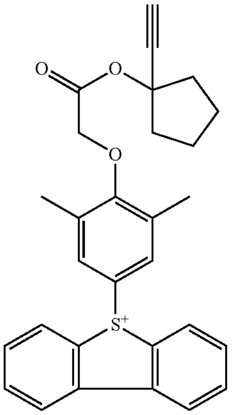
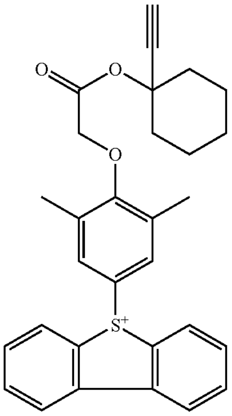
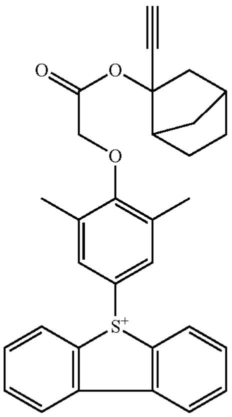
-continued
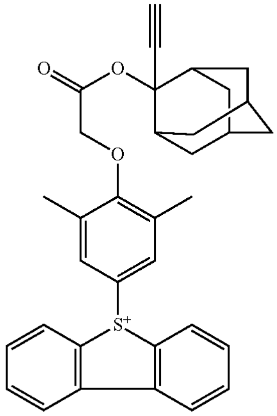
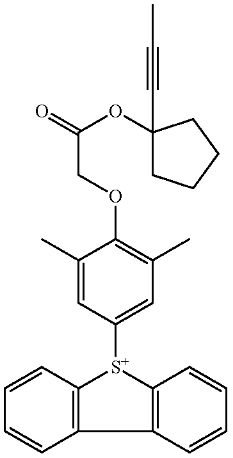
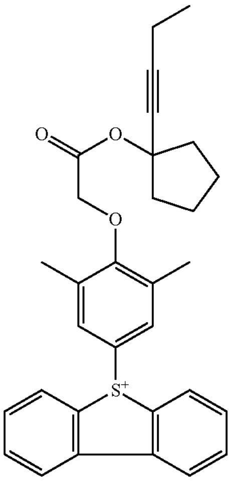

-continued
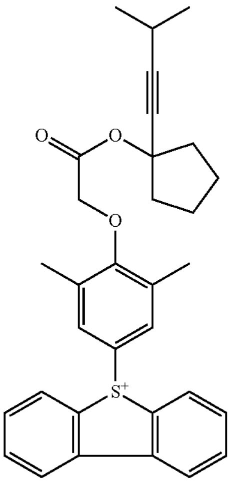
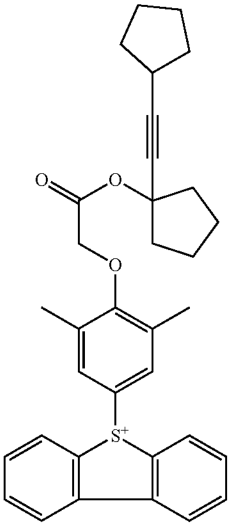
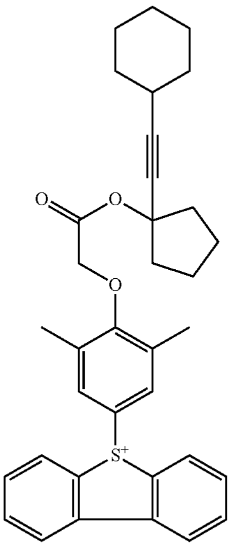
-continued
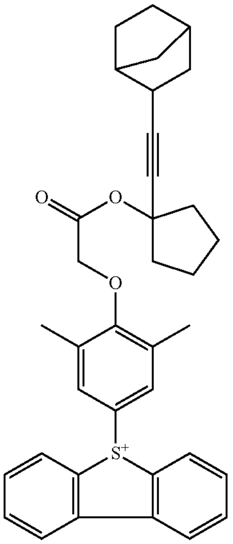
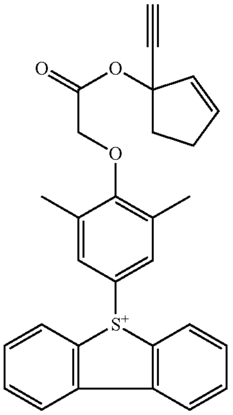
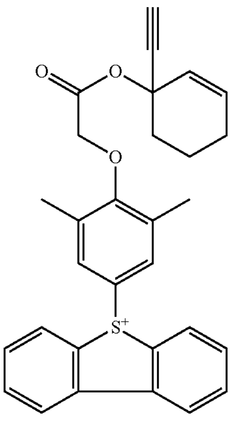

-continued
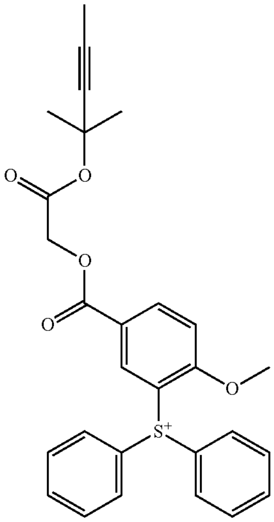
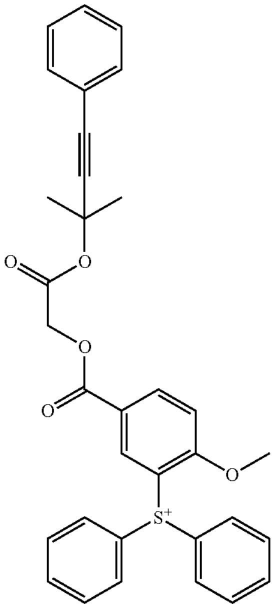
-continued
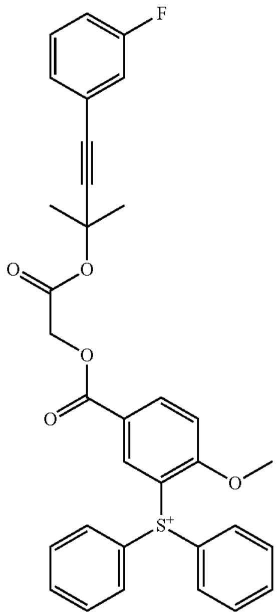
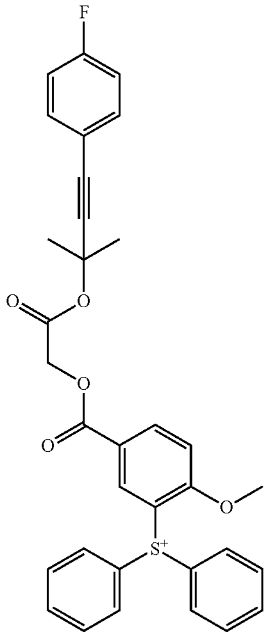

-continued
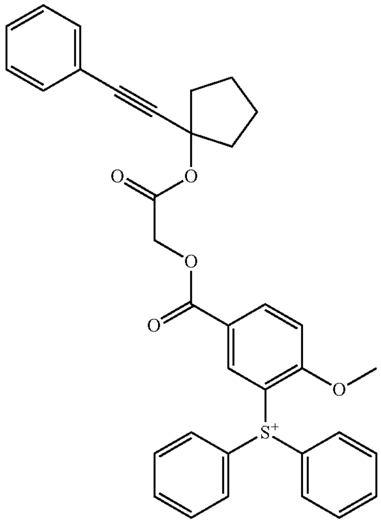
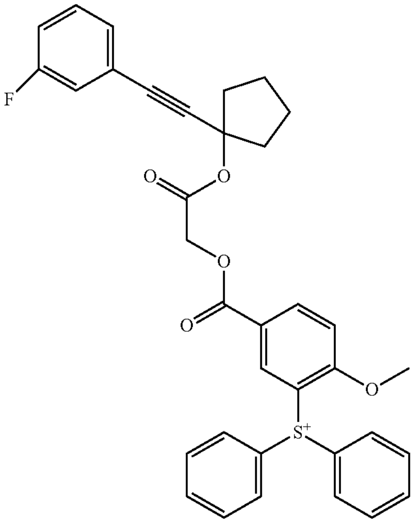
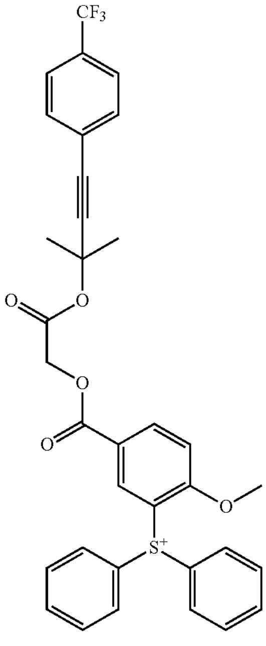
-continued
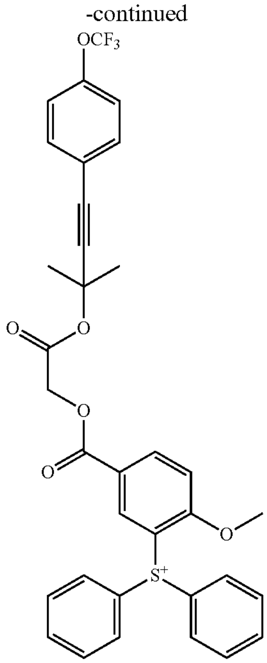
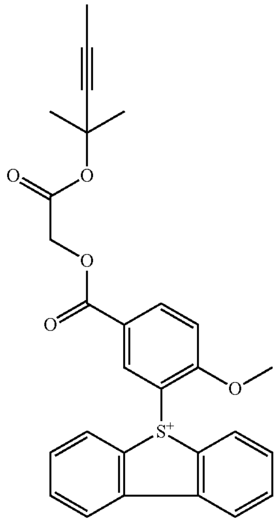

-continued
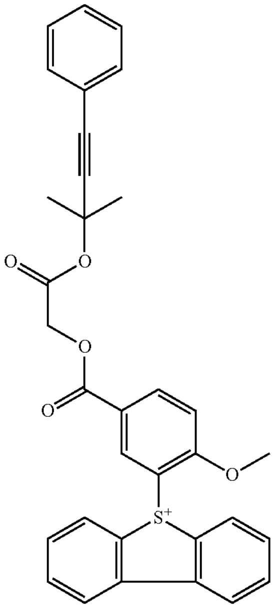
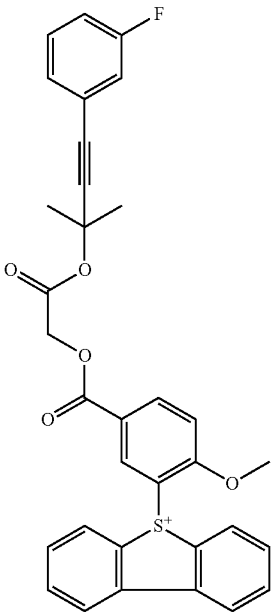
-continued
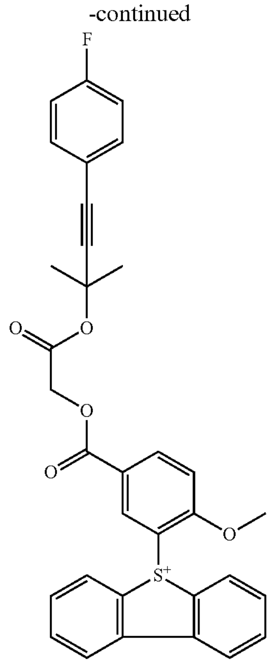
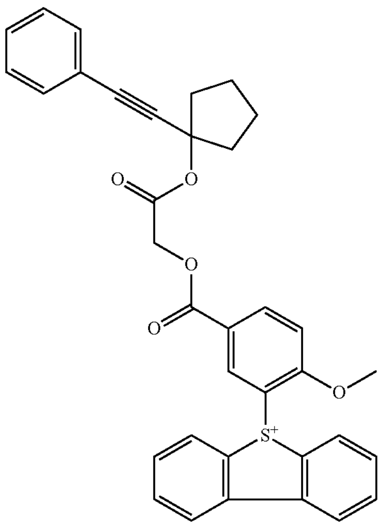
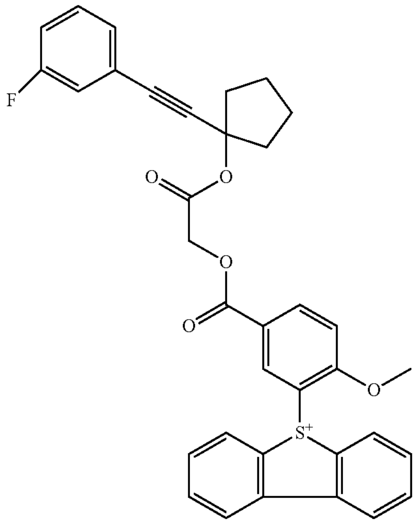

-continued
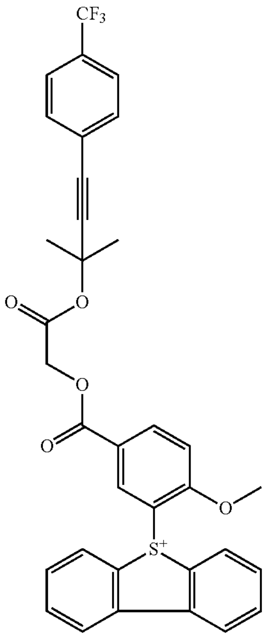
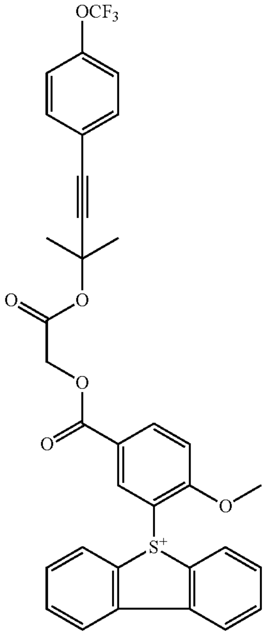
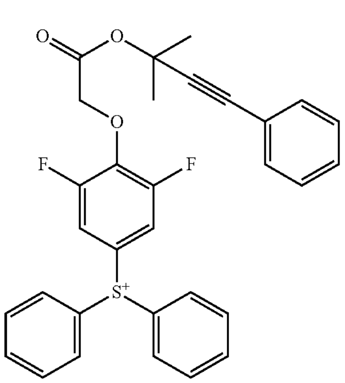
-continued
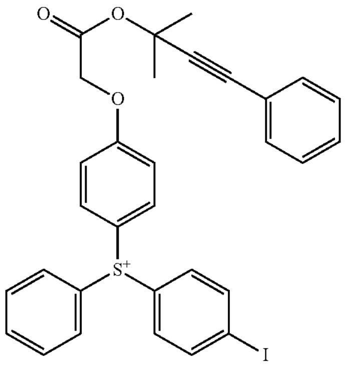
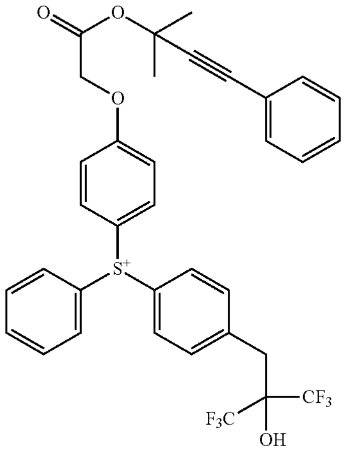
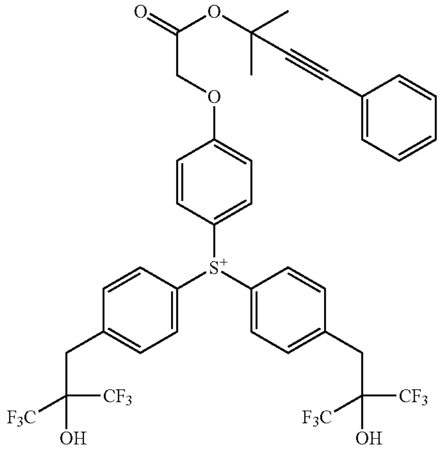
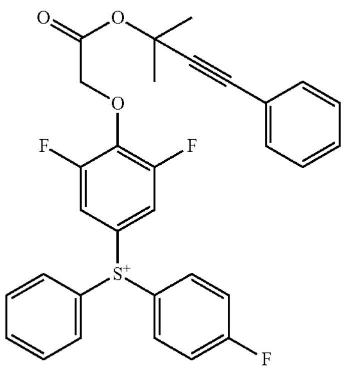

-continued
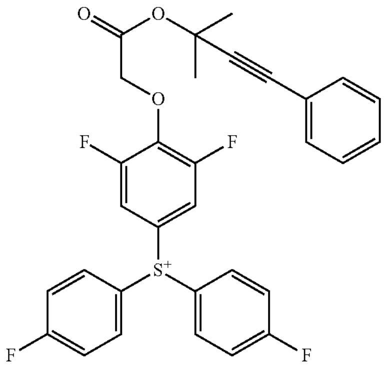
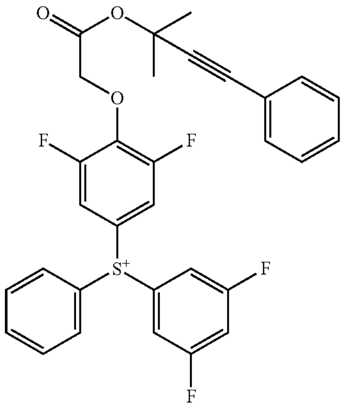
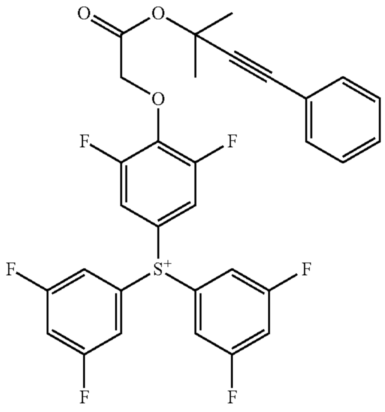
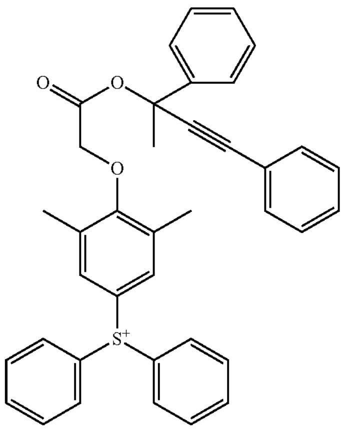
-continued
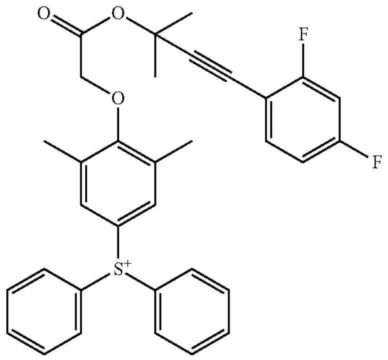
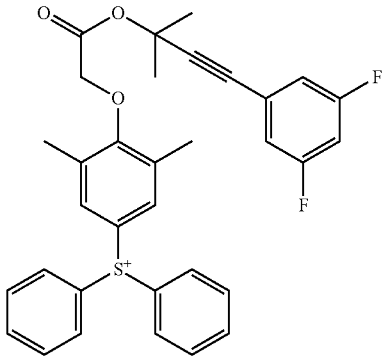
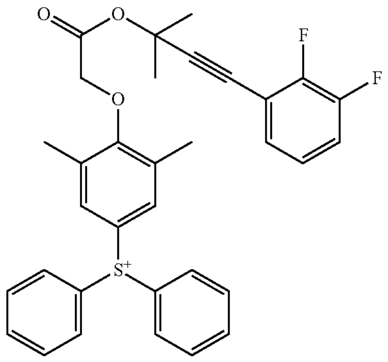
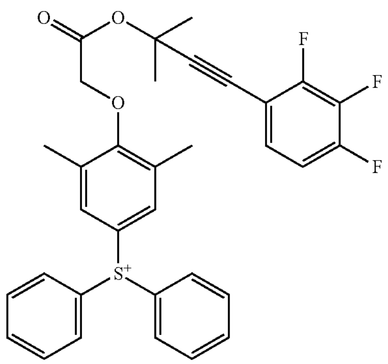

-continued
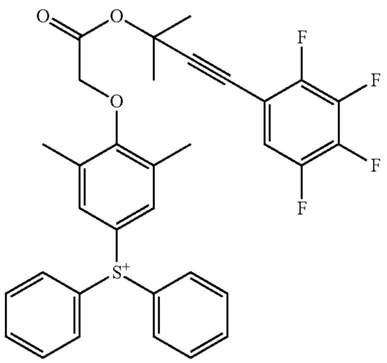
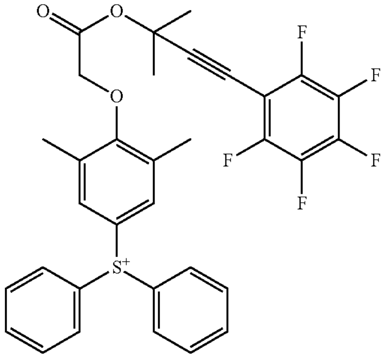
-continued
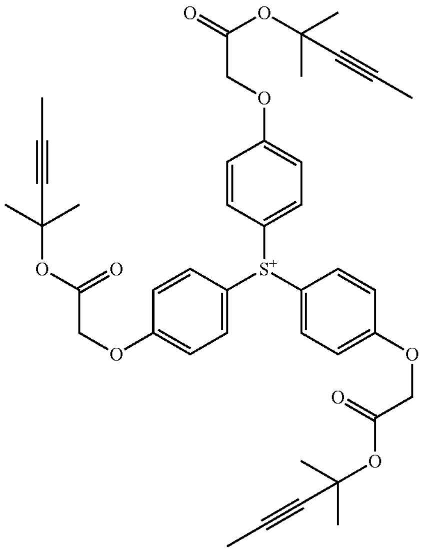
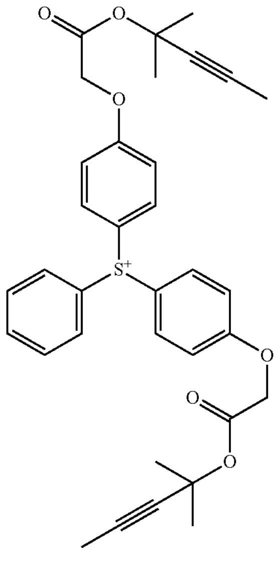
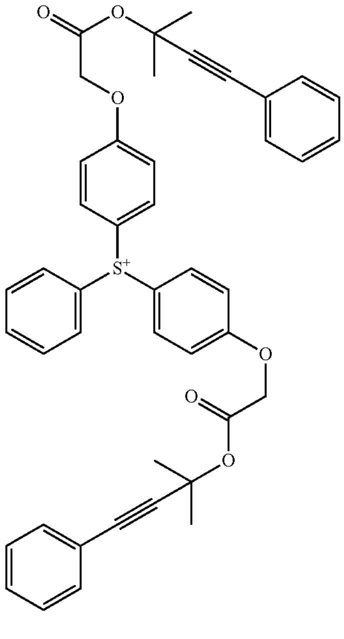

-continued
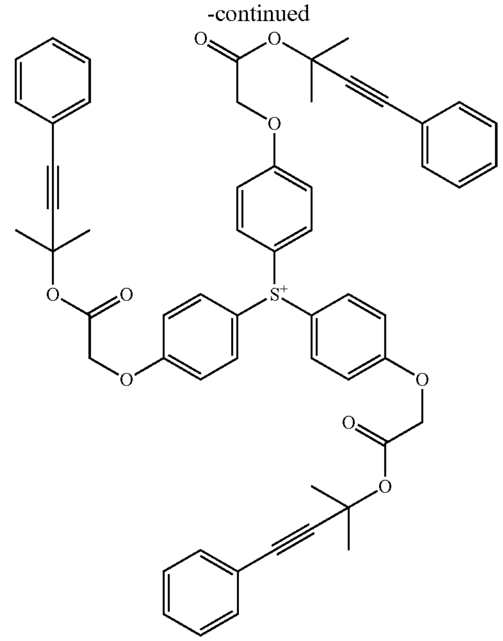
-continued
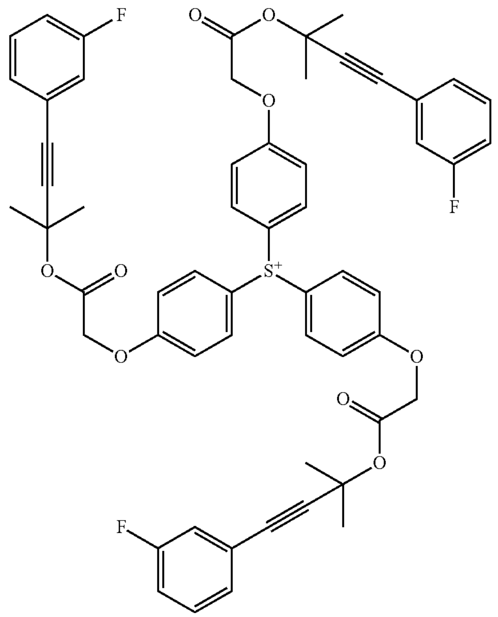
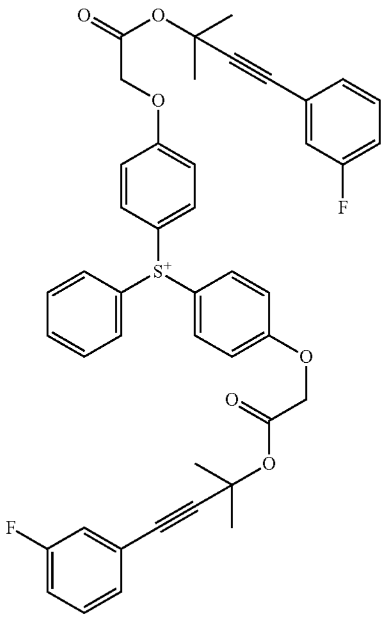
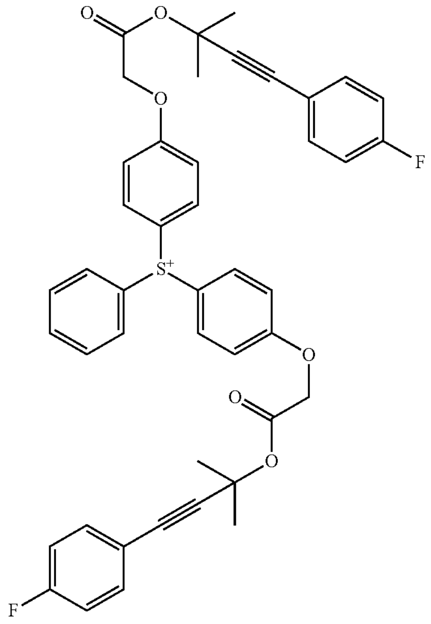

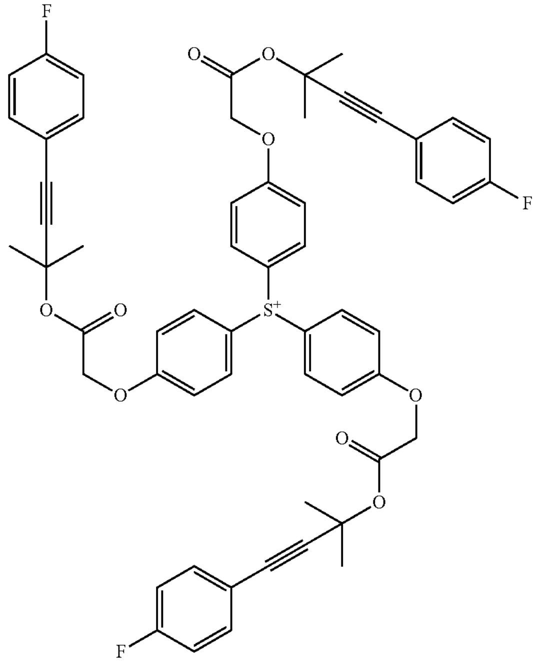
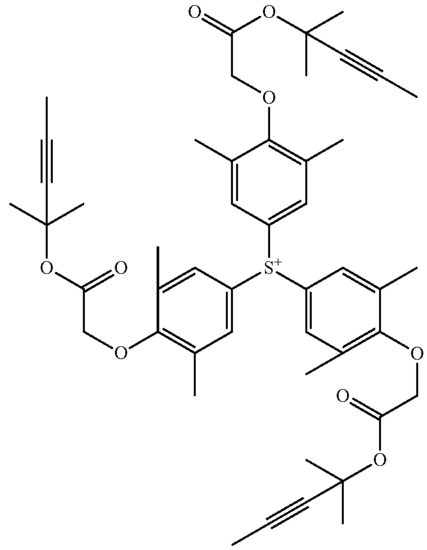
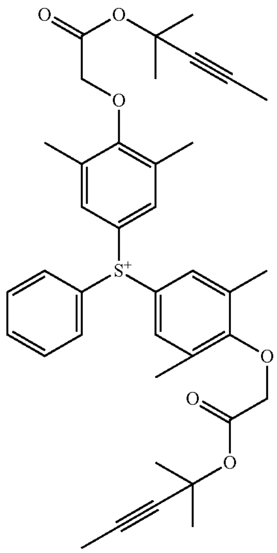
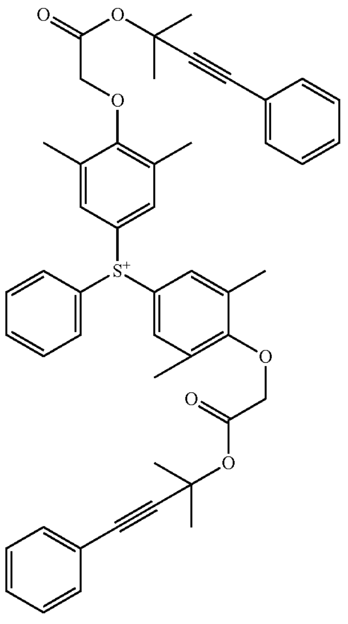

-continued
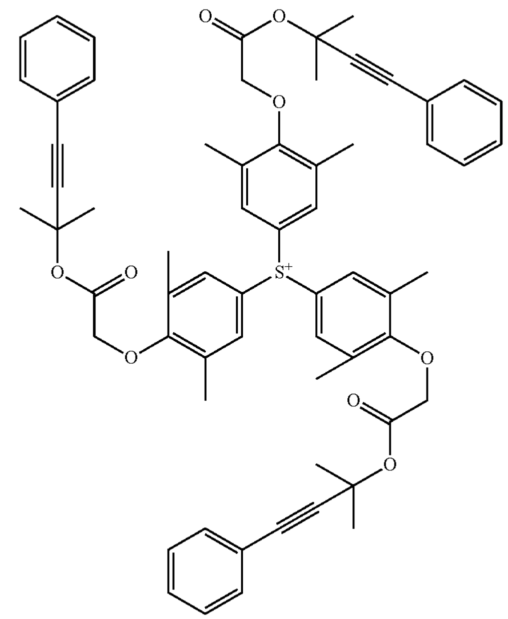
-continued
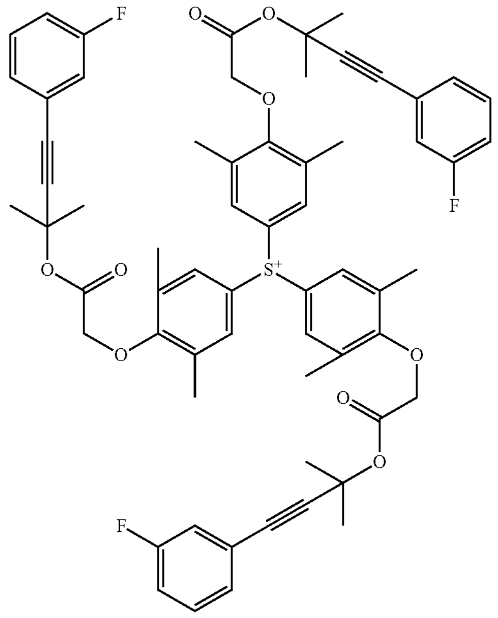
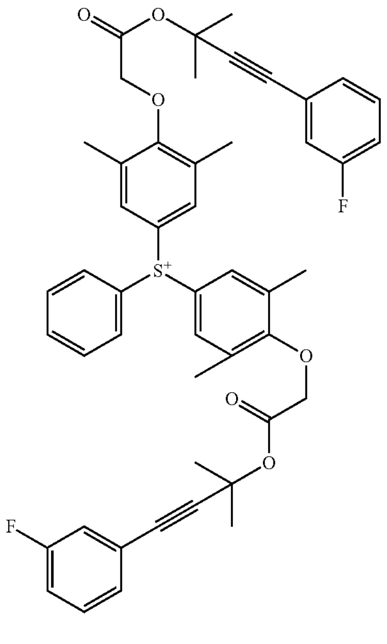
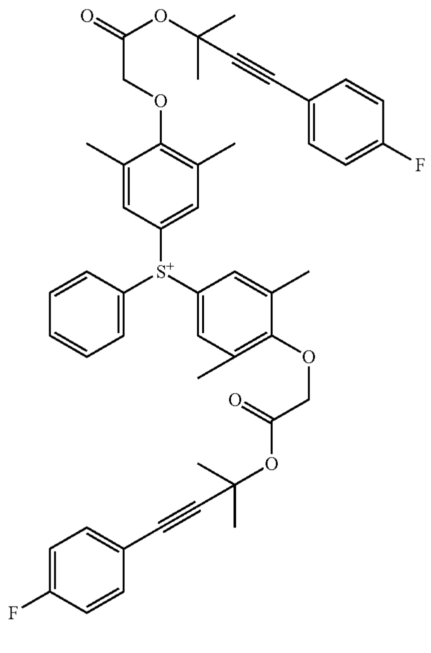

-continued
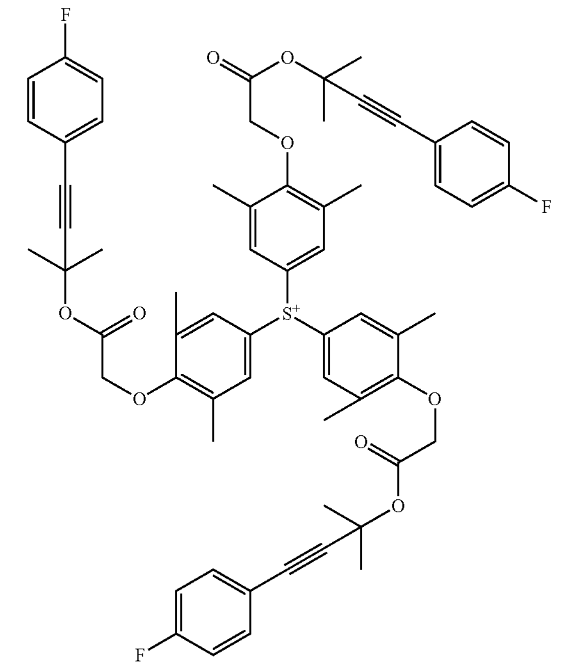
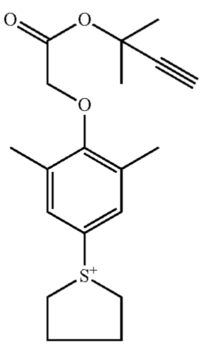
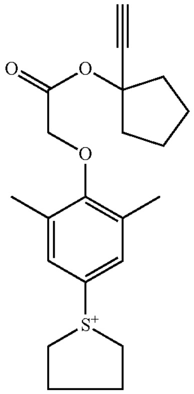
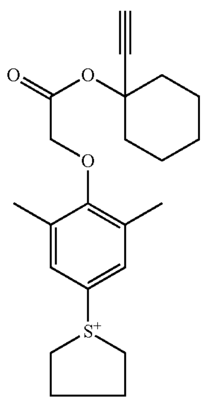
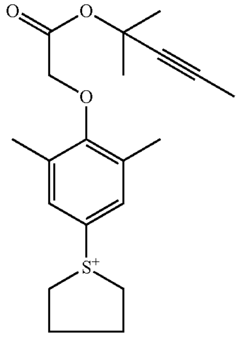
-continued
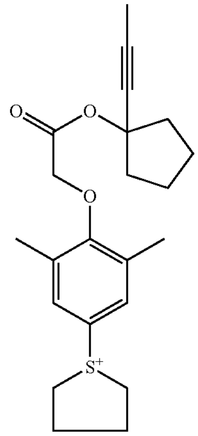
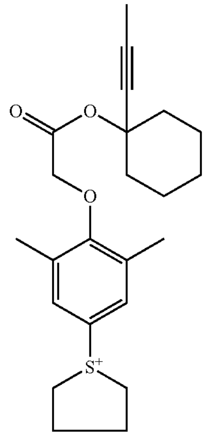
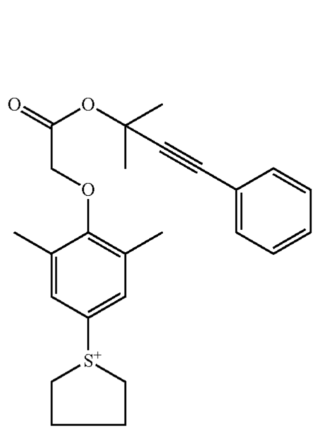
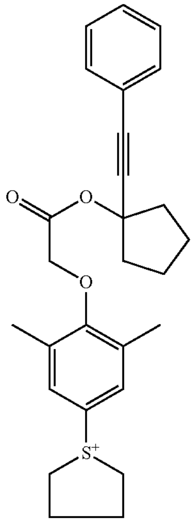
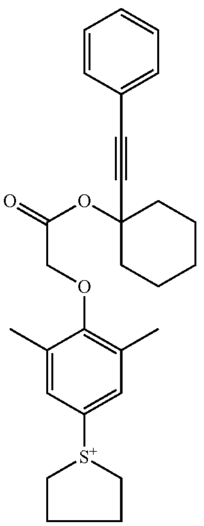
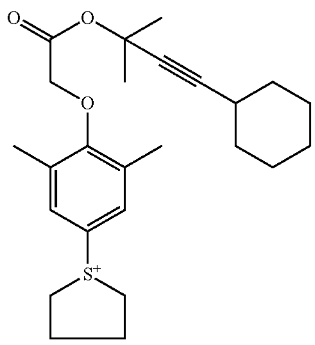

-continued
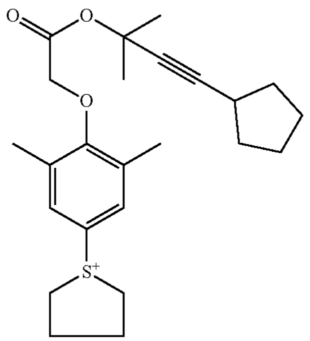
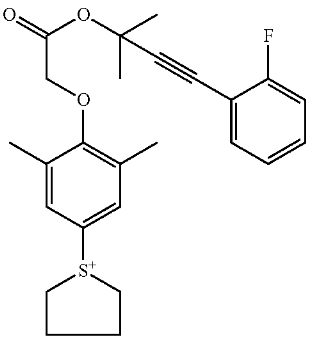
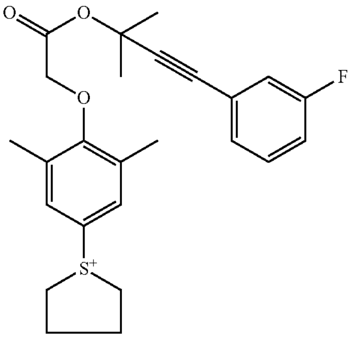
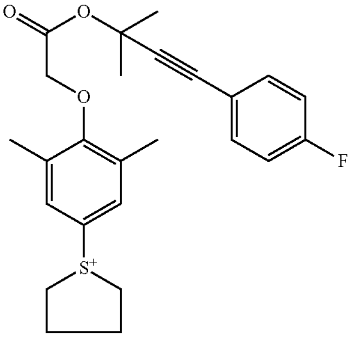
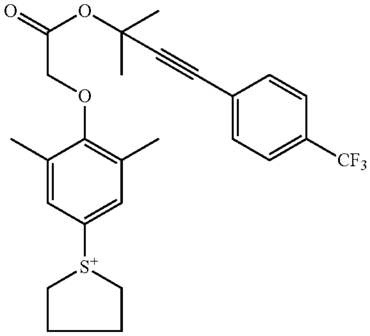
-continued
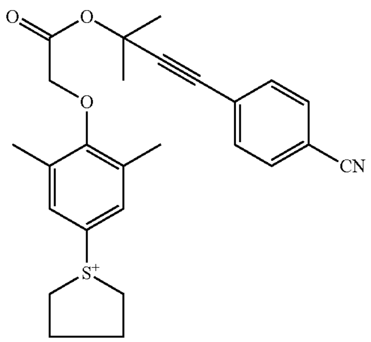
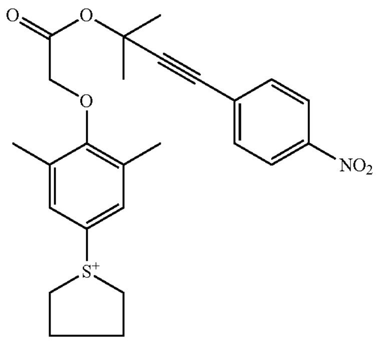
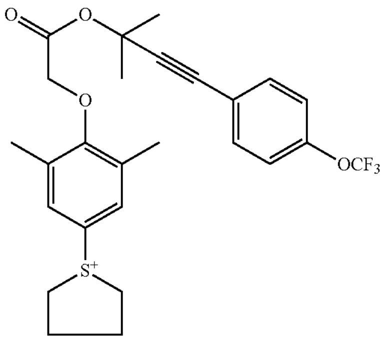
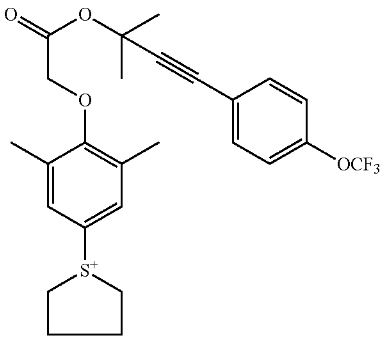
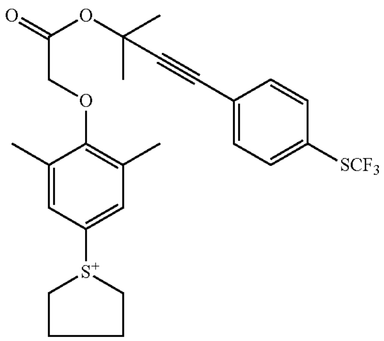

-continued
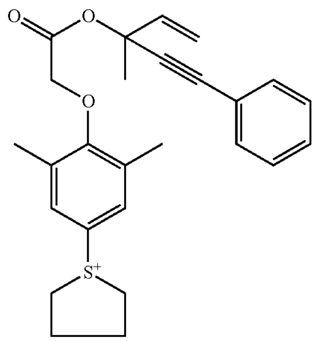
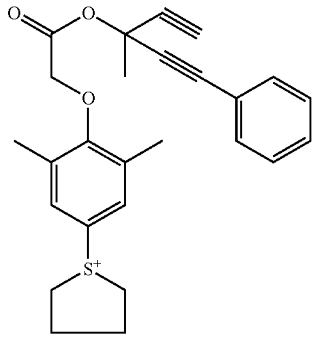
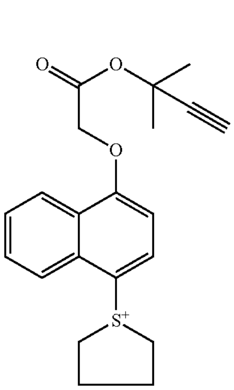
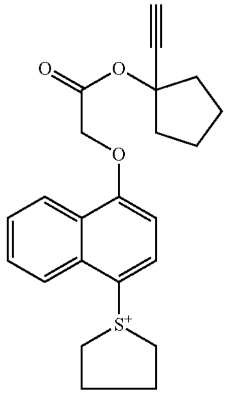
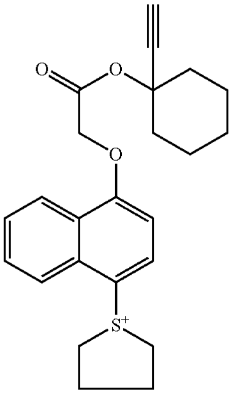
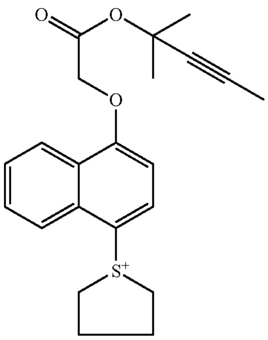
-continued
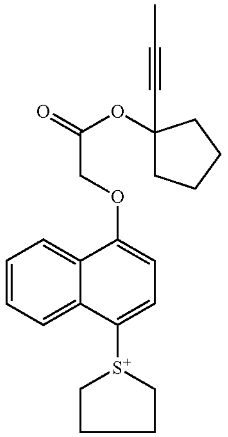
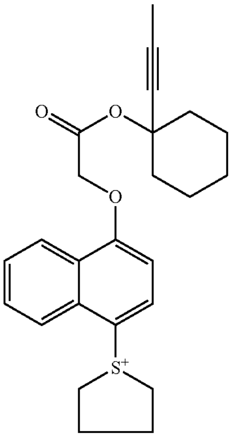
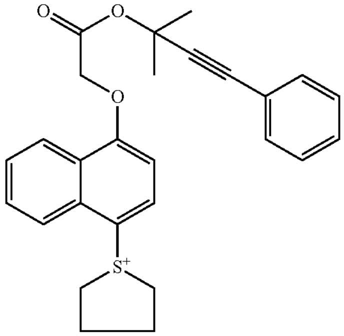
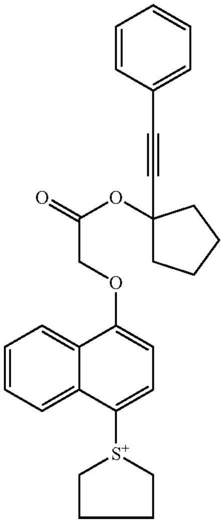

-continued
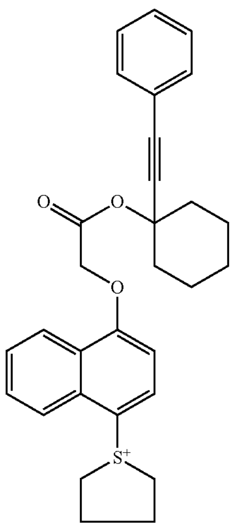
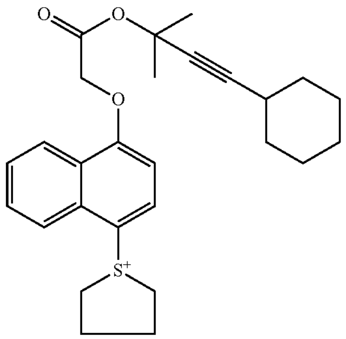
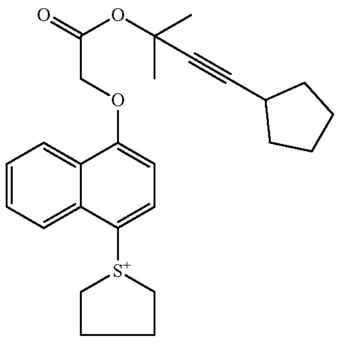
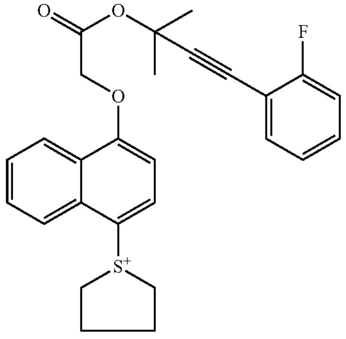
-continued
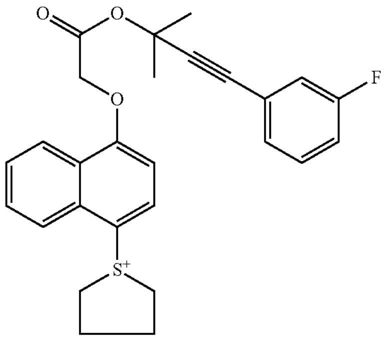
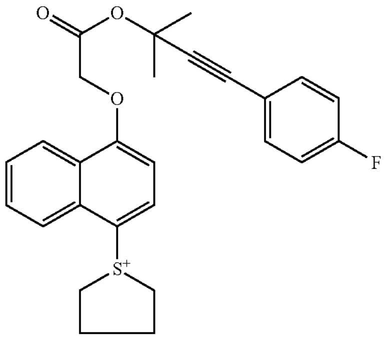
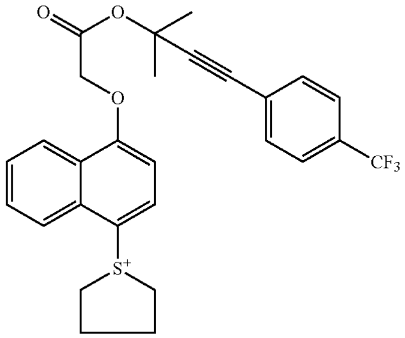
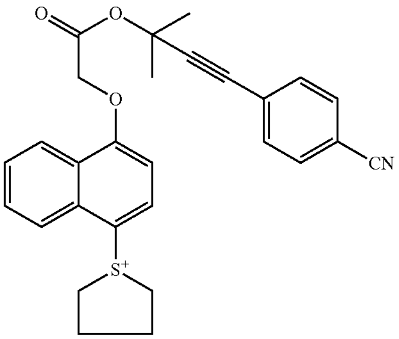
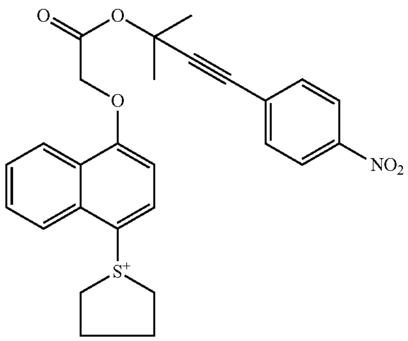

-continued
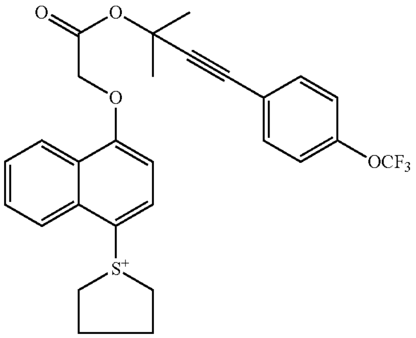
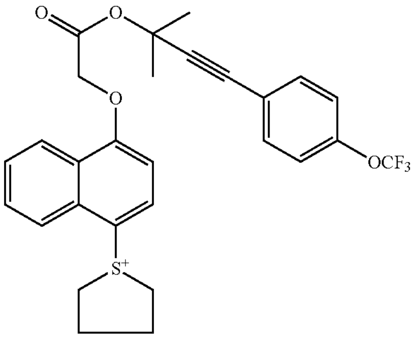
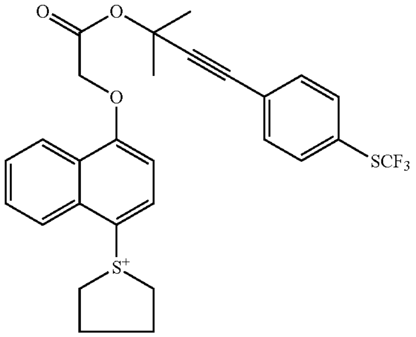
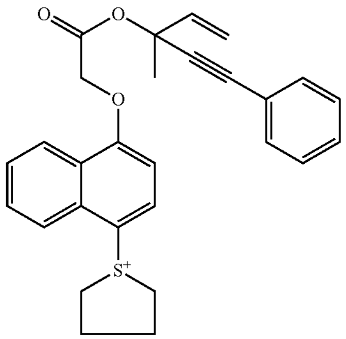
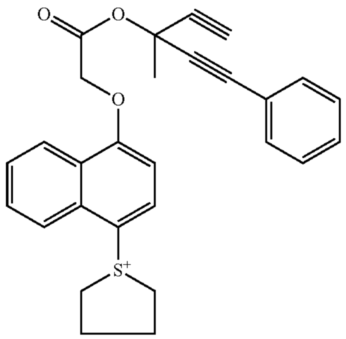
-continued
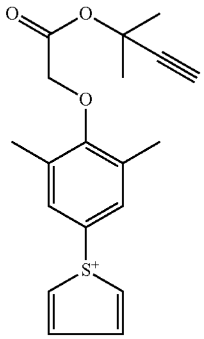
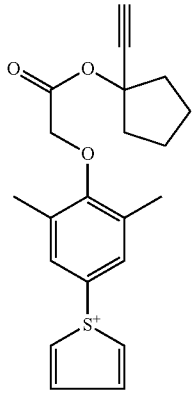
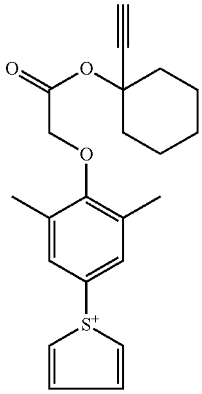
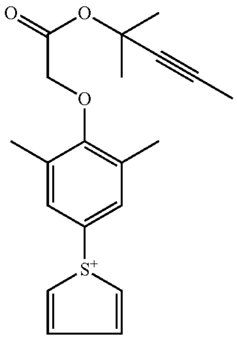
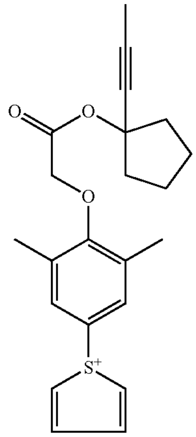
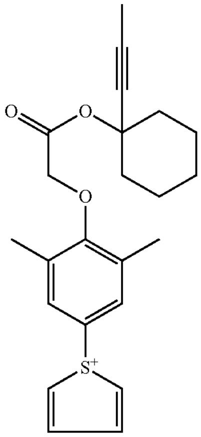
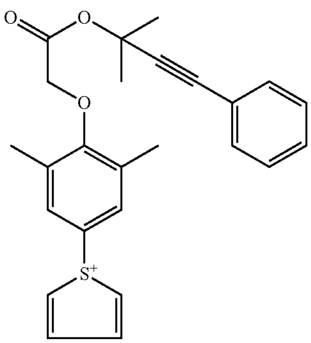

-continued
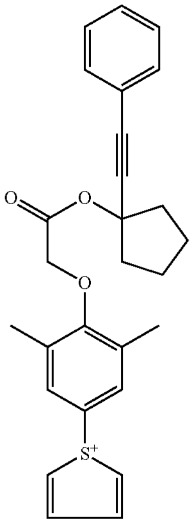
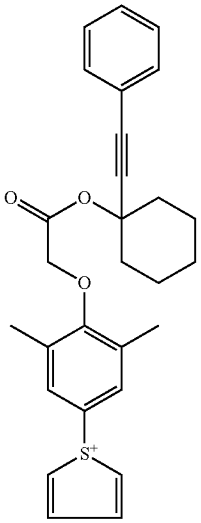
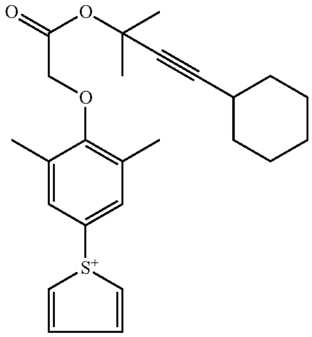
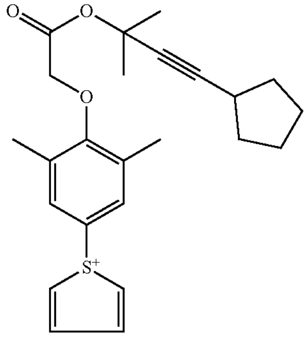
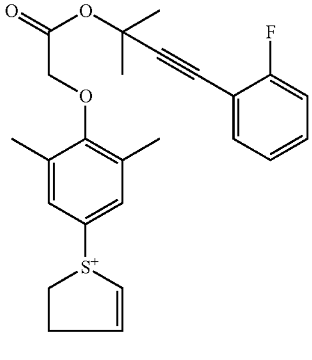
-continued
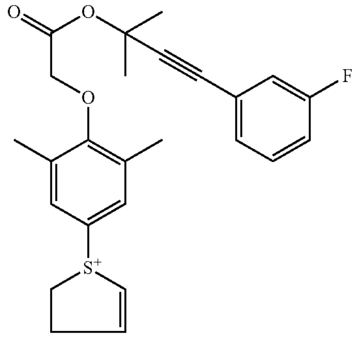
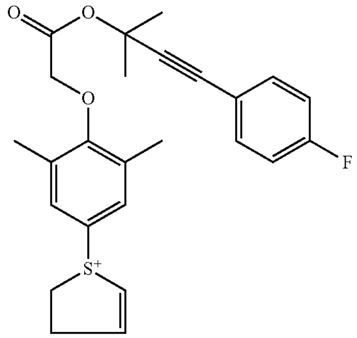
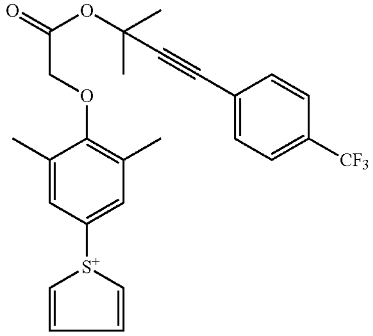
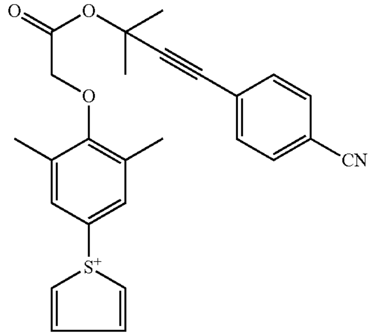
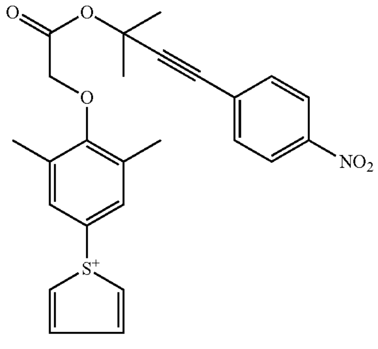

-continued
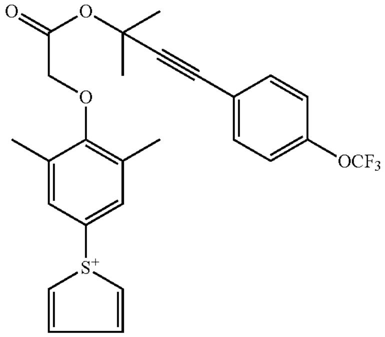
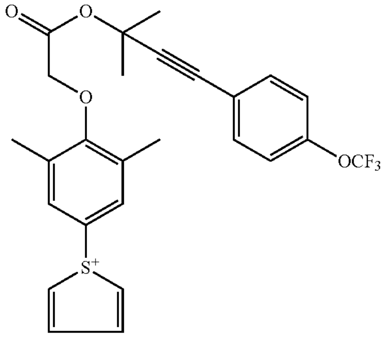
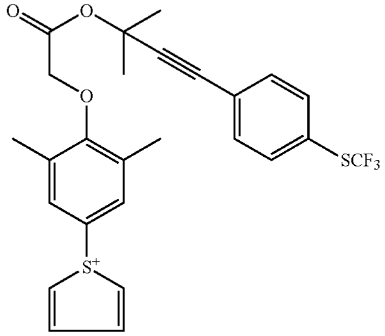
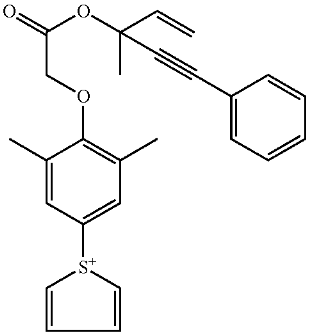
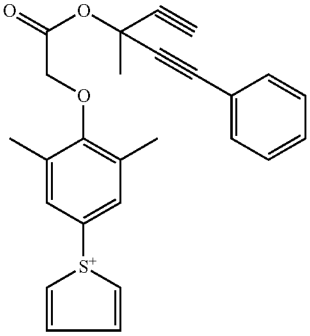
-continued
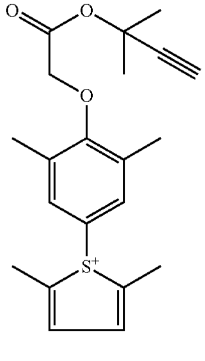
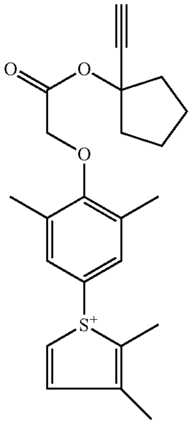
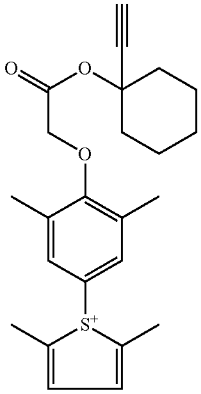
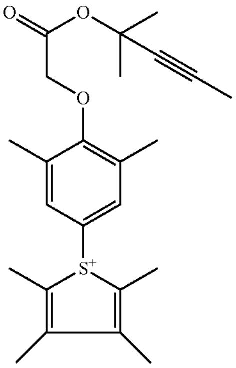
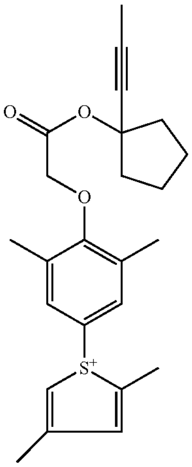
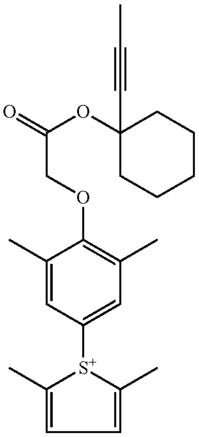

-continued
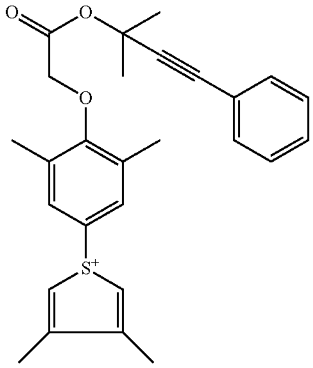
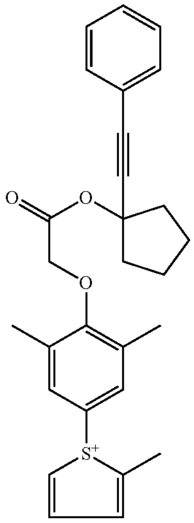
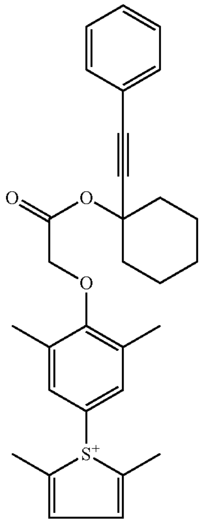
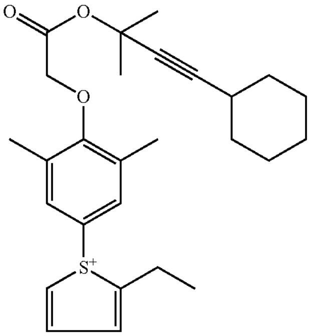
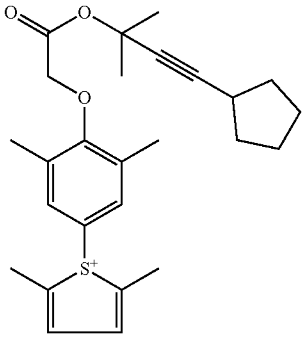
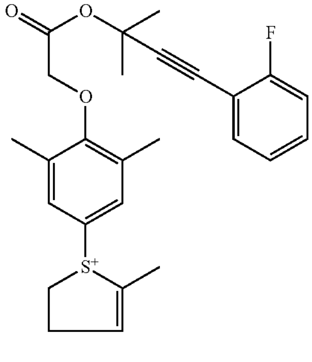
-continued
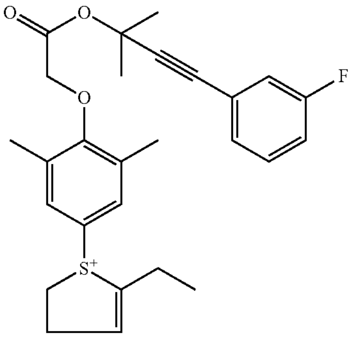
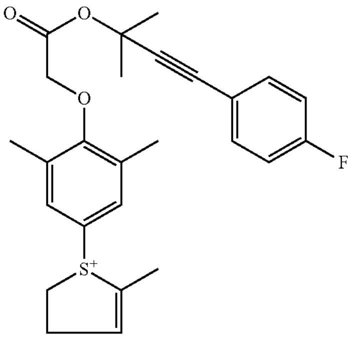
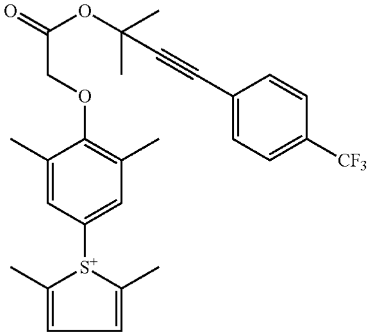
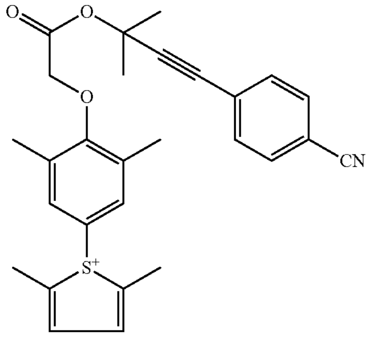
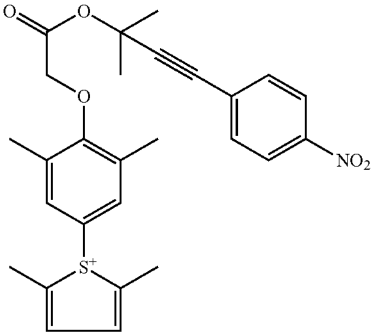

-continued
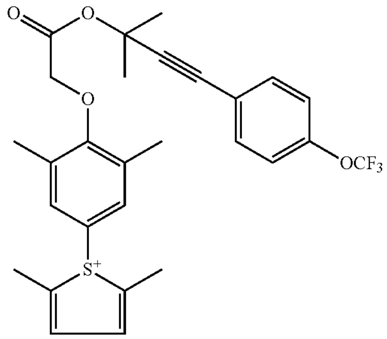
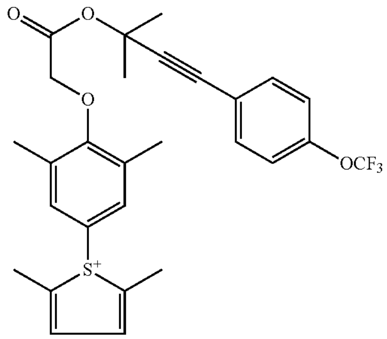
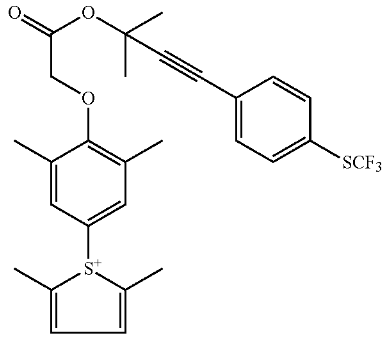
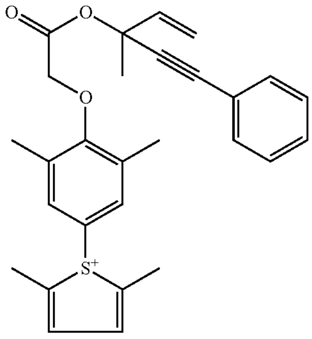
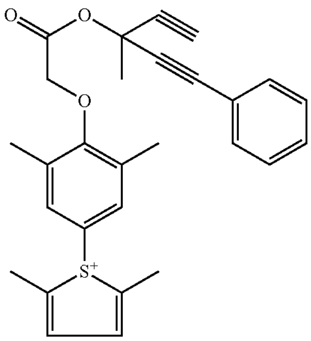
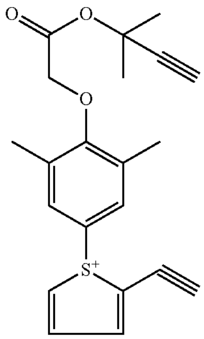
-continued
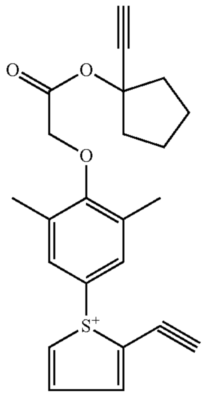
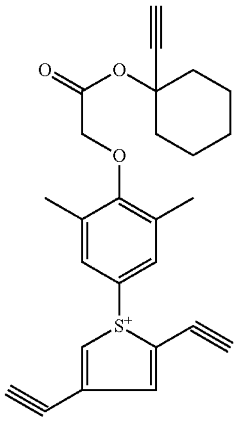
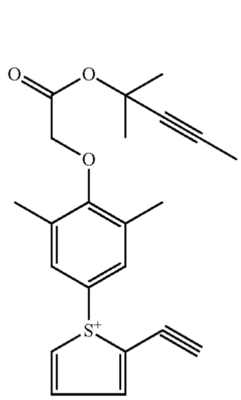
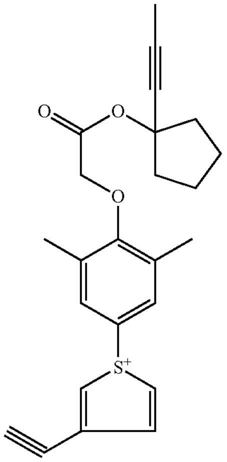
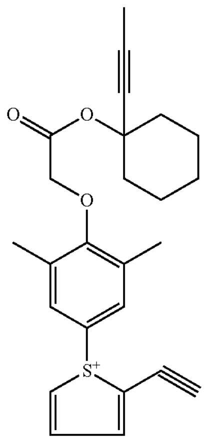
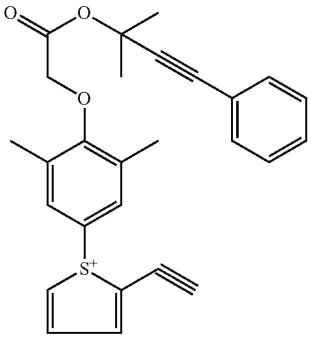

-continued
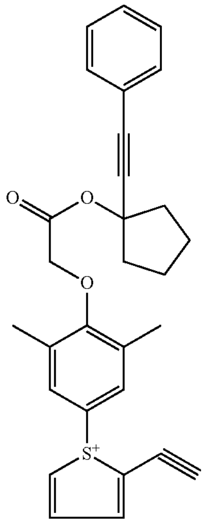
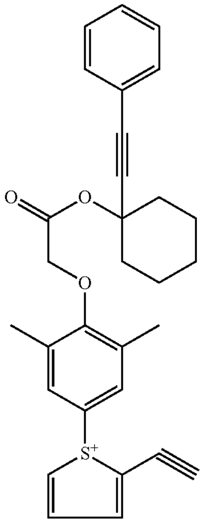
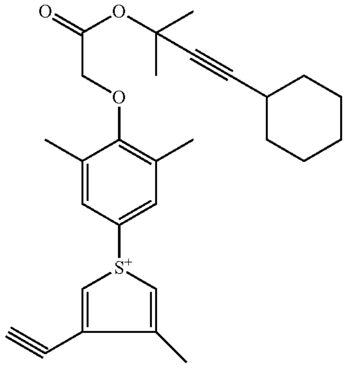
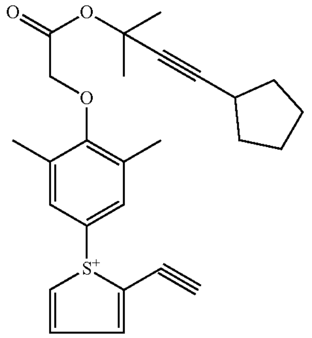
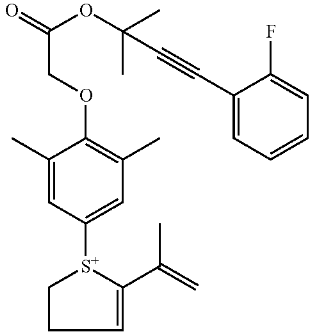
-continued
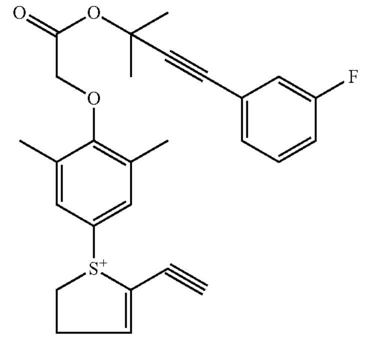
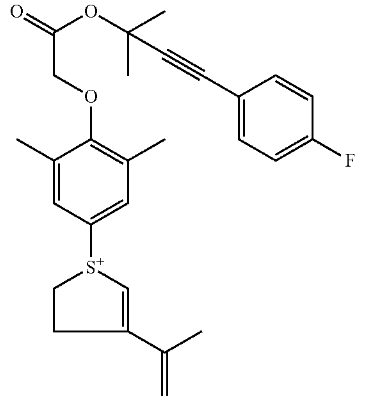
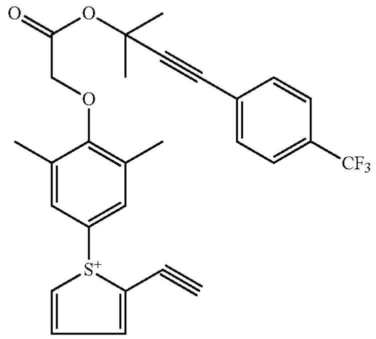
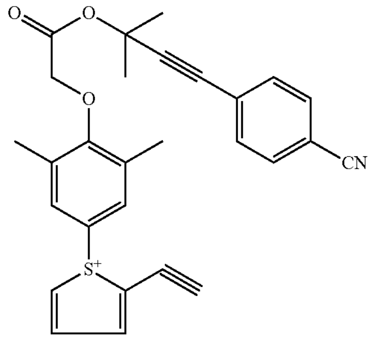

-continued
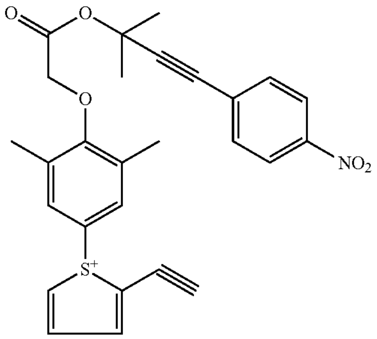
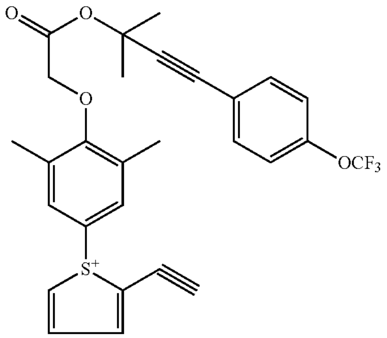
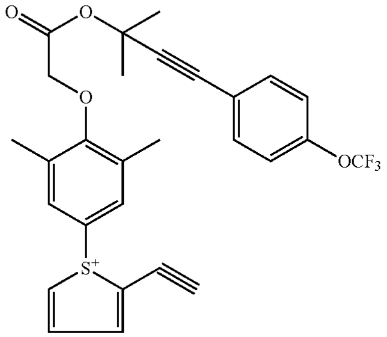
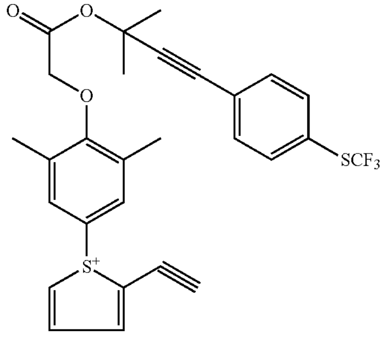
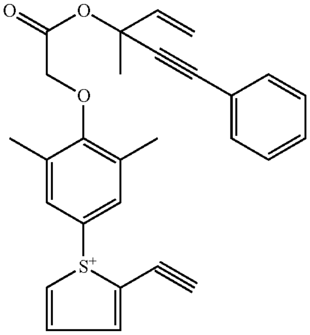
-continued
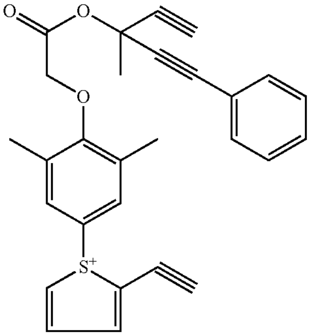
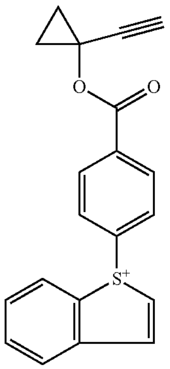
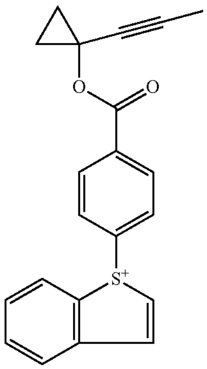
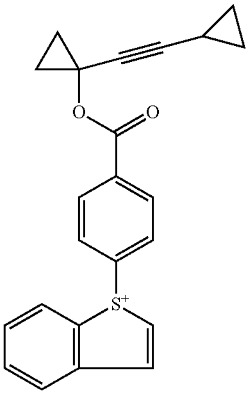
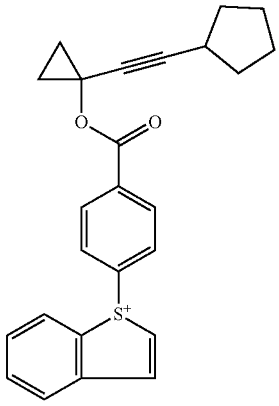
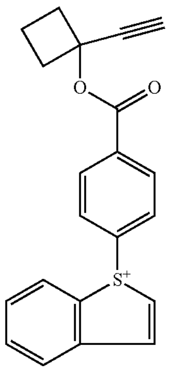
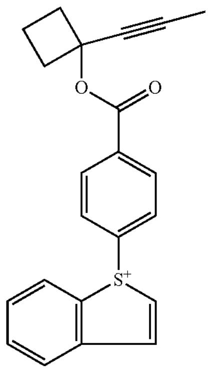

-continued
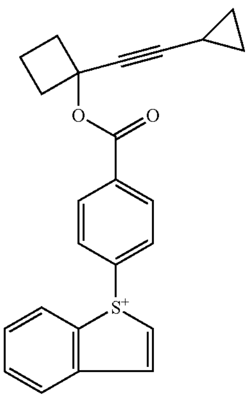
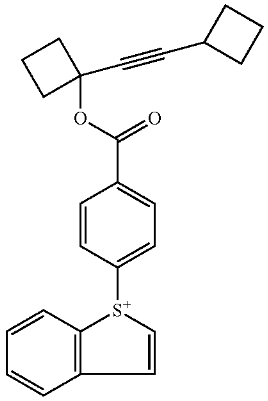
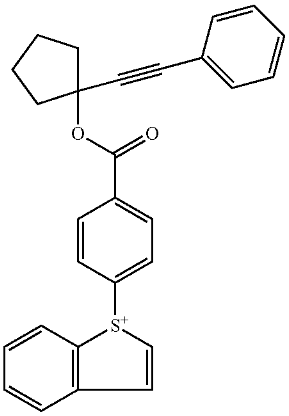
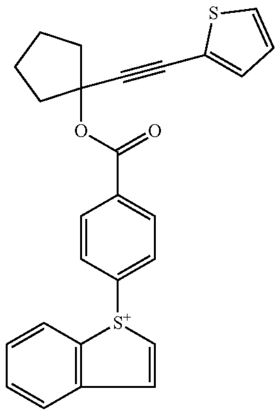
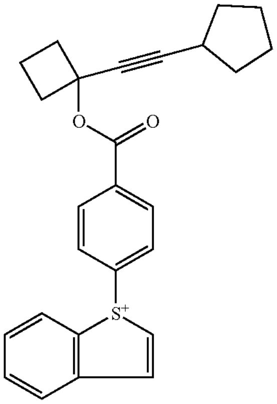
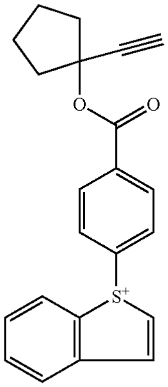
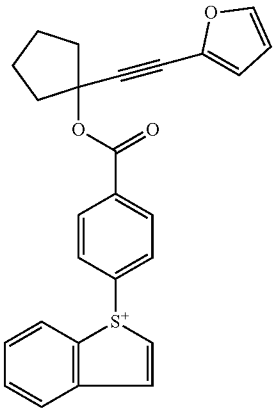
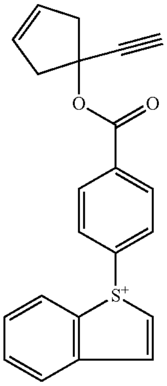
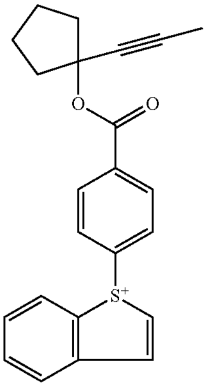
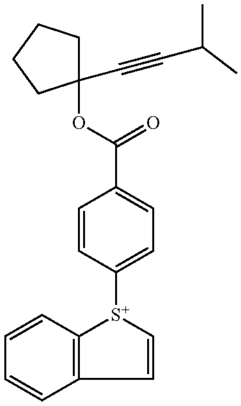
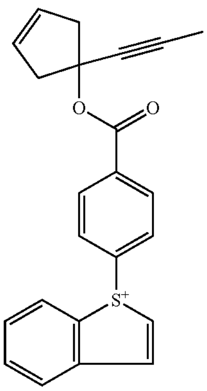
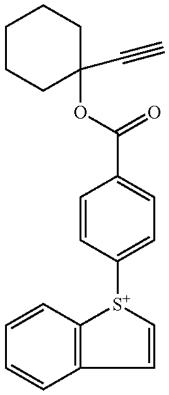
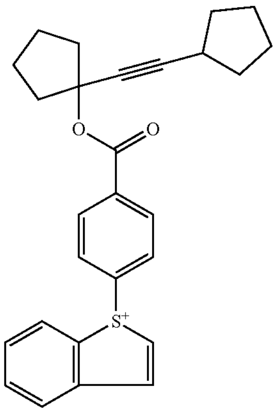
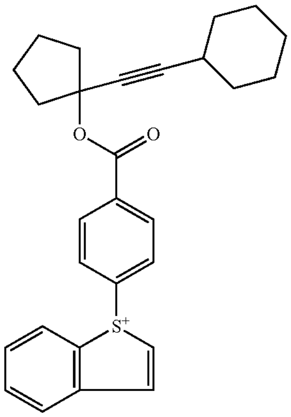
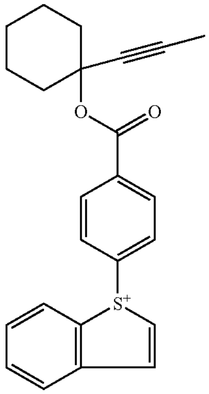
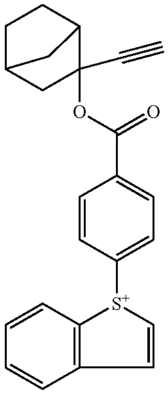

-continued
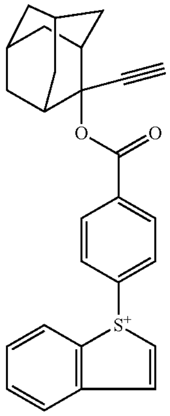
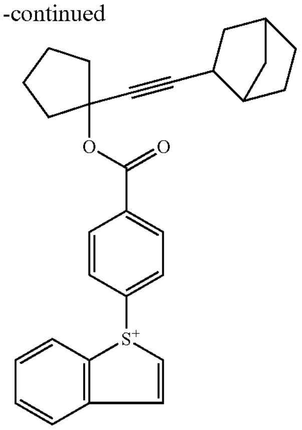
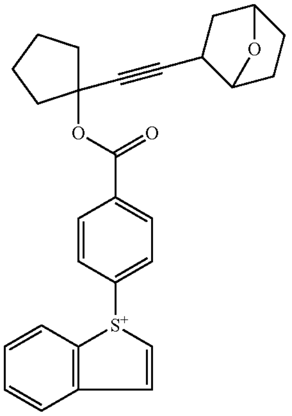
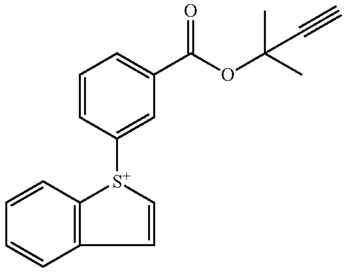
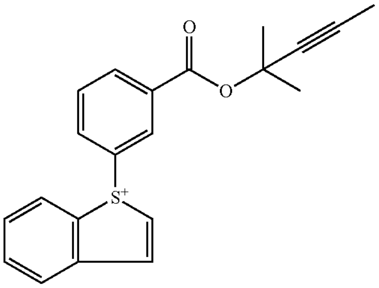
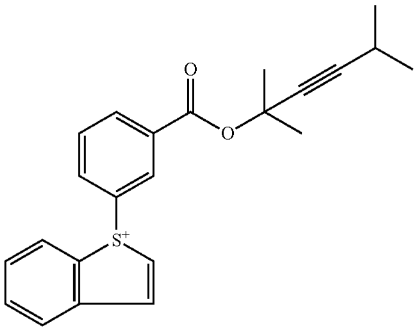
-continued
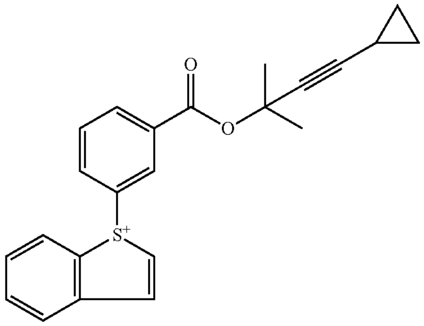
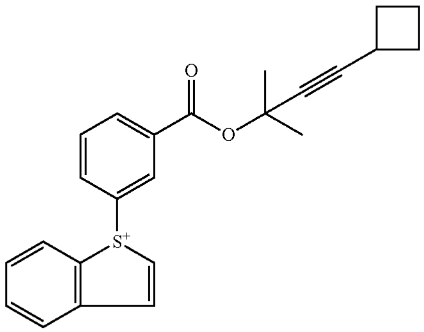
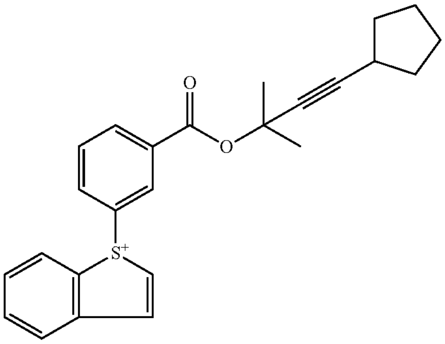
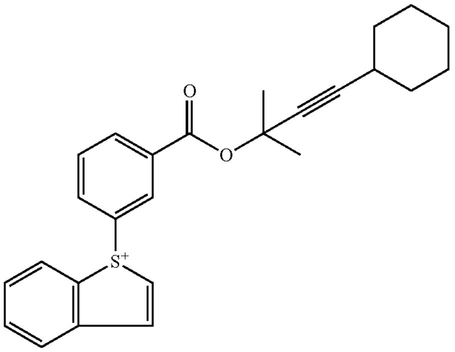
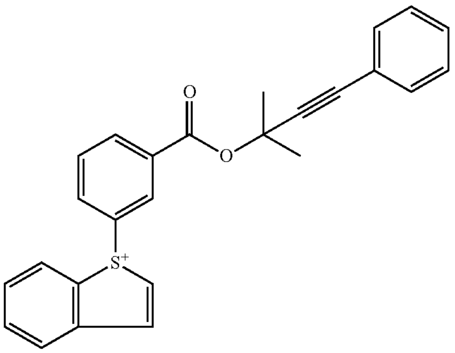

-continued
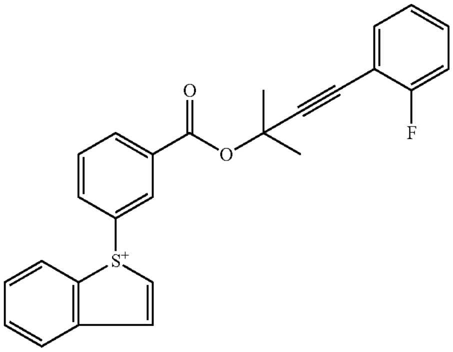
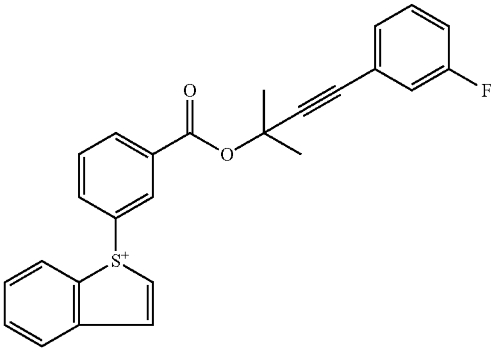
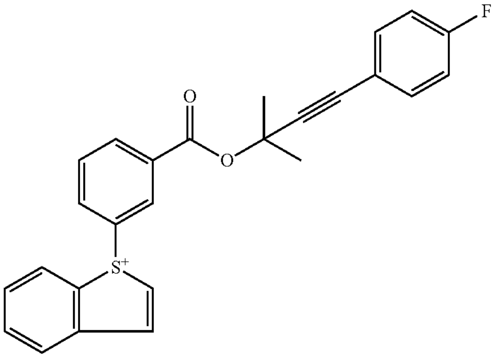
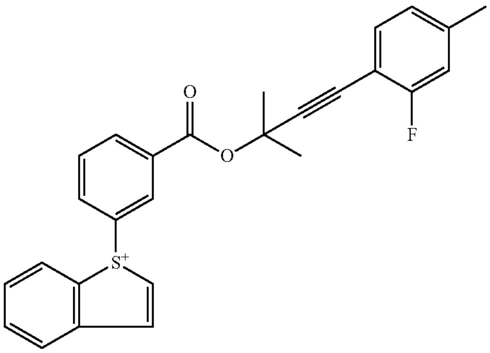
-continued
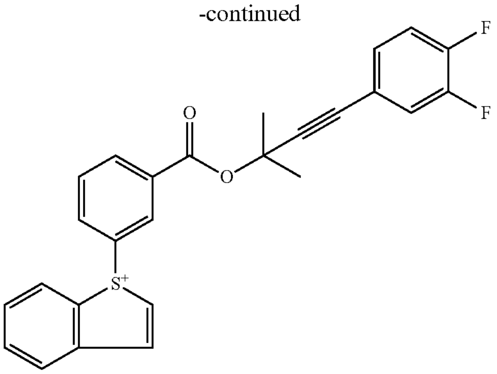
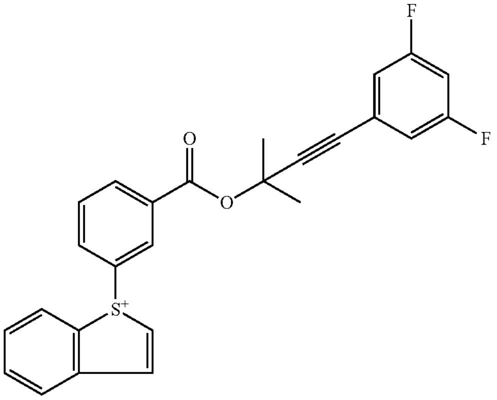
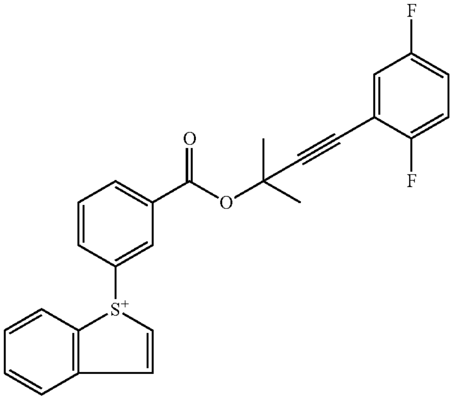
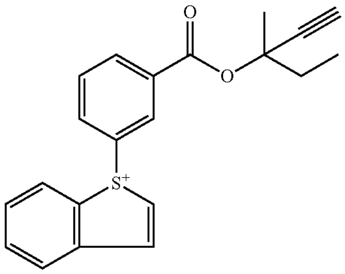
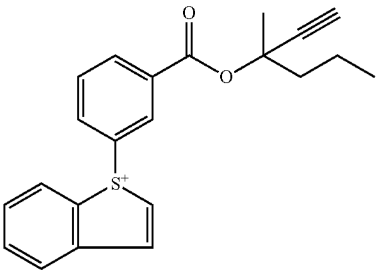

-continued
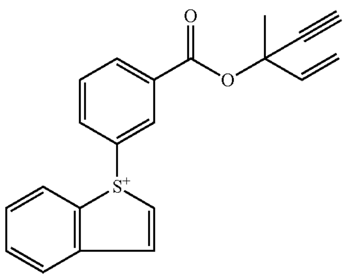
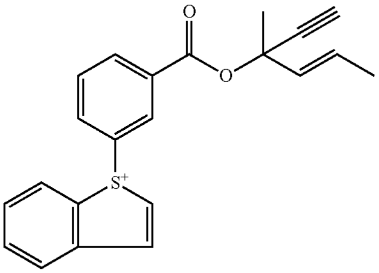
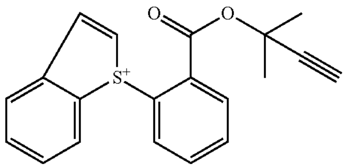
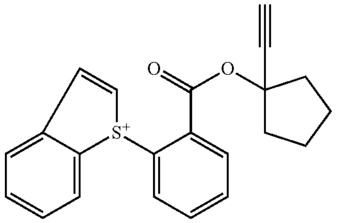
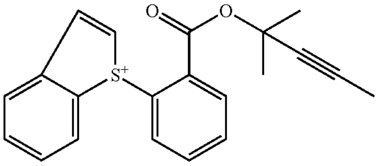
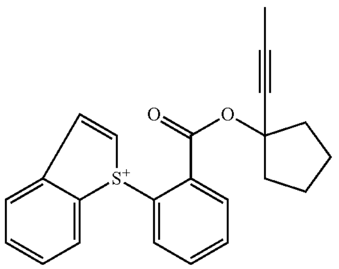
-continued
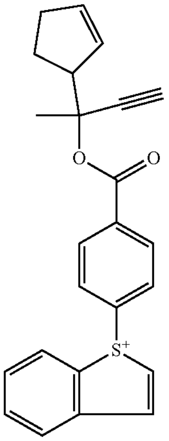
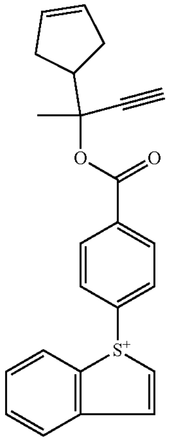
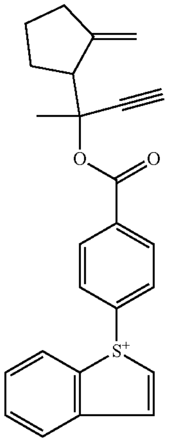
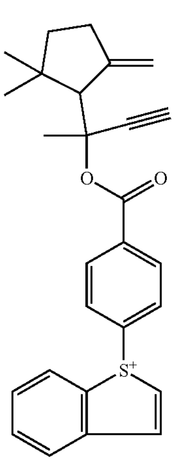
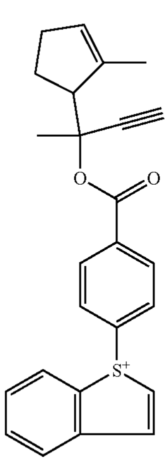
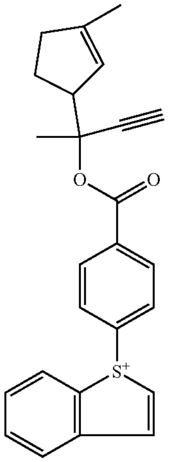
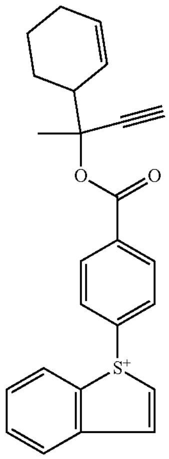
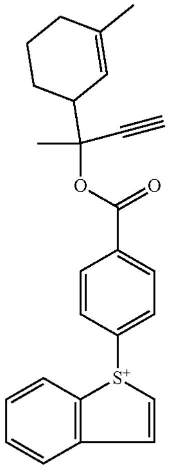
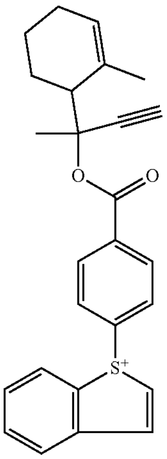

-continued
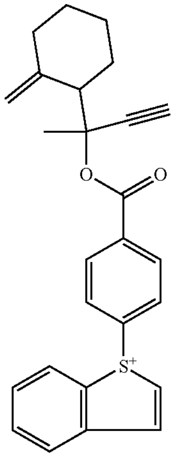
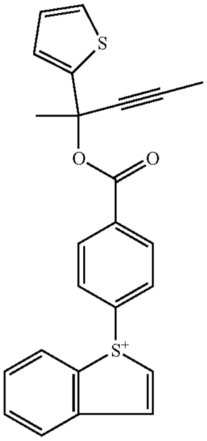
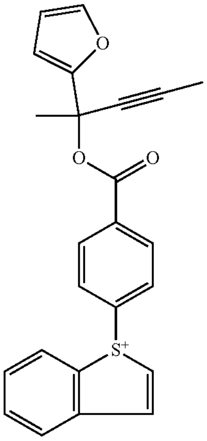
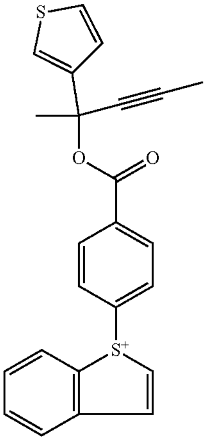
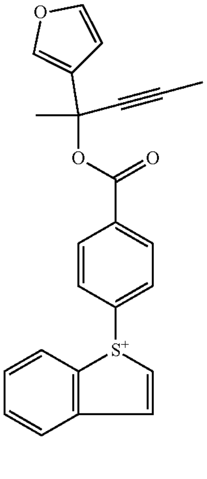
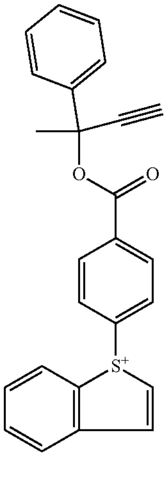
-continued
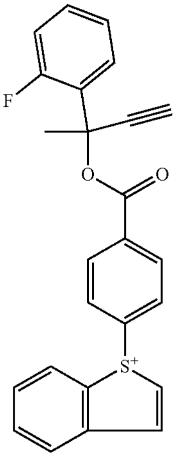
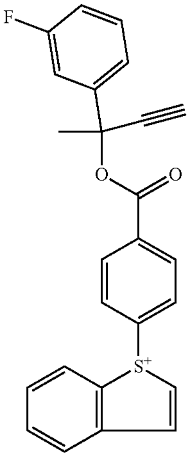
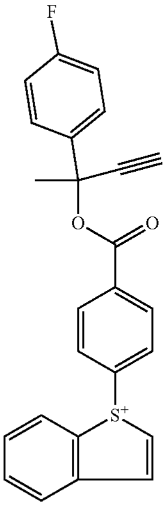
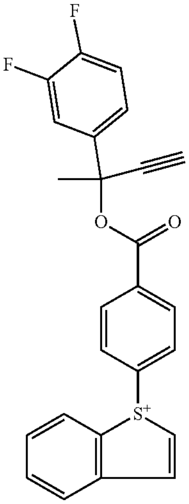
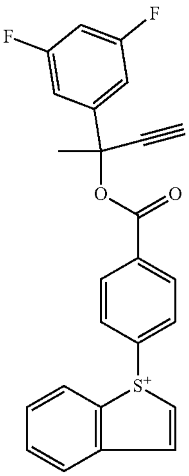
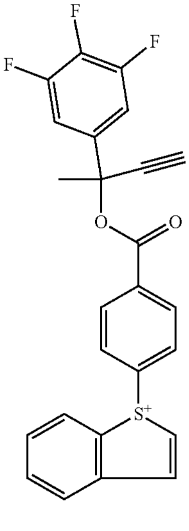
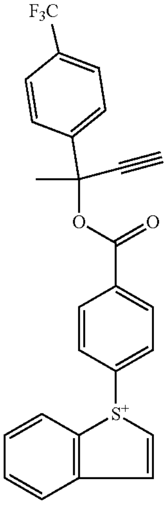

-continued
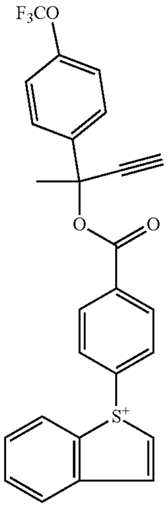
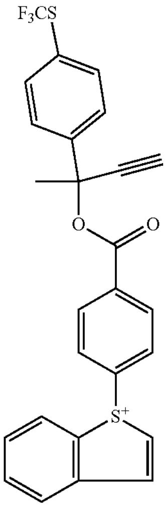
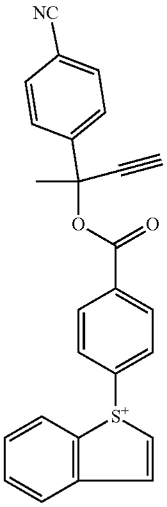
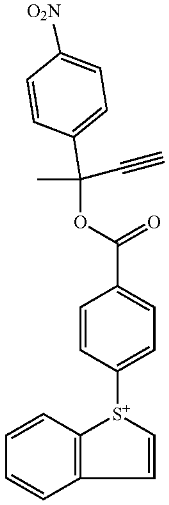
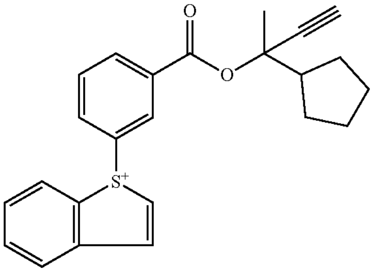
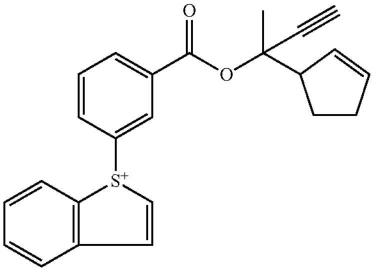
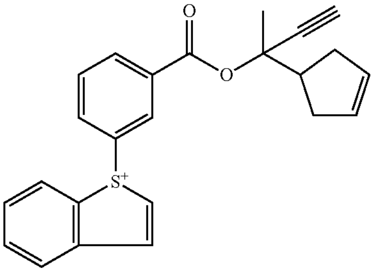
-continued
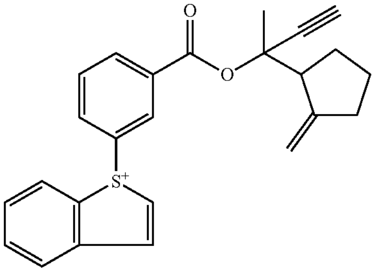
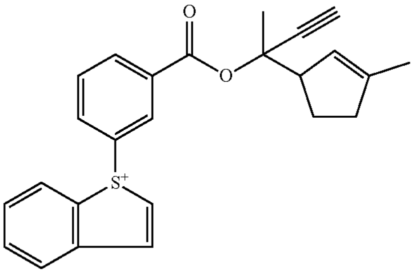
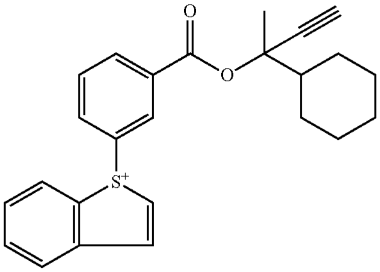
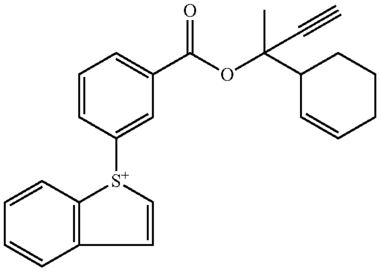
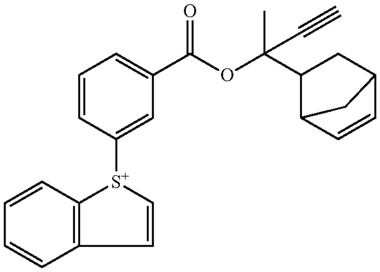
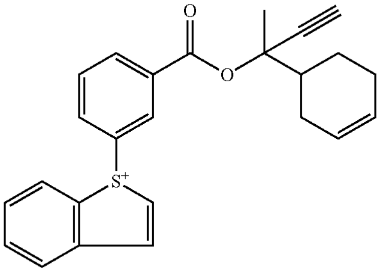

-continued
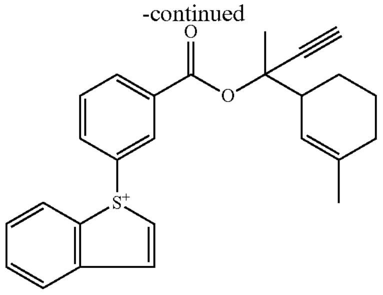
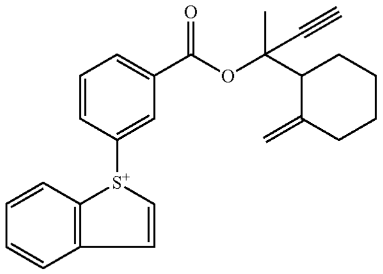
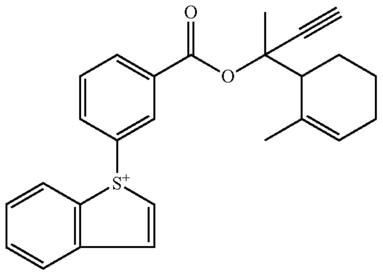
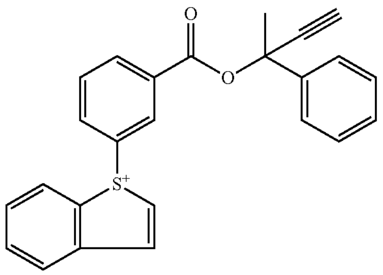
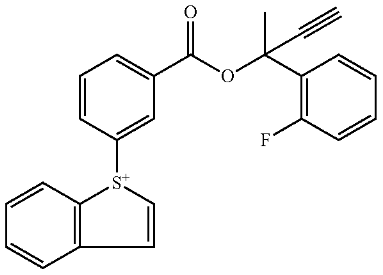
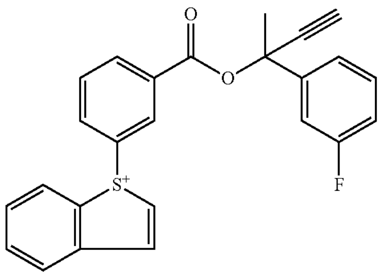
-continued
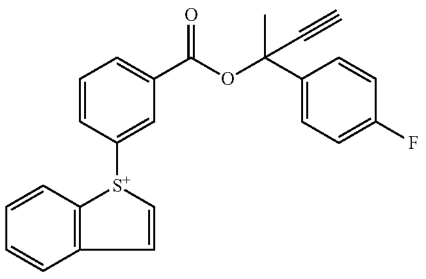
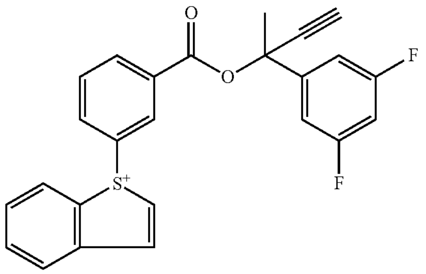
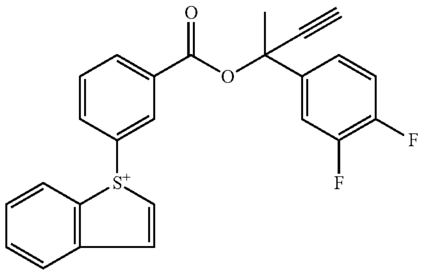
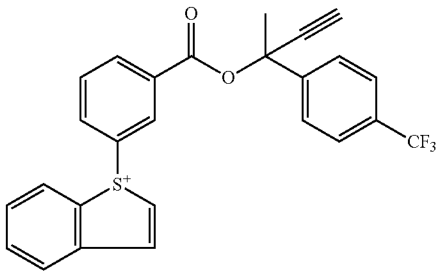
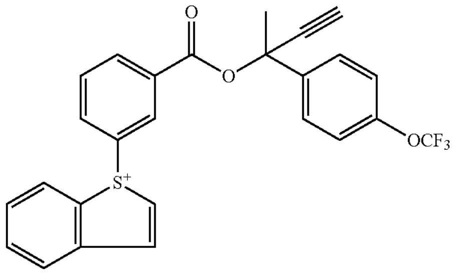
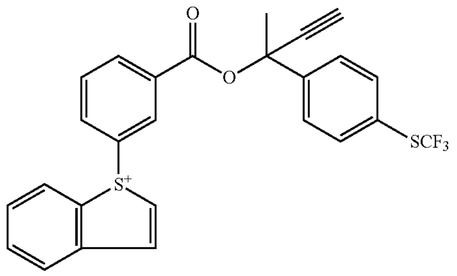

-continued
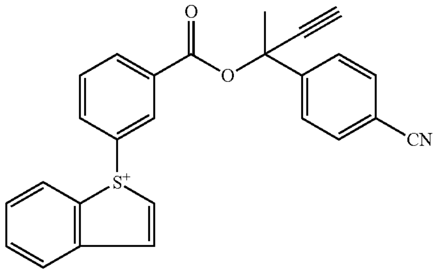
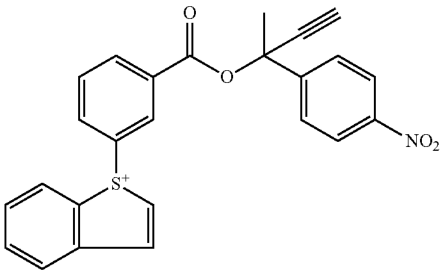
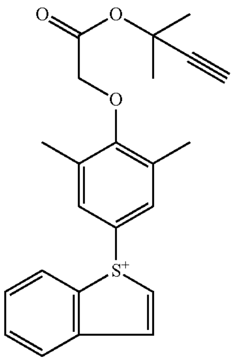
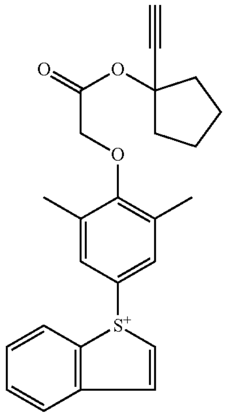
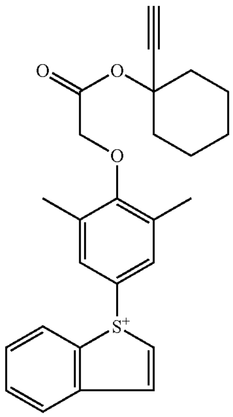
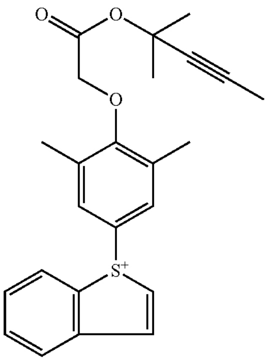
-continued
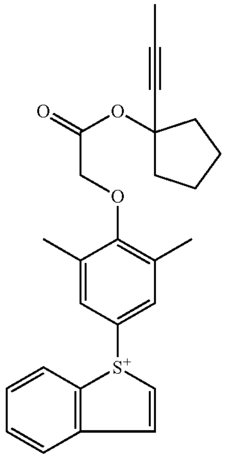
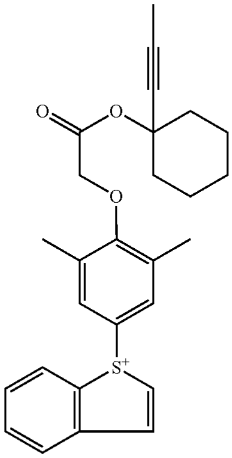
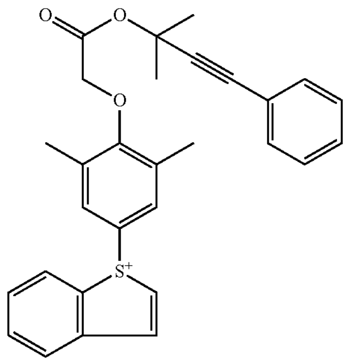
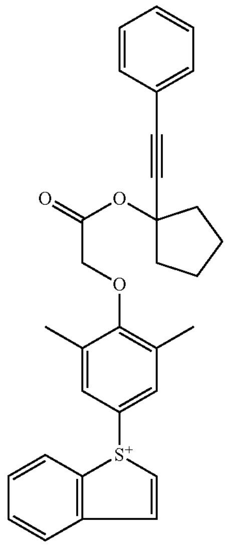
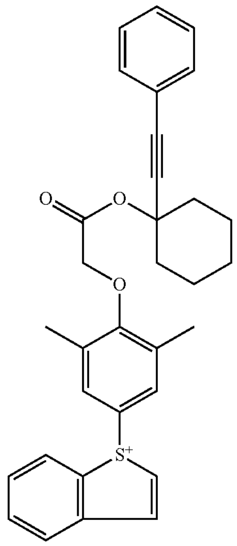
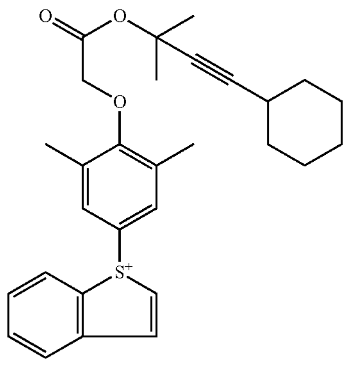

-continued
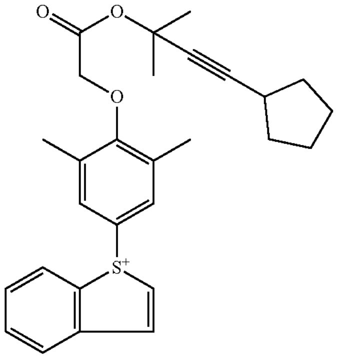
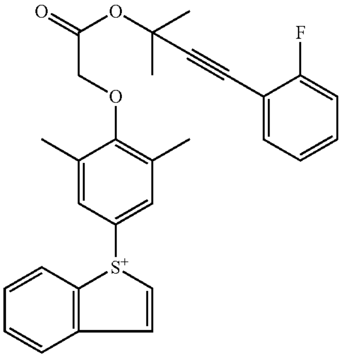
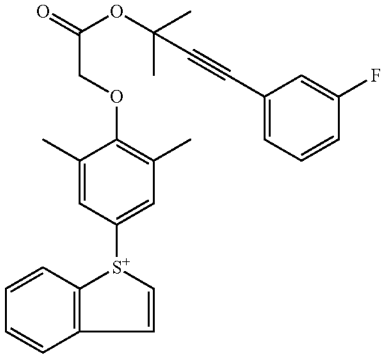
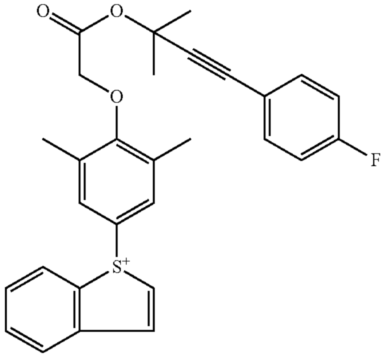
-continued
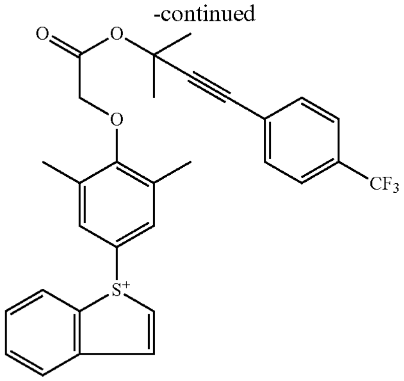
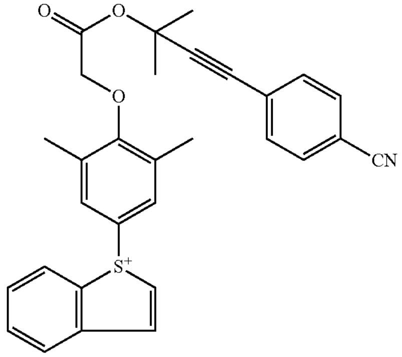
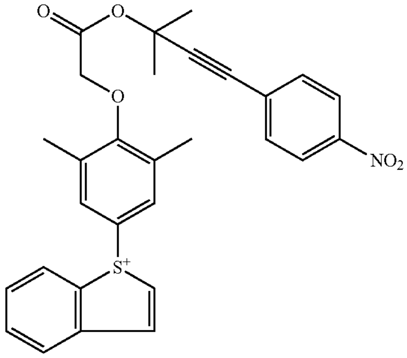
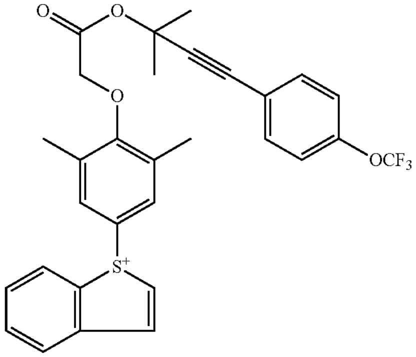

-continued
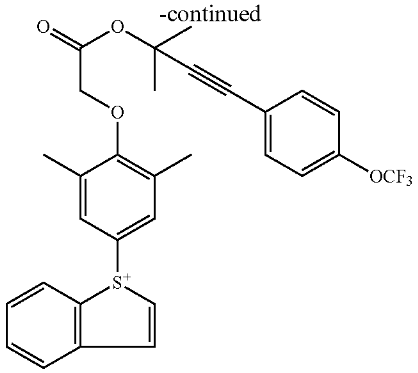
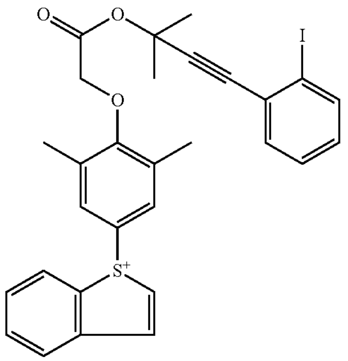
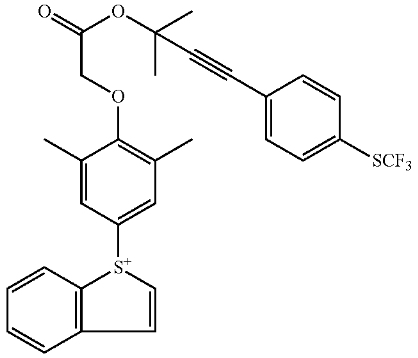
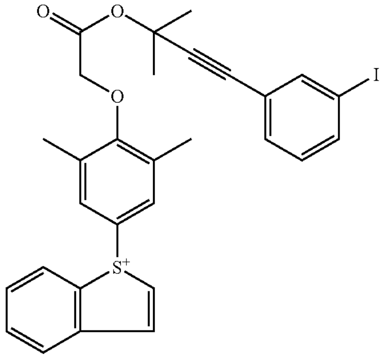
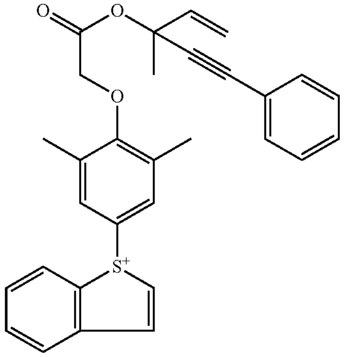
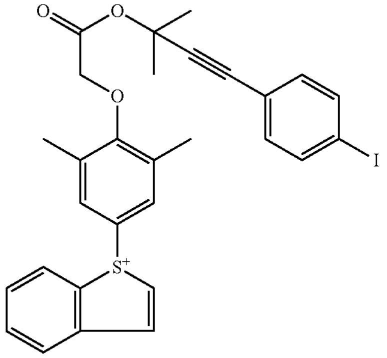
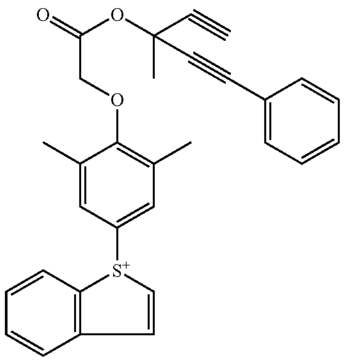
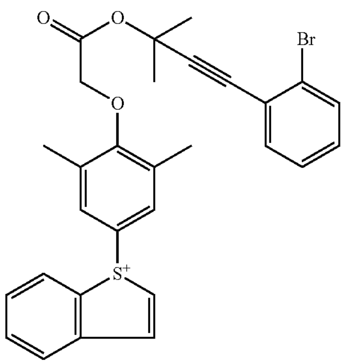

-continued
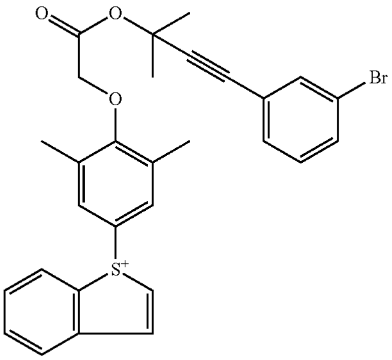
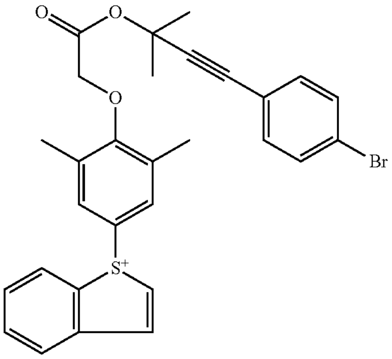
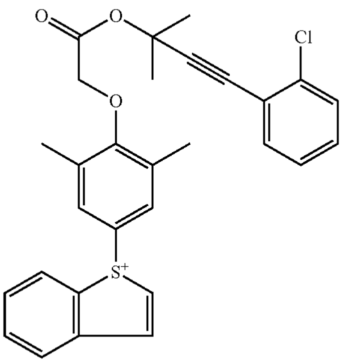
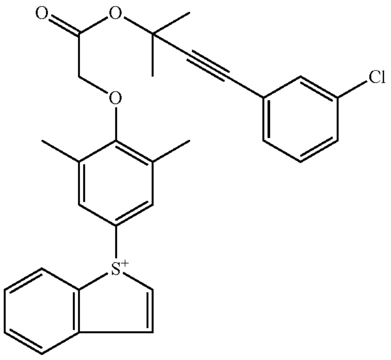
-continued
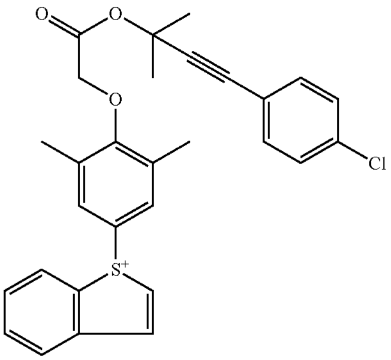
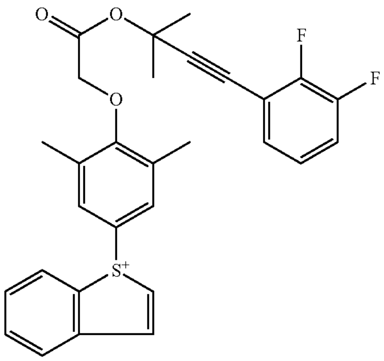
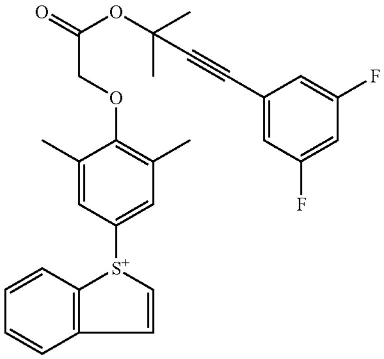
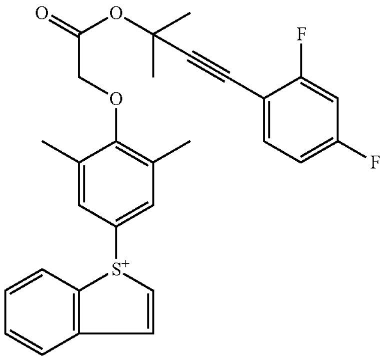

-continued
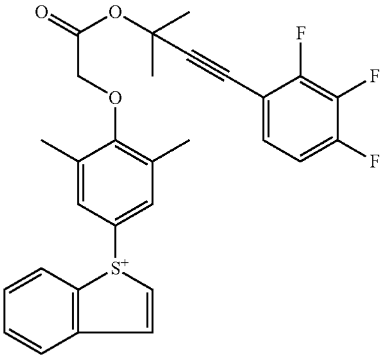
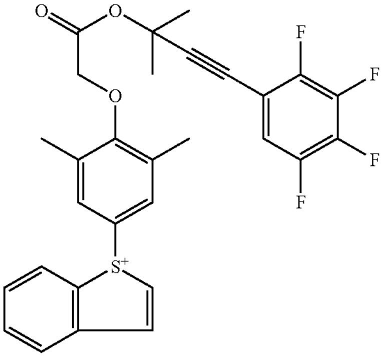
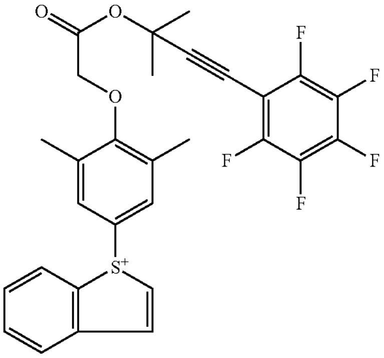
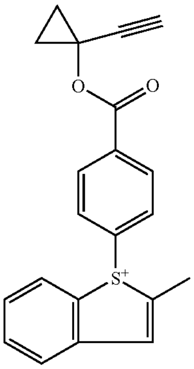
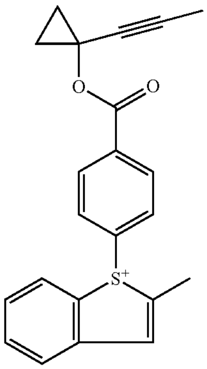
-continued
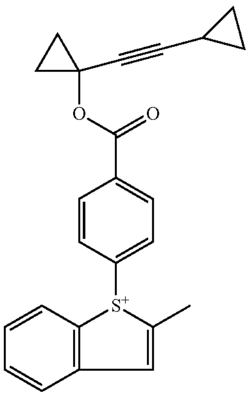
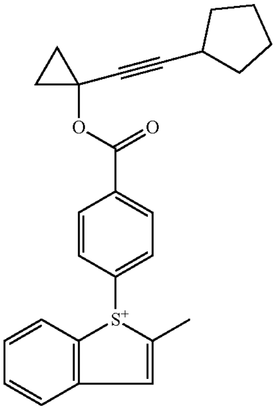
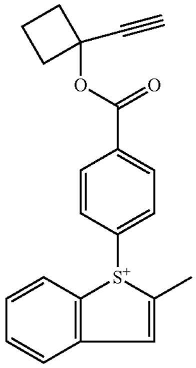
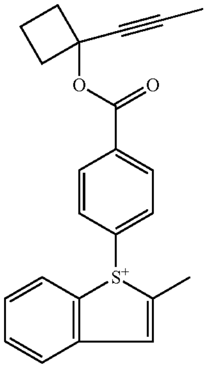
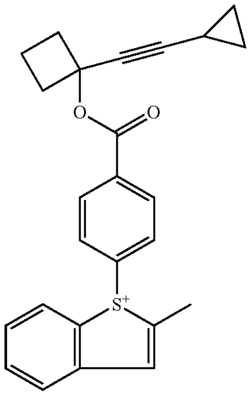
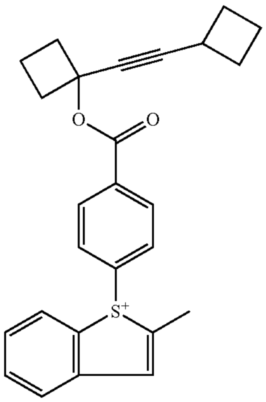
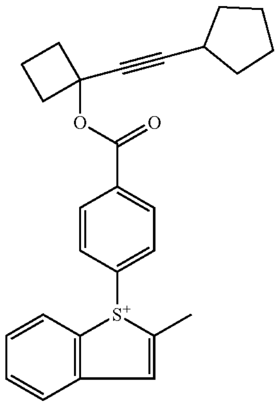
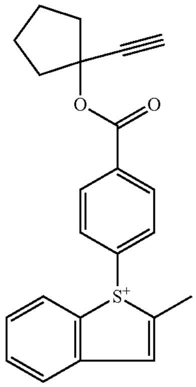

-continued
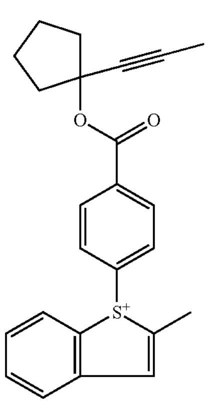
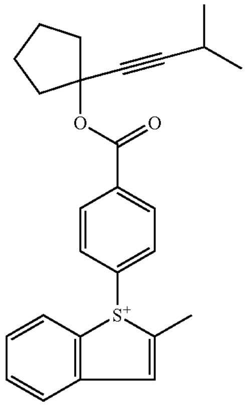
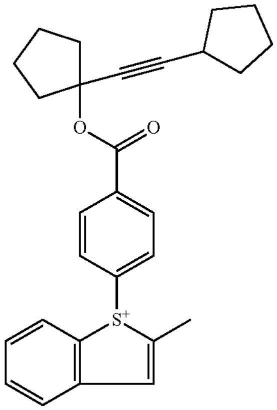
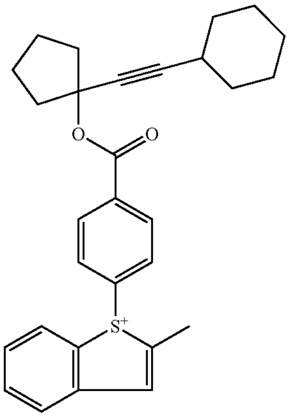
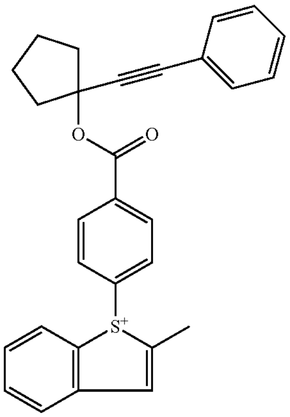
-continued
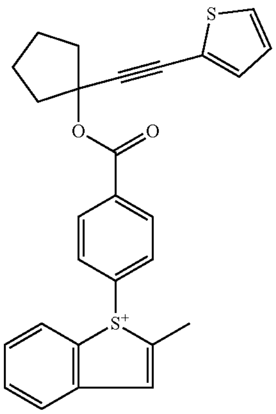
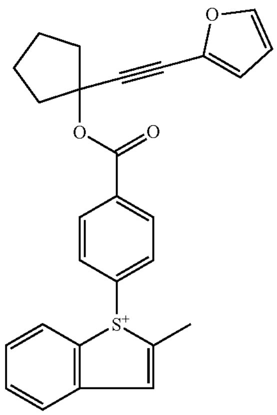
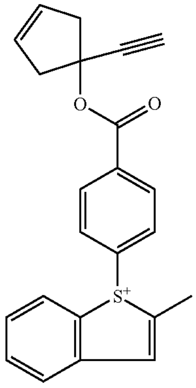
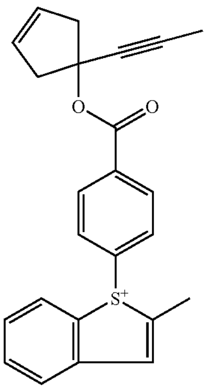
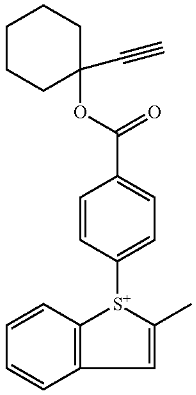
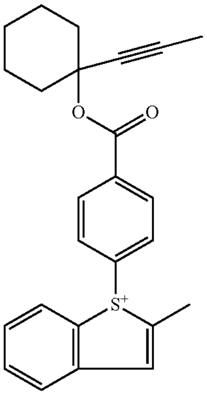
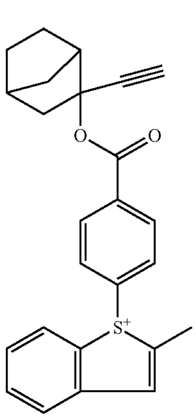
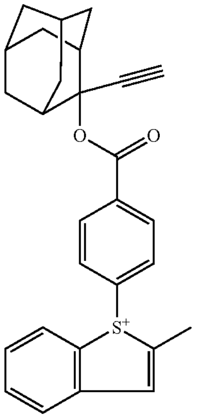

-continued
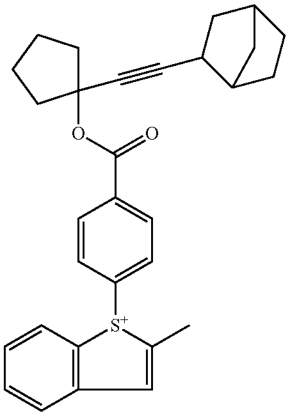
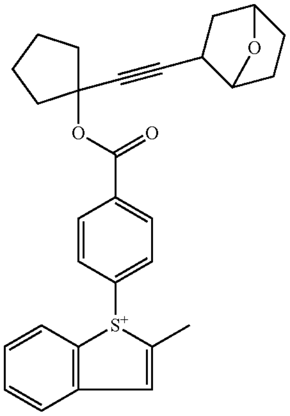
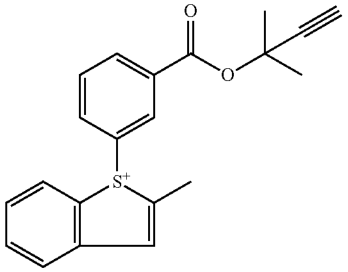
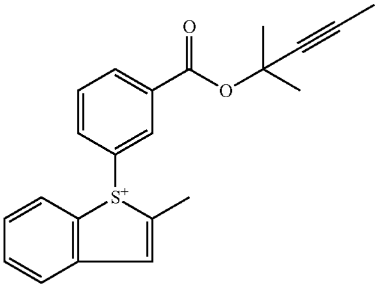
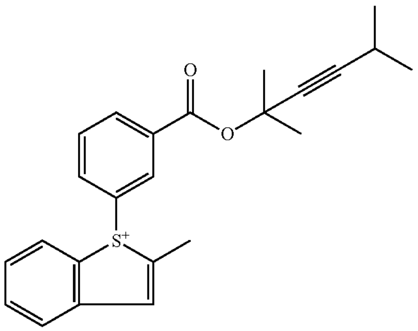
-continued
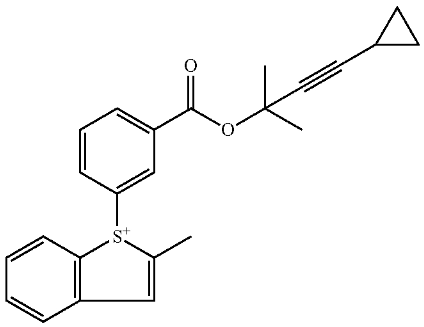
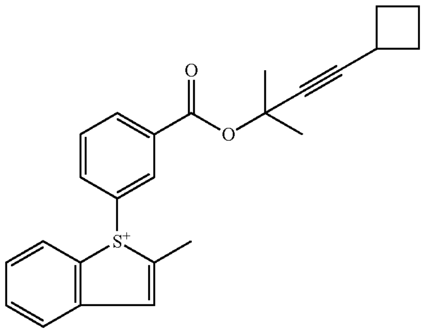
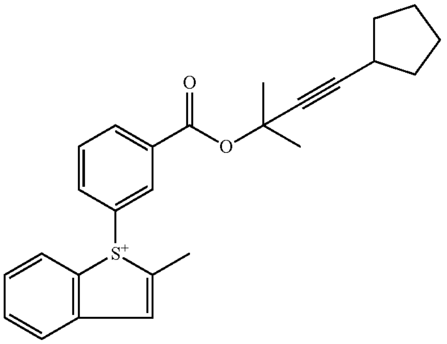
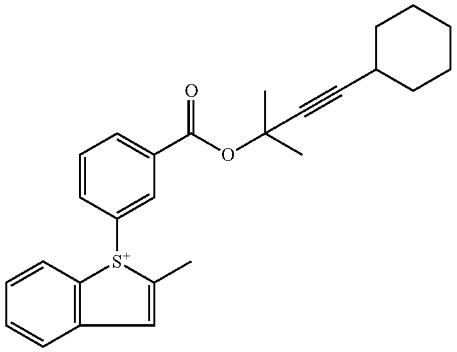
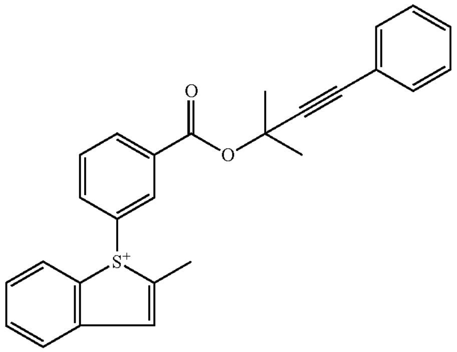

-continued
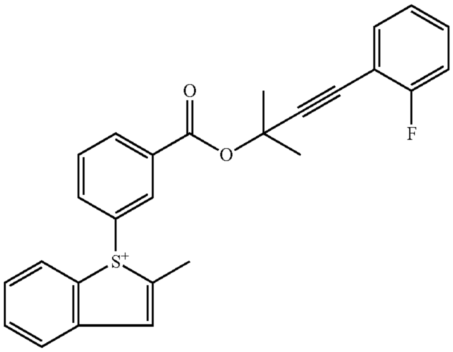
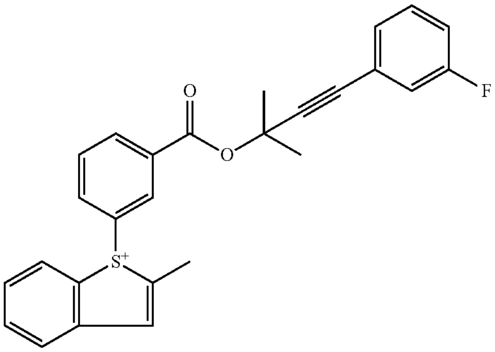
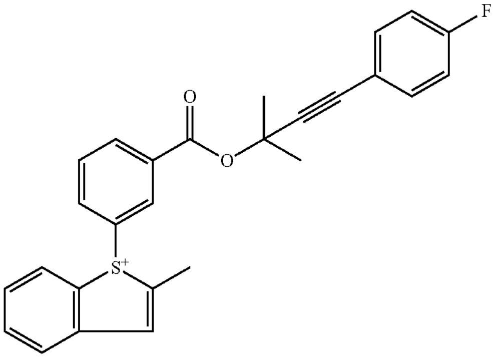
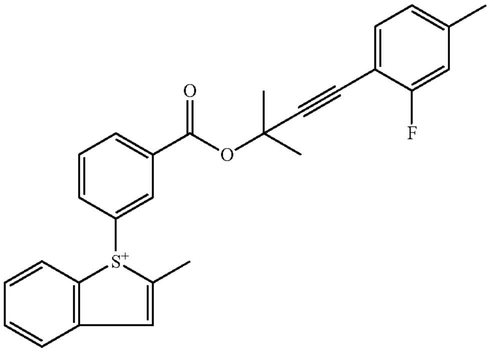
-continued
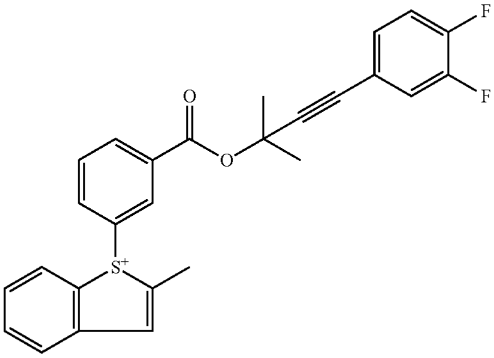
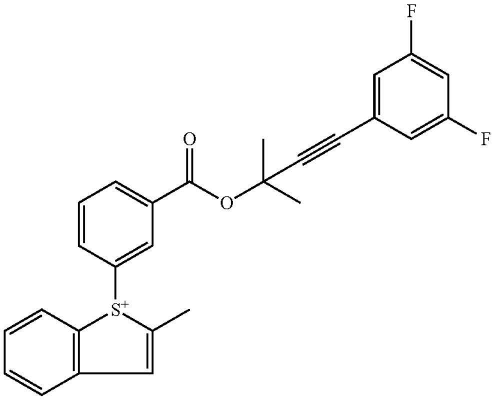
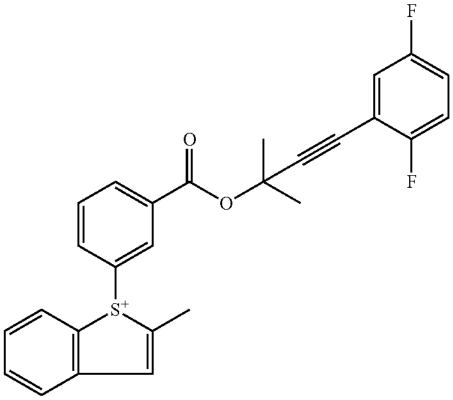
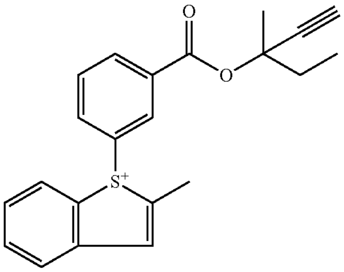
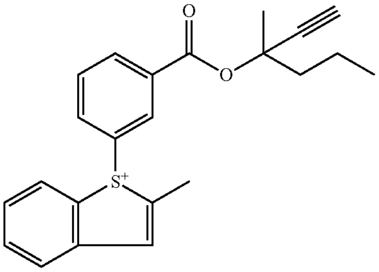

-continued
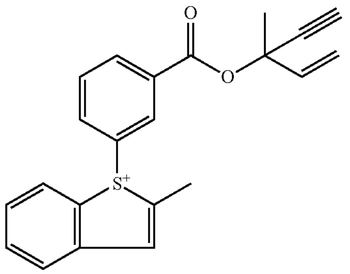
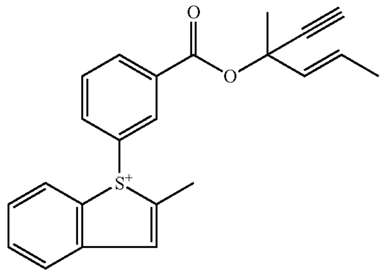
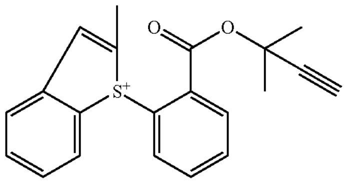
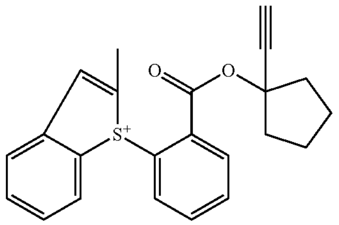
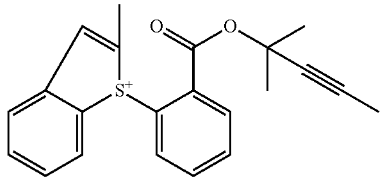
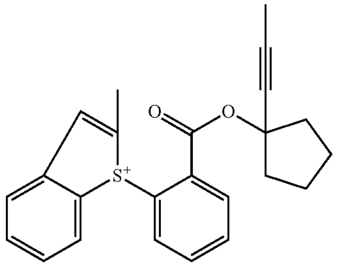
-continued
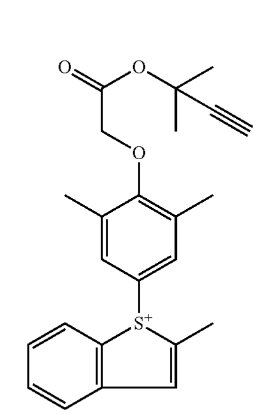
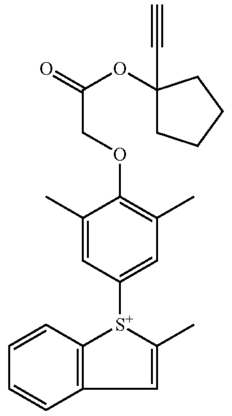
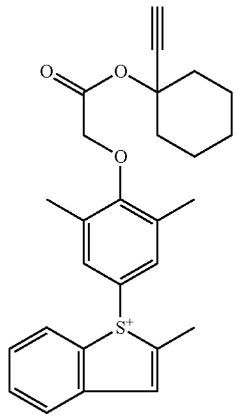
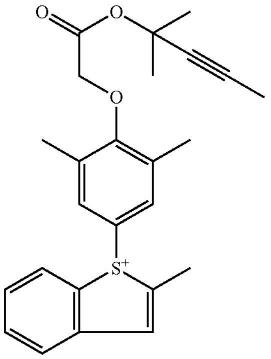
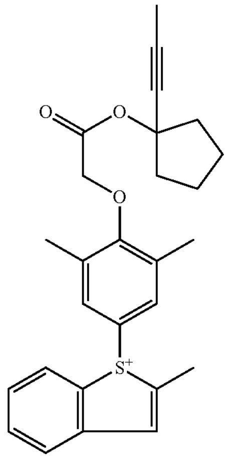
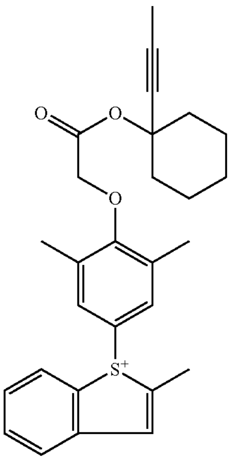
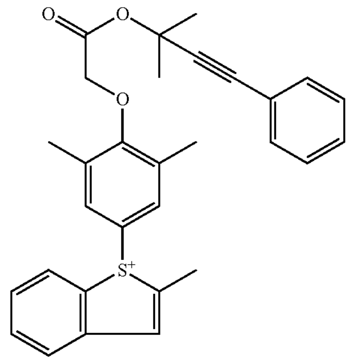

-continued
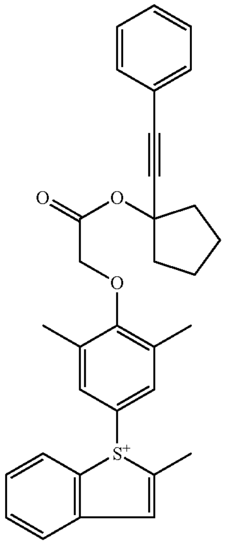
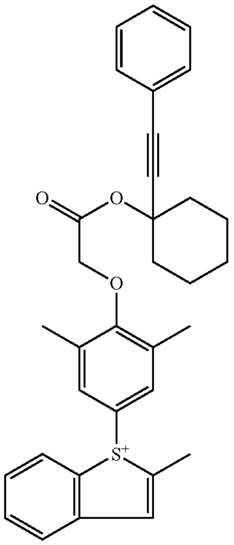
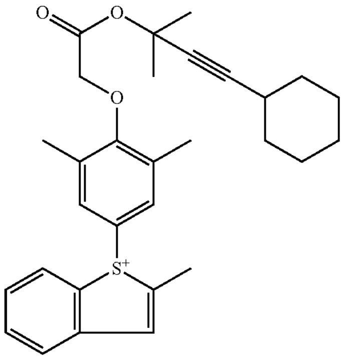
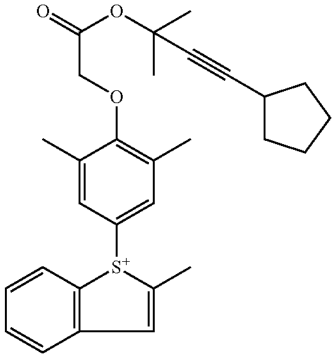
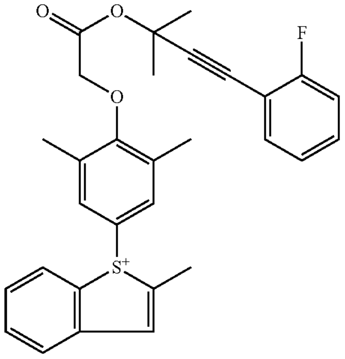
-continued
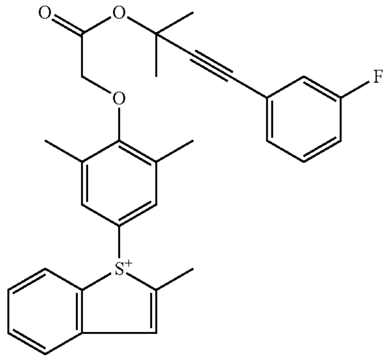
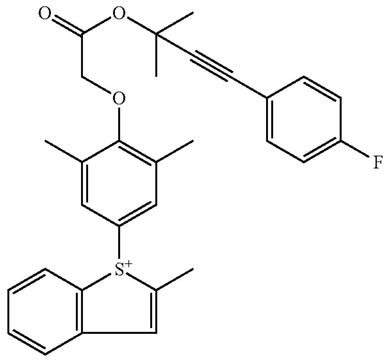
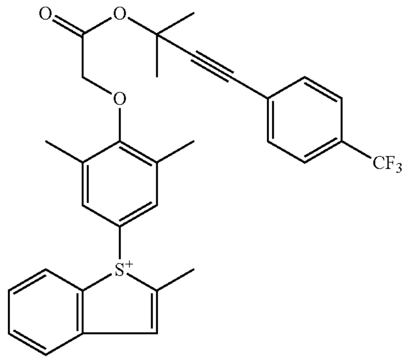
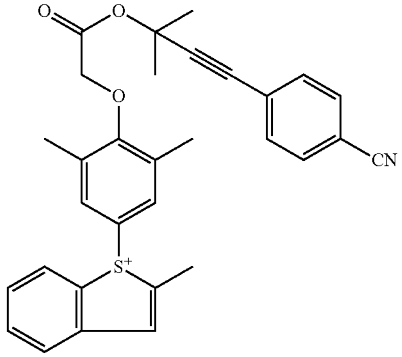

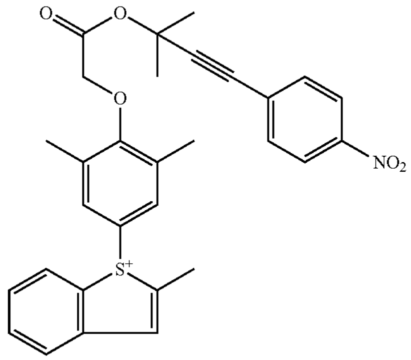
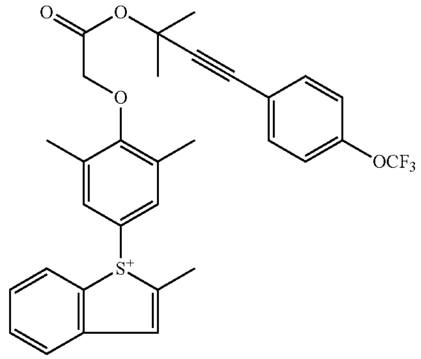
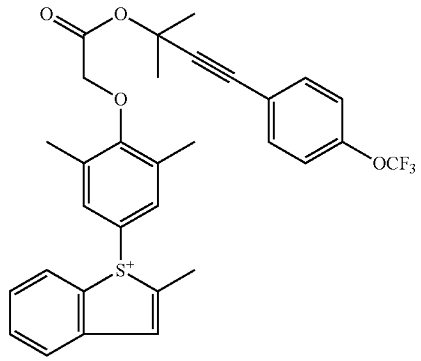
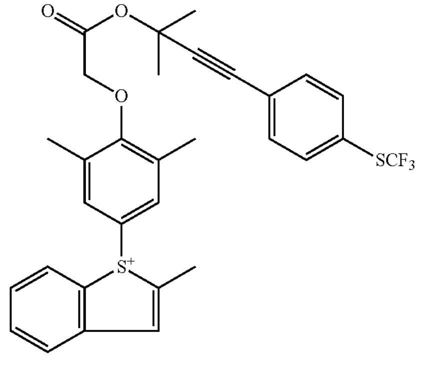
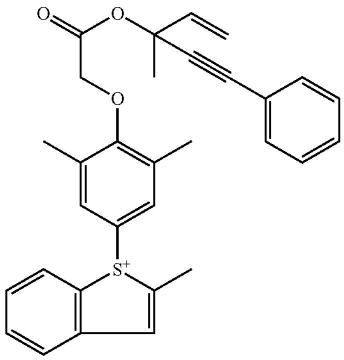
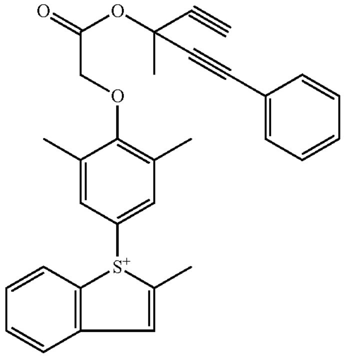
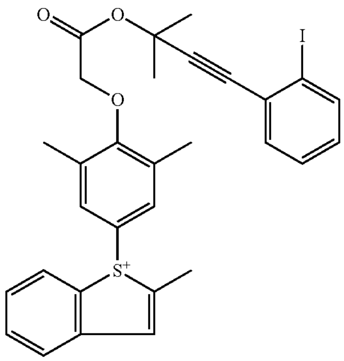
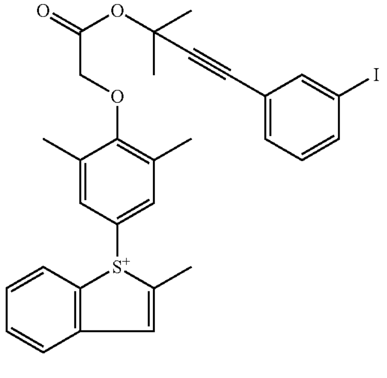

-continued
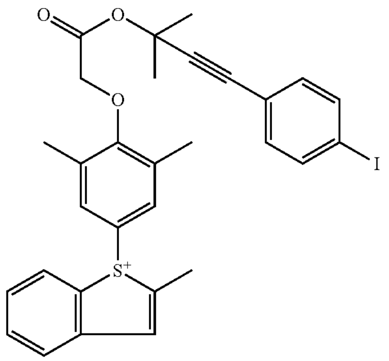
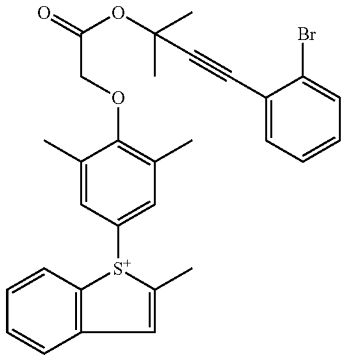
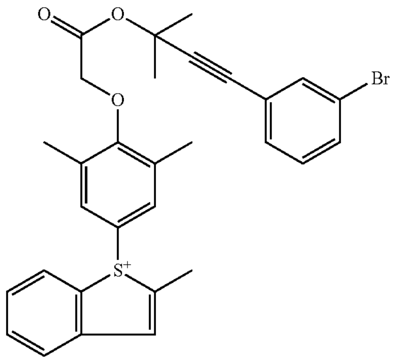
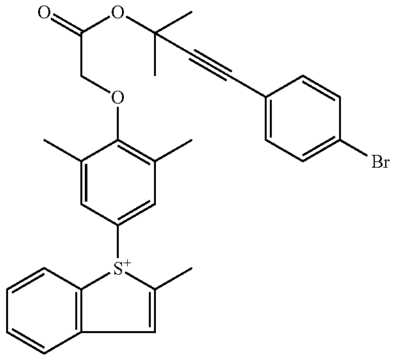
-continued
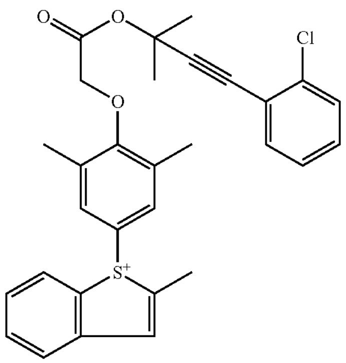
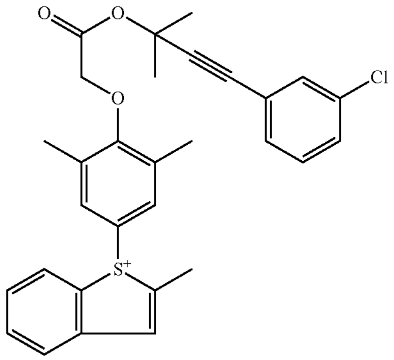
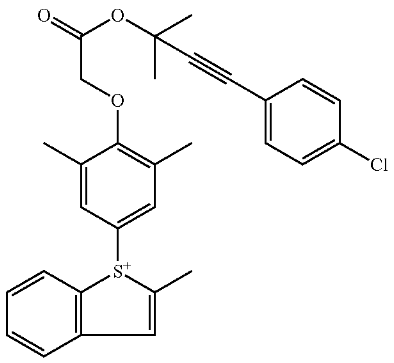
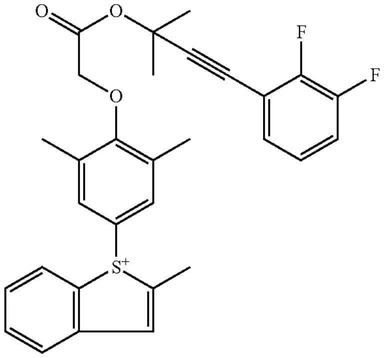

-continued
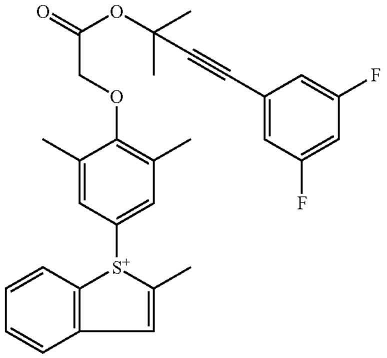
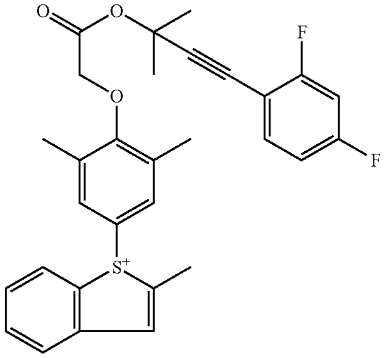
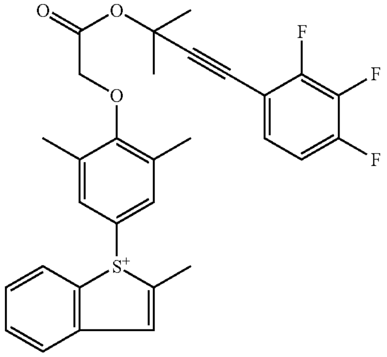
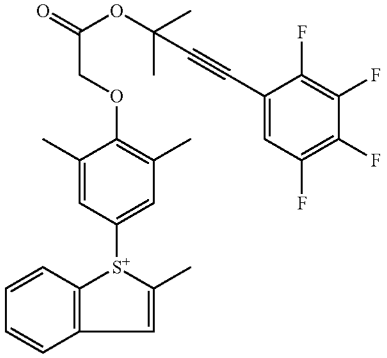
-continued
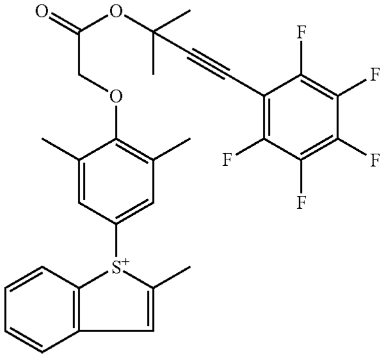
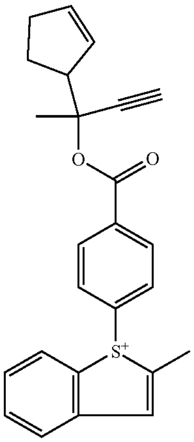
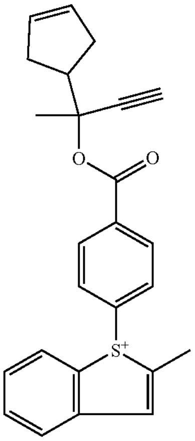
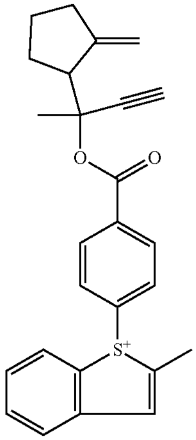
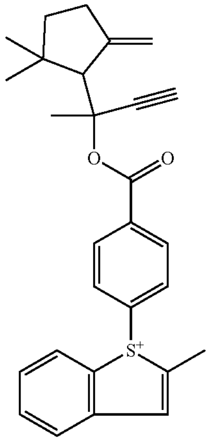
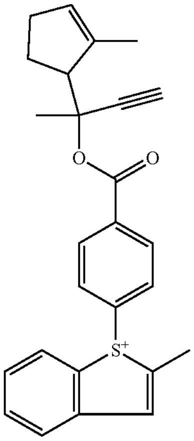
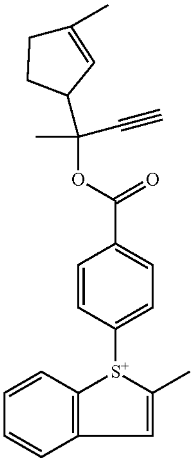

-continued
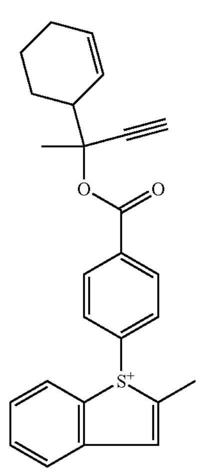
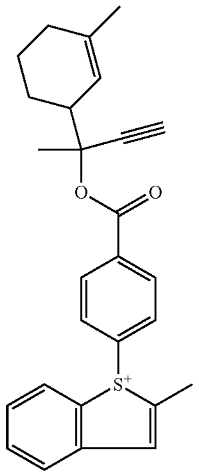
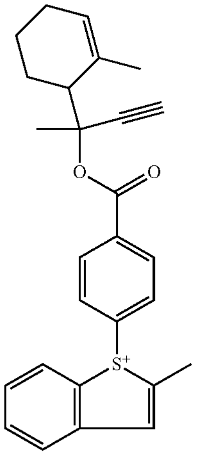
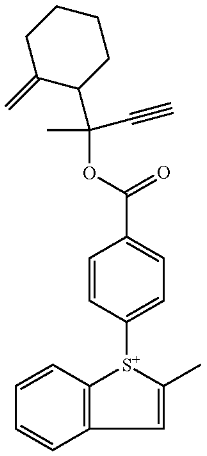
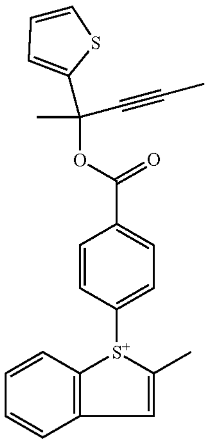
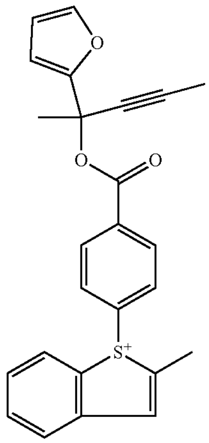
-continued
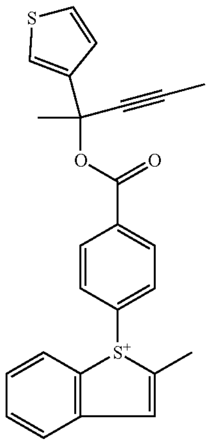
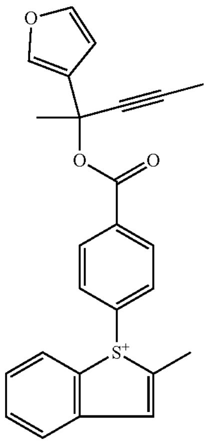
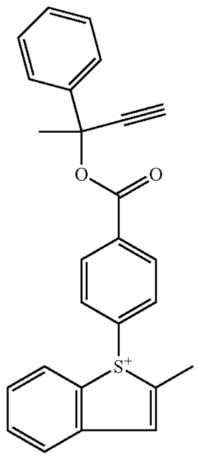
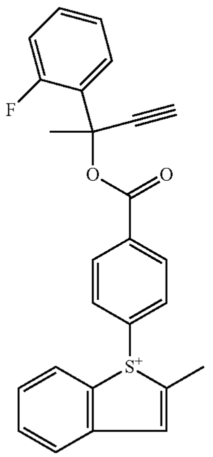
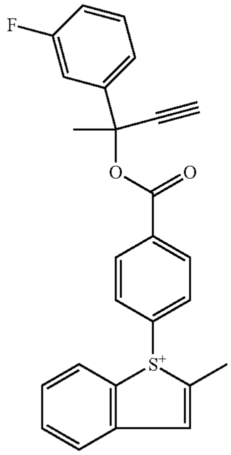
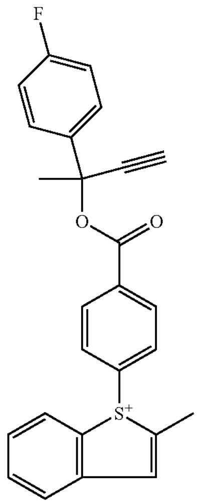

-continued
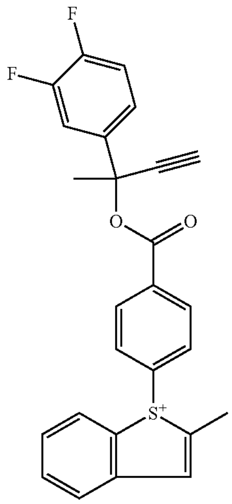
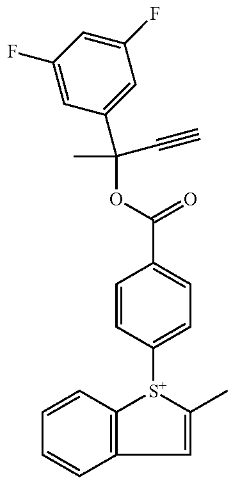
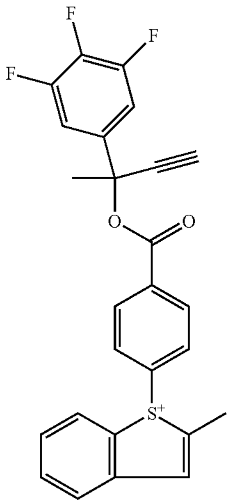
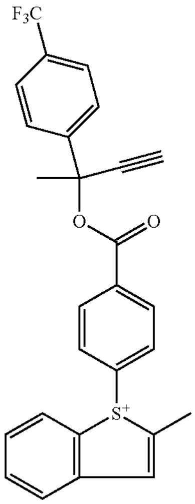
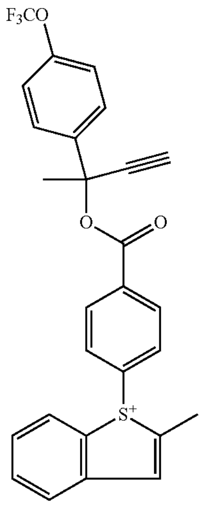
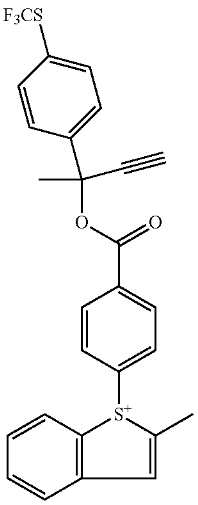
-continued
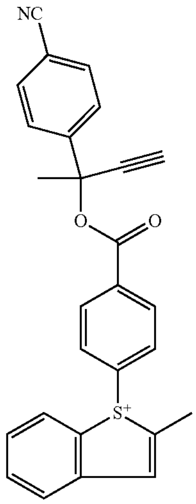
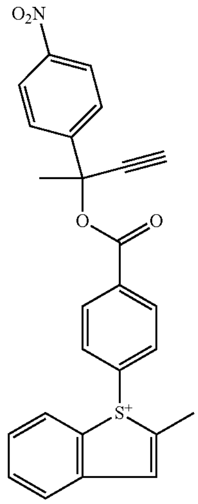
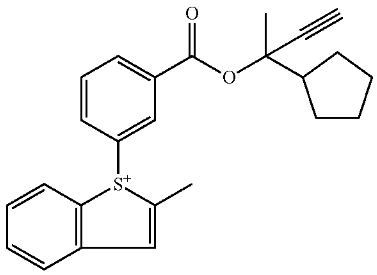
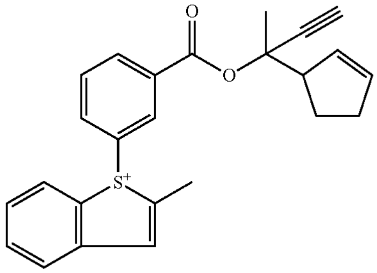
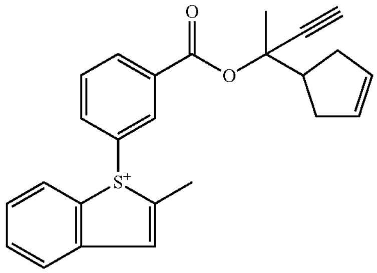
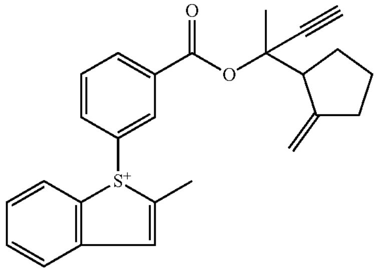

-continued
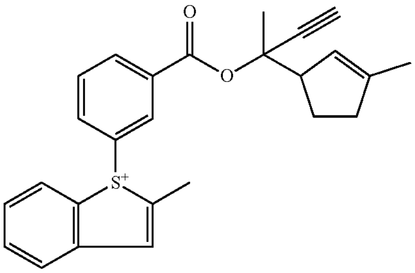
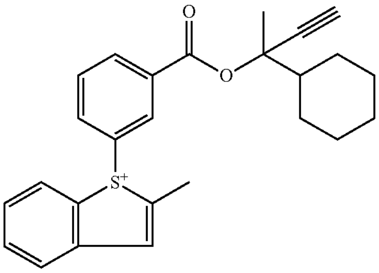
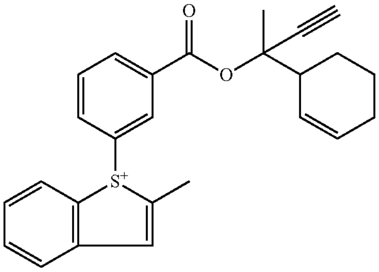
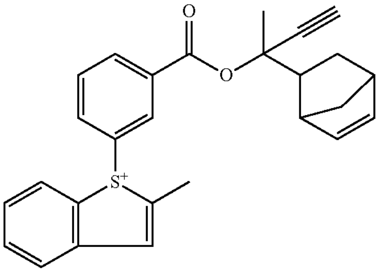
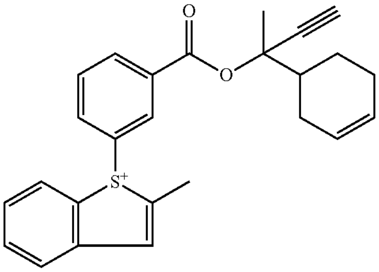
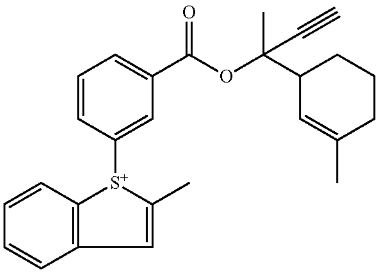
-continued
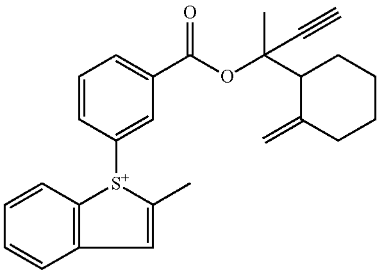
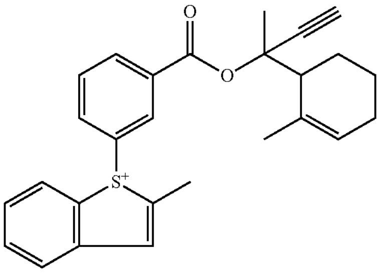
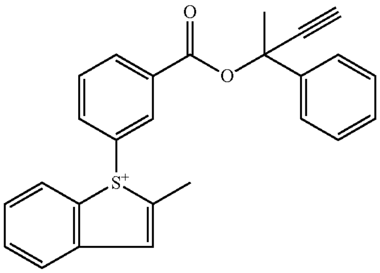
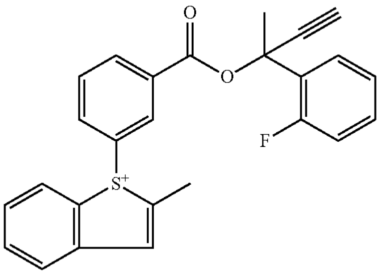
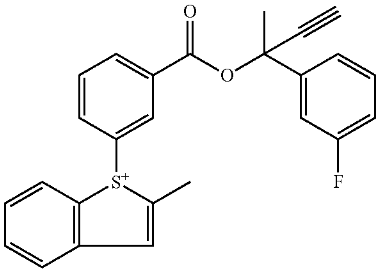
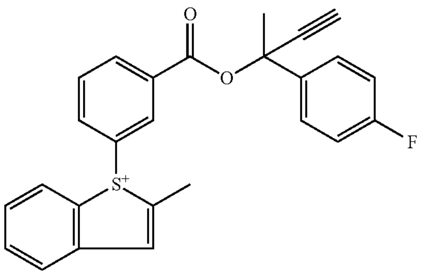

-continued
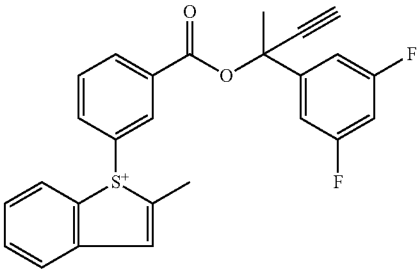
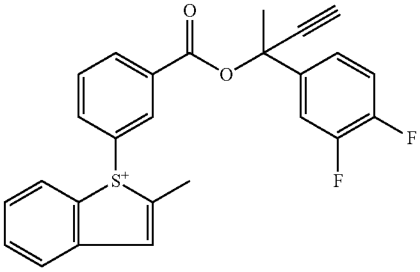
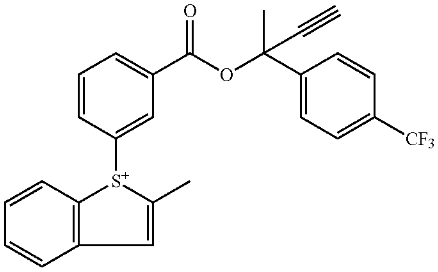
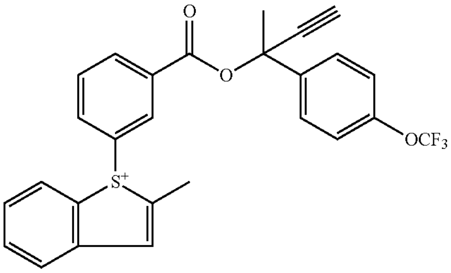
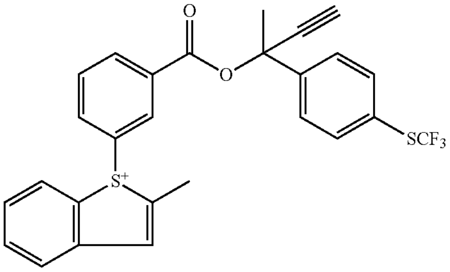
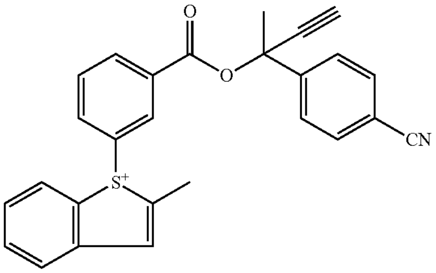
-continued
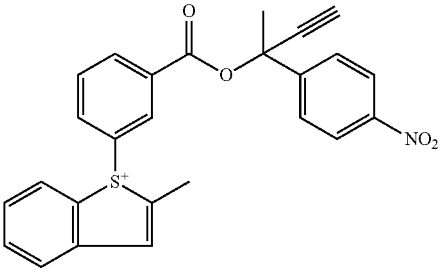
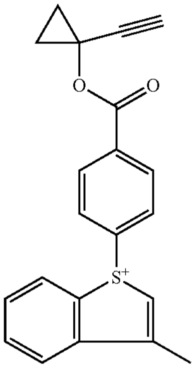
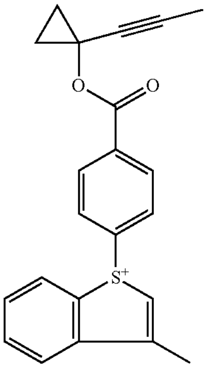
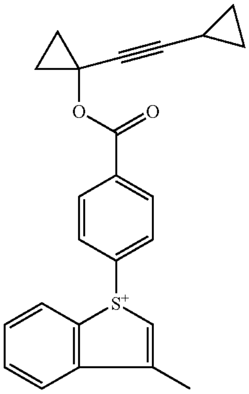
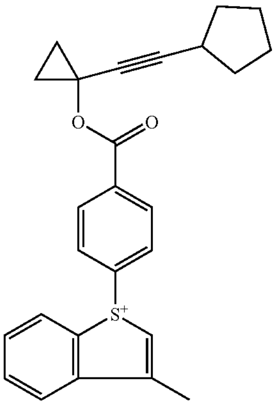
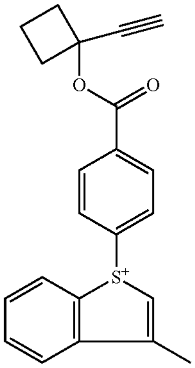
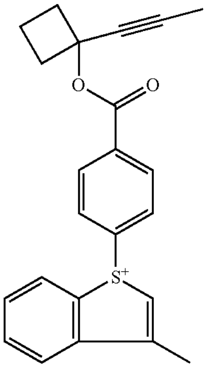

-continued
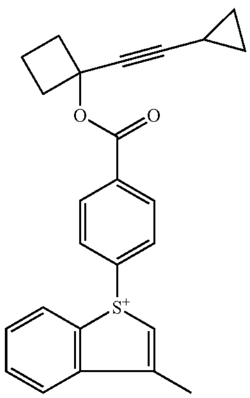
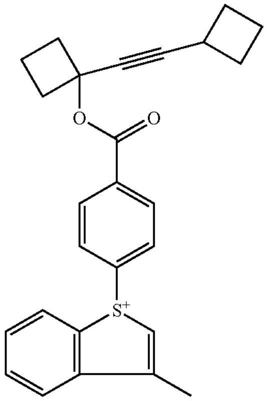
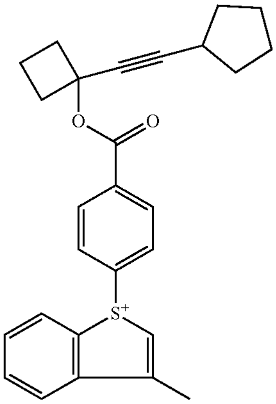
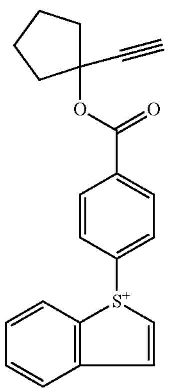
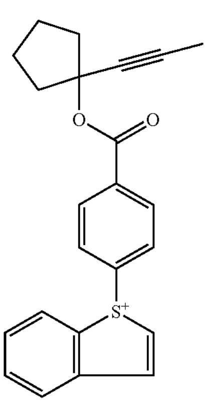
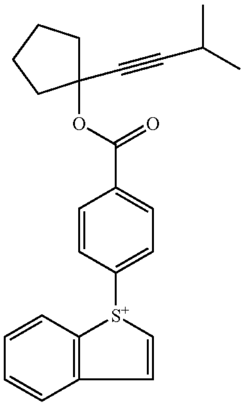
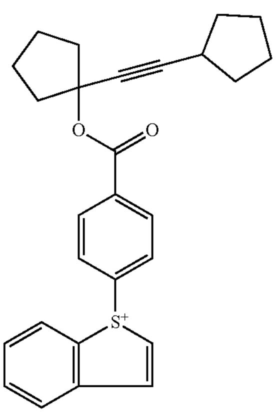
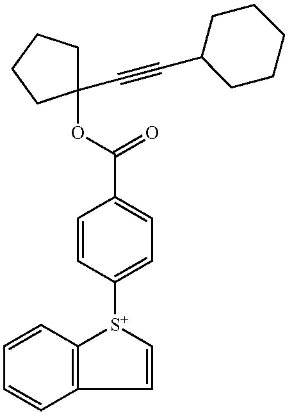
-continued
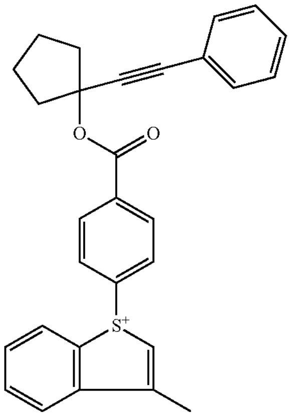
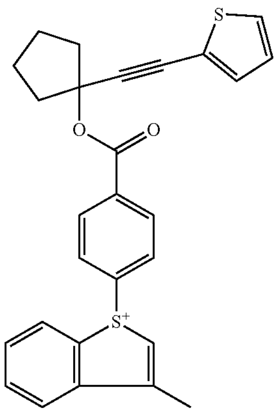
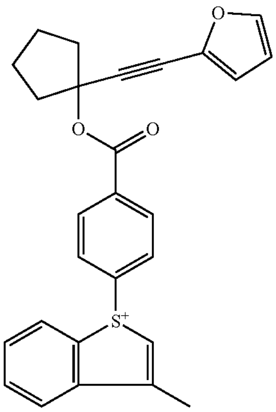
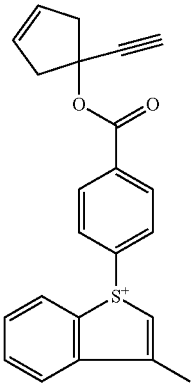
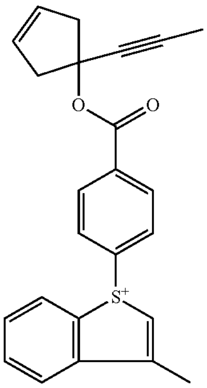
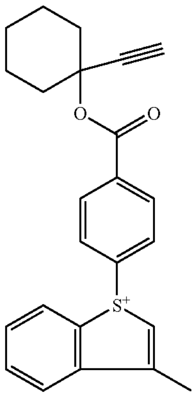
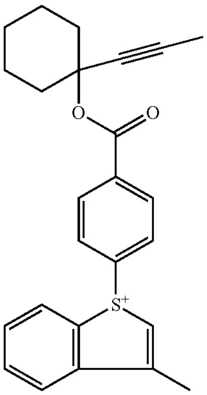
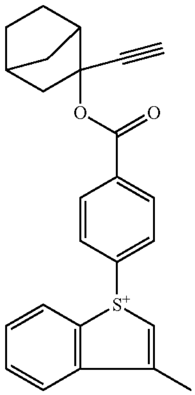

-continued
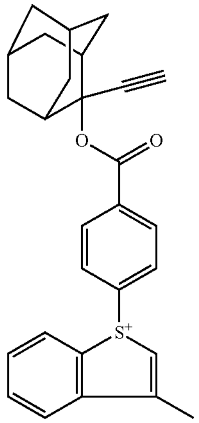
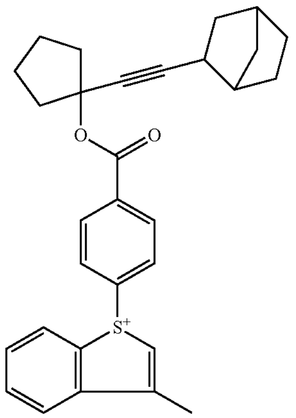
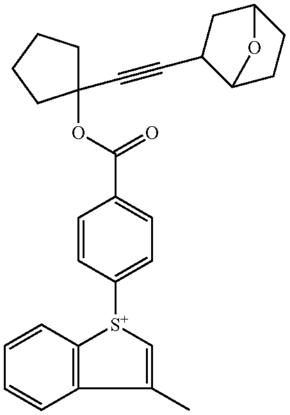
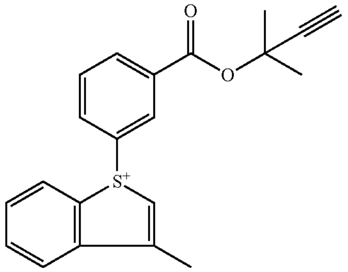
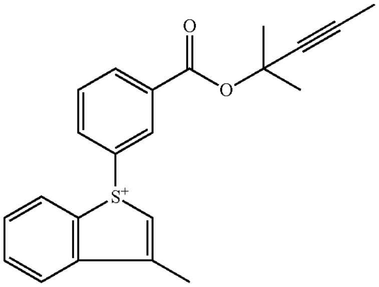
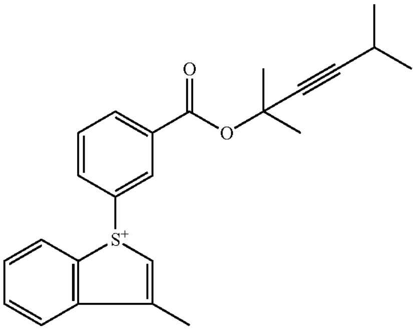
-continued
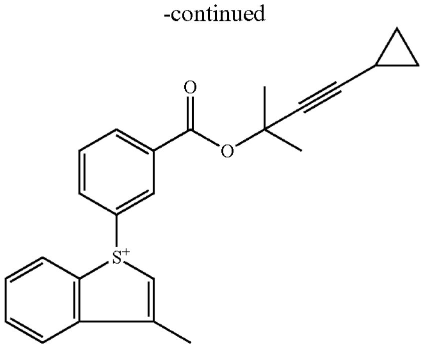
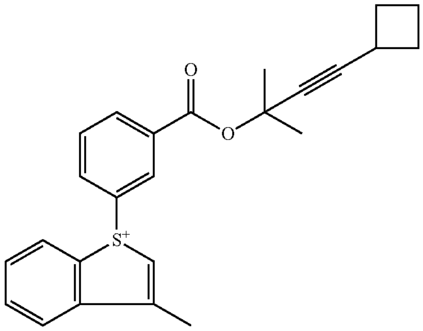
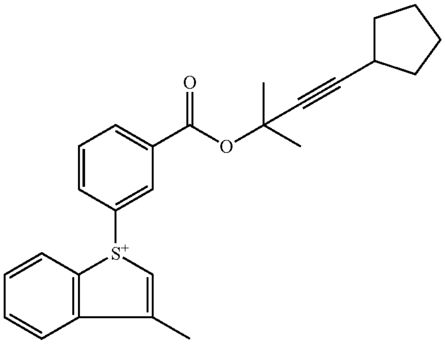
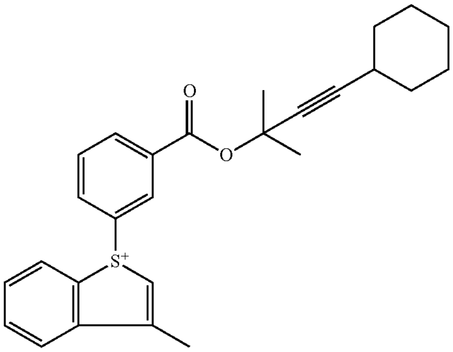
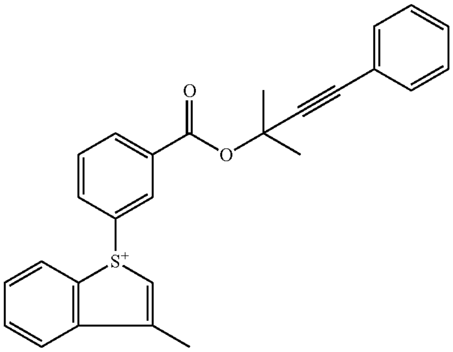

-continued
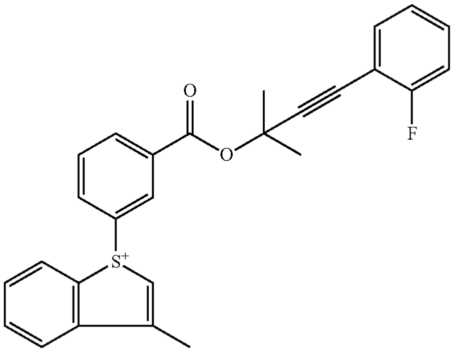
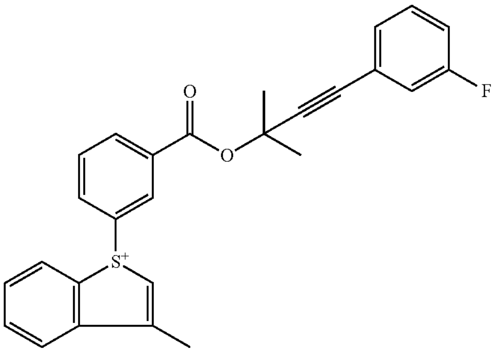
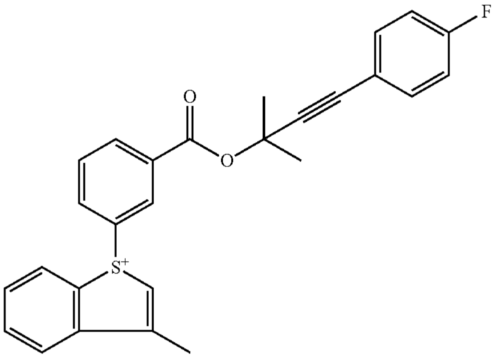
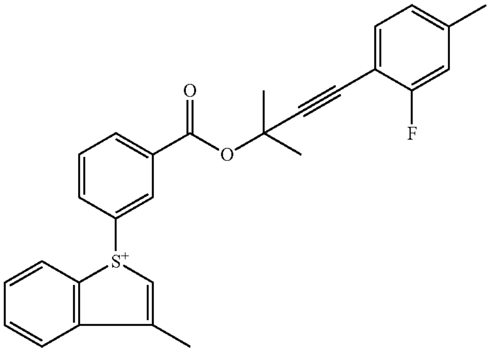
-continued
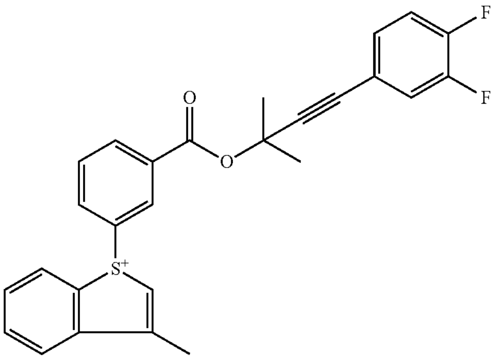
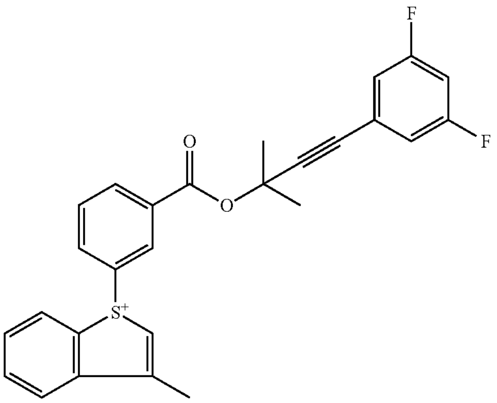
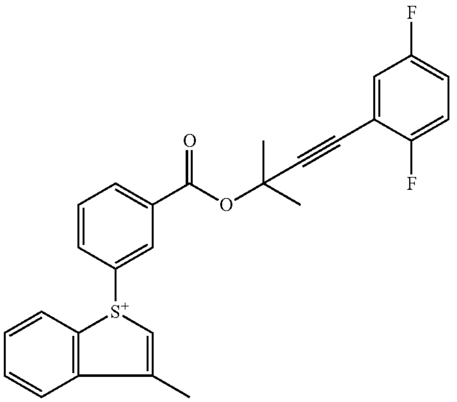
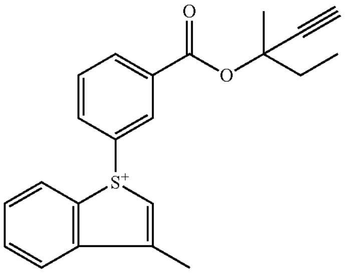
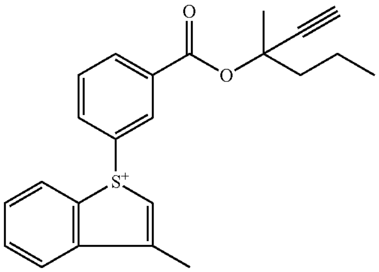

-continued
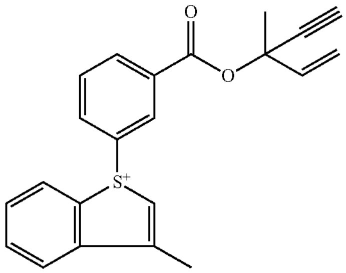
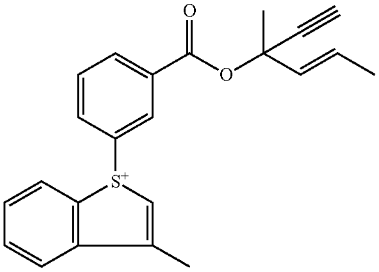
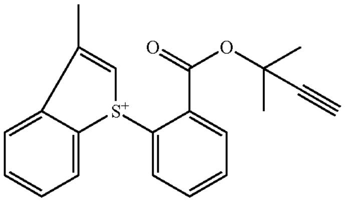
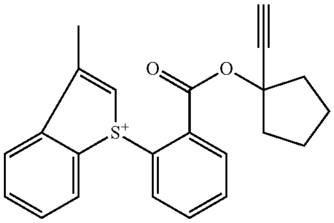
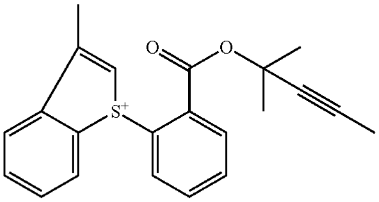
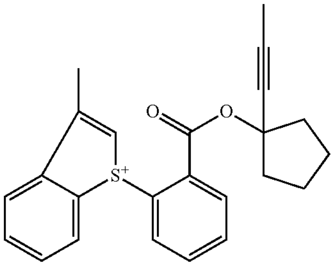
-continued
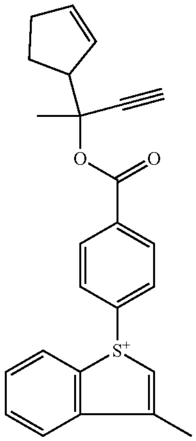
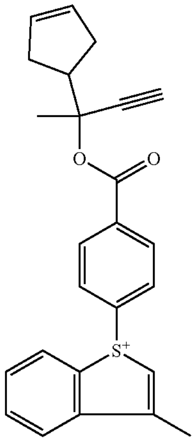
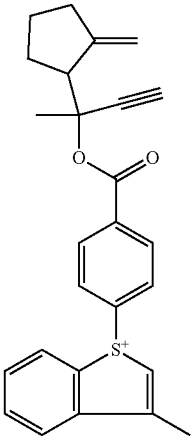
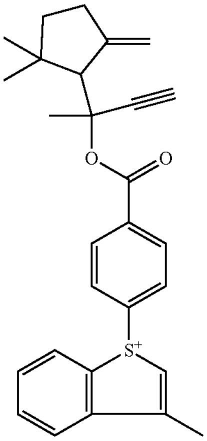
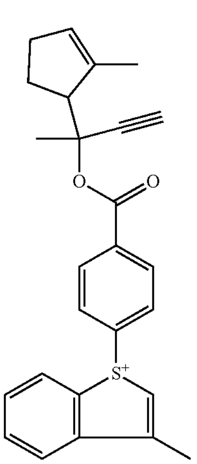
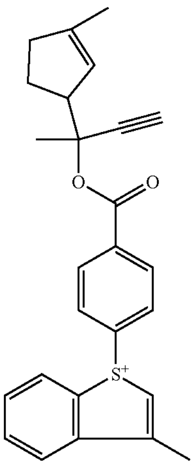

-continued
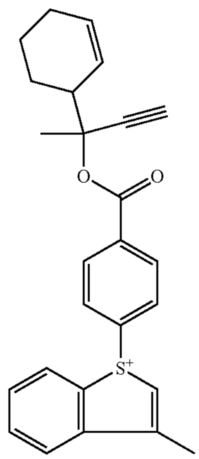
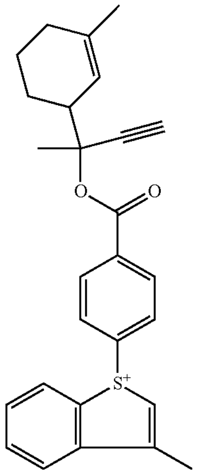
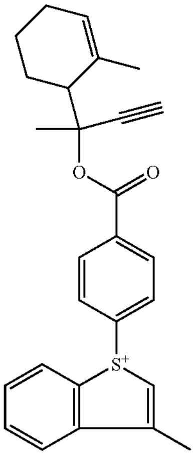
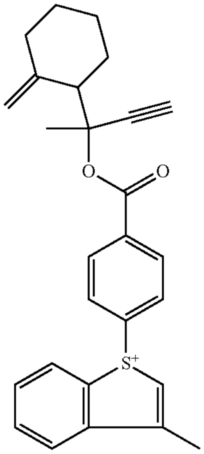
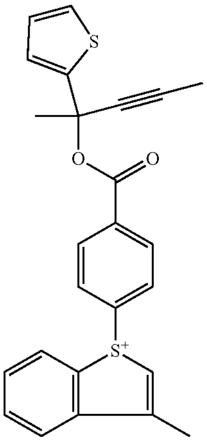
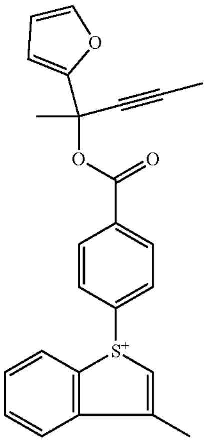
-continued
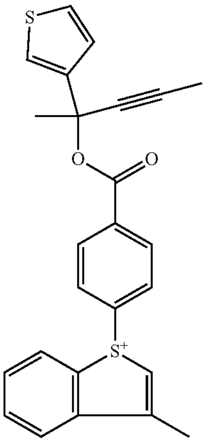
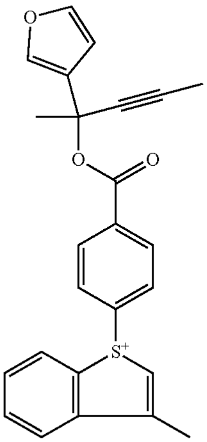
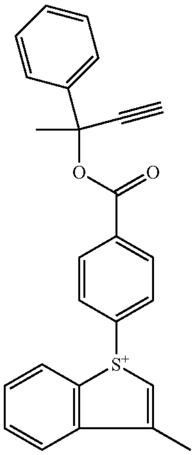
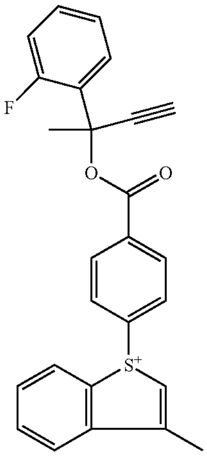
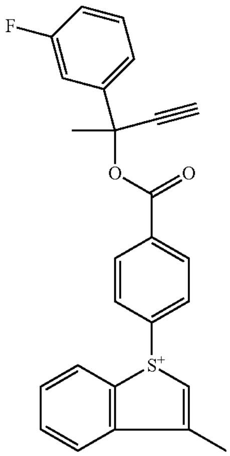
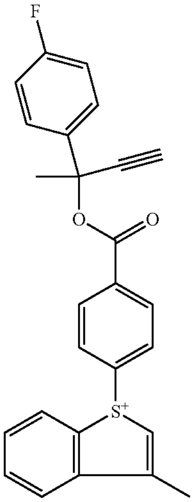

-continued
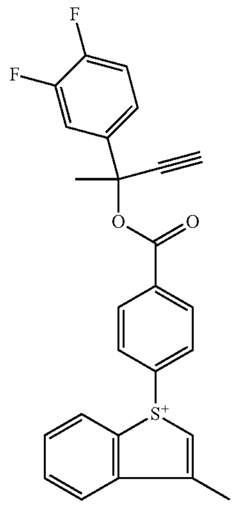
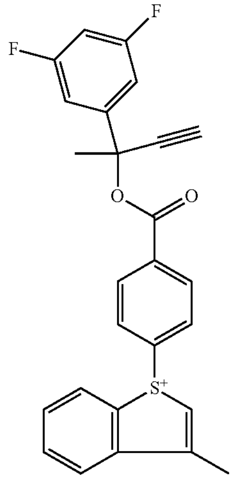
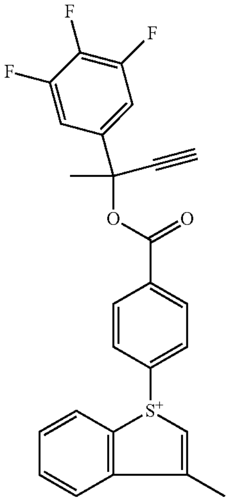
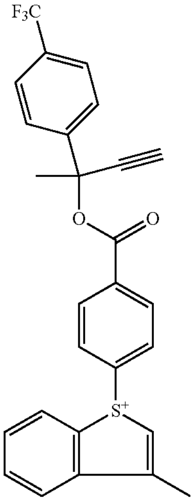
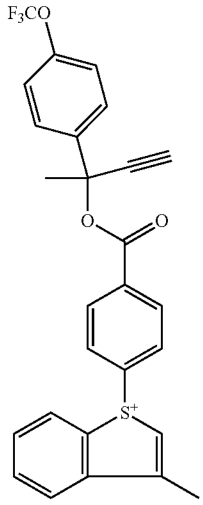
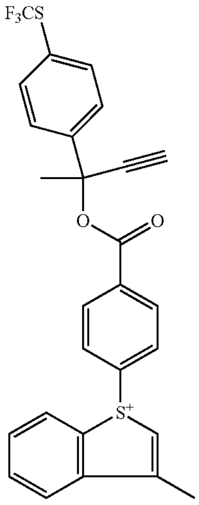
-continued
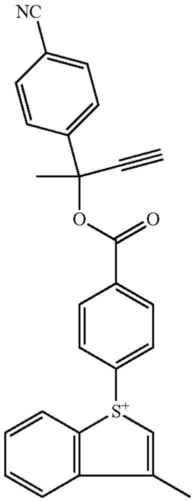
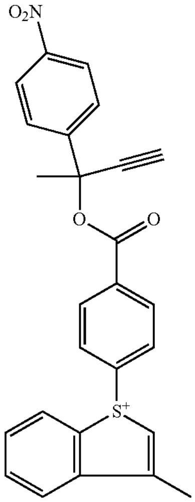
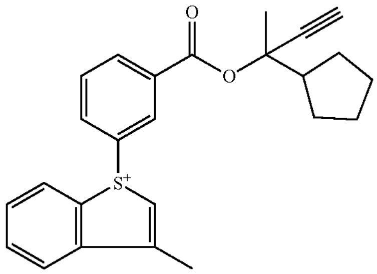
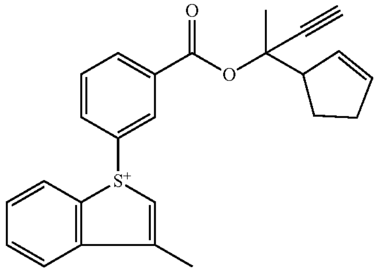
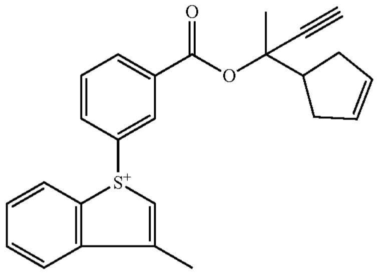
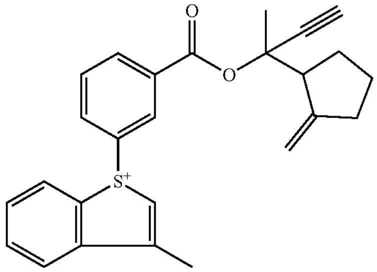

-continued
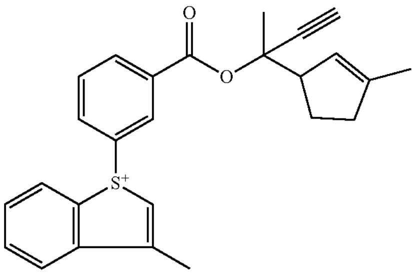
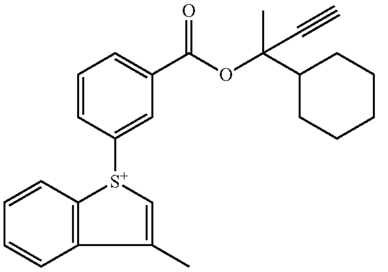
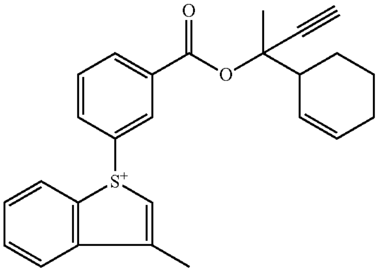
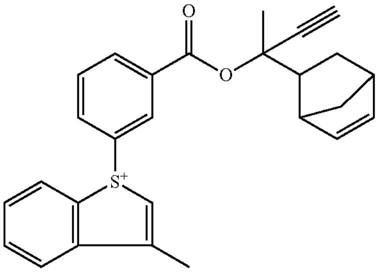
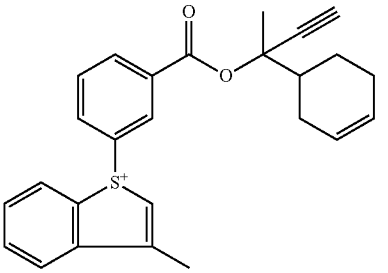
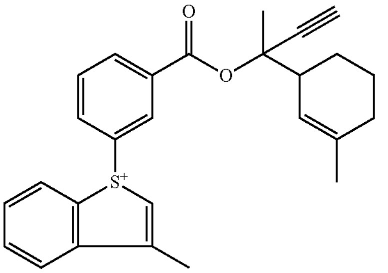
-continued
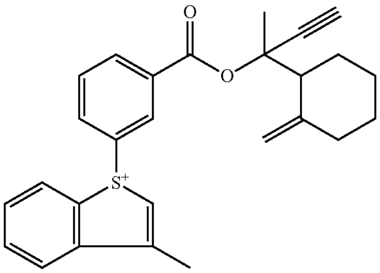
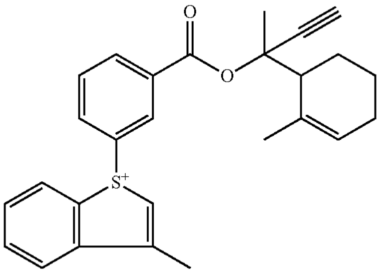
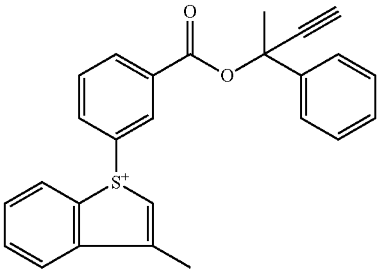
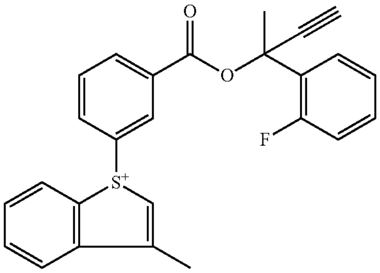
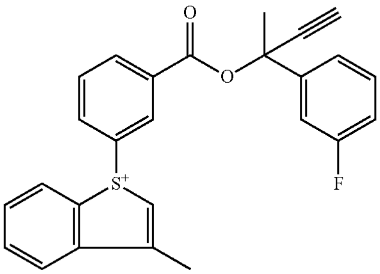
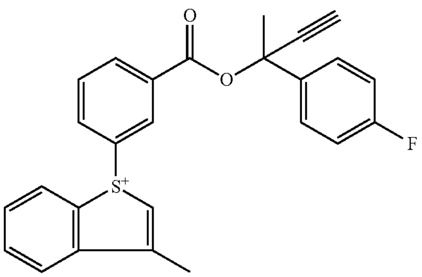

-continued
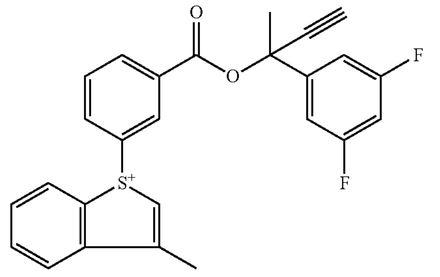
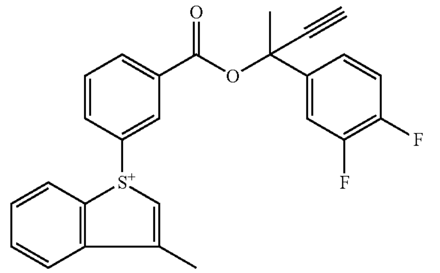
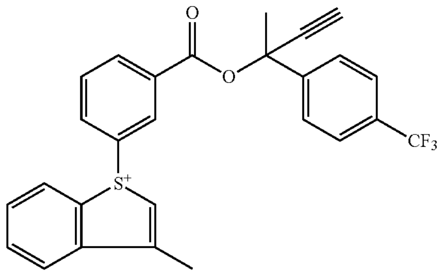
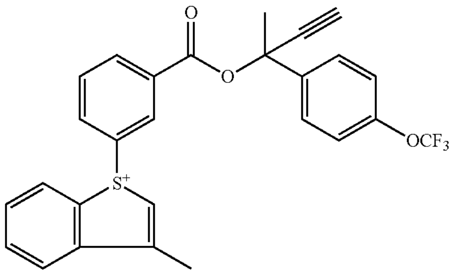
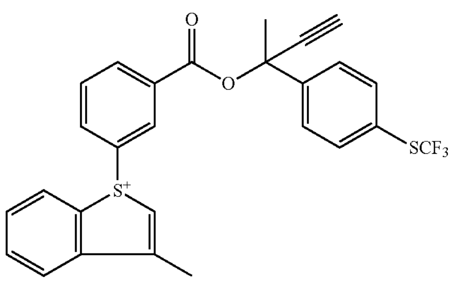
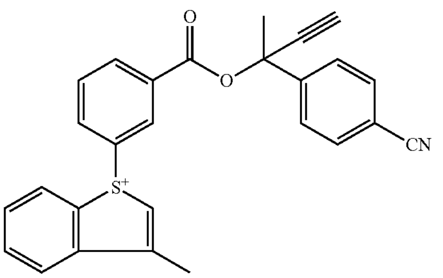
-continued
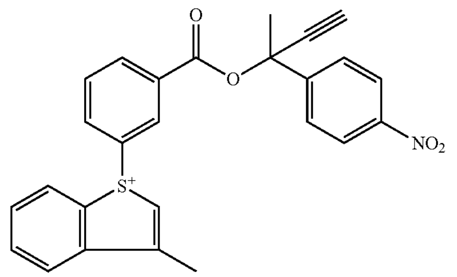
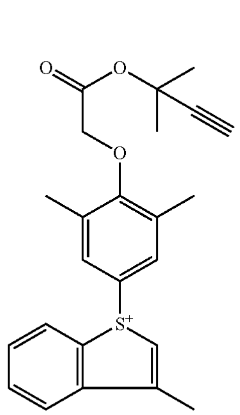
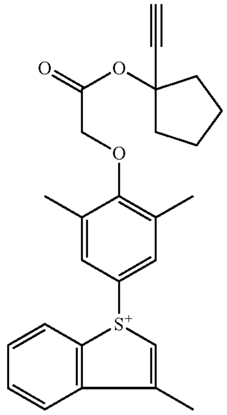
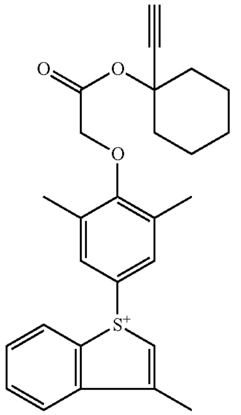
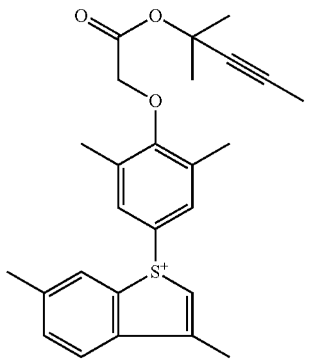
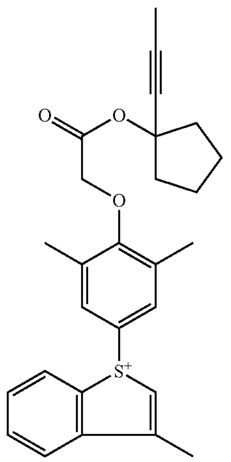
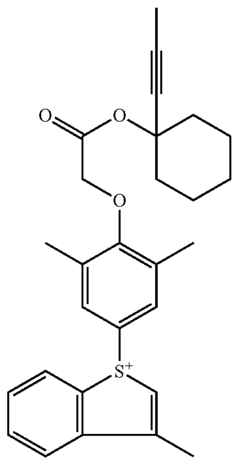

-continued
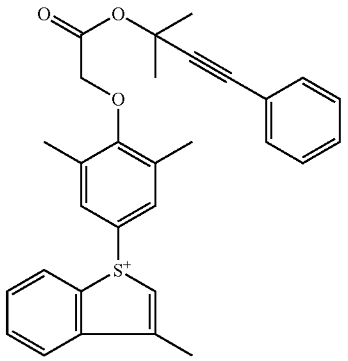
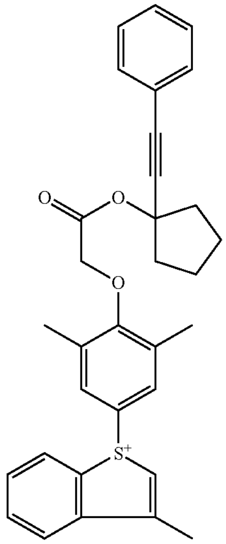
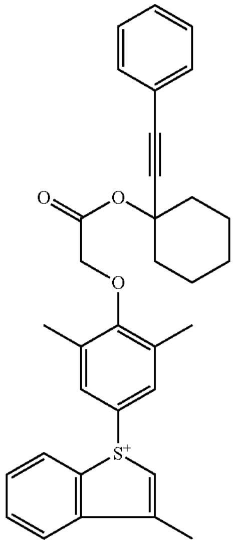
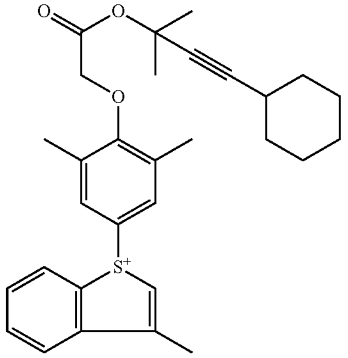
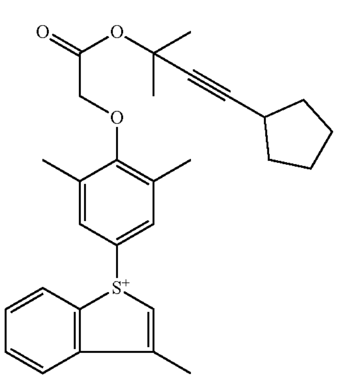
-continued
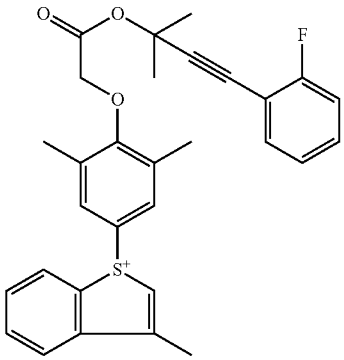
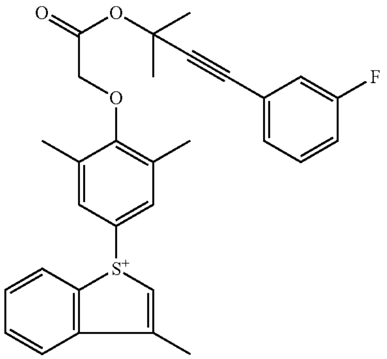
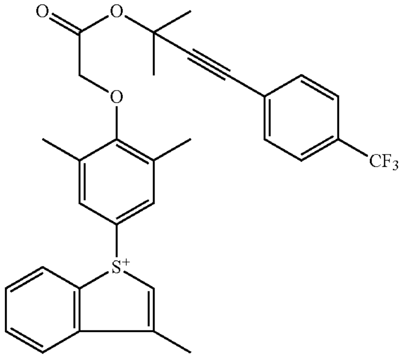
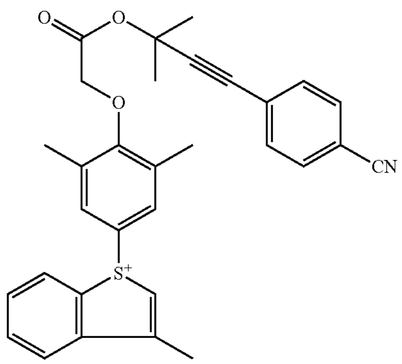

-continued
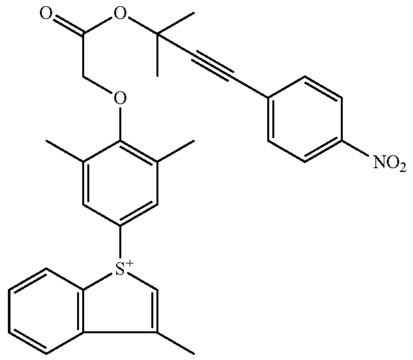
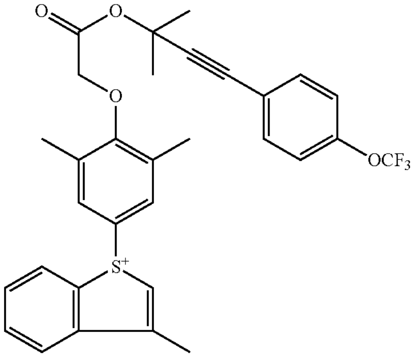
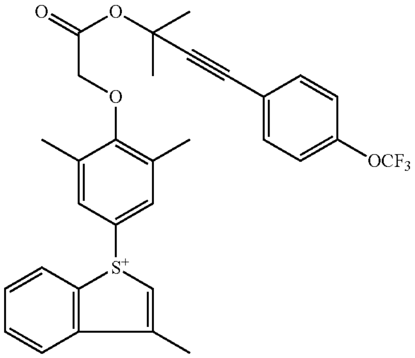
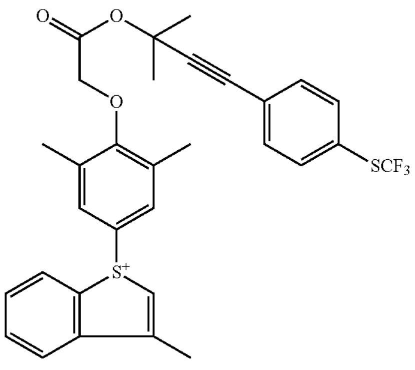
-continued
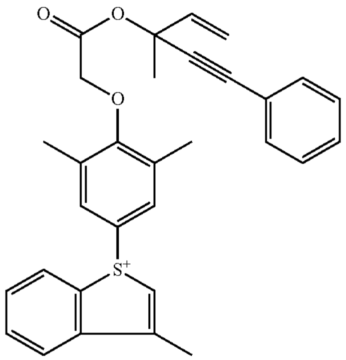
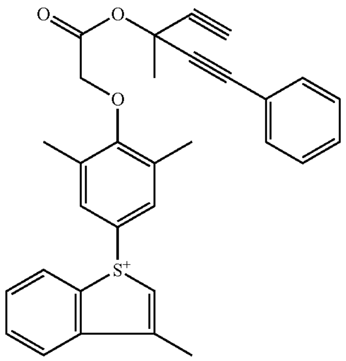
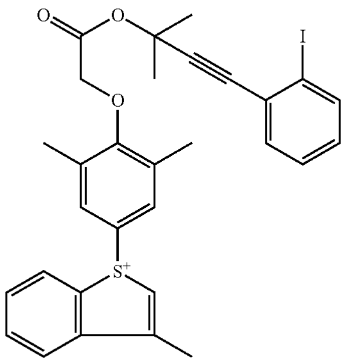
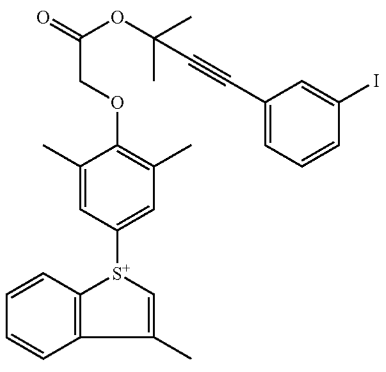

-continued
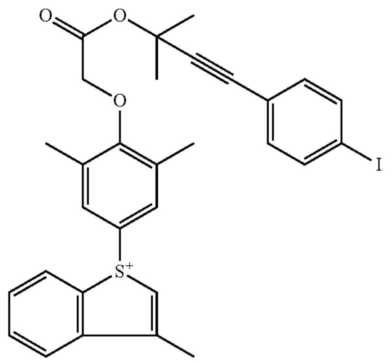
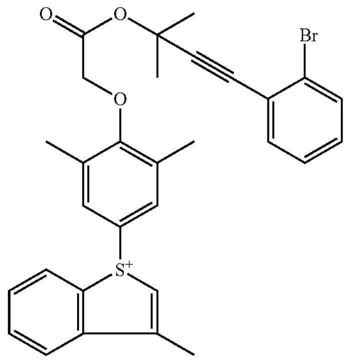
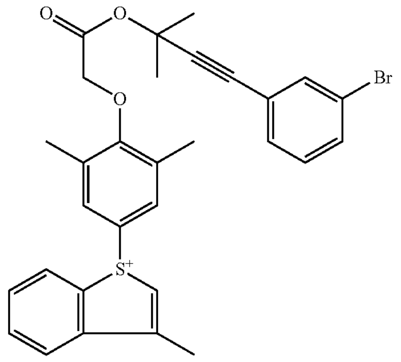
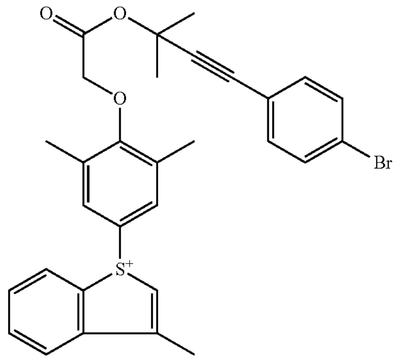
-continued
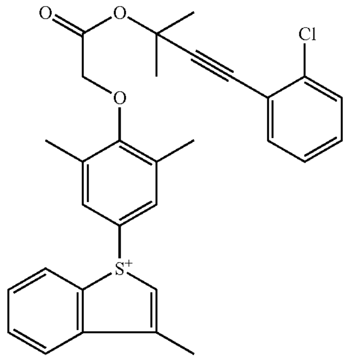
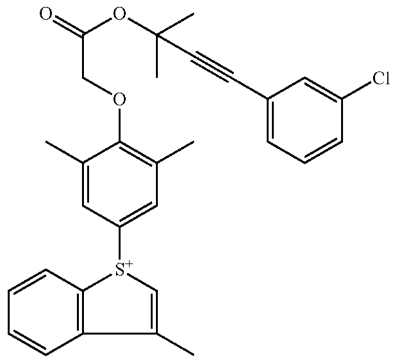
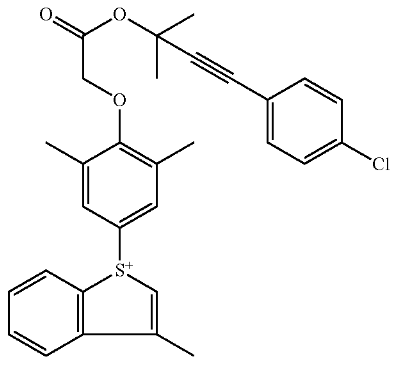
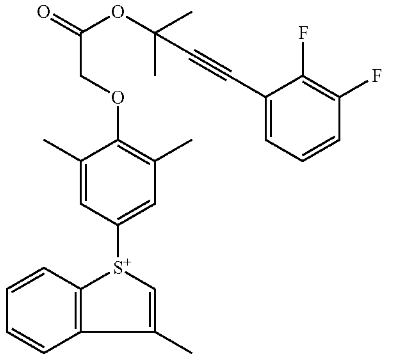

-continued
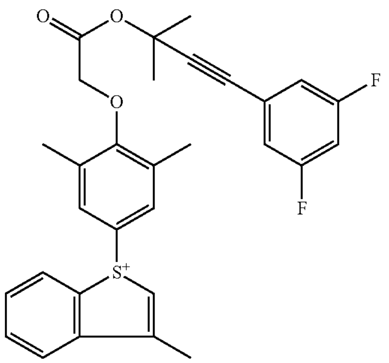
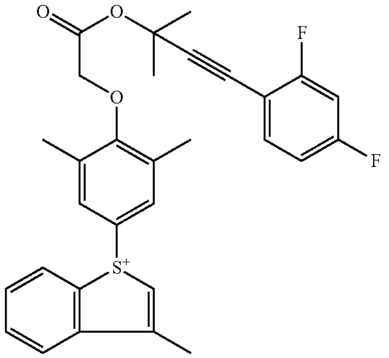
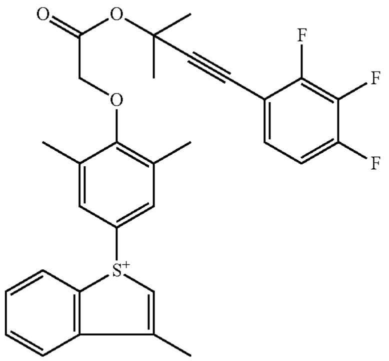
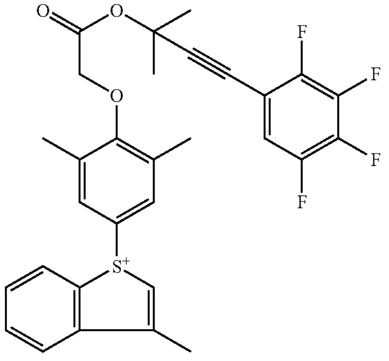
-continued
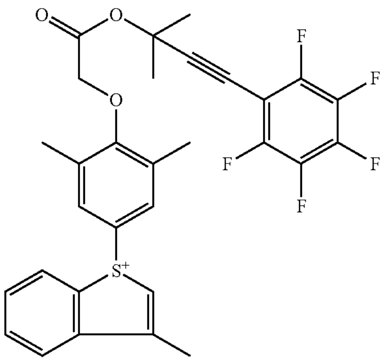
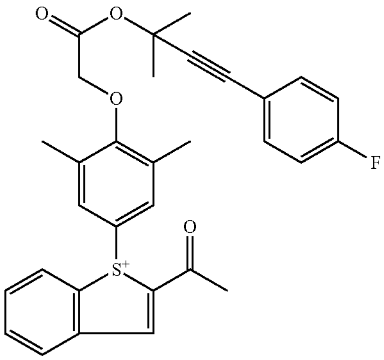
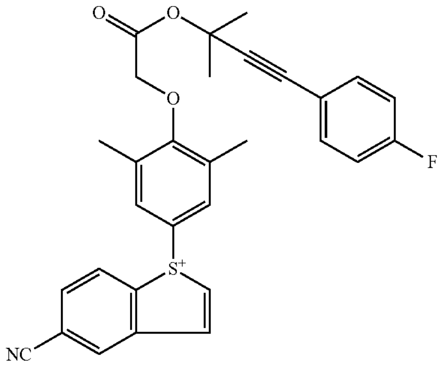
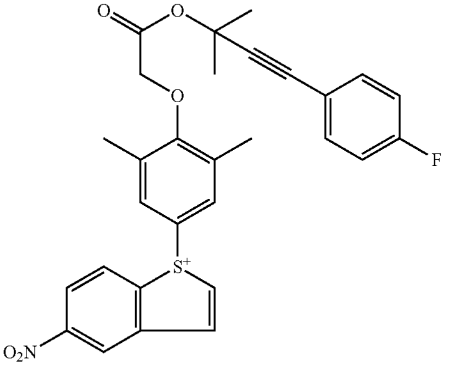

-continued
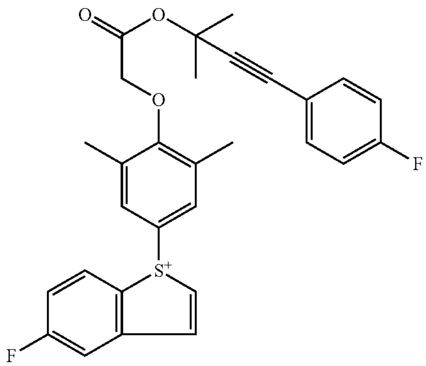
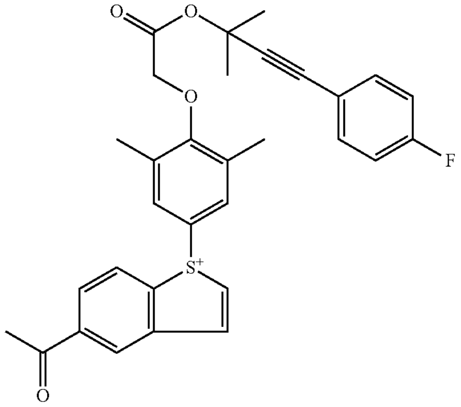
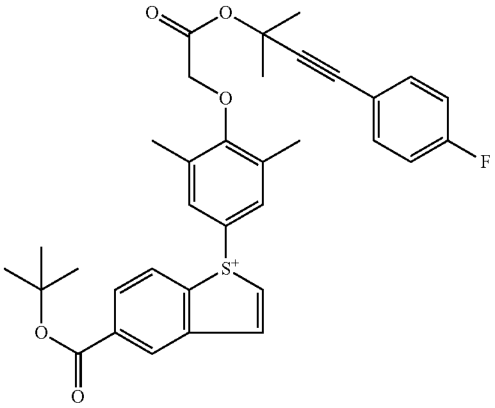
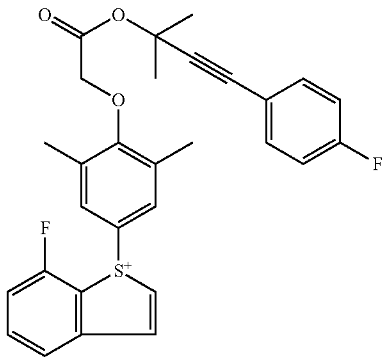
-continued
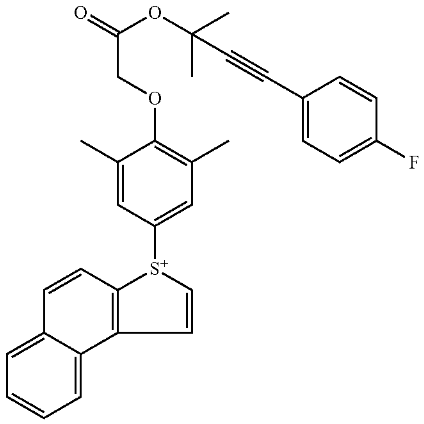
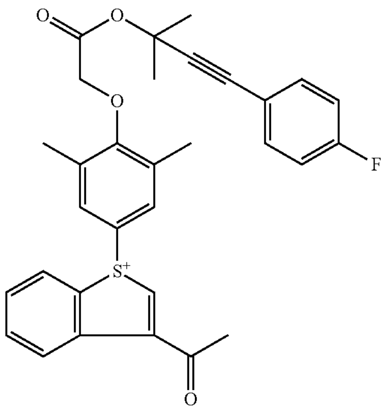
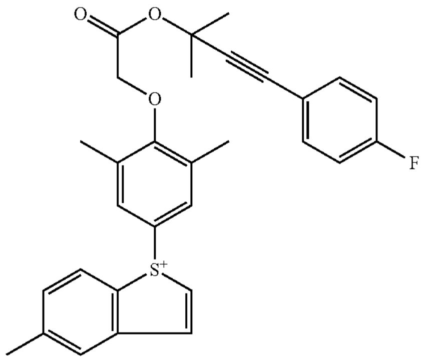
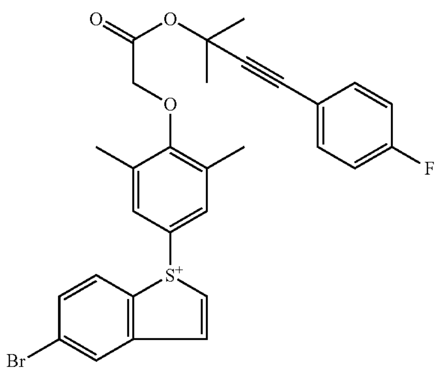

-continued
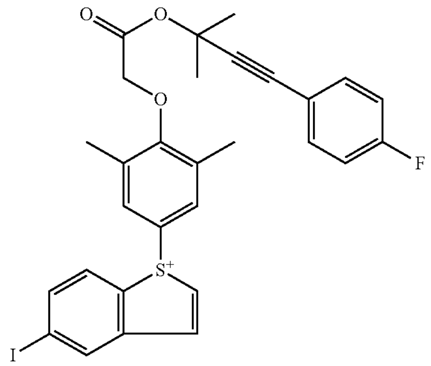
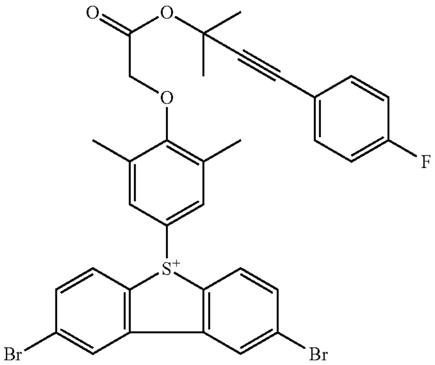
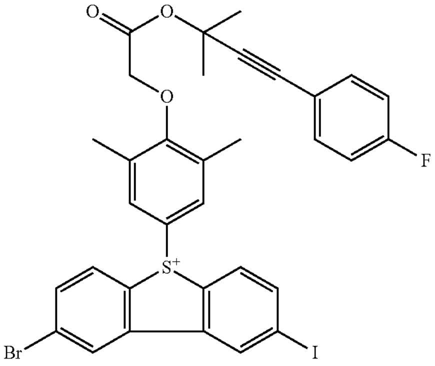
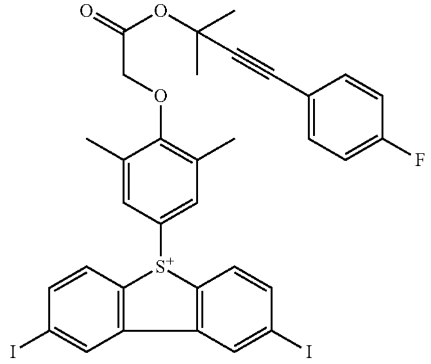
-continued
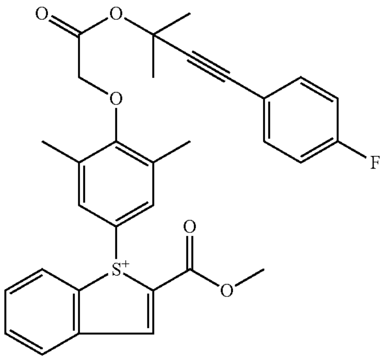
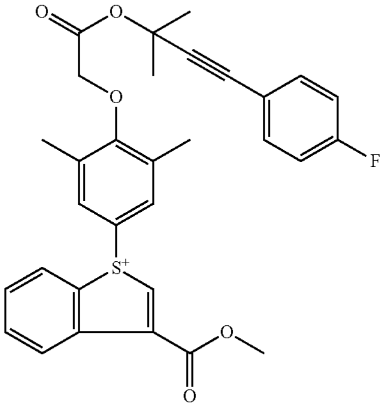
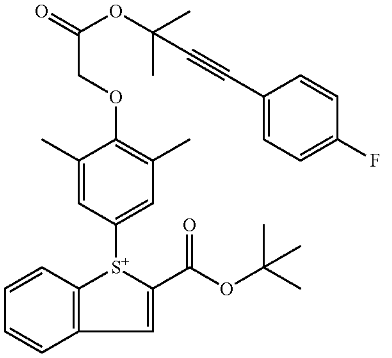
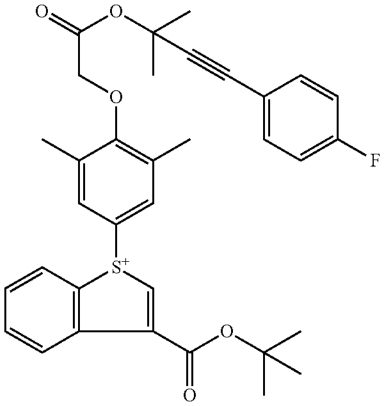

-continued
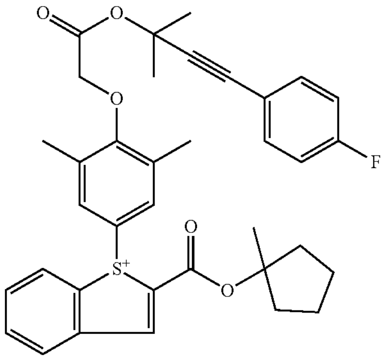
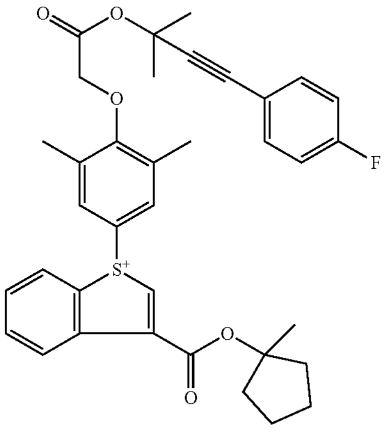
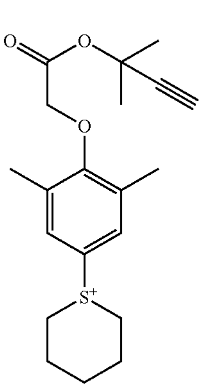
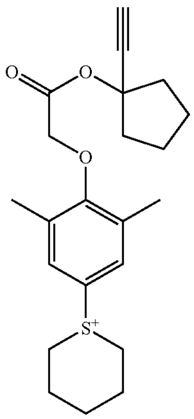
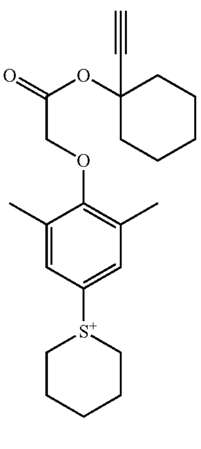
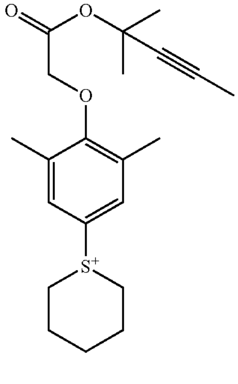
-continued
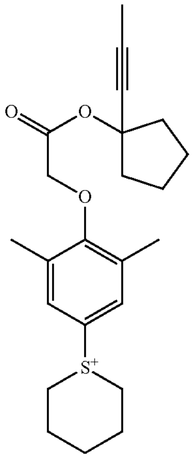
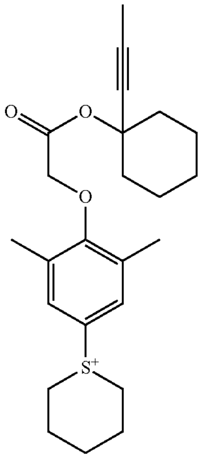
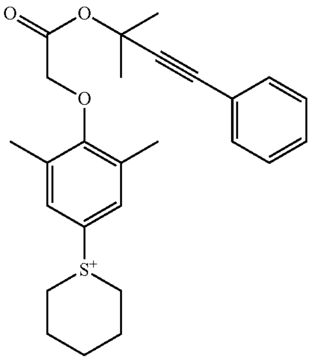
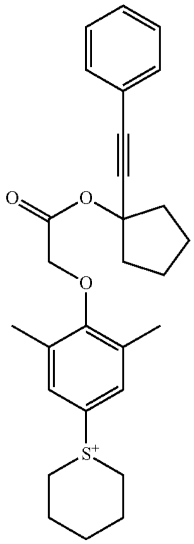
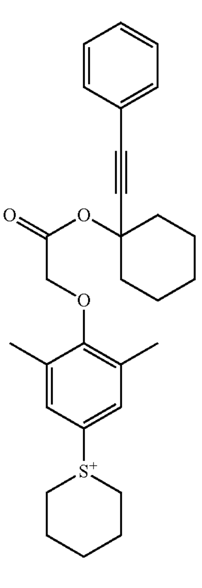
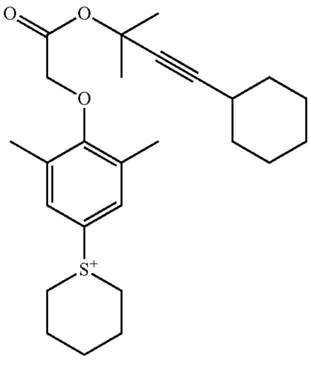

-continued
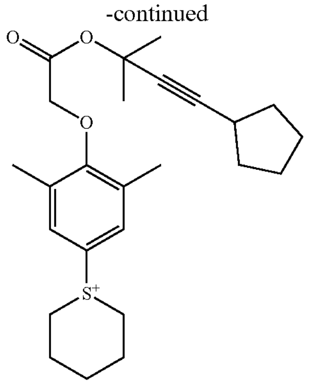
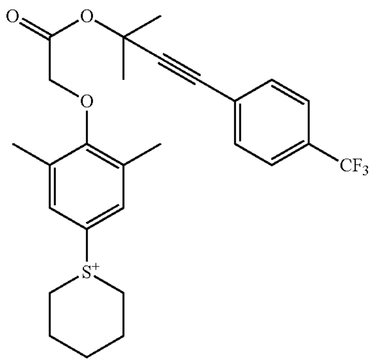
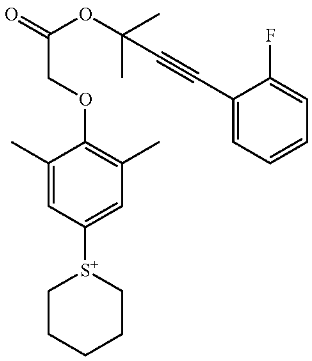
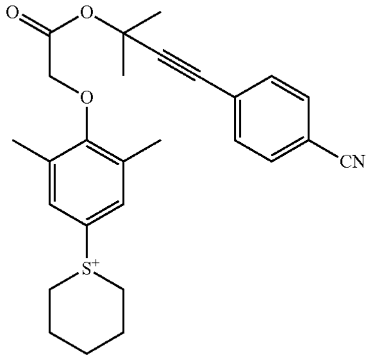
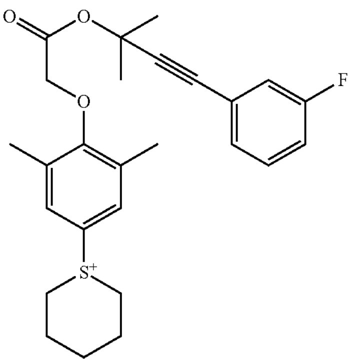
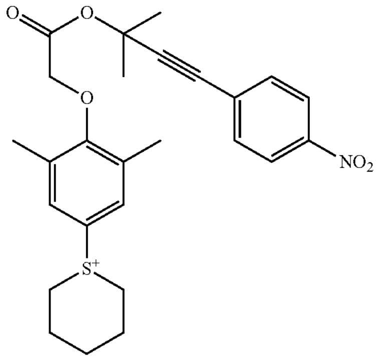
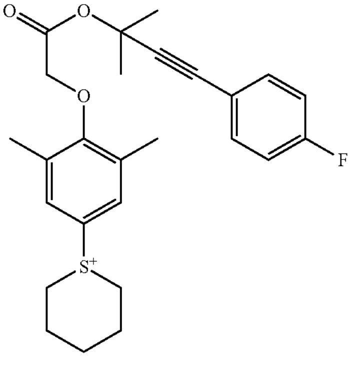
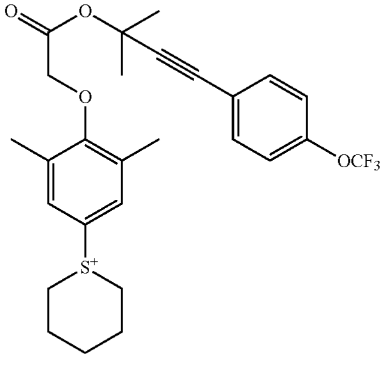
-continued -continued

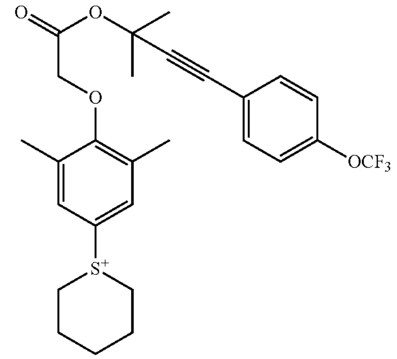

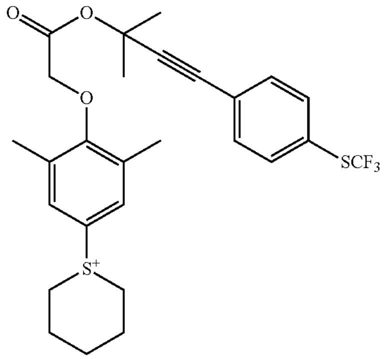

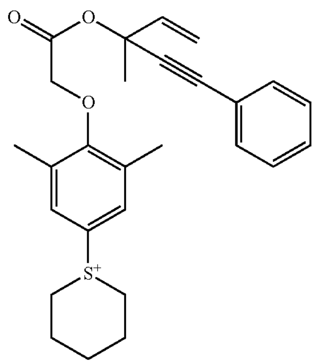

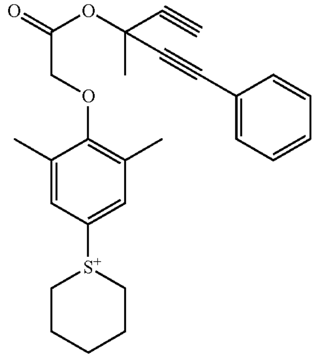

In a preferred embodiment, the repeat units (a) are repeat units having the formula (a1) or repeat units having the formula (a2), which are also referred to as repeat units (a1) or (a2), hereinafter.

(a1)

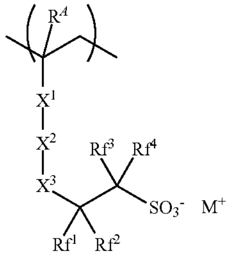

(a2)

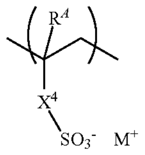

In formulae (a1) and (a2), $R^A$ is each independently hydrogen or methyl. $X^1$ is a single bond or ester bond. $X^2$ is a single bond, —$X^{21}$—C(═O)—O— or —$X^{21}$—O—, wherein $X^{21}$ is a $C_1$-$C_{12}$ hydrocarbylene group, phenylene group or a $C_7$-$C_{18}$ group obtained by combining the foregoing, which may contain carbonyl, ester bond, ether bond, iodine or bromine. $X^3$ is a single bond, methylene or ethylene. $X^4$ is a single bond, methylene, ethylene, phenylene, methylphenylene, dimethylphenylene, fluorinated phenylene, trifluoromethyl-substituted phenylene, —O—$X^{41}$—, —C(═O)—O—$X^{41}$— or —C(═O)—NH—$X^{41}$— wherein $X^{41}$ is a $C_1$-$C_6$ aliphatic hydrocarbylene group, phenylene group, methylphenylene group, dimethylphenylene group, fluorinated phenylene group, or trifluoromethyl-substituted phenylene group, which may contain carbonyl, ester bond, ether bond, hydroxy or halogen. $Rf^1$ to $Rf^4$ are each independently hydrogen, fluorine or trifluoromethyl, at least one of $Rf^1$ to $Rf^4$ being fluorine or trifluoromethyl. $Rf^1$ and $Rf^2$ may together form a carbonyl group. $M^+$ is the sulfonium cation having formula (1).

Examples of the anion in the monomer from which repeat units (a1) are derived are shown below, but not limited thereto. Herein $R^A$ is as defined above.

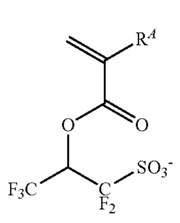

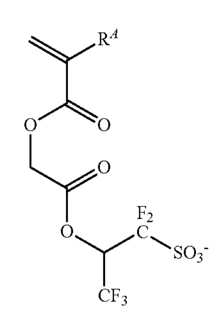

-continued
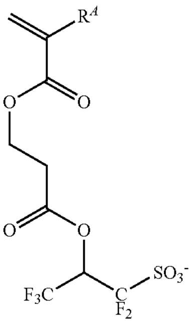
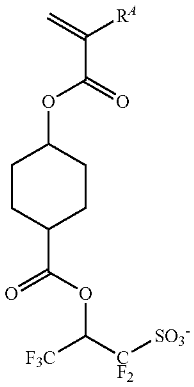
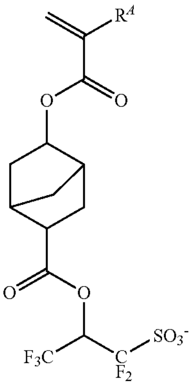
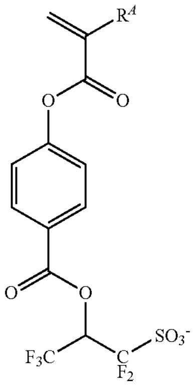
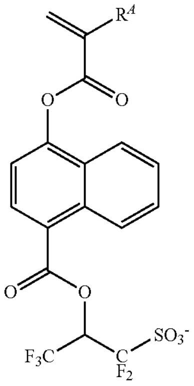
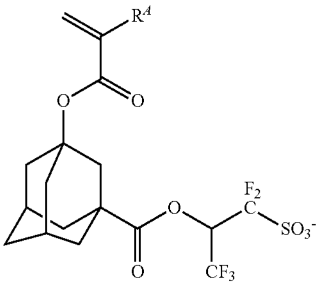
-continued
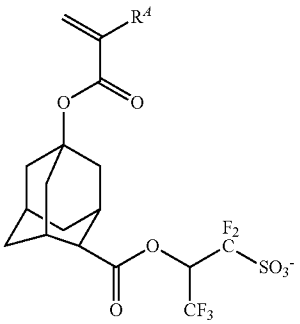
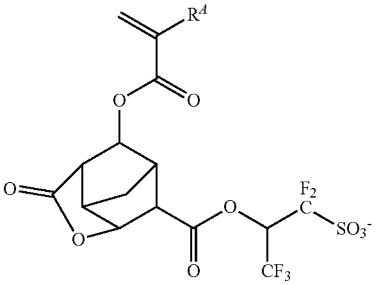
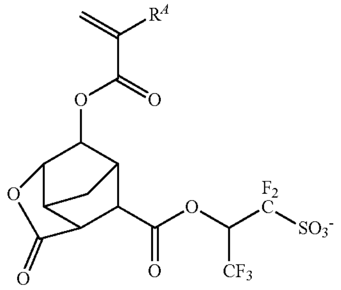
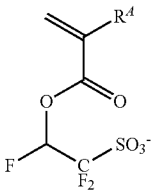
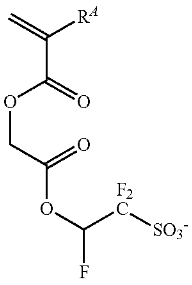
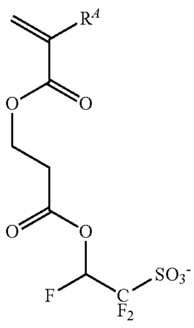
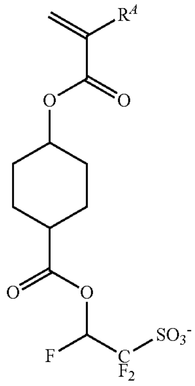

-continued
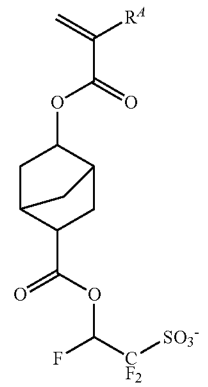
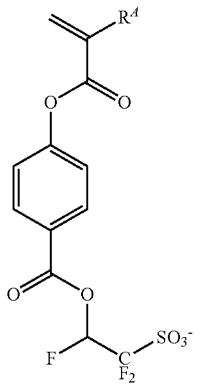
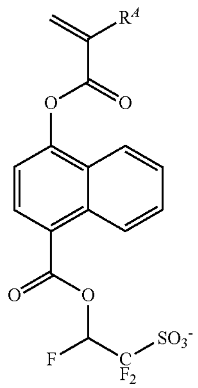
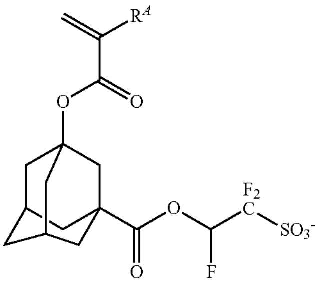
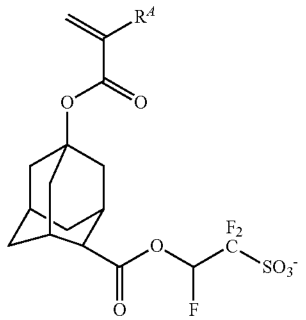
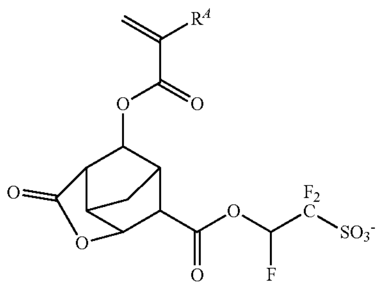
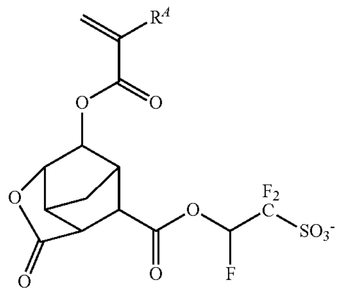
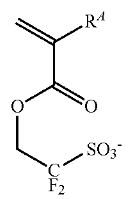
-continued
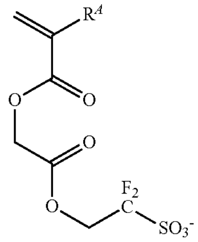
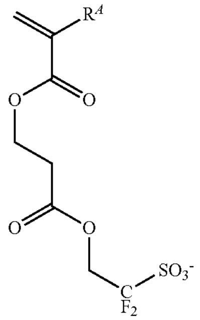
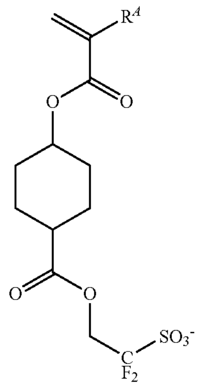
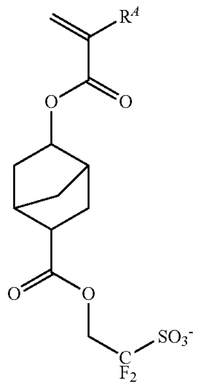
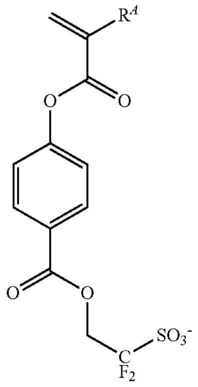
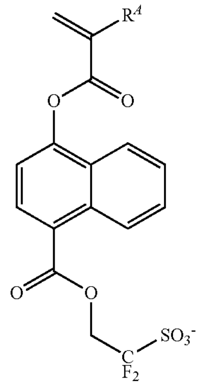
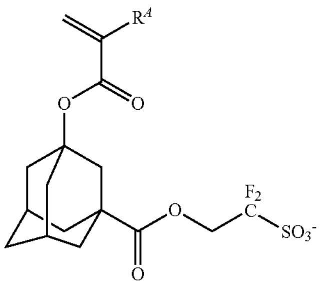
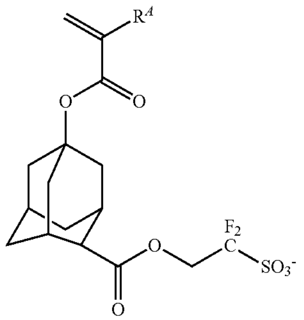

-continued
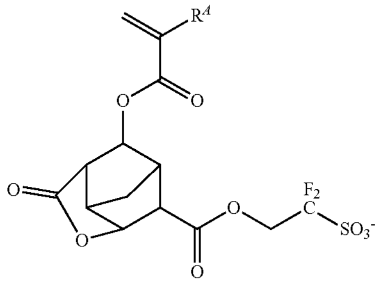
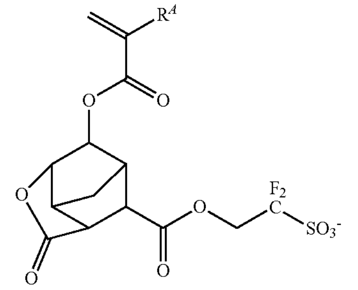
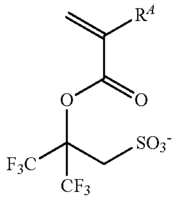
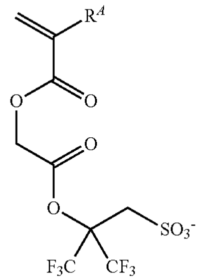
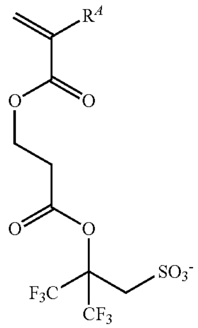
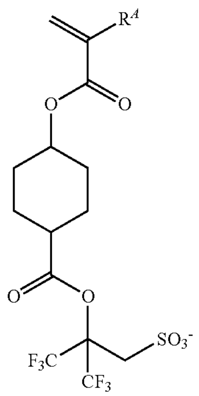
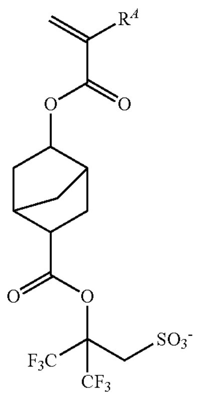
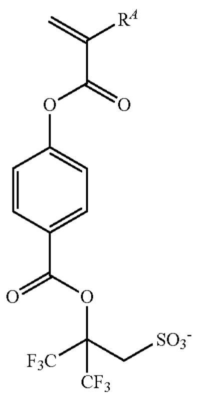
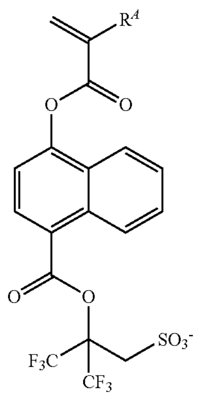
-continued
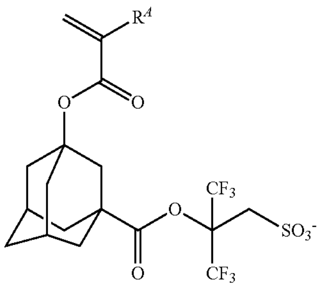
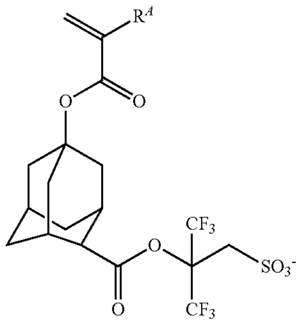
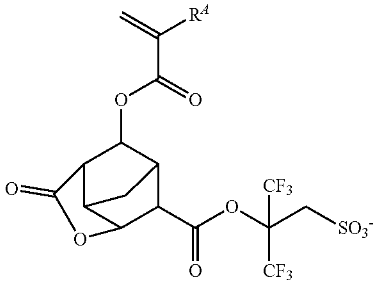
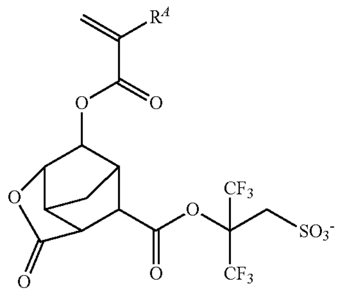
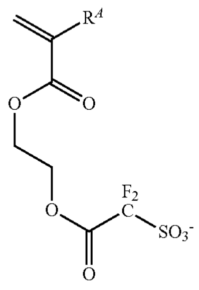
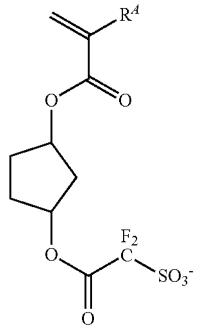
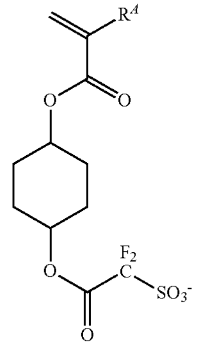

-continued
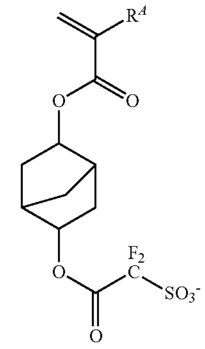
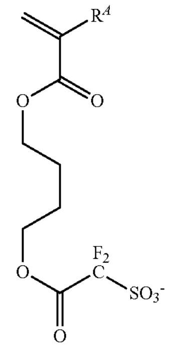
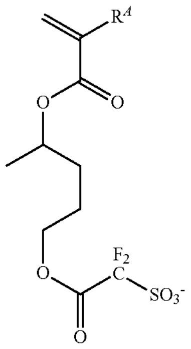
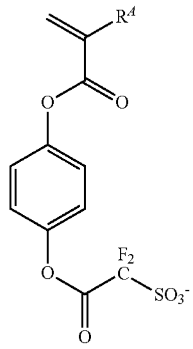
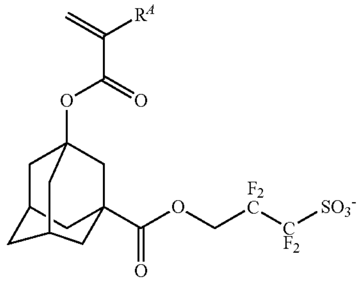
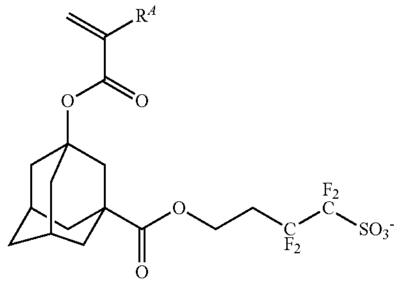
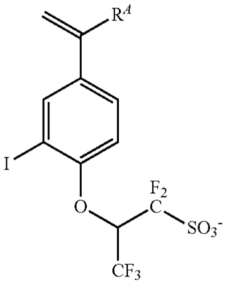
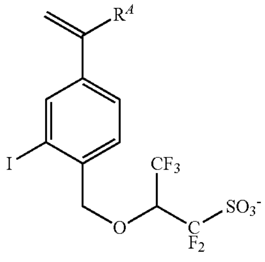
-continued
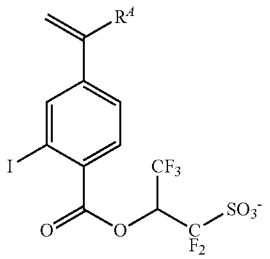
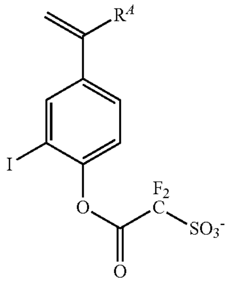
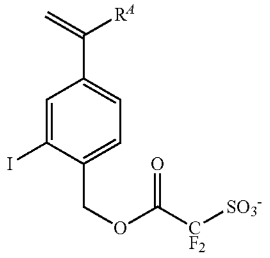
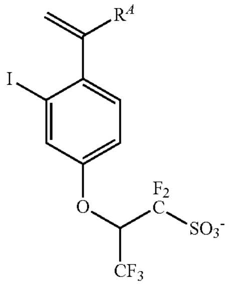
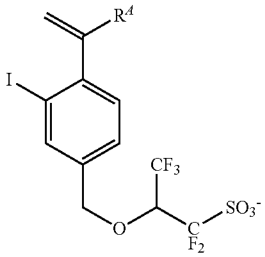
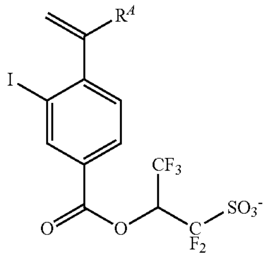
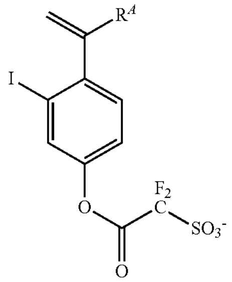
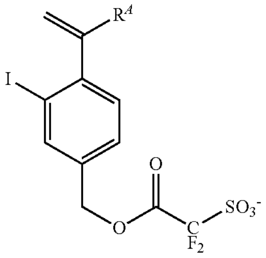
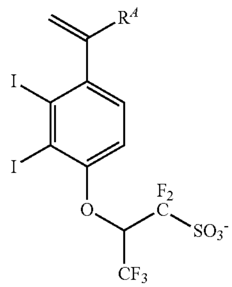
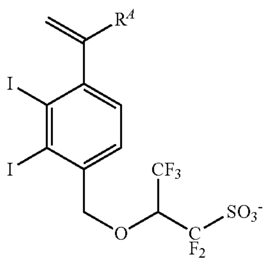
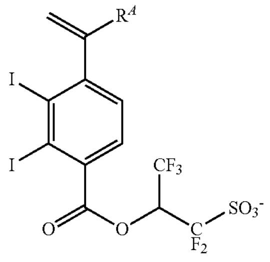
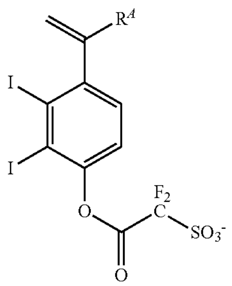

-continued
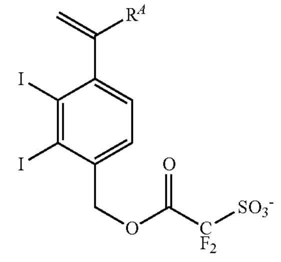
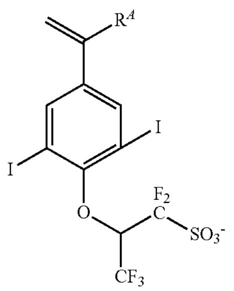
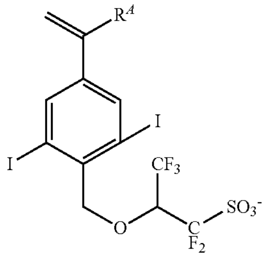
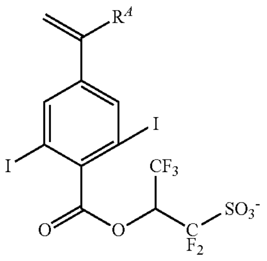
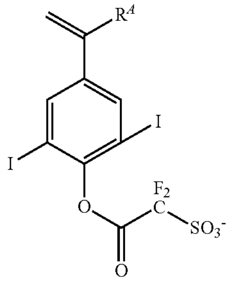
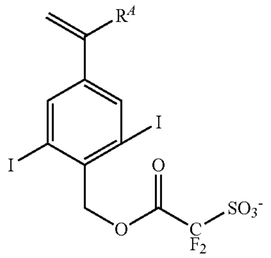
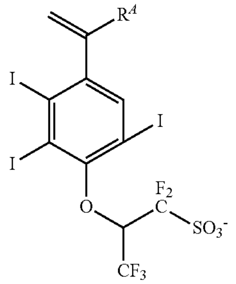
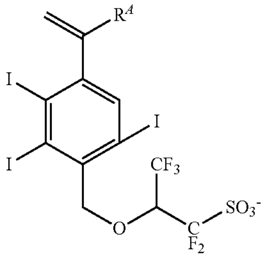
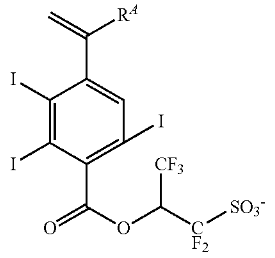
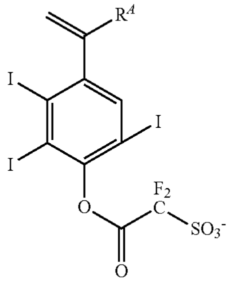
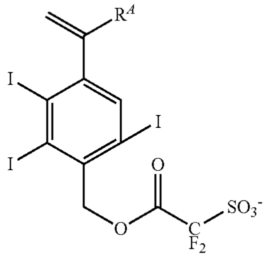
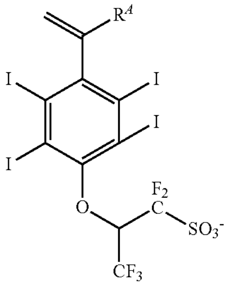
-continued
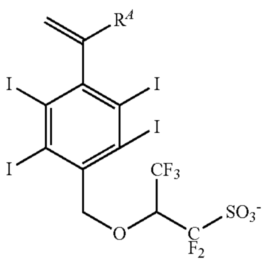
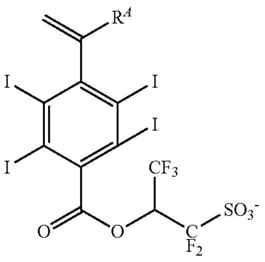
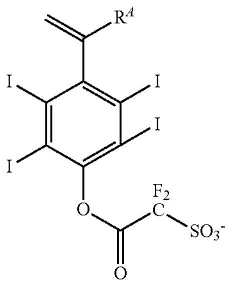
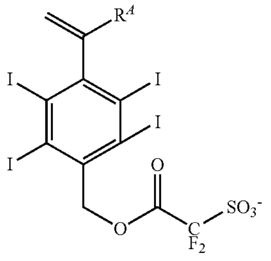
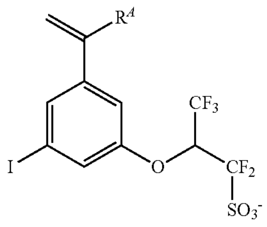
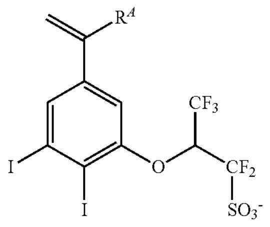
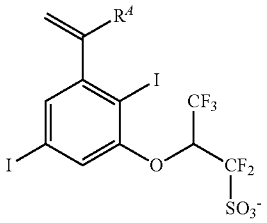
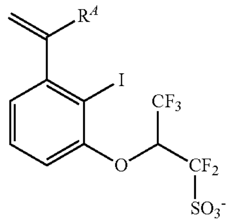
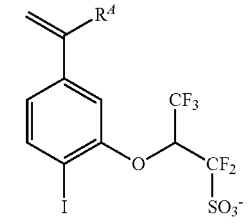
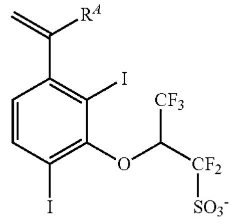
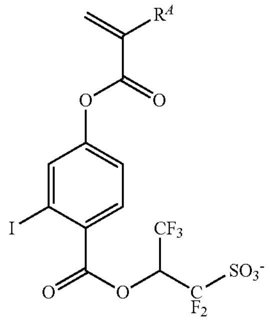

-continued
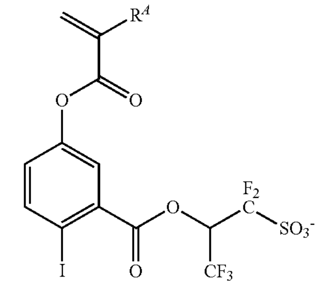
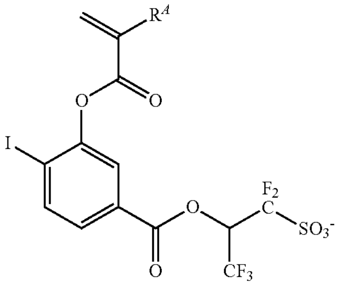
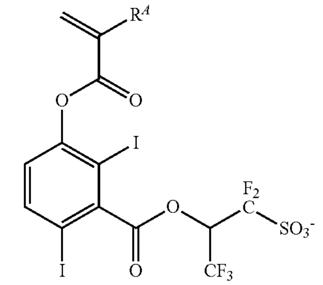
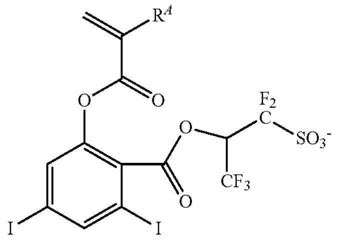
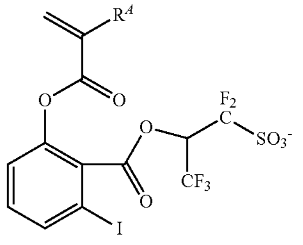
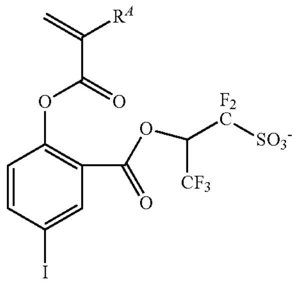
-continued
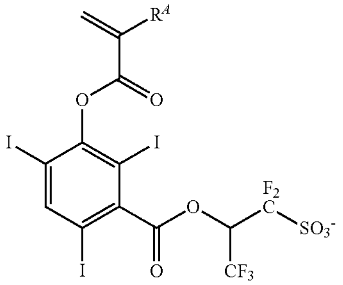
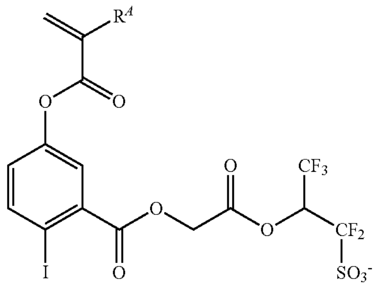
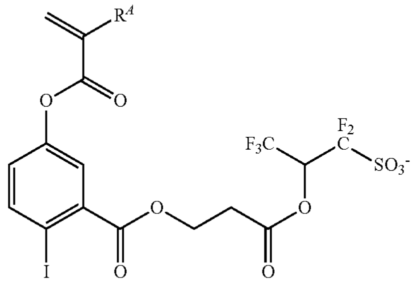
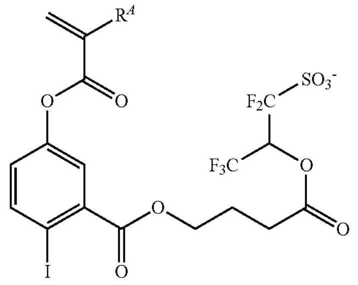
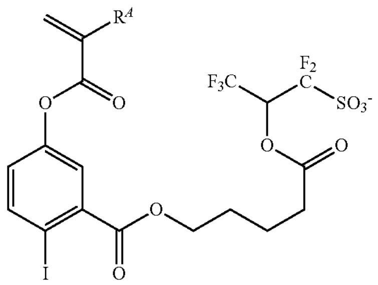

-continued
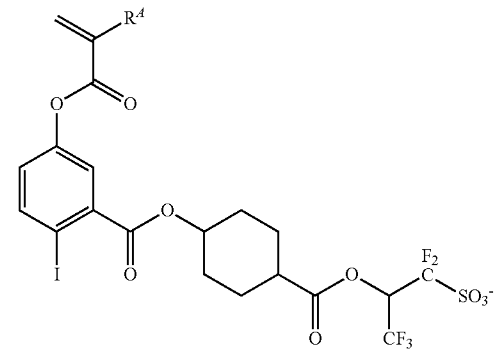
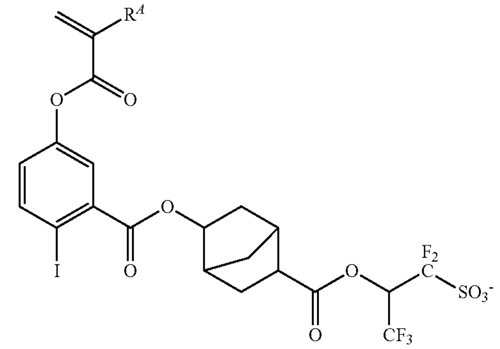
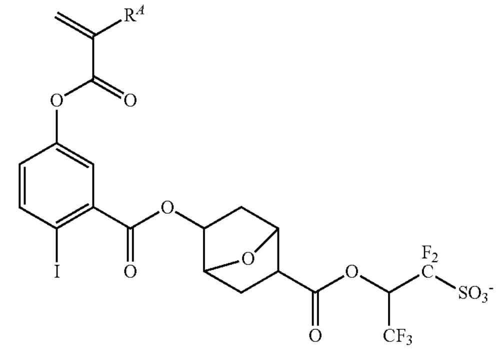
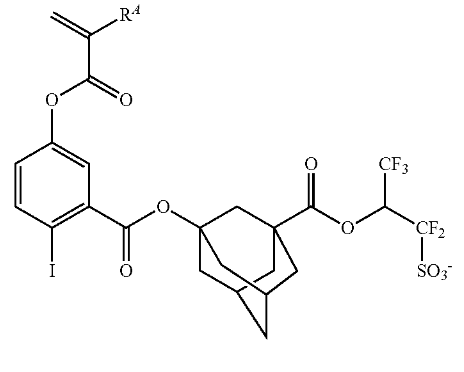
-continued
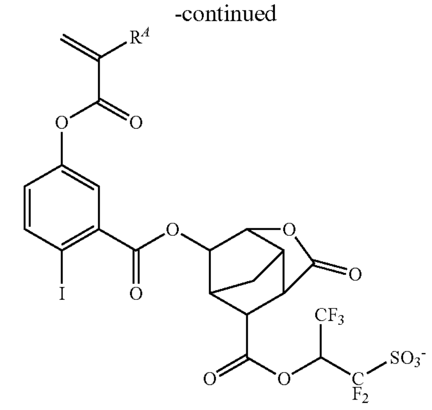
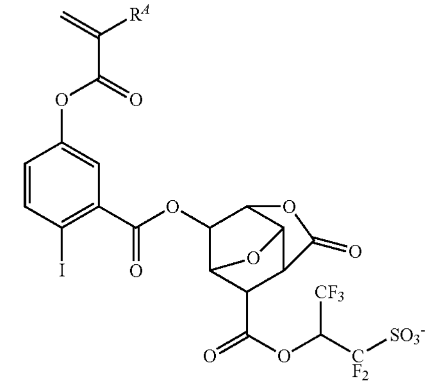
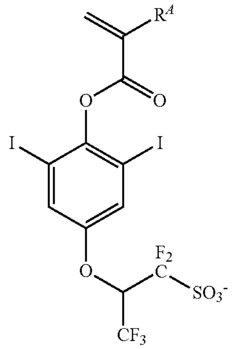
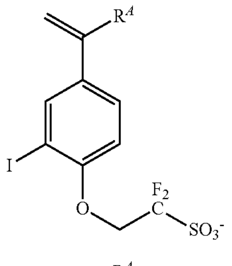
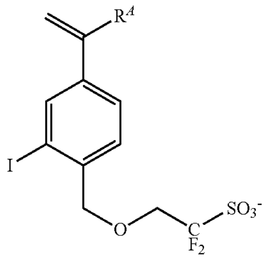
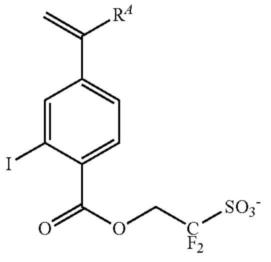
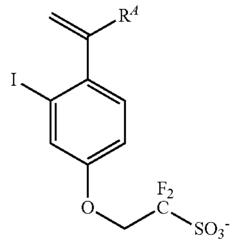

-continued
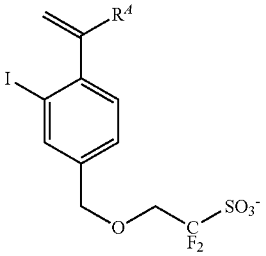
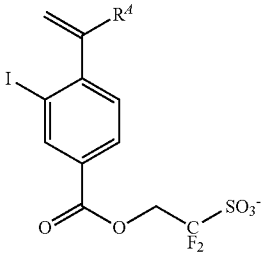
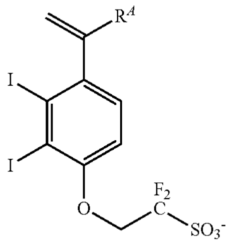
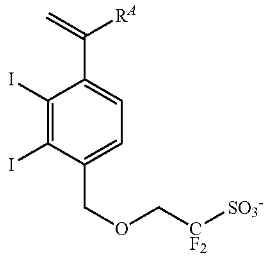
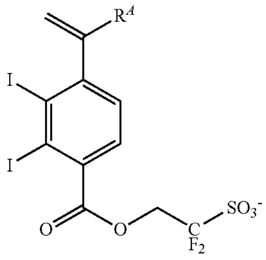
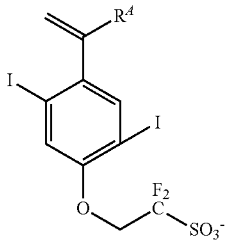
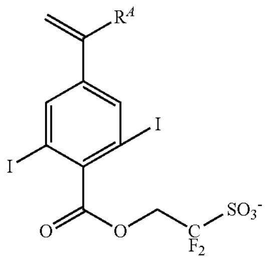
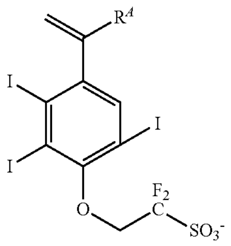
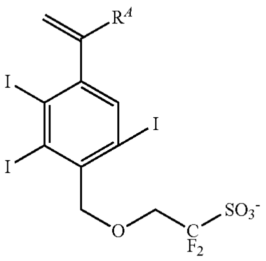
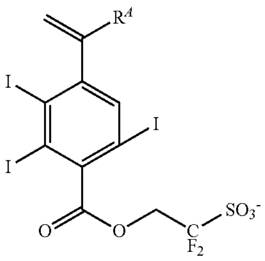
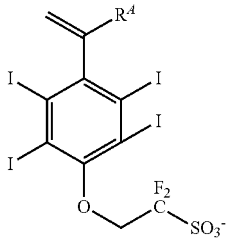
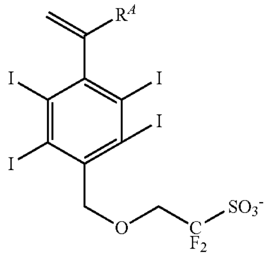
-continued
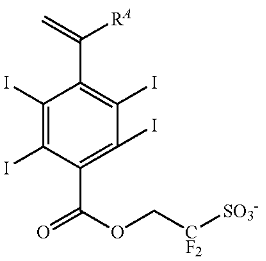
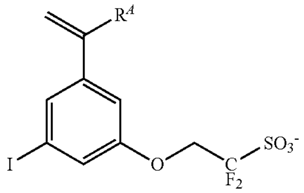
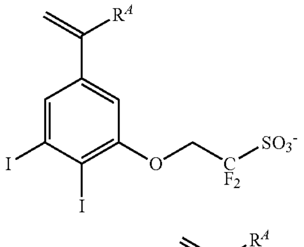
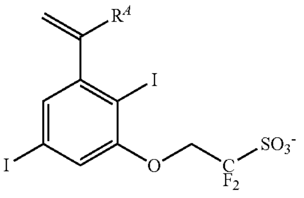
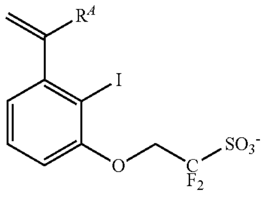
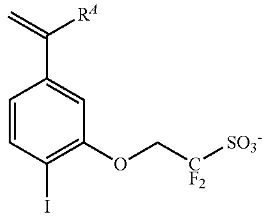
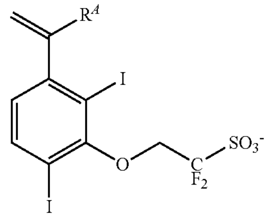
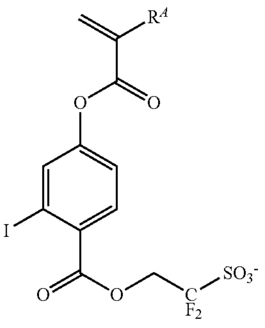
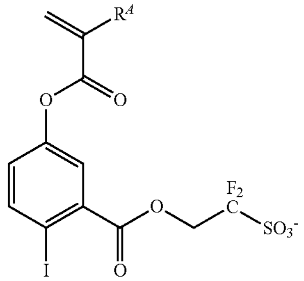
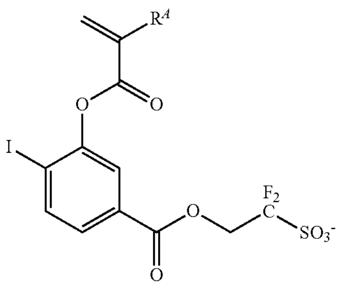

-continued
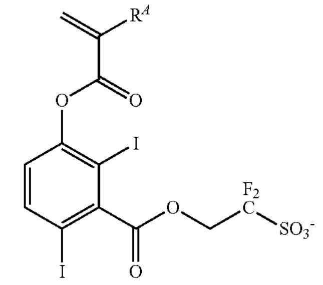
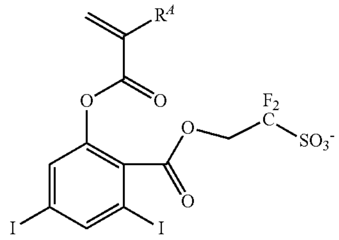
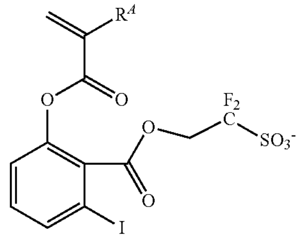
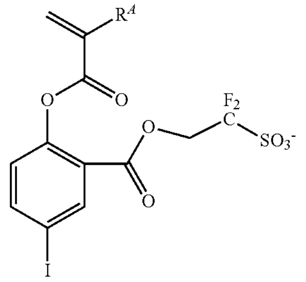
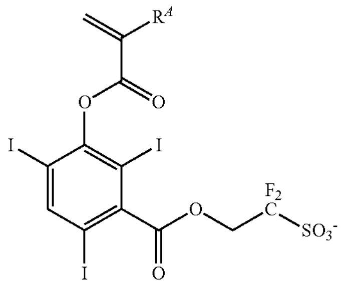
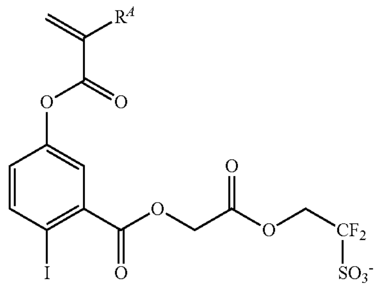
-continued
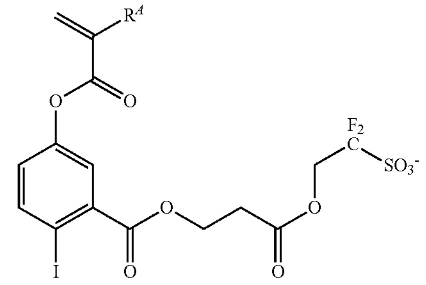
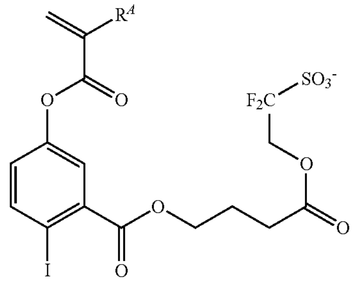
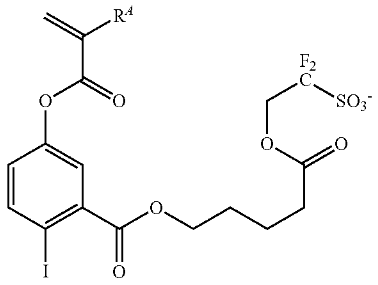
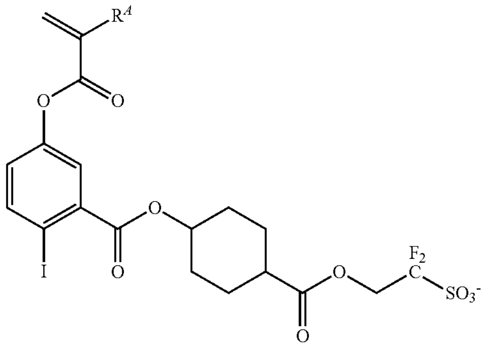
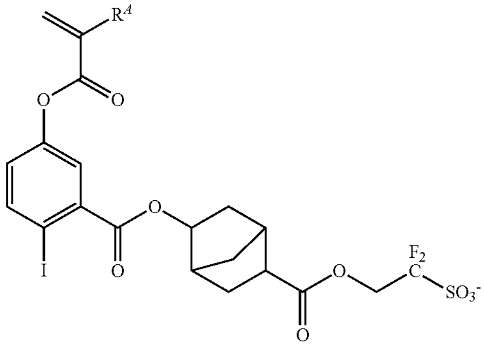

-continued
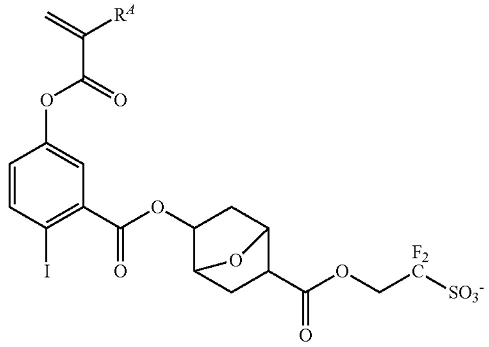
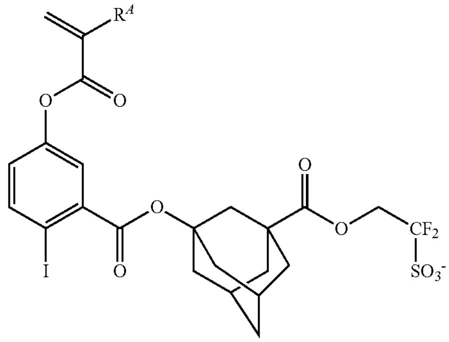
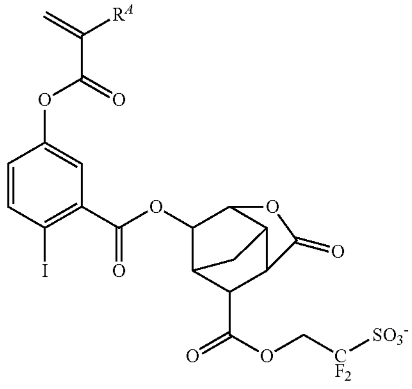
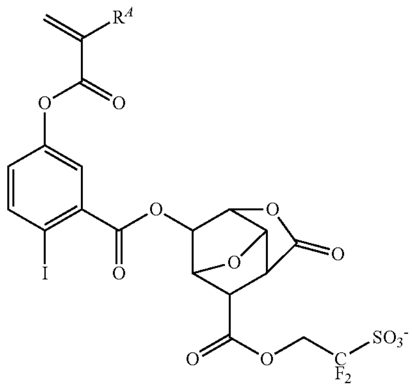
-continued
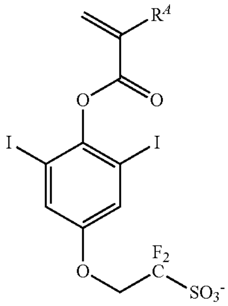
Examples of the anion in the monomer from which repeat units (a2) are derived are shown below, but not limited thereto. Herein $R^4$ is as defined above.
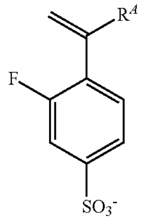
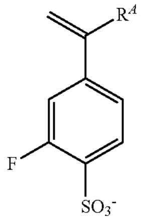
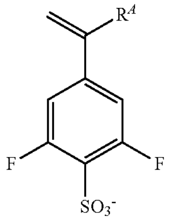
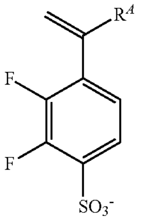
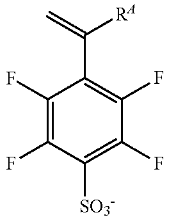
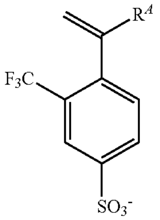
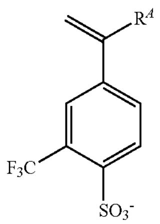
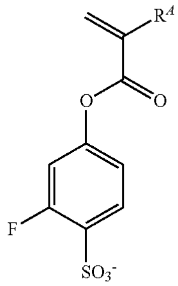
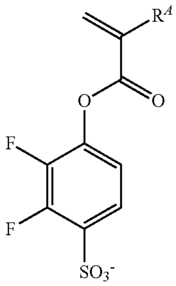
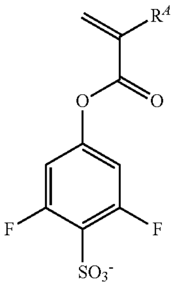
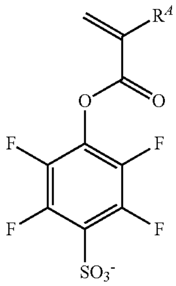

-continued

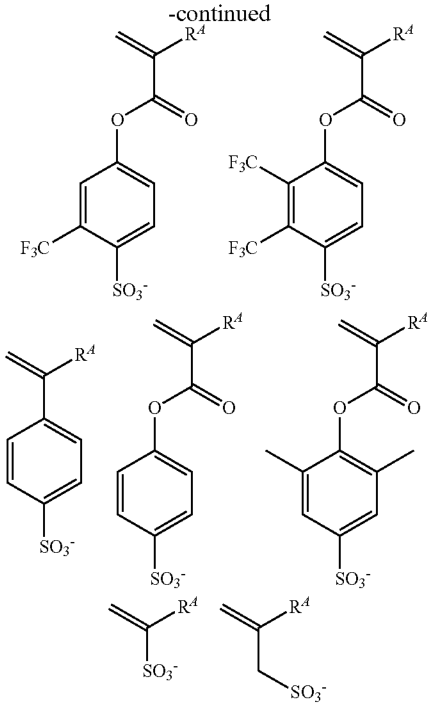

The sulfonium salt from which repeat units (a1) or (a2) are derived may be synthesized, for example, by an ion exchange between a weak acid salt of the sulfonium cation and an ammonium salt having the aforementioned anion.

When the resist composition is of positive tone, the base polymer preferably comprises repeat units having an acid labile group. The repeat units having an acid labile group are preferably repeat units having the formula (b1) or repeat units having the formula (b2). These repeat units are also referred to as repeat units (b1) or (b2). In the exposed region, not only repeat units (b1) and (b2) containing an acid labile group, but also repeat units (a1) and (a2) containing an acid generator undergo catalytic reaction whereby the dissolution rate in the developer is accelerated. Thus, a positive tone resist composition having a very high sensitivity is constructed.

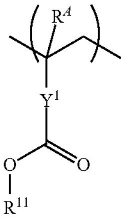

(b1)

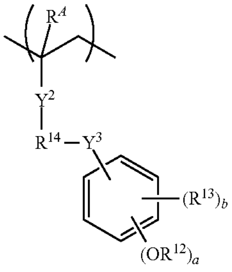

(b2)

In formulae (b1) and (b2), $R^A$ is each independently hydrogen or methyl. $Y^1$ is a single bond, phenylene, naphthylene, or a $C_1$-$C_{12}$ linking group containing at least one moiety selected from an ester bond, ether bond and lactone ring. $Y^2$ is a single bond or ester bond. $Y^3$ is a single bond, ether bond or ester bond. $R^{11}$ and $R^{12}$ are each independently an acid labile group. $R^{13}$ is fluorine, trifluoromethyl, cyano, a $C_1$-$C_6$ saturated hydrocarbyl group, $C_1$-$C_6$ saturated hydrocarbyloxy group, $C_2$-$C_7$ saturated hydrocarbylcarbonyl group, $C_2$-$C_7$ saturated hydrocarbylcarbonyloxy group, or $C_2$-$C_7$ saturated hydrocarbyloxycarbonyl group. $R^{14}$ is a single bond or a $C_1$-$C_6$ alkanediyl group in which some constituent —$CH_2$— may be replaced by an ether bond or ester bond. The subscript "a" is 1 or 2, "b" is an integer of 0 to 4, and a+b is from 1 to 5.

Examples of the monomer from which repeat units (b1) are derived are shown below, but not limited thereto. Herein $R^A$ and $R^{11}$ are as defined above.

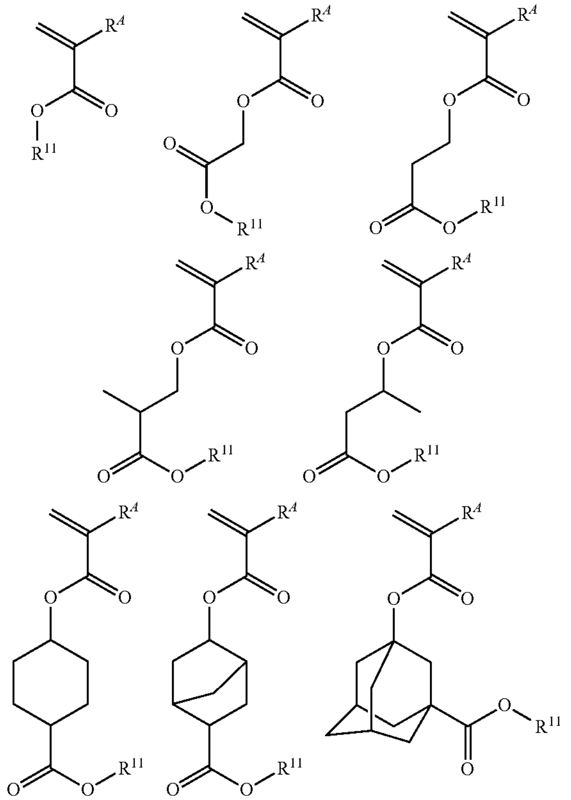

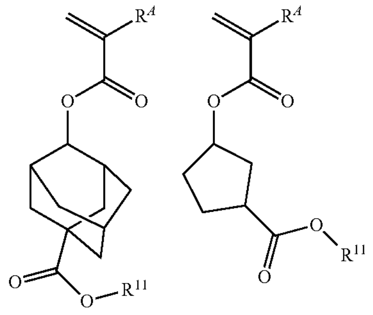

-continued

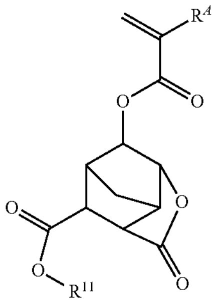

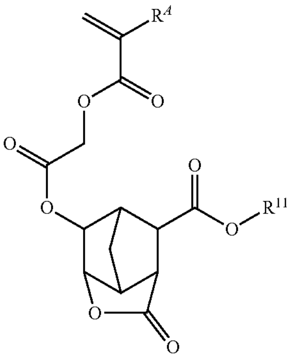

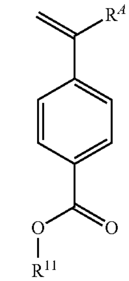

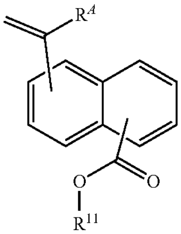

Examples of the monomer from which repeat units (b2) are derived are shown below, but not limited thereto. Herein $R^A$ and $R^{12}$ are as defined above.

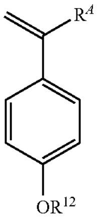

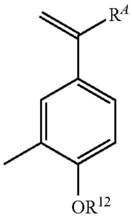

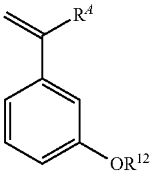

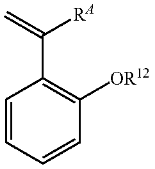

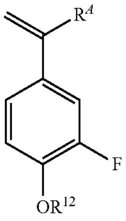

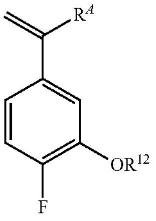

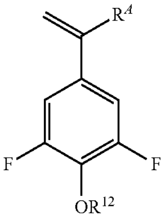

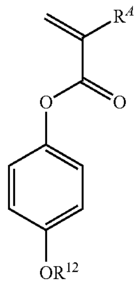

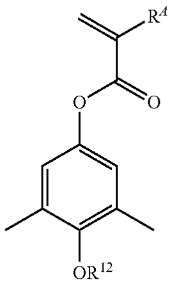

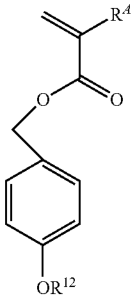

-continued

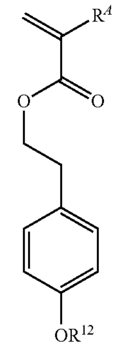

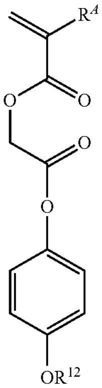

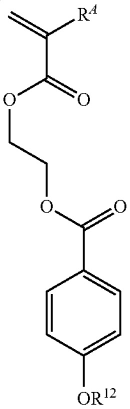

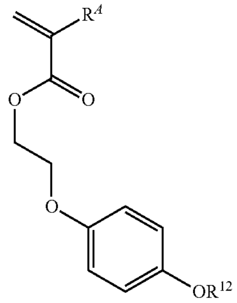

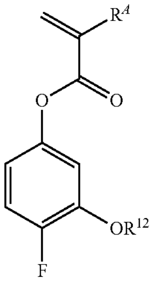

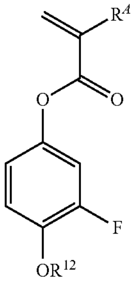

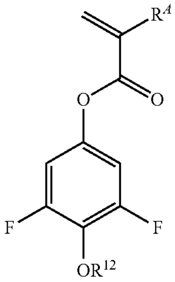

The acid labile groups represented by $R^{11}$ and $R^{12}$ in formulae (b1) and (b2) include those described in U.S. Pat. No. 8,574,817 (JP-A 2013-080033) and U.S. Pat. No. 8,846,303 (JP-A 2013-083821).

Typically, the acid labile groups are selected from groups having the following formulae (L-1) to (L-3).

(L-1)

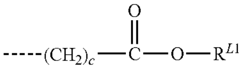

(L-2)

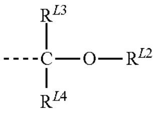

(L-3)

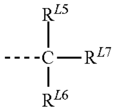

In formulae (L-1) and (L-2), $R^{L1}$ and $R^{L2}$ are each independently a $C_1$-$C_{40}$ hydrocarbyl group which may contain a heteroatom such as oxygen, sulfur, nitrogen or fluorine. The hydrocarbyl group may be saturated or unsaturated and straight, branched or cyclic. Preferred are $C_1$-$C_{40}$ saturated or $C_2$-$C_{40}$ unsaturated hydrocarbyl groups, especially $C_1$-$C_{20}$ saturated or $C_2$-$C_{20}$ unsaturated hydrocarbyl groups.

In formula (L-1), c is an integer of 0 to 10, preferably 1 to 5.

In formula (L-2), $R^{L3}$ and $R^{L4}$ are each independently hydrogen or a $C_1$-$C_{20}$ hydrocarbyl group which may contain a heteroatom such as oxygen, sulfur, nitrogen or fluorine. The hydrocarbyl group may be saturated or unsaturated and straight, branched or cyclic. Preferred are $C_1$-$C_{20}$ saturated hydrocarbyl groups. Any two of $R^{L2}$, $R^{L3}$ and $R^{L4}$ may bond together to form a ring, typically alicyclic, with the carbon atom or carbon and oxygen atoms to which they are attached, the ring containing 3 to 20 carbon atoms, preferably 4 to 16 carbon atoms.

In formula (L-3), $R^{L5}$, $R^{L6}$ and $R^{17}$ are each independently a $C_1$-$C_{20}$ hydrocarbyl group which may contain a heteroatom such as oxygen, sulfur, nitrogen or fluorine. The hydrocarbyl group may be saturated or unsaturated and straight, branched or cyclic. Preferred are $C_1$-$C_{20}$ saturated hydrocarbyl groups. Any two of $R^{L5}$, $R^{L6}$ and $R^{L7}$ may bond together to form a ring, typically alicyclic, with the carbon atom to which they are attached, the ring having 3 to 20 carbon atoms, preferably 4 to 16 carbon atoms and optionally containing a double bond or triple bond.

Also suited as the acid labile group having formula (L-3) are aromatic group-containing acid labile groups as described in JP 5655754, JP 5655755, JP 5655756, JP 5407941, JP 5434983, JP 5565293, and JP-A 2007-279699: triple bond-containing acid labile groups as described in JP 5565293 and JP-A 2007-279699; and double or triple bond-containing acid labile groups as described in JP-A 2021-050307.

The base polymer may further comprise repeat units (c) having a phenolic hydroxy group as an adhesive group. Examples of suitable monomers from which repeat units (c) are derived are given below, but not limited thereto. Herein $R^A$ is as defined above.

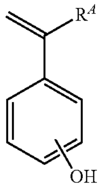
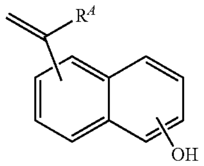
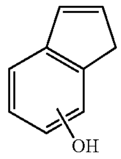
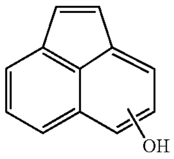
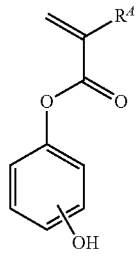
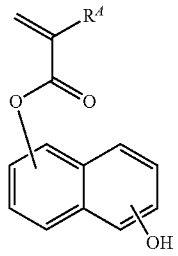

-continued

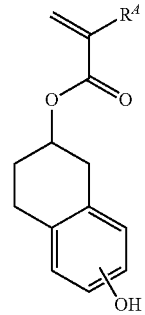
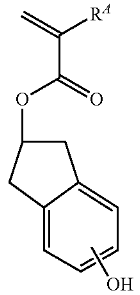
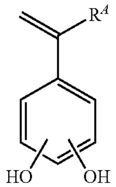
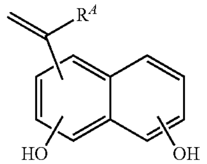
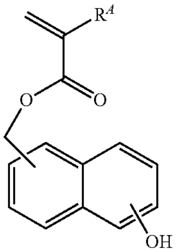
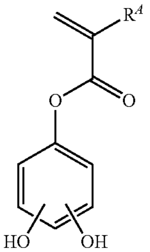
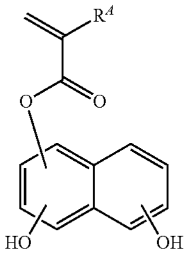
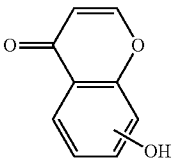
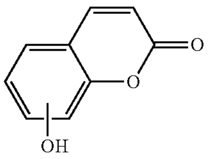
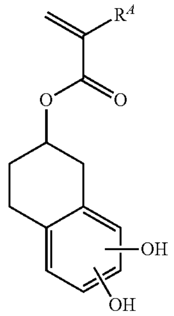
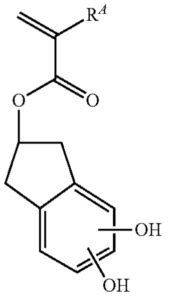

The base polymer may further comprise repeat units (d) having another adhesive group selected from hydroxy (other than the foregoing phenolic hydroxy), lactone ring, sultone ring, ether bond, ester bond, sulfonic ester bond, carbonyl, sulfonyl, cyano and carboxy groups. Examples of suitable monomers from which repeat units (d) are derived are given below, but not limited thereto. Herein $R^A$ is as defined above.
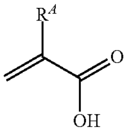
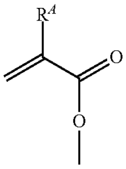
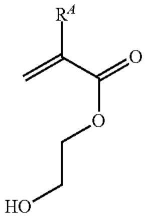
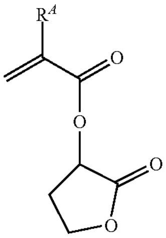
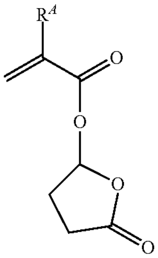
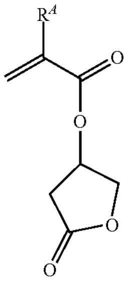
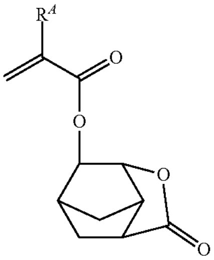
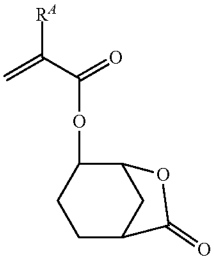
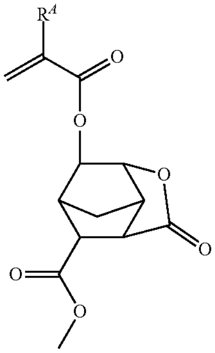
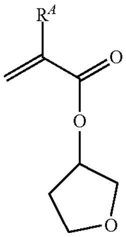
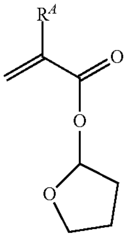
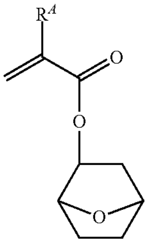
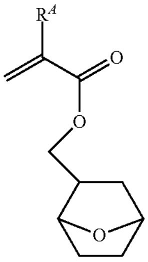
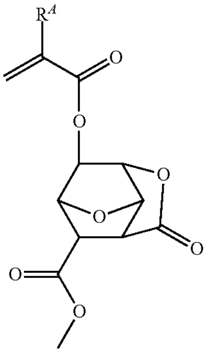
-continued
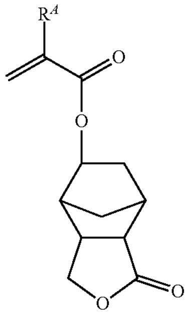
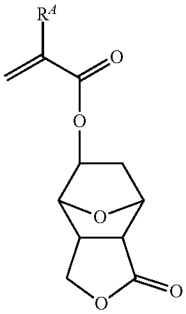
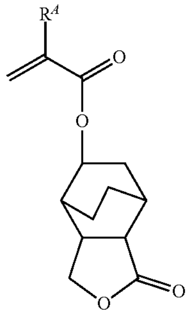
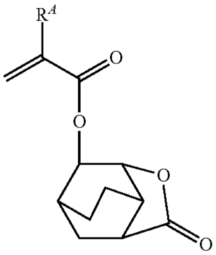
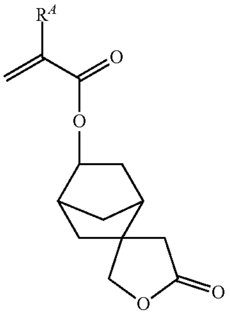
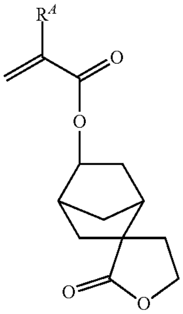
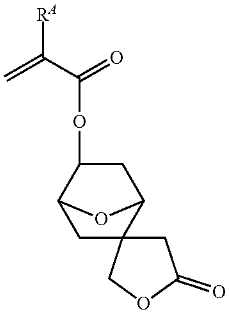
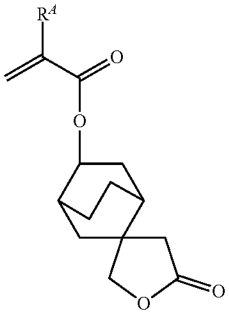
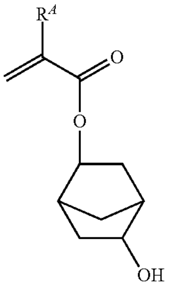
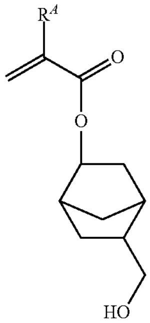
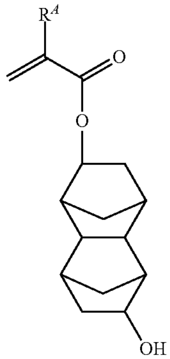

-continued
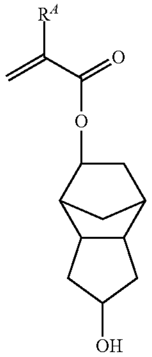
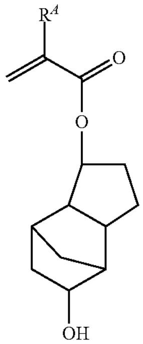
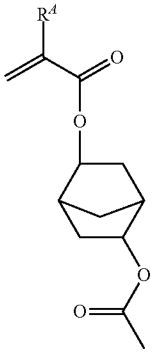
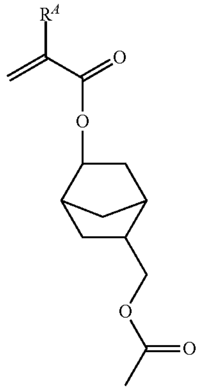
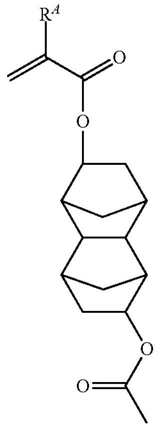
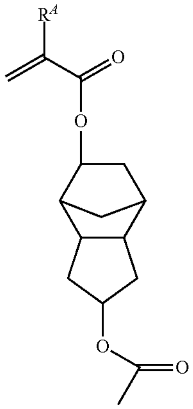
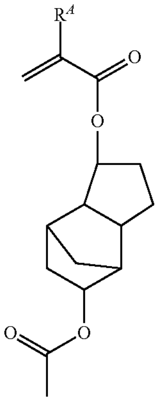
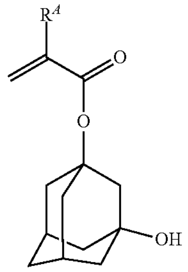
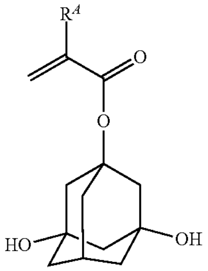
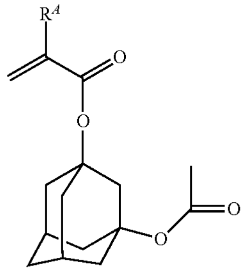
-continued
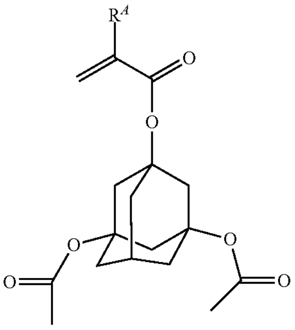
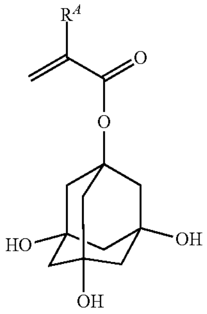
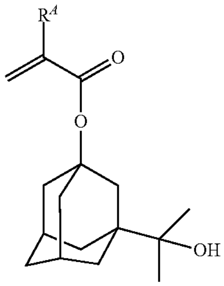
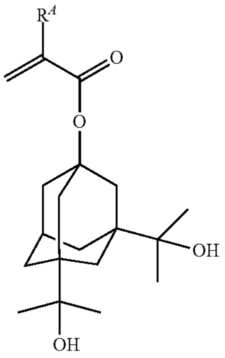
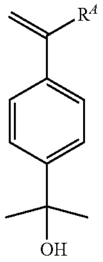
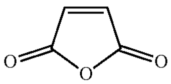
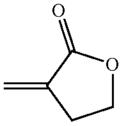
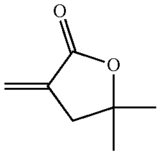
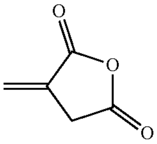
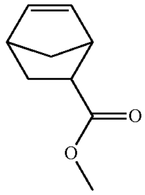
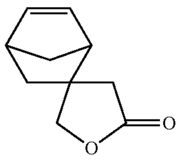
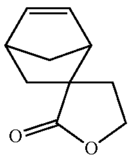
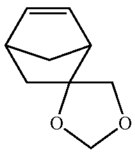
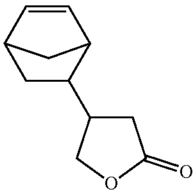
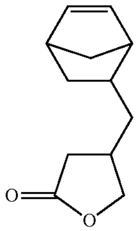
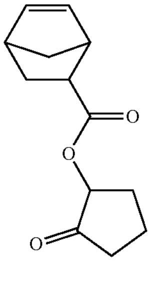

-continued
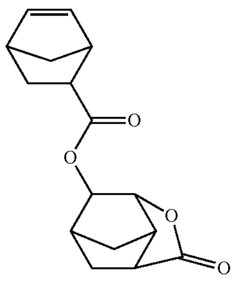
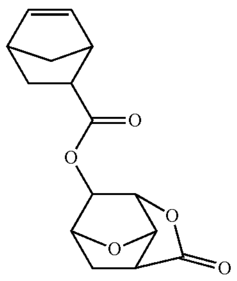
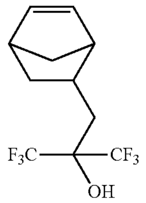
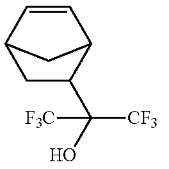
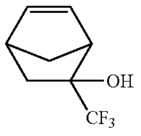
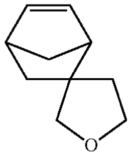
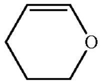
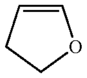
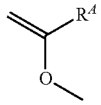
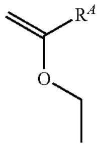
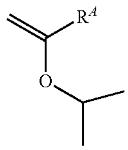
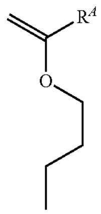
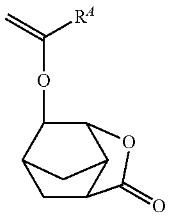
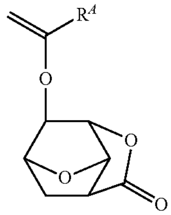
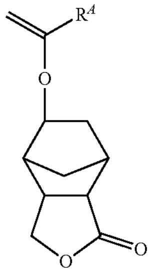
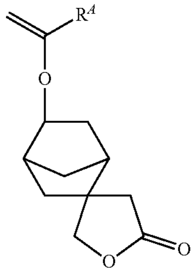
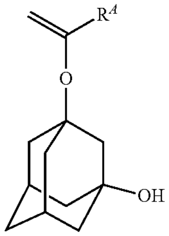
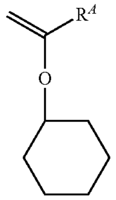
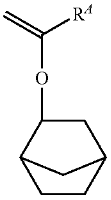
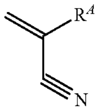
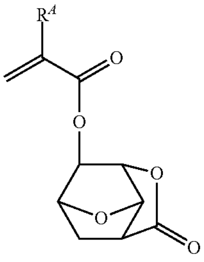
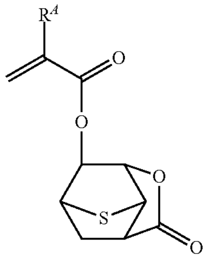
-continued
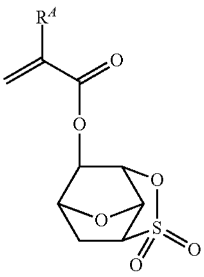
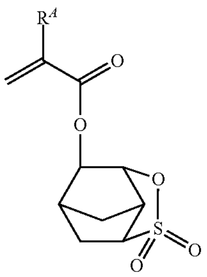
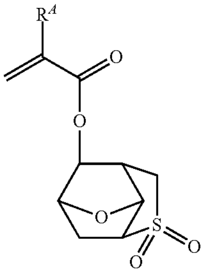
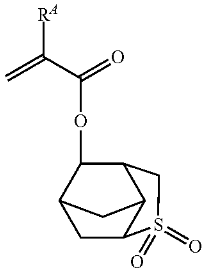
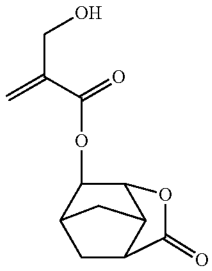
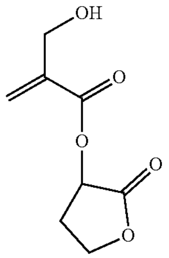
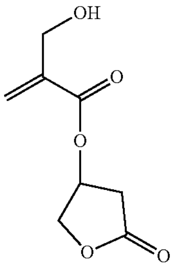
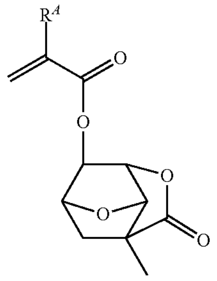
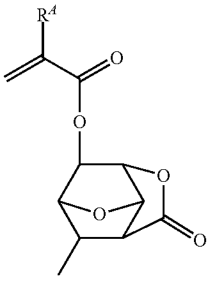
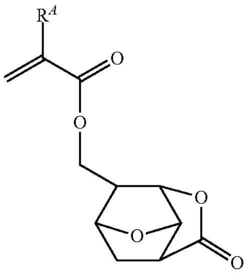
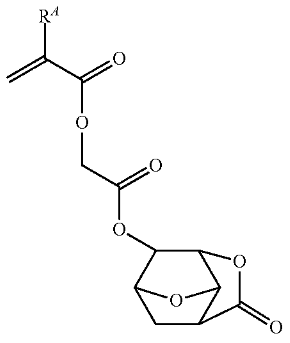

-continued
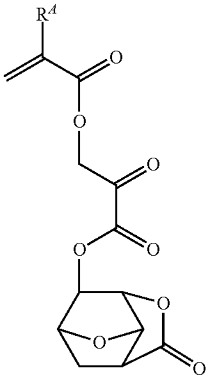
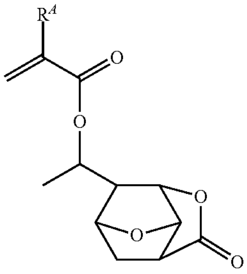
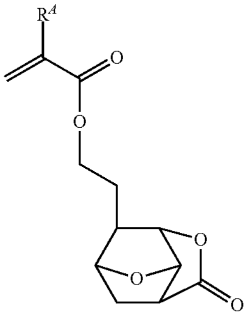
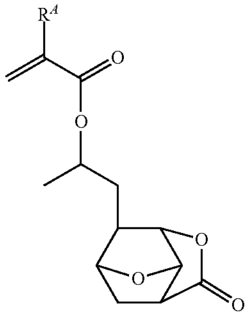
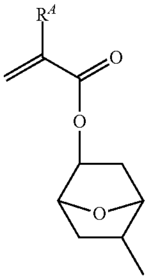
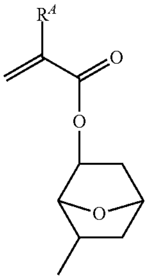
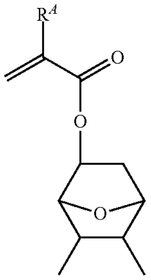
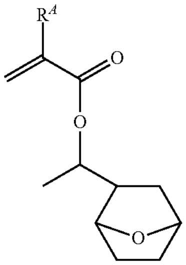
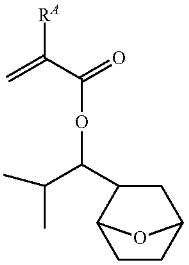
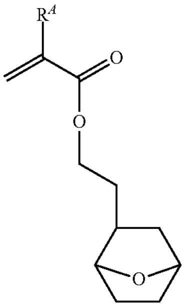
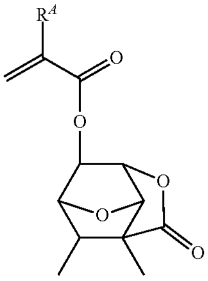
-continued
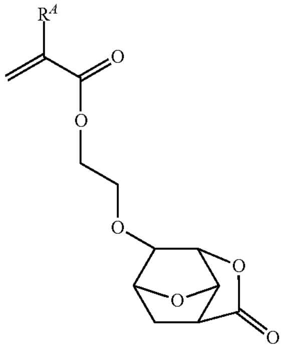
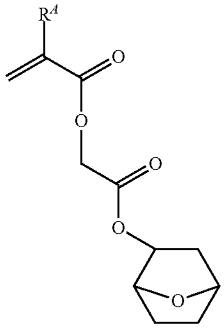
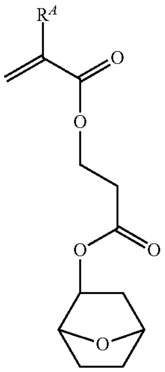
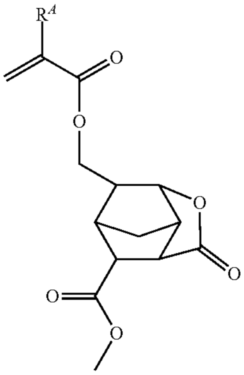
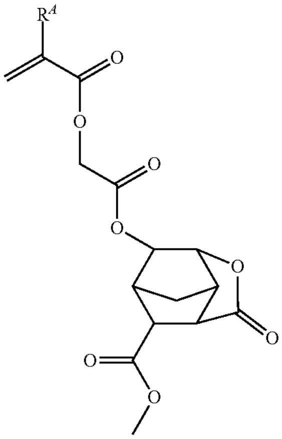
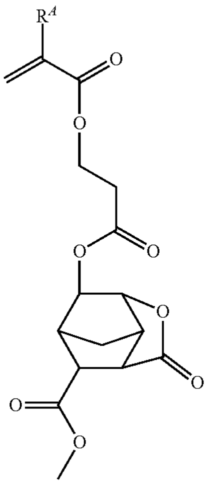
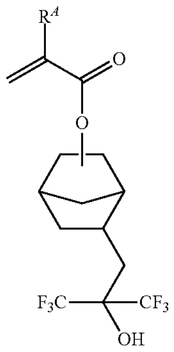
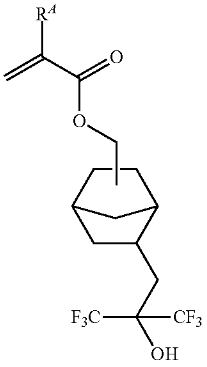

-continued
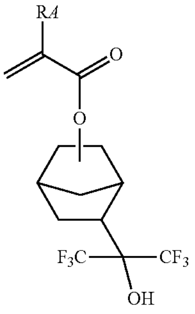
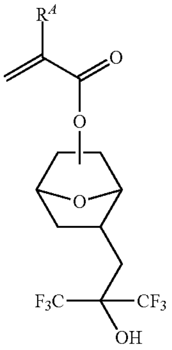
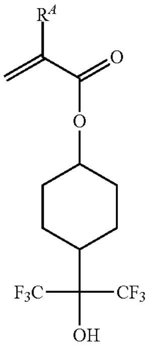
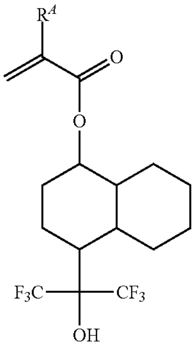
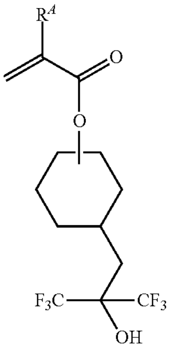
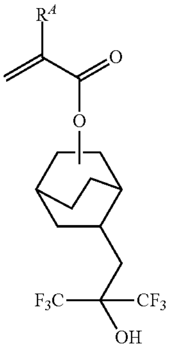
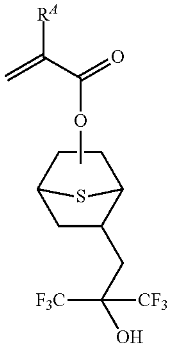
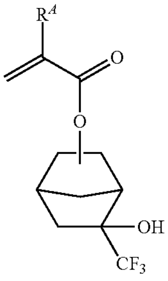
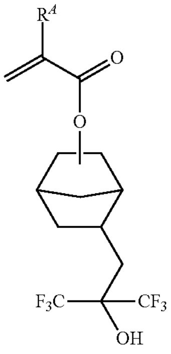
-continued
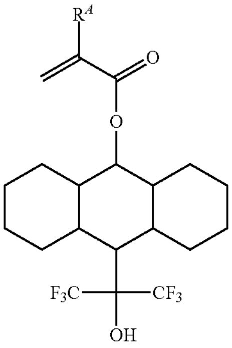
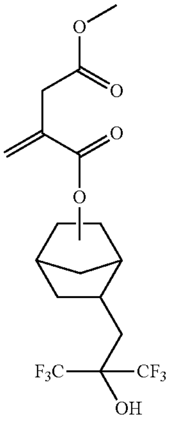
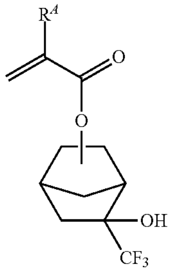
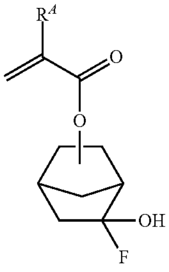
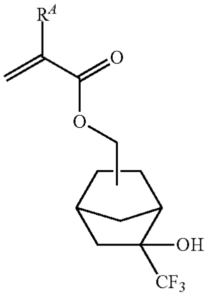
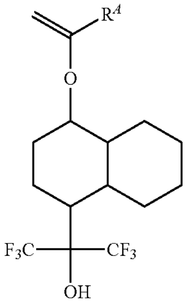
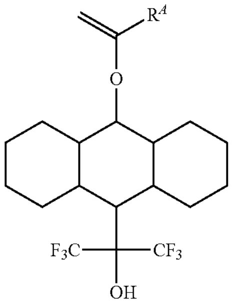
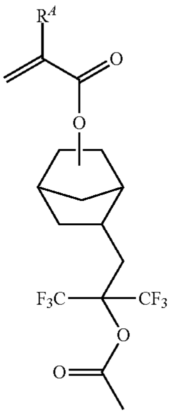
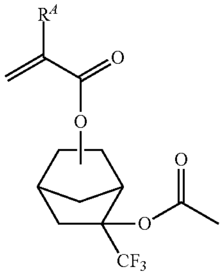
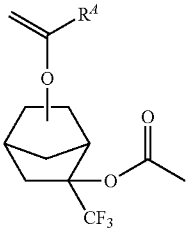

-continued
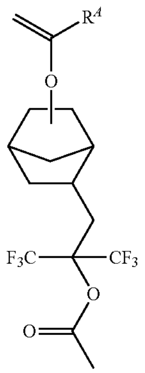
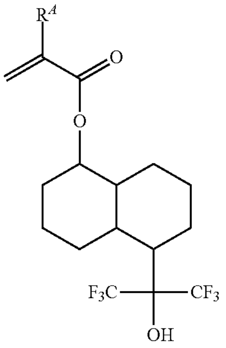
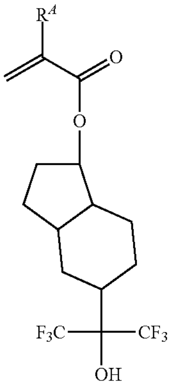
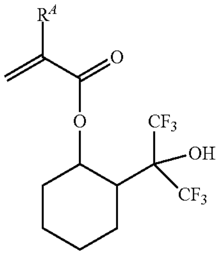
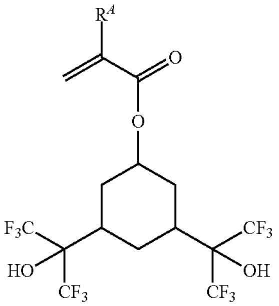
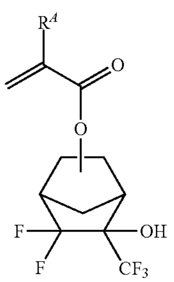
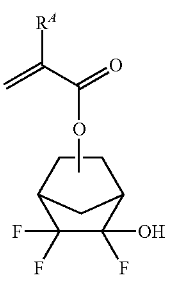
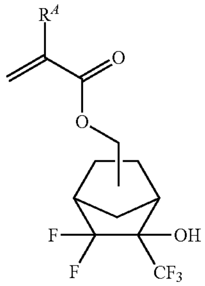
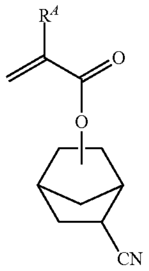
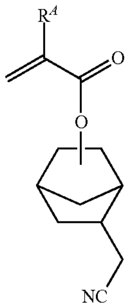
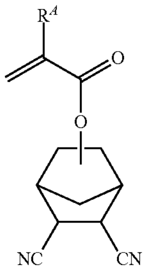
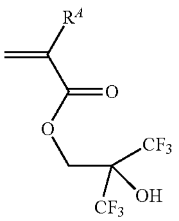
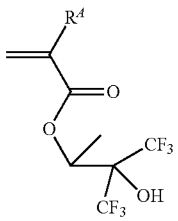
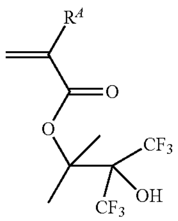
-continued
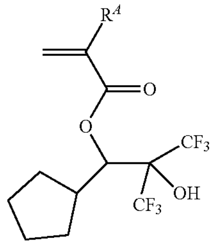
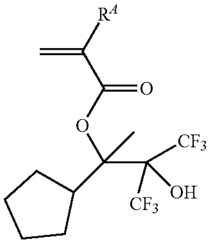
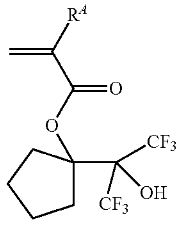
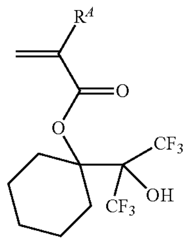
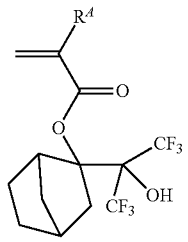
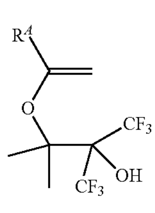
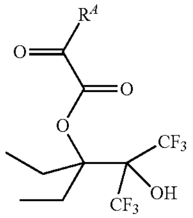
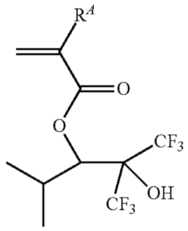
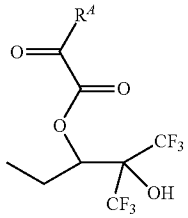
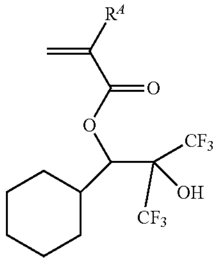
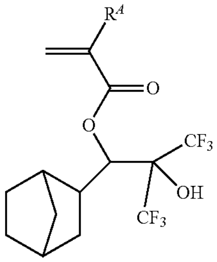
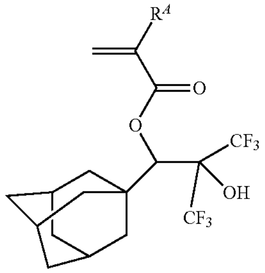
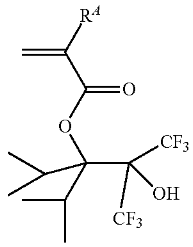
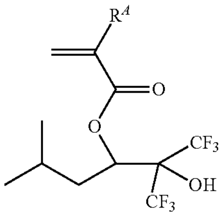
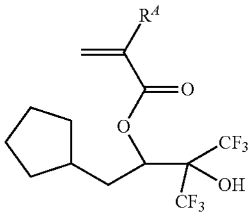

-continued
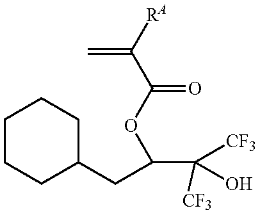
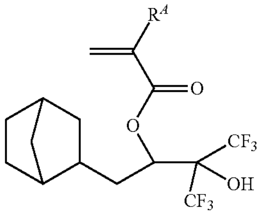
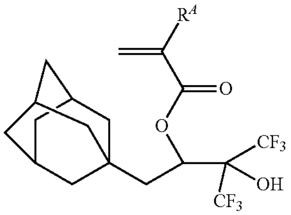
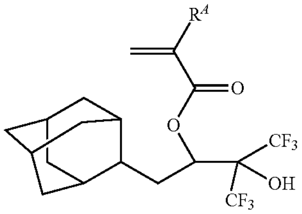
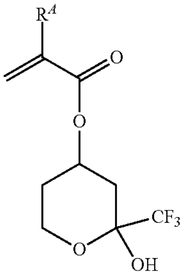
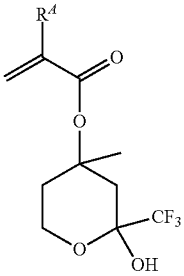
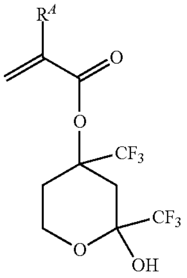
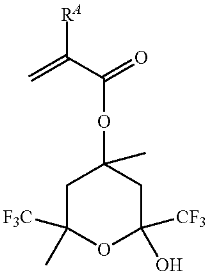
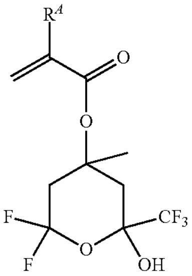
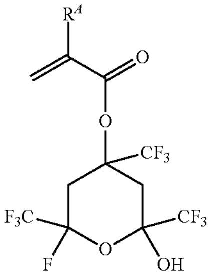
-continued
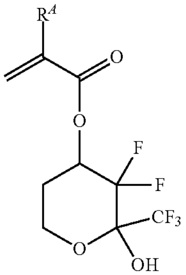
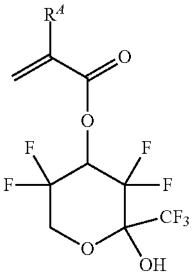
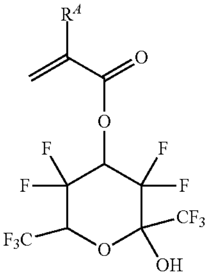
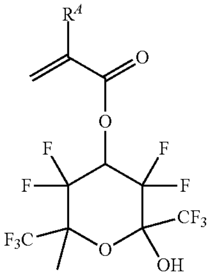
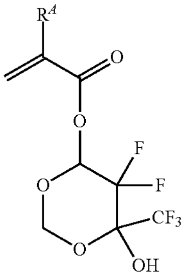
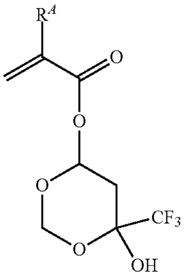
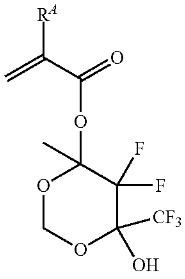
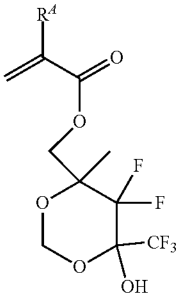
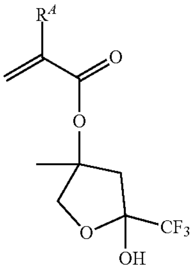
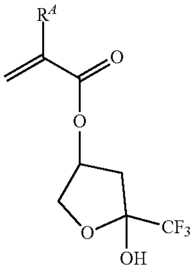
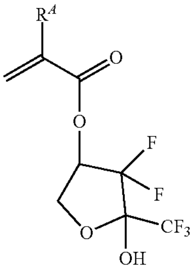
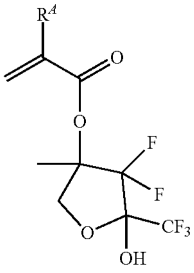

-continued
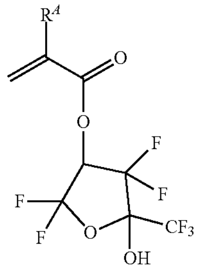
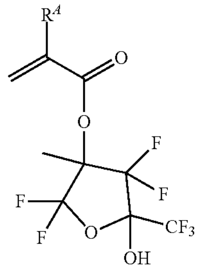
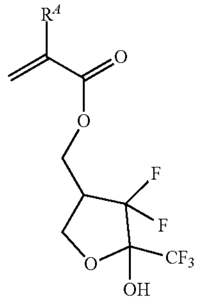
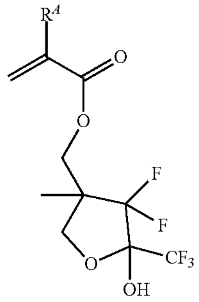
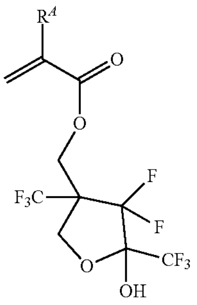
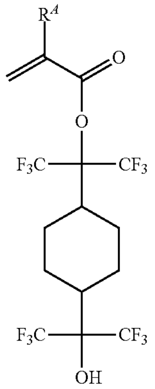
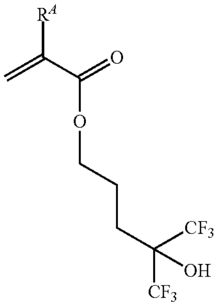
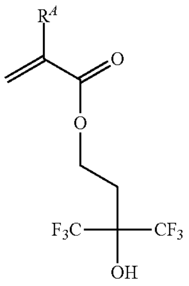
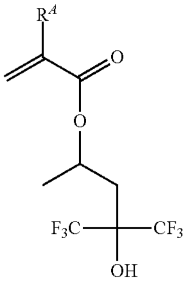
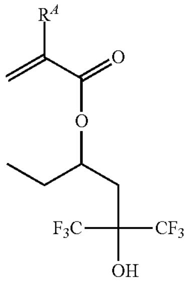
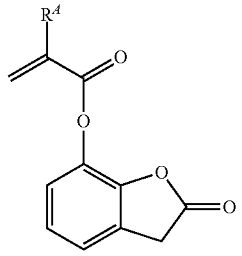
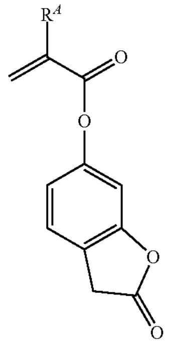
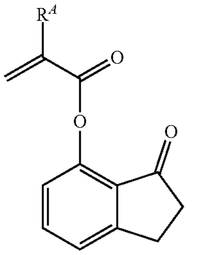
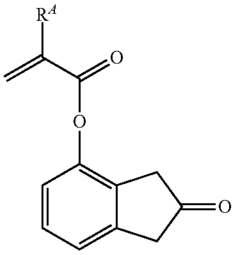
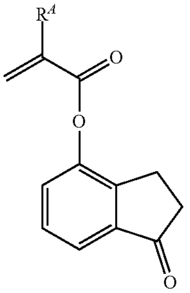
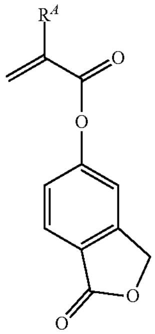
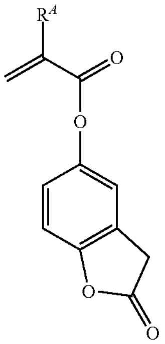
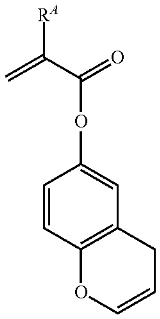
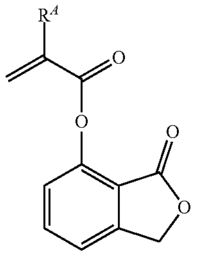
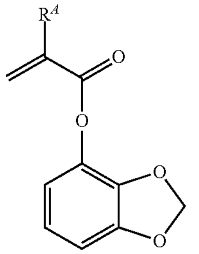
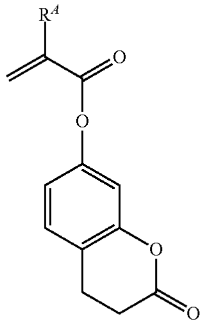

-continued
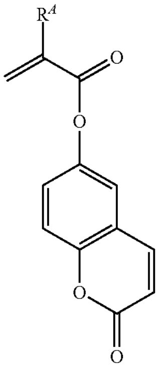
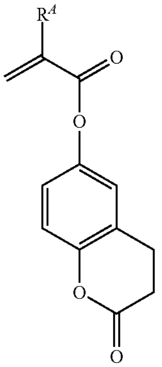
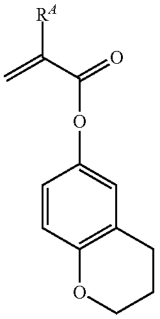
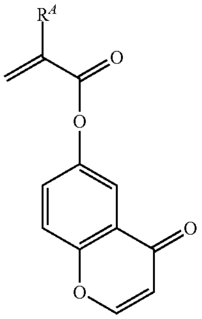
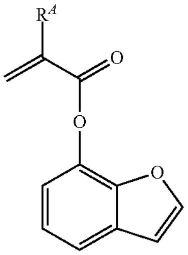
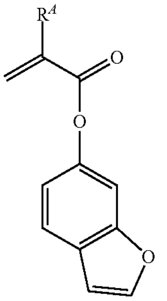
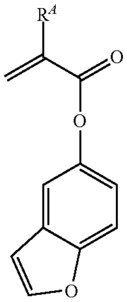
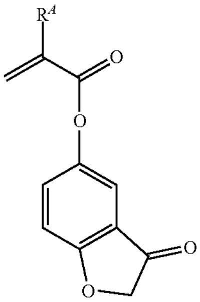
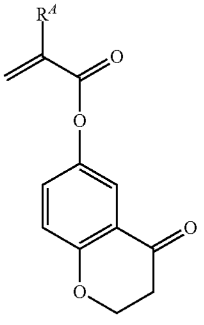
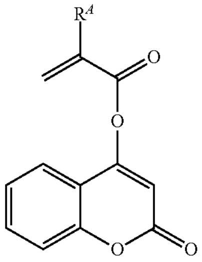
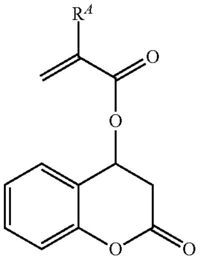
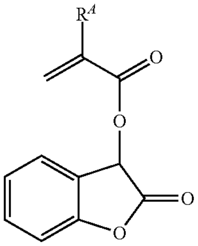
-continued
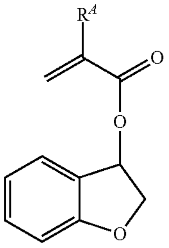
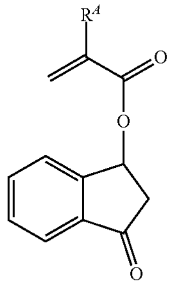
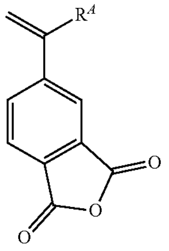
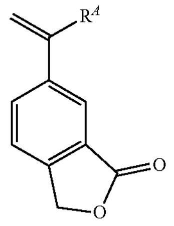
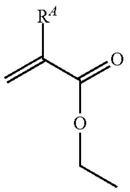
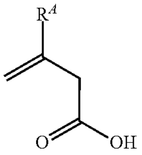
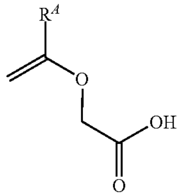
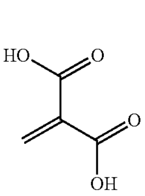
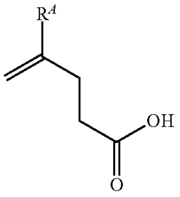
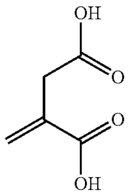
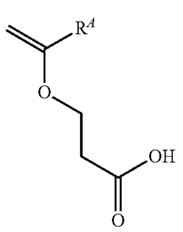
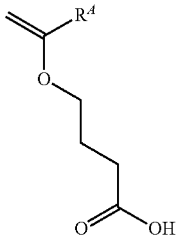
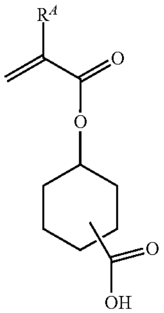
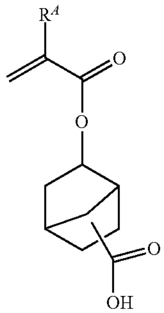
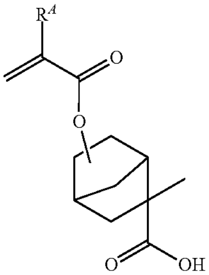

-continued
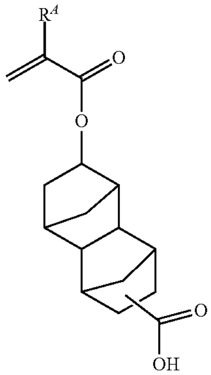
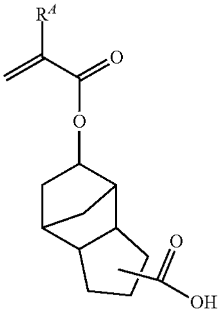
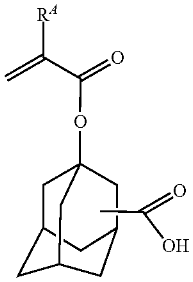
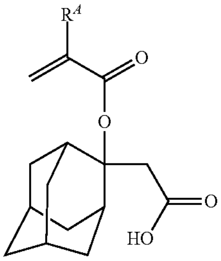
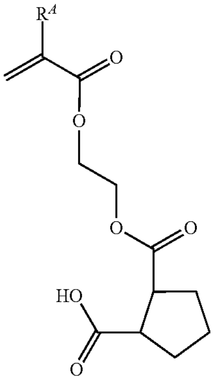
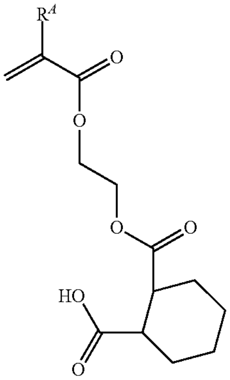
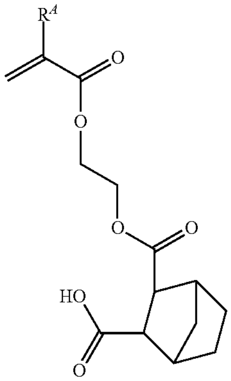
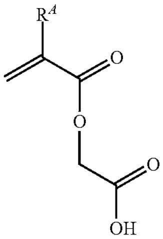
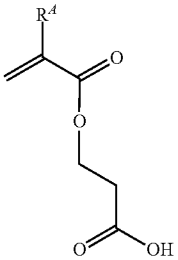
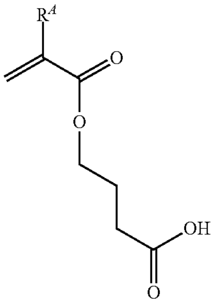
-continued
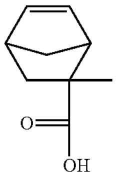
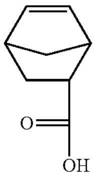
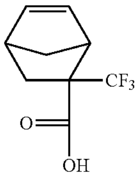
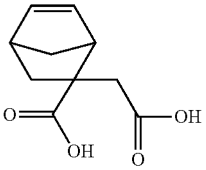
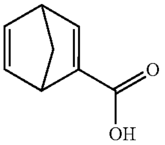
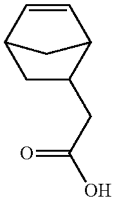
In another preferred embodiment, the base polymer may further comprise repeat units (e) derived from indene, benzofuran, benzothiophene, acenaphthylene, chromone, coumarin, and norbornadiene, or derivatives thereof. Examples of suitable monomers from which repeat units (e) are derived are given below, but not limited thereto.
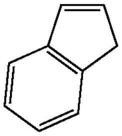
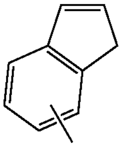
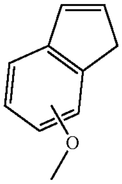
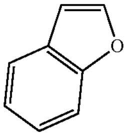
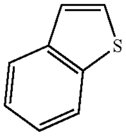
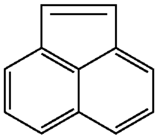
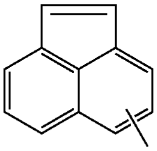
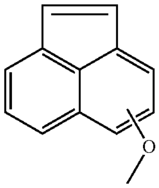
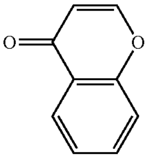
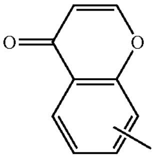
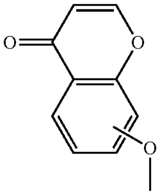
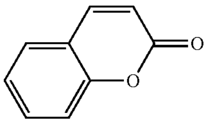
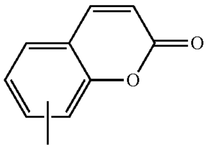
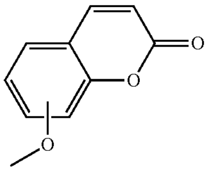

-continued

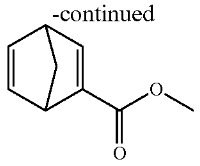

The base polymer may further include repeat units (f) which are derived from styrene, vinylnaphthalene, vinylanthracene, vinylpyrene, methyleneindene, vinylpyridine, vinylcarbazole, or derivatives thereof.

The base polymer comprises repeat units (a1) or (a2) as essential component and additional repeat units (b), (c), (d), (e), and (f) as optional components. A fraction of units (a1), (a2), (b), (c), (d), (e), and (f) is: preferably $0 \leq a1 \leq 0.5$, $0 \leq a2 \leq 0.5$, $0 < a1+a2 \leq 0.5$, $0 \leq b1 \leq 0.8$, $0 \leq b2 \leq 0.8$, $0.1 \leq b1+b2 \leq 0.8$, $0 \leq e \leq 0.9$, $0 \leq d \leq 0.8$, $0 \leq e \leq 0.8$, and $0 \leq f \leq 0.5$; more preferably $0 \leq a1 \leq 0.4$, $0 \leq a2 \leq 0.4$, $0.01 \leq a1+a2 \leq 0.4$, $0 \leq b1 \leq 0.7$, $0 \leq b2 \leq 0.7$, $0.15 \leq b1+b2 \leq 0.7$, $0 \leq c \leq 0.8$, $0 \leq d \leq 0.7$, $0 \leq e \leq 0.7$, and $0 \leq f \leq 0.4$; and even more preferably $0 \leq a1 \leq 0.35$, $0 \leq a2 \leq 0.35$, $0.02 \leq a1+a2 \leq 0.35$, $0 \leq b1 \leq 0.65$, $0 \leq b2 \leq 0.65$, $0.2 \leq b1+b2 \leq 0.65$, $0 \leq c \leq 0.7$, $0 \leq d \leq 0.6$, $0 \leq e \leq 0.6$, and $0 \leq f \leq 0.3$. Notably, $a1+a2+b1+b2+c+d+e+f=1.0$.

The base polymer may be synthesized by any desired methods, for example, by dissolving one or more monomers selected from the monomers corresponding to the foregoing repeat units in an organic solvent, adding a radical polymerization initiator thereto, and heating for polymerization. Examples of the organic solvent which can be used for polymerization include toluene, benzene, tetrahydrofuran, diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the polymerization temperature is 50 to 80° C., and the reaction time is 2 to 100 hours, more preferably 5 to 20 hours.

When a monomer having a hydroxy group is copolymerized, the hydroxy group may be replaced by an acetal group susceptible to deprotection with acid, typically ethoxyethoxy, prior to polymerization, and the polymerization be followed by deprotection with weak acid and water. Alternatively, the hydroxy group may be replaced by an acetyl, formyl, pivaloyl or similar group prior to polymerization, and the polymerization be followed by alkaline hydrolysis.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

The base polymer should preferably have a weight average molecular weight (Mw) in the range of 1,000 to 500,000, and more preferably 2,000 to 30,000, as measured by GPC versus polystyrene standards using tetrahydrofuran (THF) solvent. A Mw in the range ensures that the resist film has heat resistance and high solubility in alkaline developer.

If a base polymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and Mw/Mn become stronger as the pattern rule becomes finer. Therefore, the base polymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, Mw or Mw/Mn is acceptable.

Organic Solvent

An organic solvent may be added to the resist composition. The organic solvent used herein is not particularly limited as long as the foregoing and other components are soluble therein. Examples of the organic solvent are described in JP-A 2008-111103, paragraphs [0144]-[0145] (U.S. Pat. No. 7,537,880). Exemplary solvents include ketones such as cyclohexanone, cyclopentanone, methyl-2-n-pentyl ketone and 2-heptanone; alcohols such as 3-methoxybutanol, 3-methyl-3-methoxybutanol, 1-methoxy-2-propanol, 1-ethoxy-2-propanol and diacetone alcohol (DAA): ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, methyl 2-hydroxyisobutyrate, ethyl 2-hydroxyisobutyrate, propyl 2-hydroxyisobutyrate, and butyl 2-hydroxyisobutyrate; and lactones such as γ-butyrolactone, which may be used alone or in admixture.

The organic solvent is preferably added in an amount of 100 to 10,000 parts, and more preferably 200 to 8,000 parts by weight per 100 parts by weight of the base polymer.

Quencher

The resist composition may further comprise a quencher. As used herein, the "quencher" refers to a compound capable of trapping the acid generated from the acid generator for thereby preventing the acid from diffusing to the unexposed region.

The quencher is typically selected from conventional basic compounds. Conventional basic compounds include primary, secondary, and tertiary aliphatic amines, mixed amines, aromatic amines, heterocyclic amines, nitrogen-containing compounds with carboxy group, nitrogen-containing compounds with sulfonyl group, nitrogen-containing compounds with hydroxy group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxy, ether bond, ester bond, lactone ring, cyano, or sulfonic ester bond as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Suitable quenchers also include onium salts such as sulfonium salts, iodonium salts and ammonium salts of sulfonic acids which are not fluorinated at α-position, carboxylic acids or fluorinated alkoxides, as described in JP-A 2008-158339. While an α-fluorinated sulfonic acid, imide acid, and methide acid are necessary to deprotect the acid labile group of carboxylic acid ester, an α-non-fluorinated sulfonic acid, carboxylic acid or fluorinated alcohol is released by salt exchange with an α-non-fluorinated onium salt. The α-non-fluorinated sulfonic acid, carboxylic acid and fluorinated alcohol function as a quencher because they do not induce deprotection reaction.

Exemplary such quenchers include a compound (onium salt of α-non-fluorinated sulfonic acid) having the formula (2), a compound (onium salt of carboxylic acid) having the formula (3), and a compound (onium salt of alkoxide) having the formula (4).

$$R^{101}—SO_3^- \ Mq^+ \quad (2)$$

$$R^{102}—CO_2^- \ Mq^+ \quad (3)$$

$$R^{103}—O^- \ Mq^+ \quad (4)$$

In formula (2), $R^{101}$ is hydrogen or a $C_1$-$C^{40}$ hydrocarbyl group which may contain a heteroatom, exclusive of the hydrocarbyl group in which the hydrogen bonded to the carbon atom at α-position of the sulfo group is substituted by fluorine or fluoroalkyl moiety.

The $C_1$-$C_{40}$ hydrocarbyl group may be saturated or unsaturated and straight, branched or cyclic. Examples thereof include $C_1$-$C^{40}$ alkyl groups such as methyl, ethyl, n-propyl, isopropyl, n-butyl, isobutyl, sec-butyl, tert-butyl, tert-pentyl, n-pentyl, n-hexyl, n-octyl, 2-ethylhexyl, n-nonyl, n-decyl; $C_3$-$C_{40}$ cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, tricyclo[5.2.1.$0^{2,6}$]decanyl, adamantyl, and adamantylmethyl; $C_2$-$C^{40}$ alkenyl groups such as vinyl, allyl, propenyl, butenyl and hexenyl: $C_3$-$C_{40}$ cyclic unsaturated aliphatic hydrocarbyl groups such as cyclohexenyl; $C_6$-$C_{40}$ aryl groups such as phenyl, naphthyl, alkylphenyl groups (e.g., 2-methylphenyl, 3-methylphenyl, 4-methylphenyl, 4-ethylphenyl, 4-tert-butylphenyl, 4-n-butylphenyl), dialkylphenyl groups (e.g., 2,4-dimethylphenyl and 2,4,6-triisopropylphenyl), alkylnaphthyl groups (e.g., methylnaphthyl and ethylnaphthyl), dialkylnaphthyl groups (e.g., dimethylnaphthyl and diethylnaphthyl); and $C_7$-$C_{40}$ aralkyl groups such as benzyl. 1-phenylethyl and 2-phenylethyl.

In the hydrocarbyl group, some or all of the hydrogen atoms may be substituted by a moiety containing a heteroatom such as oxygen, sulfur, nitrogen or halogen, and some constituent —$CH_2$— may be replaced by a moiety containing a heteroatom such as oxygen, sulfur or nitrogen, so that the group may contain a hydroxy moiety, cyano moiety, carbonyl moiety, ether bond, ester bond, sulfonic ester bond, carbonate bond, lactone ring, sultone ring, carboxylic anhydride (—C(═O)—O—C(═O)—), or haloalkyl moiety. Suitable heteroatom-containing hydrocarbyl groups include heteroaryl groups such as thienyl, 4-hydroxyphenyl, alkoxyphenyl groups such as 4-methoxyphenyl, 3-methoxyphenyl, 2-methoxyphenyl, 4-ethoxyphenyl, 4-tert-butoxyphenyl, 3-tert-butoxyphenyl; alkoxynaphthyl groups such as methoxynaphthyl, ethoxynaphthyl, n-propoxynaphthyl and n-butoxynaphthyl; dialkoxynaphthyl groups such as dimethoxynaphthyl and diethoxynaphthyl; and aryloxoalkyl groups, typically 2-aryl-2-oxoethyl groups such as 2-phenyl-2-oxoethyl, 2-(1-naphthyl)-2-oxoethyl and 2-(2-naphthyl)-2-oxoethyl.

In formula (3), $R^{102}$ is a $C_1$-$C_{40}$ hydrocarbyl group which may contain a heteroatom. Examples of the hydrocarbyl group $R^{102}$ are as exemplified above for the hydrocarbyl group $R^{101}$. Also included are fluorinated alkyl groups such as trifluoromethyl, trifluoroethyl, 2,2,2-trifluoro-1-methyl-1-hydroxyethyl, 2,2,2-trifluoro-1-(trifluoromethyl)-1-hydroxyethyl, and fluorinated aryl groups such as pentafluorophenyl and 4-trifluoromethylphenyl.

In formula (4), $R^{103}$ is a $C_1$-$C_8$ saturated hydrocarbyl group containing at least 3 fluorine atoms or a $C_6$-$C_{10}$ aryl group containing at least 3 fluorine atoms, the hydrocarbyl and aryl groups optionally containing a nitro moiety.

In formulae (2). (3) and (4), $Mq^+$ is an onium cation. The onium cation is preferably a sulfonium, iodonium or ammonium cation, with the sulfonium cation being more preferred. Suitable sulfonium cations are as exemplified in U.S. Pat. No. 10,295,904 (JP-A 2017-219836).

A sulfonium salt of iodized benzene ring-containing carboxylic acid having the formula (5) is also useful as the quencher.

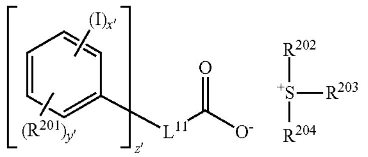

(5)

In formula (5), $R^{201}$ is hydroxy, fluorine, chlorine, bromine, amino, nitro, cyano, or a $C_1$-$C_6$ saturated hydrocarbyl, $C_1$-$C_6$ saturated hydrocarbyloxy, $C_2$-$C_6$ saturated hydrocarbylcarbonyloxy, or $C_1$-$C_4$ saturated hydrocarbylsulfonyloxy group, in which some or all hydrogen may be substituted by halogen, or —N($R^{201A}$)—C(═O)—$R^{201B}$, or —N($R^{201A}$)—C(═O)—O—$R^{201B}$, wherein $R^{201A}$ is hydrogen or a $C_1$-$C_6$ saturated hydrocarbyl group and $R^{201B}$ is a $C_1$-$C_6$ saturated hydrocarbyl or $C_2$-$C_8$ unsaturated aliphatic hydrocarbyl group.

In formula (5), x' is an integer of 1 to 5, y' is an integer of 0 to 3, and z' is an integer of 1 to 3. $L^{11}$ is a single bond, or a $C_1$-$C_{20}$ (z'+1)-valent linking group which may contain an ether bond, carbonyl, ester bond, amide bond, sultone ring, lactam ring, carbonate bond, halogen, hydroxy or carboxy moiety or a mixture thereof. The saturated hydrocarbyl, saturated hydrocarbyloxy, saturated hydrocarbylcarbonyloxy and saturated hydrocarbylsulfonyloxy groups may be straight, branched or cyclic. Groups $R^{201}$ may be identical or different when y' and/or z' is 2 or 3.

In formula (5), $R^{202}$, $R^{203}$ and $R^{204}$ are each independently halogen or a $C_1$-$C_{20}$ hydrocarbyl group which may contain a heteroatom. The hydrocarbyl group may be saturated or unsaturated and straight, branched or cyclic. Examples thereof are as exemplified for the hydrocarbyl group $R^8$ in formula (1). In these hydrocarbyl groups, some or all hydrogen may be substituted by hydroxy, carboxy, halogen, oxo, cyano, nitro, sultone, sulfone, or sulfonium salt-containing moiety, or some constituent —$CH_2$— may be replaced by an ether bond, ester bond, carbonyl, amide bond, carbonate bond or sulfonic ester bond. A pair of $R^{202}$ and $R^{203}$ may bond together to form a ring with the sulfur atom to which they are attached.

Examples of the compound having formula (5) include those described in U.S. Pat. No. 10,295,904 (JP-A 2017-219836) and US20210188770 (JP-A 2021-091666).

Also useful are quenchers of polymer type as described in U.S. Pat. No. 7,598,016 (JP-A 2008-239918). The polymeric quencher segregates at the resist film surface and thus enhances the rectangularity of resist pattern. When a protective film is applied as is often the case in the immersion lithography, the polymeric quencher is also effective for preventing a film thickness loss of resist pattern or rounding of pattern top.

Other useful quenchers include sulfonium salts of betaine structure as described in JP 6848776 and JP-A 2020-037544, fluorine-free methide acids as described in JP-A 2020-055797, sulfonium salts of sulfonamide as described in JP 5807552, and sulfonium salts of iodized sulfonamide as described in JP-A 2019-211751.

The quencher is preferably added in an amount of 0 to 5 parts, more preferably 0 to 4 parts by weight per 100 parts by weight of the base polymer. The quencher may be used alone or in admixture.

Other Components

In addition to the foregoing components, the resist composition may contain other components such as an acid generator of sulfonium or iodonium salt type (referred to as another acid generator, hereinafter), surfactant, dissolution inhibitor, water repellency improver and acetylene alcohol. Each of the other components may be used alone or in admixture.

The other acid generator is typically a compound (PAG) capable of generating an acid upon exposure to actinic ray or radiation. Although the PAG used herein may be any compound capable of generating an acid upon exposure to high-energy radiation, those compounds capable of generating sulfonic acid, imide acid (imidic acid) or methide acid are preferred. Suitable PAGs include sulfonium salts, iodonium salts, sulfonyldiazomethane, N-sulfonyloxyimide, and oxime-O-sulfonate acid generators. Exemplary PAGs are described in JP-A 2008-111103, paragraphs [0122]-[0142] (U.S. Pat. No. 7,537,880), JP-A 2018-005224, and JP-A 2018-025789. Especially suited for EUV resist materials are sulfonium or iodonium salts of iodized sulfonic acid anions as described in JP 6720926 and JP 6743781. The other acid generator is preferably used in an amount of 0 to 200 parts, more preferably 0.1 to 100 parts by weight per 100 parts by weight of the base polymer.

Exemplary surfactants are described in JP-A 2008-111103, paragraphs [0165]-[0166]. Inclusion of a surfactant may improve or control the coating characteristics of the resist composition. The surfactant is preferably added in an amount of 0.0001 to 10 parts by weight per 100 parts by weight of the base polymer.

In the embodiment wherein the resist composition is of positive tone, the inclusion of a dissolution inhibitor may lead to an increased difference in dissolution rate between exposed and unexposed areas and a further improvement in resolution. The dissolution inhibitor is typically a compound having at least two phenolic hydroxy groups on the molecule, in which an average of from 0 to 100 mol % of all the hydrogen atoms on the phenolic hydroxy groups are replaced by acid labile groups or a compound having at least one carboxy group on the molecule, in which an average of 50 to 100 mol % of all the hydrogen atoms on the carboxy groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxy or carboxy group is replaced by an acid labile group, as described in U.S. Pat. No. 7,771,914 (JP-A 2008-122932, paragraphs [0155]-[0178]).

The dissolution inhibitor is preferably added in an amount of 0 to 50 parts, more preferably 5 to 40 parts by weight per 100 parts by weight of the base polymer.

To the resist composition, a water repellency improver may also be added for improving the water repellency on surface of a resist film. The water repellency improver may be used in the topcoatless immersion lithography. Suitable water repellency improvers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in alkaline developers and organic solvent developers. The water repellency improver of specific structure with a 1,1,1,3,3,3-hexafluoro-2-propanol residue is well soluble in the developer. A polymer having an amino group or amine salt copolymerized as repeat units may serve as the water repellent additive and is effective for preventing evaporation of acid during PEB, thus preventing any hole pattern opening failure after development. An appropriate amount of the water repellency improver is 0 to 20 parts, preferably 0.5 to 10 parts by weight per 100 parts by weight of the base polymer.

Also, an acetylene alcohol may be blended in the resist composition. Suitable acetylene alcohols are described in JP-A 2008-122932, paragraphs [0179]-[0182]. An appropriate amount of the acetylene alcohol blended is 0 to 5 parts by weight per 100 parts by weight of the base polymer.

The resist composition of the invention may be prepared by intimately mixing the selected components to form a solution, adjusting so as to meet a predetermined range of sensitivity and film thickness, and filtering the solution. The filtering step is important for reducing the number of defects in a resist pattern after development. The membrane for filtration or filter has a pore size of preferably up to 1 μm, more preferably up to 10 mun, even more preferably up to 5 nm. As the filter pore size is smaller, the number of defects in a small size pattern is reduced. The membrane is typically made of such materials as tetrafluoroethylene, polyethylene, polypropylene, nylon, polyurethane, polycarbonate, polyimide, polyamide-imide, and polysulfone. Membranes of tetrafluoroethylene, polyethylene and polypropylene which have been surface-modified so as to increase an adsorption ability are also useful. Unlike the membranes of nylon, polyurethane, polycarbonate and polyimide possessing an ability to adsorb gel and metal ions due to their polarity, membranes of tetrafluoroethylene, polyethylene and polypropylene which are non-polar do not possess the gel/metal ion adsorption ability in themselves, but can be endowed with the adsorption ability by surface modification with a functional group having polarity. In particular, filters obtained from surface modification of membranes of polyethylene and polypropylene in which pores of a smaller size can be perforated are effective for removing not only sub-micron particles, but also polar particles and metal ions. A laminate of membranes of different materials or a laminate of membranes having different pore sizes is also useful.

A membrane having an ion exchange ability may also be used as the filter. For example, an ion-exchange membrane capable of adsorbing cations acts to adsorb metal ions for thereby reducing metal impurities.

In the practice of filtration, a plurality of filters may be connected through serial or parallel pipes. The type and pore size of membranes in the plural filters may be the same or different. The filter may be disposed in a conduit between vessels. Alternatively, the filter is disposed in a conduit between inlet and outlet ports of a single vessel so that the solution is filtered while it is circulated.

Process

The resist composition is used in the fabrication of various integrated circuits. Pattern formation using the resist composition may be performed by well-known lithography processes. The process generally involves the steps of applying the resist composition onto a substrate to form a resist film thereon, exposing the resist film to high-energy radiation, and developing the exposed resist film in a developer. If necessary, any additional steps may be added.

Specifically, the resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, CrN, $MoSi_2$, $SiO_2$, $MoSi_2$ multilayer film, Ta, TaN, TaCN, Ru, Nb, Mo, Mn, Co, Ni or alloys thereof) by a suitable coating technique such as spin coating, roll coating, flow coating, dipping, spraying or doctor coating. The coating is prebaked on a hotplate preferably at a temperature of 60 to 150° C. for 10 seconds to 30 minutes, more preferably at 80 to 120° C. for 30 seconds to 20 minutes. The resulting resist film is generally 0.01 to 2 μm thick.

The resist film is then exposed to a desired pattern of high-energy radiation such as UV, deep-UV, EB, EUV of wavelength 3 to 15 mm, x-ray, soft x-ray, excimer laser light, γ-ray or synchrotron radiation. When UV, deep-UV, EUV, x-ray, soft x-ray, excimer laser light, γ-ray or synchrotron radiation is used as the high-energy radiation, the resist film is exposed thereto through a mask having a desired pattern in a dose of preferably about 1 to 200 $mJ/cm^2$, more preferably about 10 to 100 $mJ/cm^2$. When EB is used as the high-energy radiation, the resist film is exposed thereto directly or through a mask having a desired pattern in a dose of preferably about 0.1 to 300 $\mu C/cm^2$, more preferably about 0.5 to 200 $\mu C/cm^2$. It is appreciated that the inventive resist composition is suited in micropatterning using KrF excimer laser, ArF excimer laser, EB, EUV, x-ray, soft x-ray, γ-ray or synchrotron radiation, especially in micropatterning using EB or EUV.

After the exposure, the resist film may be baked (PEB) on a hotplate or in an oven preferably at 30 to 150° C. for 10 seconds to 30 minutes, more preferably at 50 to 120° C. for 30 seconds to 20 minutes.

After the exposure or PEB, the resist film is developed in a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). In the case of positive tone, the resist film in the exposed area is dissolved in the developer whereas the resist film in the unexposed area is not dissolved. In this way, the desired positive pattern is formed on the substrate. In the case of negative tone, inversely the resist film in the exposed area is insolubilized whereas the resist film in the unexposed area is dissolved away.

In an alternative embodiment, a negative pattern can be obtained from the positive resist composition comprising a base polymer containing acid labile groups by effecting organic solvent development. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, t-butylbenzene and mesitylene.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLES

Examples of the invention are given below by way of illustration and not by way of limitation. All parts are by weight (pbw).

Monomers PM-1 to PM-32, cPM-1 to cPM-3, AM-1 to AM-3, and FM-1 used in the synthesis of base polymers are shown below. Monomers PM-1 to PM-32 were synthesized by ion exchange between an ammonium salt of fluorinated sulfonic acid providing the anion shown below and a sulfonium chloride providing the cation shown below. The Mw of a polymer is determined versus polystyrene standards by GPC using tetrahydrofuran (THF) solvent.

PM-1

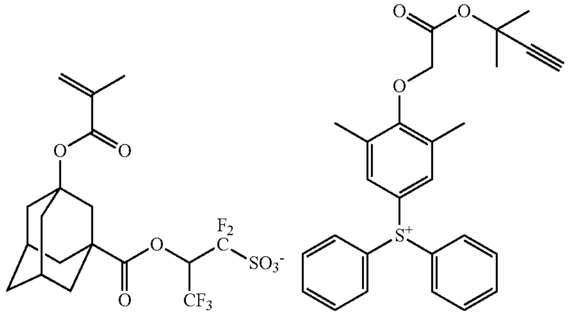

PM-2

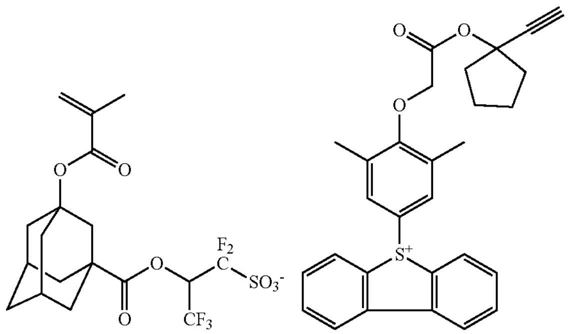

PM-3

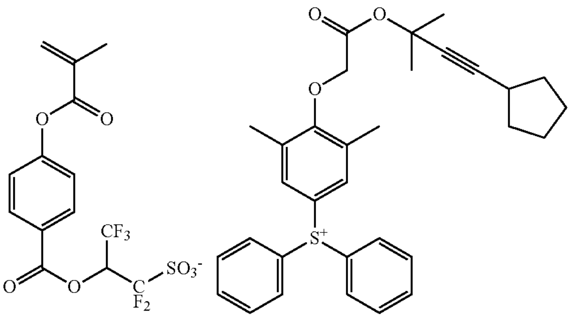

PM-4

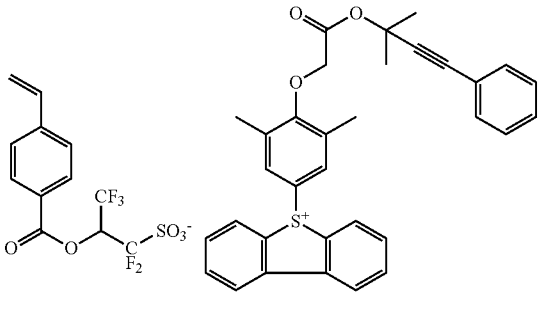

-continued

PM-5

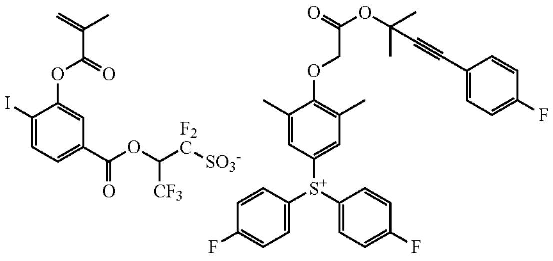

PM-6

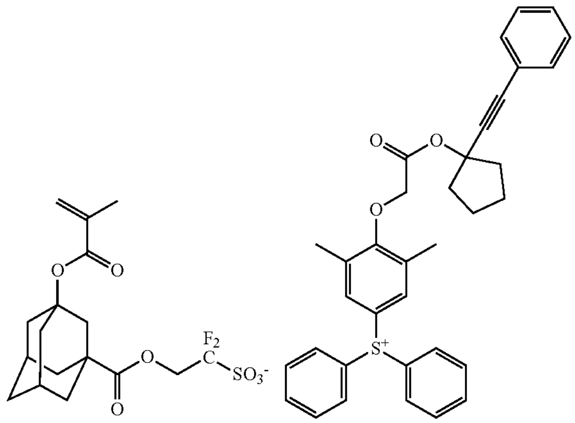

PM-7

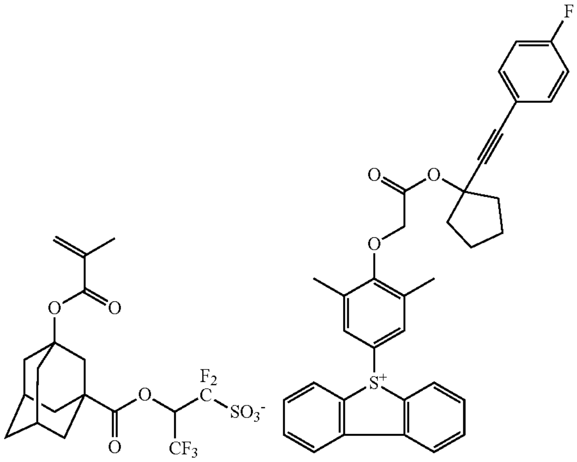

PM-8

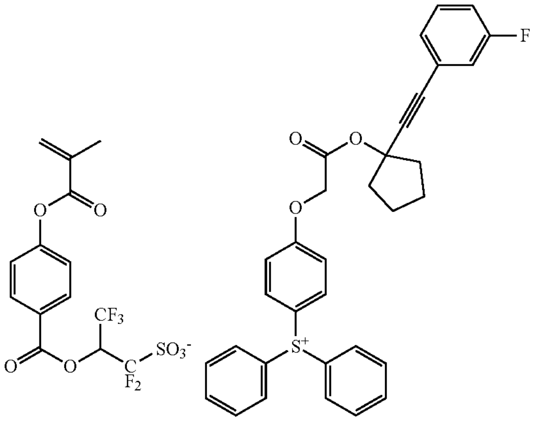

-continued
PM-9
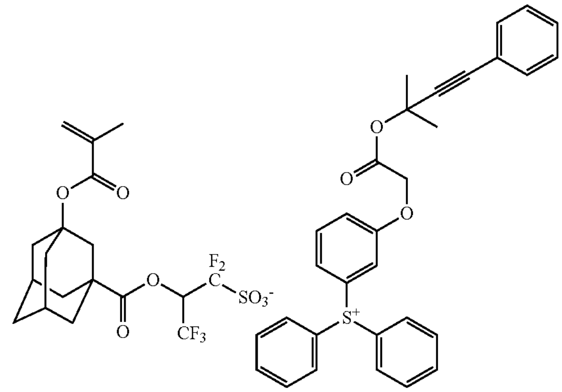
PM-10
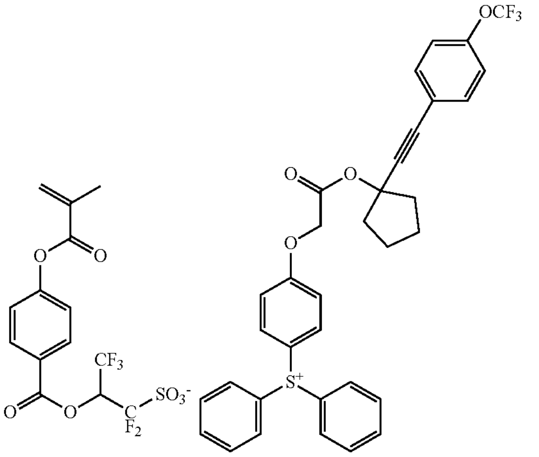
PM-11
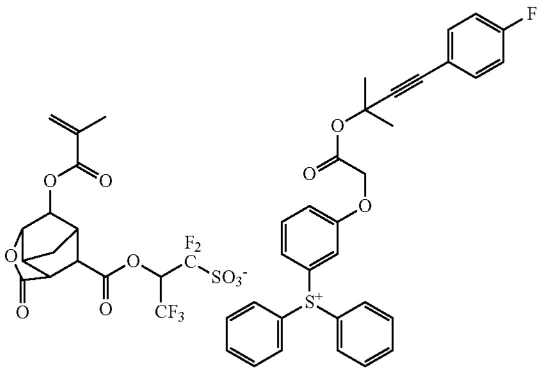
-continued
PM-12
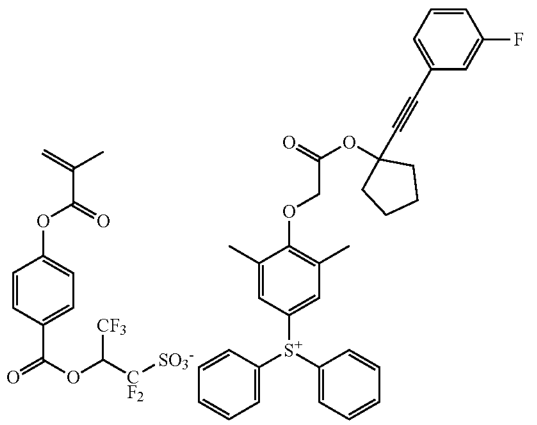
PM-13
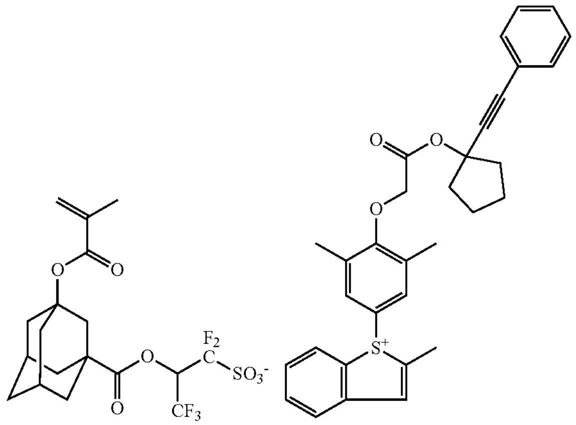
PM-14
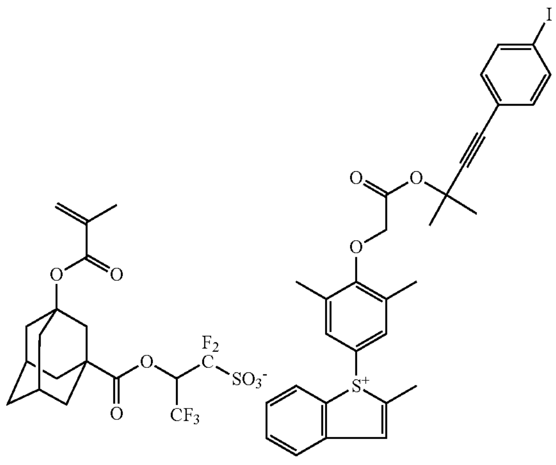

-continued
PM-15
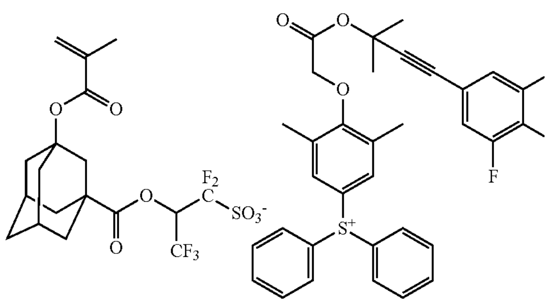
PM-16
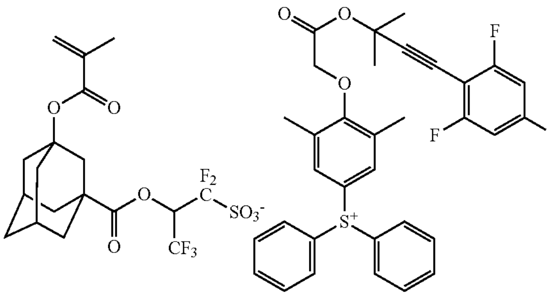
PM-17
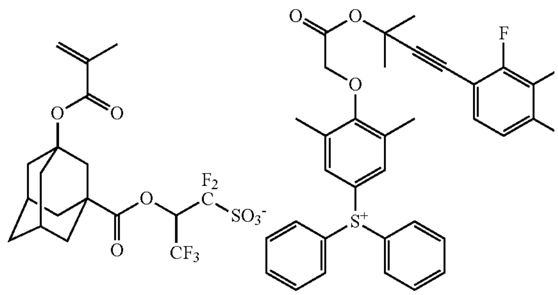
PM-18
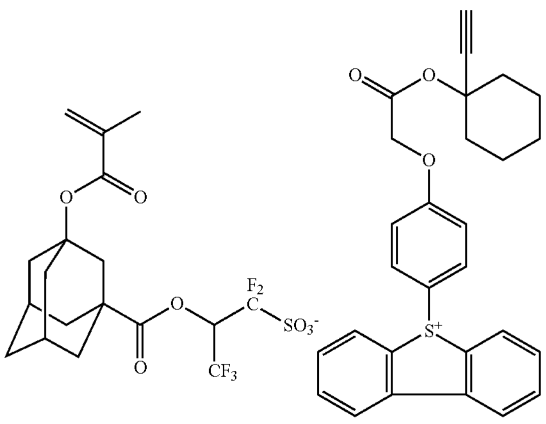
-continued
PM-19
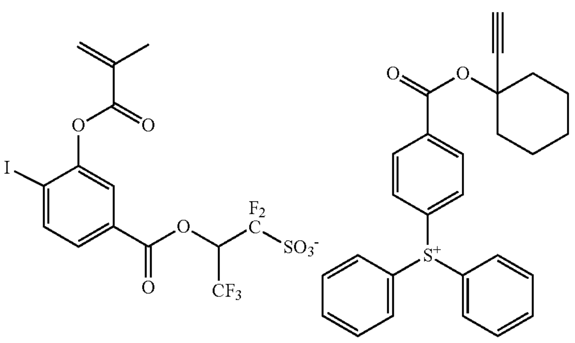
PM-20
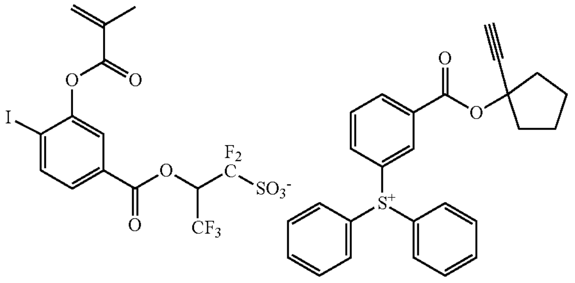
PM-21
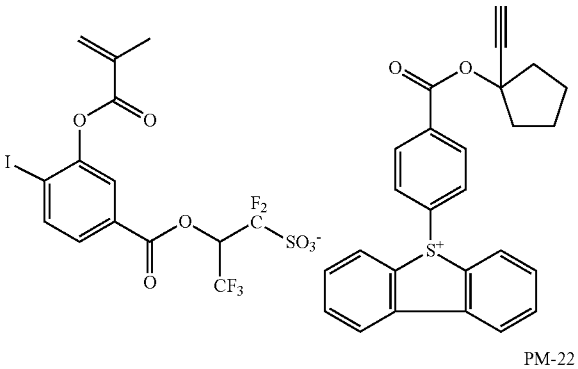
PM-22
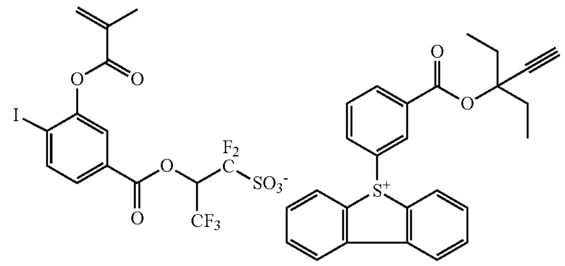
PM-23
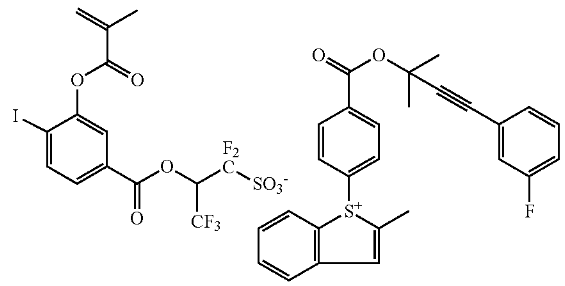

PM-24
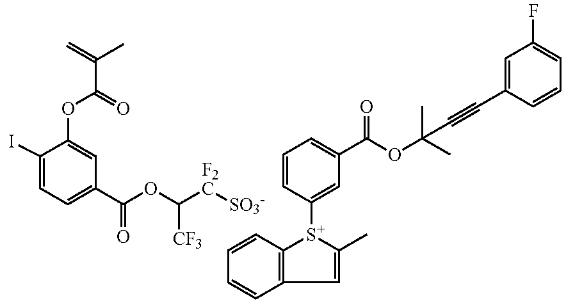
PM-25
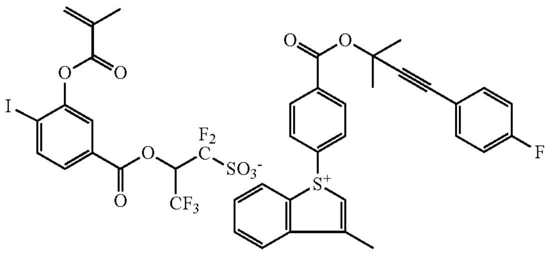
PM-26
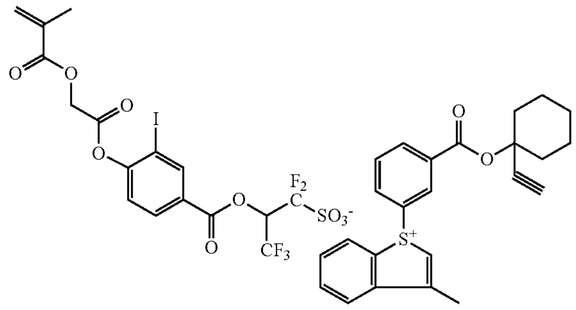
PM-27
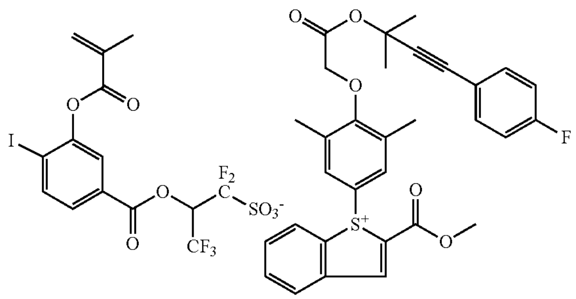
PM-28
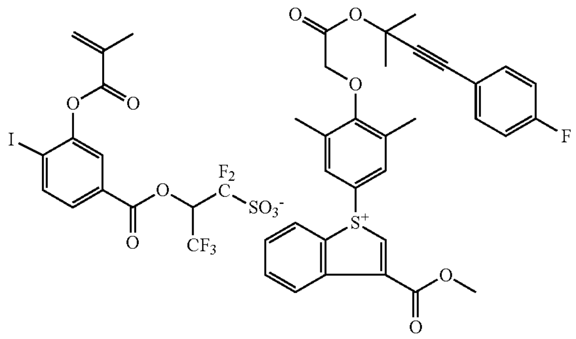
PM-29
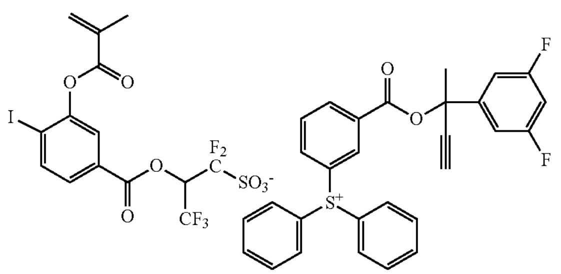
PM-30
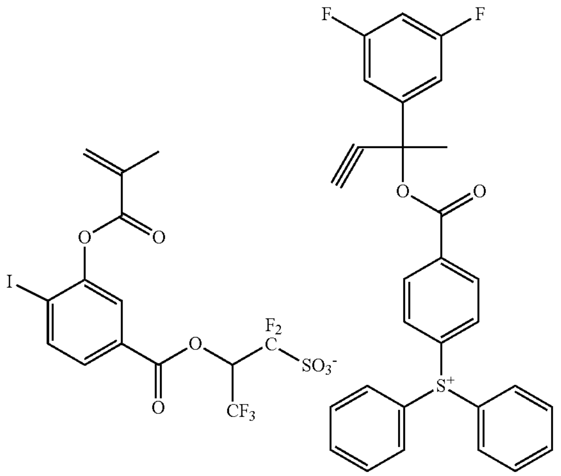
PM-31
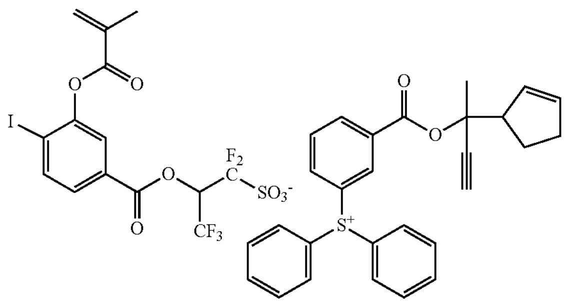
PM-32
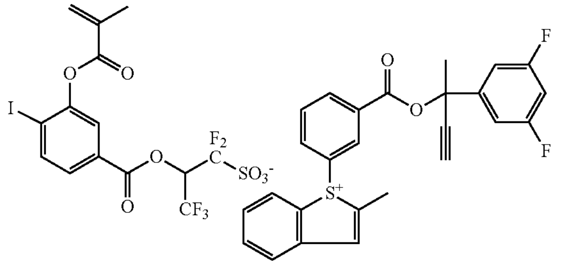

-continued ePM-1

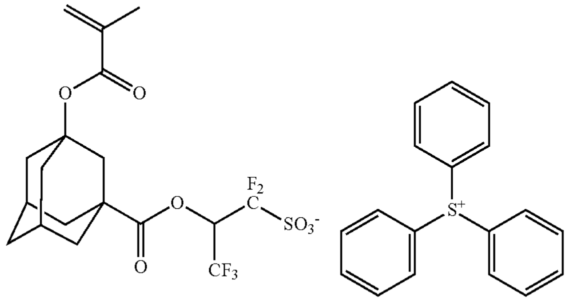

ePM-2

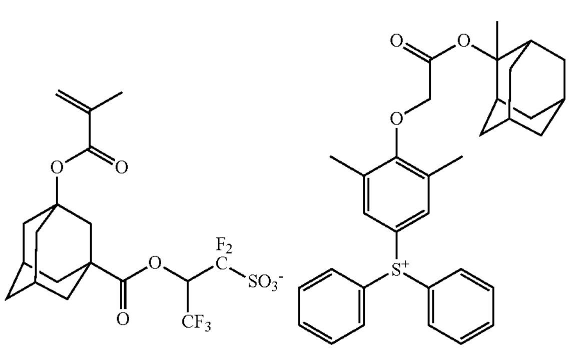

ePM-3

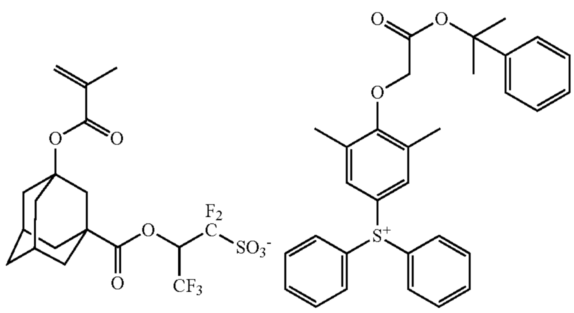

AM-1

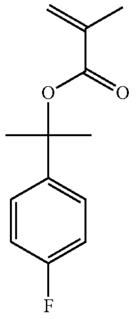

AM-2

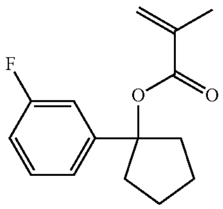

-continued

AM-3

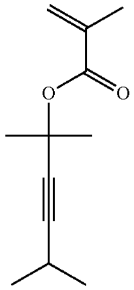

FM-1

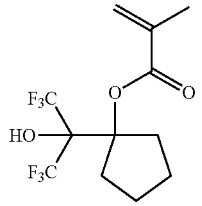

Synthesis Example 1

Synthesis of Polymer P-1

A 2-L flask was charged with 8.4 g of 1-methyl-1-cyclopentyl methacrylate, 4.8 g of 4-hydroxystyrene, 9.1 g of PM-1, and 40 g of THF solvent. The reactor was cooled at −70° C. in nitrogen atmosphere, after which vacuum pumping and nitrogen blow were repeated three times. The reactor was warmed up to room temperature, whereupon 1.2 g of azobisisobutyronitrile (AIBN) as polymerization initiator was added. The reactor was heated at 60° C., whereupon reaction ran for 15 hours. The reaction solution was poured into 1 L of isopropyl alcohol (IPA) for precipitation. The resulting white solid was collected by filtration and vacuum dried at 60° C., yielding Polymer P-1 as white solid. The polymer was analyzed for composition by $^{13}C$— and $^{1}H$-NMR and for Mw and Mw/Mn by GPC, with the results shown below.

P-1

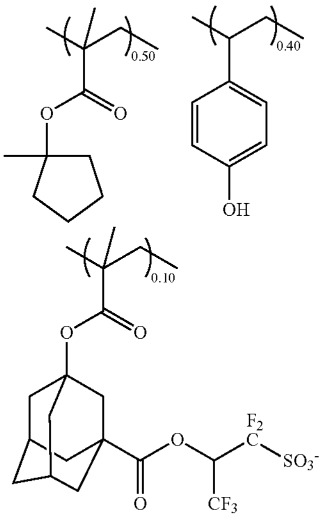

-continued

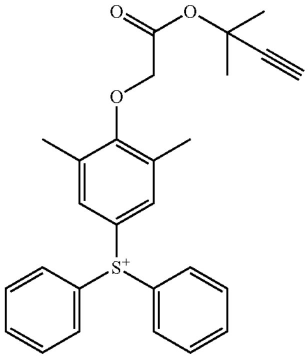

Mw = 8,000
Mw/Mn = 1.66

Synthesis Example 2

Synthesis of Polymer P-2

A 2-L flask was charged with 11.1 g of AM-1, 4.8 g of 3-hydroxystyrene, 9.3 g of PM-2, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-2 as white solid. The polymer was analyzed for composition by $^{13}C$— and $^{1}H$-NMR and for Mw and Mw/Mn by GPC, with the results shown below.

P-2

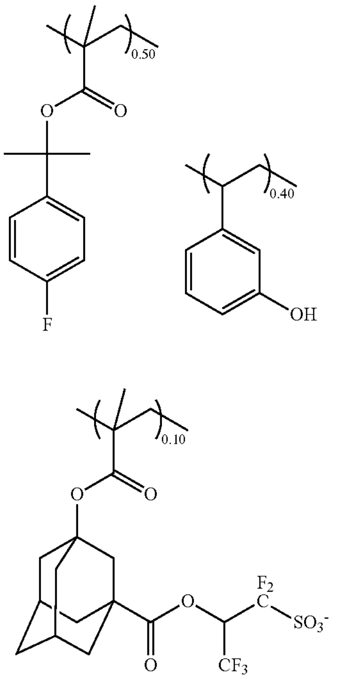

-continued

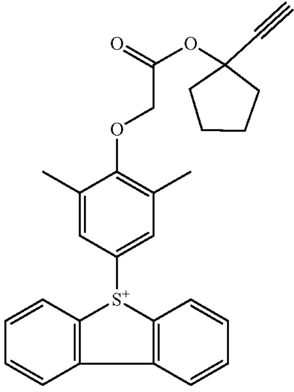

Mw = 8,200
Mw/Mn = 1.69

Synthesis Example 3

Synthesis of Polymer P-3

A 2-L flask was charged with 11.1 g of AM-1, 4.8 g of 3-hydroxystyrene, 9.2 g of PM-3, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-3 as white solid. The polymer was analyzed for composition by $^{13}C$— and $^{1}H$-NMR and for Mw and Mw/Mn by GPC, with the results shown below.

P-3

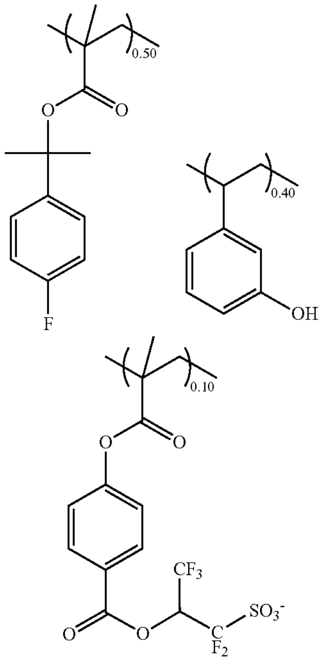

-continued

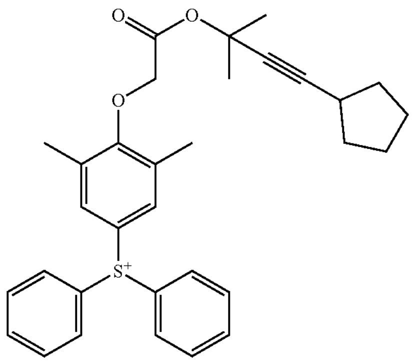

Mw = 8,400
Mw/Mn = 1.77

-continued

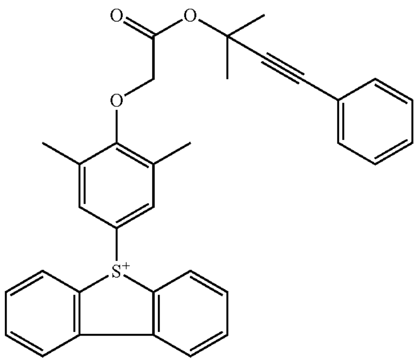

Mw = 8,600
Mw/Mn = 1.86

Synthesis Example 4

Synthesis of Polymer P-4

A 2-L flask was charged with 7.8 g of AM-1, 3.6 g of AM-3, 4.8 g of 3-hydroxystyrene, 8.6 g of PM-4, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-4 as white solid. The polymer was analyzed for composition by $^{13}$C— and $^{1}$H-NMR and for Mw and Mw/Mn by GPC, with the results shown below.

P-4

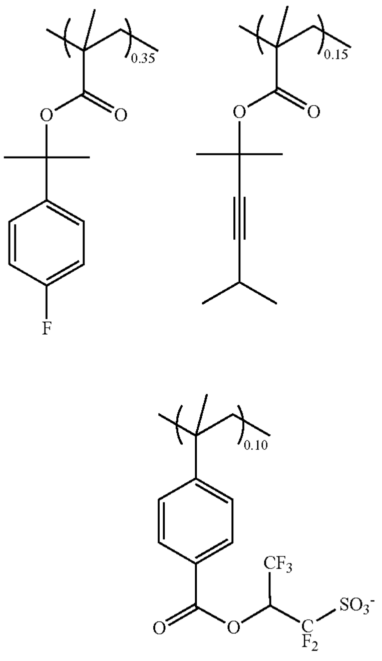

Synthesis Example 5

Synthesis of Polymer P-5

A 2-L flask was charged with 11.9 g of AM-2, 5.2 g of 3-hydroxystyrene, 9.9 g of PM-5, and 40 g of THE solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-5 as white solid. The polymer was analyzed for composition by 13C— and $^{1}$H-NMR and for Mw and Mw/Mn by GPC, with the results shown below.

P-5

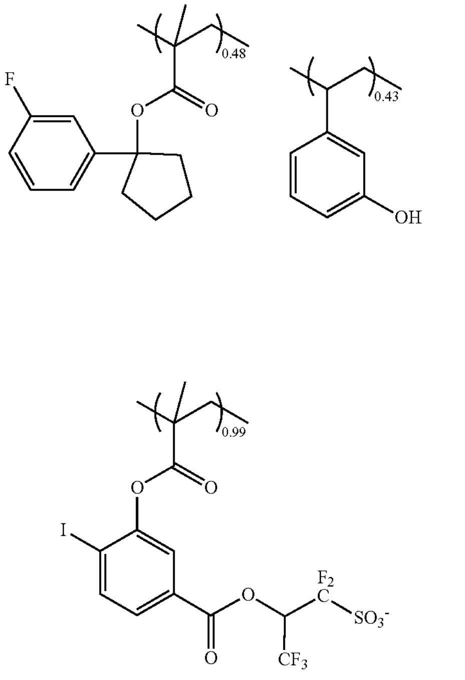

-continued

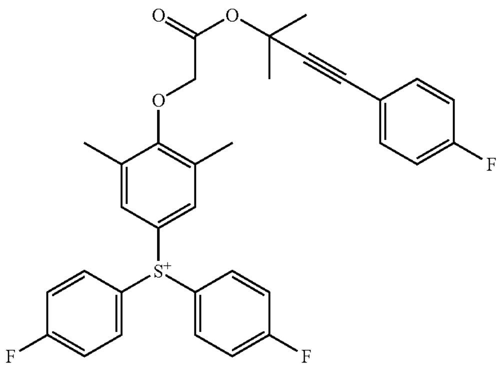

Mw = 9,000
Mw/Mn = 1.79

Synthesis Example 6

Synthesis of Polymer P-6

A 2-L flask was charged with 11.1 g of AM-1, 4.8 g of 3-hydroxystyrene, 9.4 g of PM-6, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-6 as white solid. The polymer was analyzed for composition by $^{13}C$— and $^{1}H$-NMR and for Mw and Mw/Mn by GPC, with the results shown below.

P-6

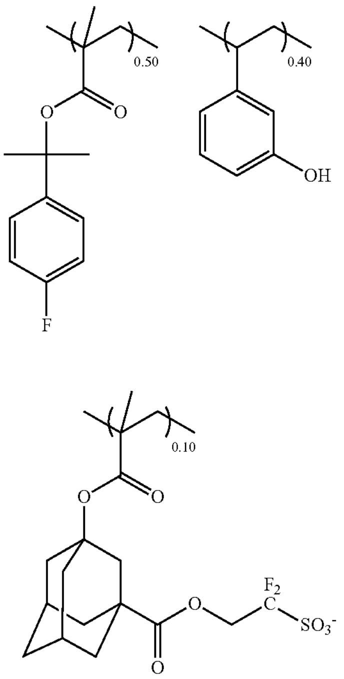

-continued

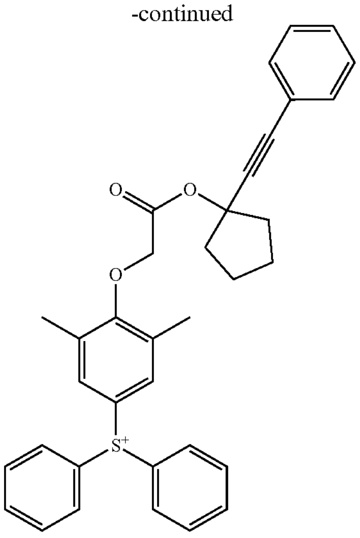

Mw = 8,100
Mw/Mn = 1.83

Synthesis Example 7

Synthesis of Polymer P-7

A 2-L flask was charged with 11.1 g of AM-1, 3.4 g of 3-hydroxystyrene, 3.2 g of FM-1, 12.3 g of PM-7, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-7 as white solid. The polymer was analyzed for composition by $^{13}C$— and $^{1}H$-NMR and for Mw and Mw/Mn by GPC, with the results shown below.

P-7

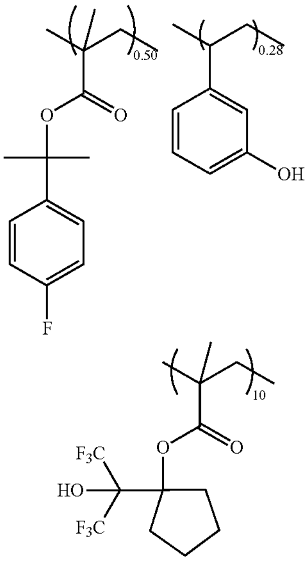

-continued

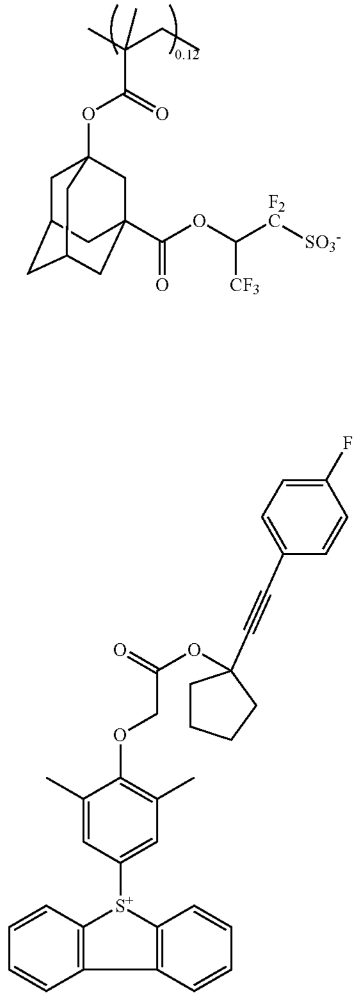

Mw = 8,500
Mw/Mn = 1.83

Synthesis Example 8

Synthesis of Polymer P-8

A 2-L flask was charged with 11.1 g of AM-1, 4.8 g of 3-hydroxystyrene, 9.4 g of PM-8, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-8 as white solid. The polymer was analyzed for composition by $^{13}C$— and $^{1}H$-NMR and for Mw and Mw/Mn by GPC, with the results shown below.

P-8

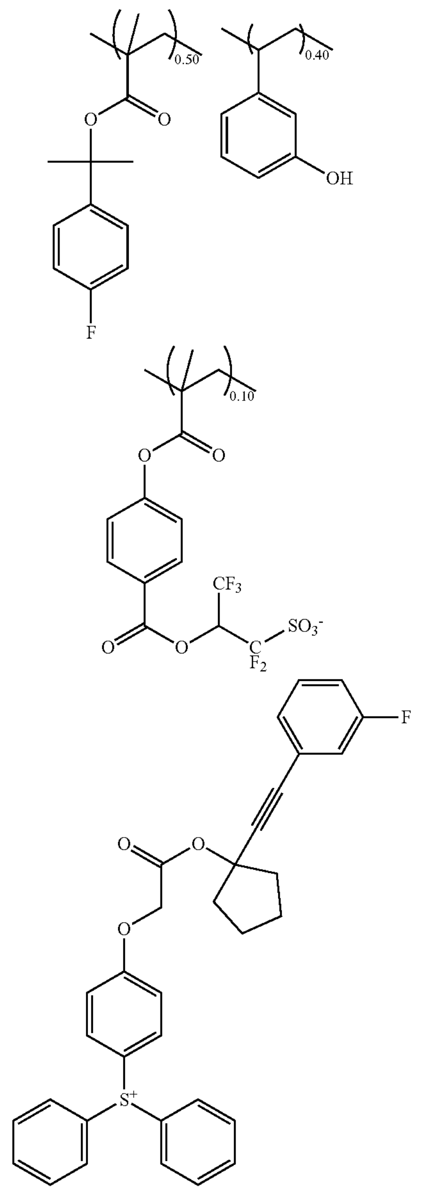

Mw = 8,100
Mw/Mn = 1.59

Synthesis Example 9

Synthesis of Polymer P-9

A 2-L flask was charged with 11.1 g of AM-1, 4.8 g of 3-hydroxystyrene, 9.6 g of PM-9, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-9 as white solid. The polymer was analyzed for composition by $^{13}C$— and $^{1}H$-NMR and for Mw and Mw/Mn by GPC, with the results shown below.

P-9

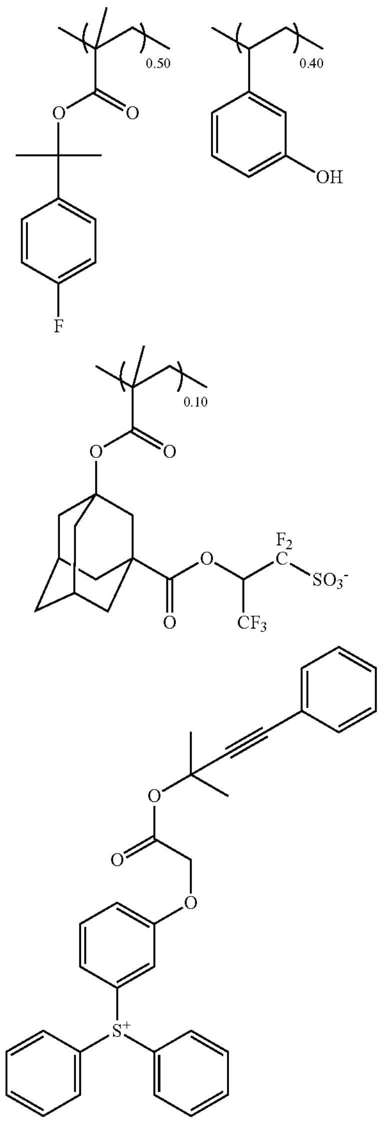

Mw = 8,600
Mw/Mn = 1.65

Synthesis Example 10

Synthesis of Polymer P-10

A 2-L flask was charged with 11.1 g of AM-1, 4.8 g of 3-hydroxystyrene, 10.1 g of PM-10, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-10 as white solid. The polymer was analyzed for composition by $^{13}C$— and $^{1}H$-NMR and for Mw and Mw/Mn by GPC, with the results shown below.

P-10

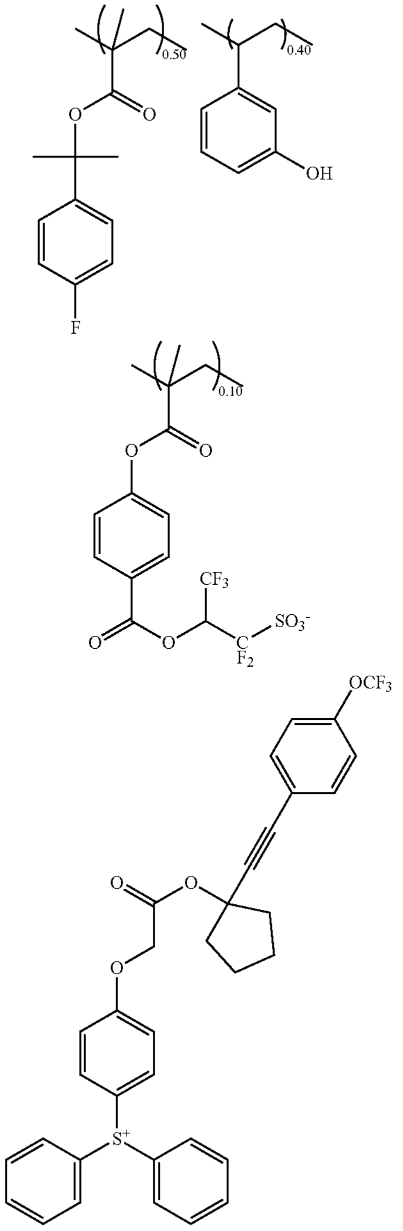

Mw = 8,300
Mw/Mn = 1.84

Synthesis Example 11

Synthesis of Polymer P-11

A 2-L flask was charged with 11.1 g of AM-1, 4.8 g of 3-hydroxystyrene, 9.7 g of PM-11, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-11 as white solid. The polymer was analyzed for composition by $^{13}C$— and $^{1}H$-NMR and for Mw and Mw/Mn by GPC, with the results shown below.

P-11

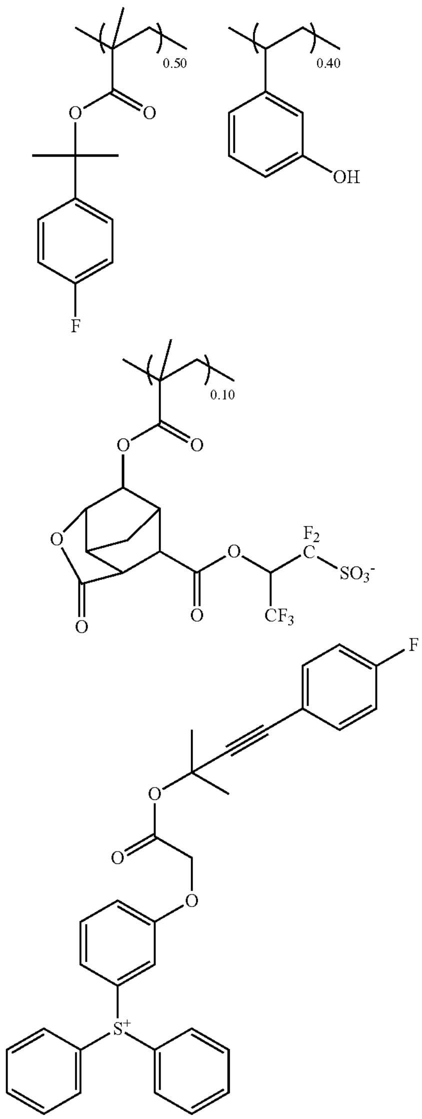

Mw = 8,500
Mw/Mn = 1.74

Synthesis Example 12

Synthesis of Polymer P-12

A 2-L flask was charged with 11.1 g of AM-1, 4.8 g of 3-hydroxystyrene, 9.7 g of PM-12, and 40 g of THE solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-12 as white solid. The polymer was analyzed for composition by $^{13}C$— and $^{1}H$-NMR and for Mw and Mw/Mn by GPC, with the results shown below.

P-12

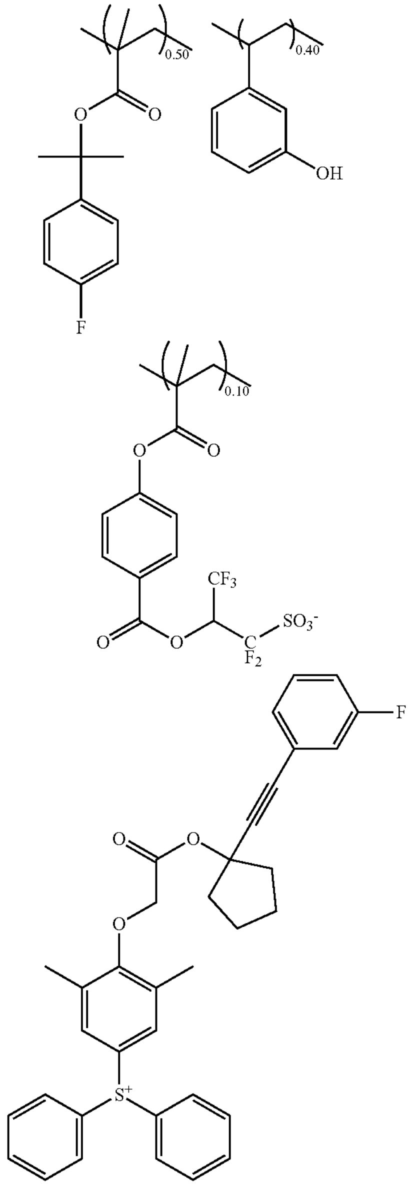

Mw = 8,300
Mw/Mn = 1.73

Synthesis Example 13

Synthesis of Polymer P-13

A 2-L flask was charged with 11.1 g of AM-1, 4.8 g of 3-hydroxystyrene, 9.6 g of PM-13, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-13 as white solid. The polymer was analyzed for composition by $^{13}C$— and $^{1}H$-NMR and for Mw and Mw/Mn by GPC, with the results shown below.

P-13

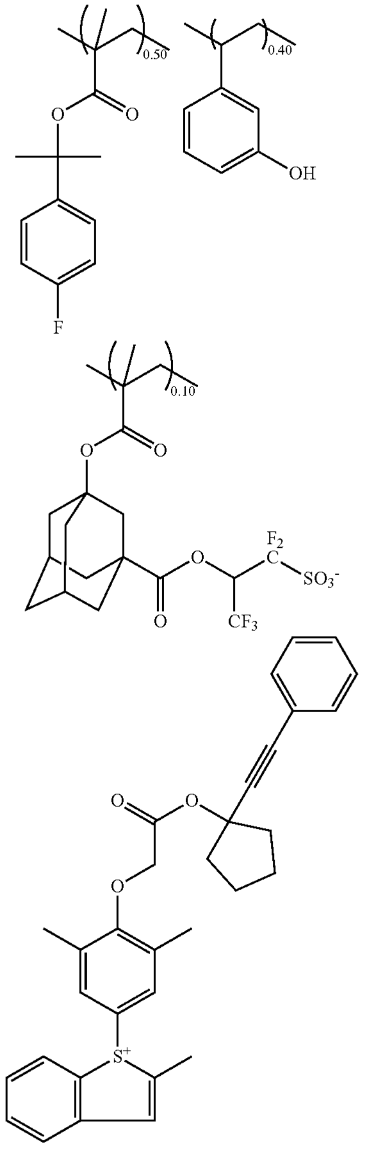

Mw = 8,100
Mw/Mn = 1.70

Synthesis Example 14

Synthesis of Polymer P-14

A 2-L flask was charged with 11.1 g of AM-1, 4.8 g of 3-hydroxystyrene, 10.6 g of PM-14, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-14 as white solid. The polymer was analyzed for composition by $^{13}C$— and $^{1}H$-NMR and for Mw and Mw/Mn by GPC, with the results shown below.

P-14

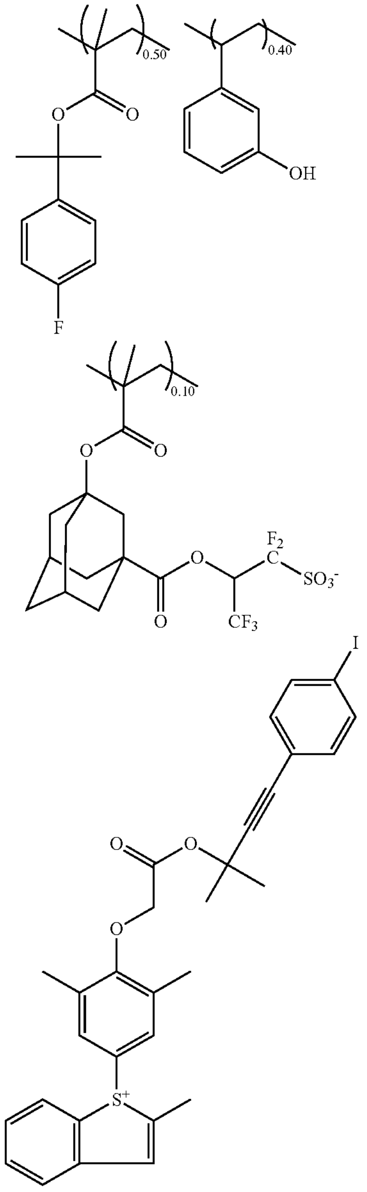

Mw = 8,800
Mw/Mn = 1.79

Synthesis Example 15

Synthesis of Polymer P-15

A 2-L flask was charged with 11.1 g of AM-1, 4.8 g of 3-hydroxystyrene, 10.4 g of PM-15, and 40 g of THE solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-15 as white solid. The polymer was analyzed for composition by $^{13}C$— and $^{1}H$-NMR and for Mw and Mw/Mn by GPC, with the results shown below.

P-15

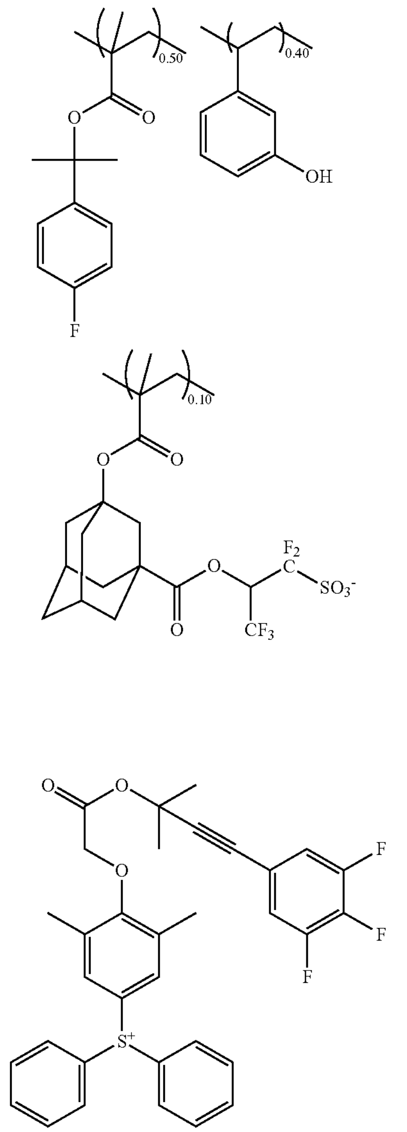

Mw = 8,700
Mw/Mn = 1.77

P-16

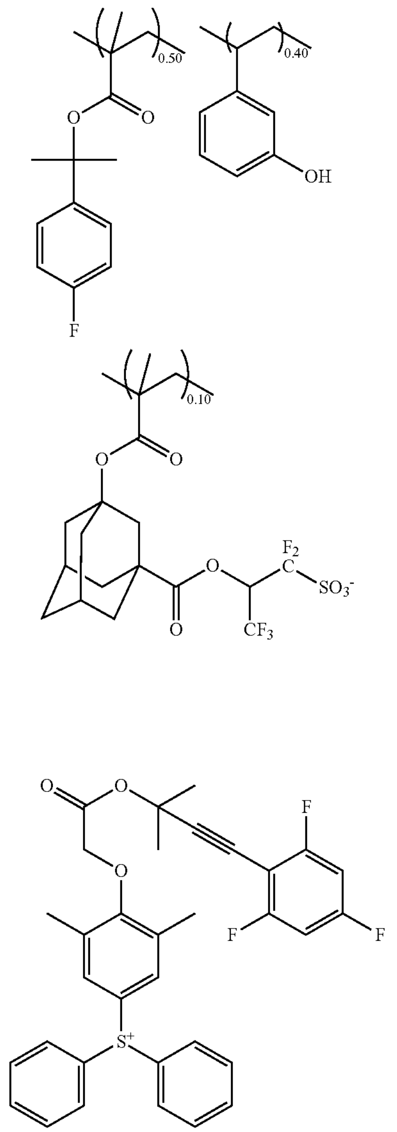

Mw = 8,600
Mw/Mn = 1.75

Synthesis Example 16

Synthesis of Polymer P-16

A 2-L flask was charged with 11.1 g of AM-1, 4.8 g of 3-hydroxystyrene, 10.4 g of PM-16, and 40 g of THE solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-16 as white solid. The polymer was analyzed for composition by $^{13}C$— and $^{1}H$-NMR and for Mw and Mw/Mn by GPC, with the results shown below.

Synthesis Example 17

Synthesis of Polymer P-17

A 2-L flask was charged with 11.1 g of AM-1, 4.8 g of 3-hydroxystyrene, 10.4 g of PM-17, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-17 as white solid. The polymer was analyzed for composition by $^{13}C$— and $^{1}H$-NMR and for Mw and Mw/Mn by GPC, with the results shown below.

P-17

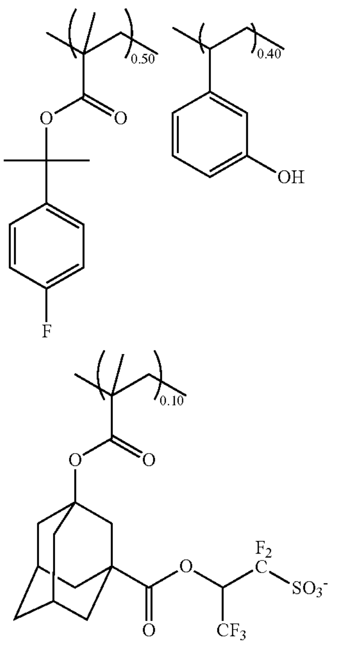

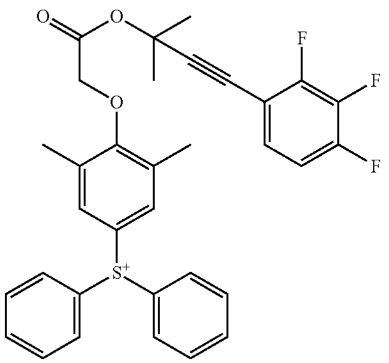

Mw = 8,500
Mw/Mn = 1.75

P-18

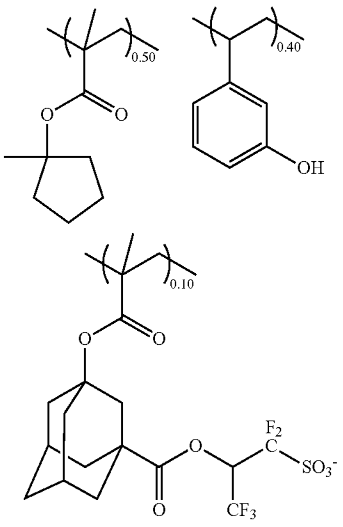

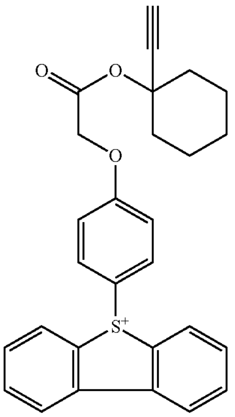

Mw = 8,100
Mw/Mn = 1.69

Synthesis Example 18

Synthesis of Polymer P-18

A 2-L flask was charged with 8.4 g of 1-methyl-1-cyclopentyl methacrylate, 4.8 g of 3-hydroxystyrene, 9.2 g of PM-18, and 40 g of THE solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-18 as white solid. The polymer was analyzed for composition by $^{13}C$— and $^{1}H$-NMR and for Mw and Mw/Mn by GPS, with the results shown below.

Synthesis Example 19

Synthesis of Polymer P-19

A 2-L flask was charged with 8.4 g of 1-methyl-1-cyclopentyl methacrylate, 4.8 g of 3-hydroxystyrene, 9.6 g of PM-19, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-19 as white solid. The polymer was analyzed for composition by $^{13}C$— and $^{1}H$-NMR and for Mw and Mw/Mn by GPS, with the results shown below.

P-19

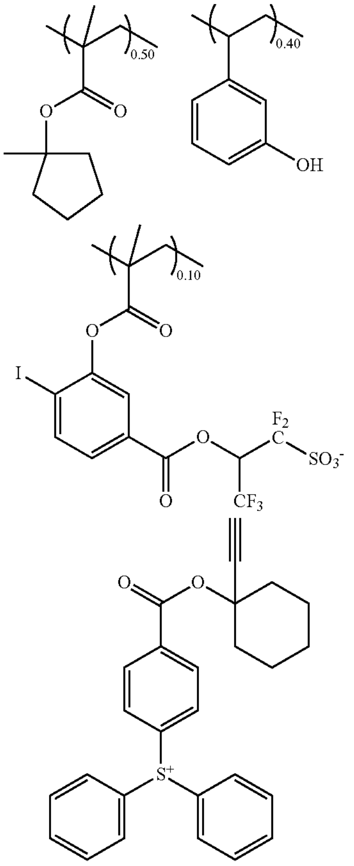

Mw = 8,100
Mw/Mn = 1.61

Synthesis Example 20

Synthesis of Polymer P-20

A 2-L flask was charged with 8.4 g of 1-methyl-1-cyclopentyl methacrylate, 4.8 g of 3-hydroxystyrene, 9.4 g of PM-20, and 40 g of THE solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-20 as white solid. The polymer was analyzed for composition by $^{13}C$— and $^{1}H$-NMR and for Mw and Mw/Mn by GPS, with the results shown below.

P-20

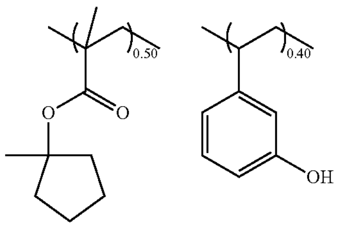

-continued

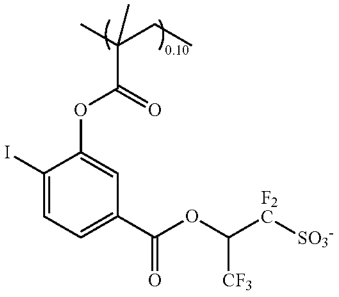

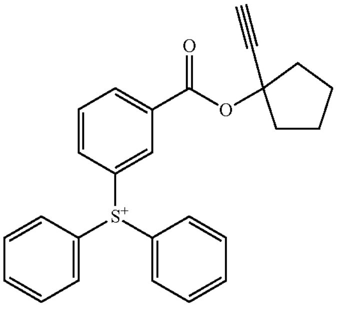

Mw = 8,400
Mw/Mn = 1.59

Synthesis Example 21

Synthesis of Polymer P-21

A 2-L flask was charged with 8.4 g of 1-methyl-1-cyclopentyl methacrylate, 4.8 g of 3-hydroxystyrene, 9.5 g of PM-21, and 40 g of THE solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-21 as white solid. The polymer was analyzed for composition by $^{13}C$— and $^{1}H$-NMR and for Mw and Mw/Mn by GPS, with the results shown below.

P-21

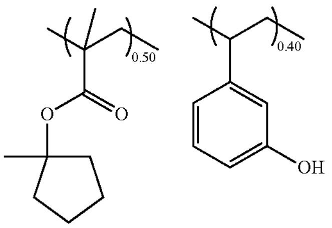

-continued

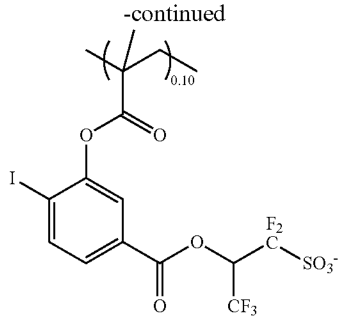

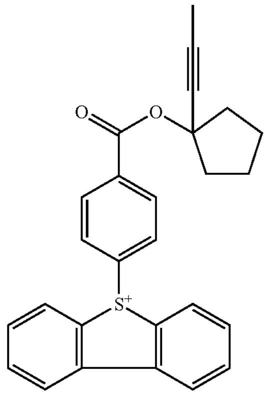

Mw = 8,300
Mw/Mn = 1.54

Synthesis Example 22

Synthesis of Polymer P-22

A 2-L flask was charged with 8.4 g of 1-methyl-1-cyclopentyl methacrylate, 4.8 g of 3-hydroxystyrene, 9.4 g of PM-22, and 40 g of THE solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-22 as white solid. The polymer was analyzed for composition by $^{13}C$— and $^{1}H$-NMR and for Mw and Mw/Mn by GPS, with the results shown below.

P-22

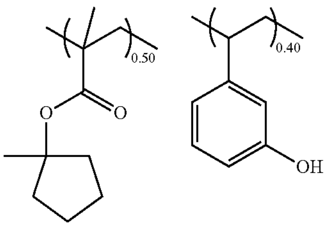

-continued

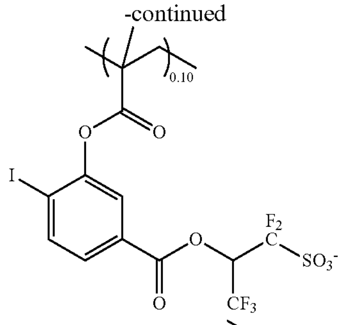

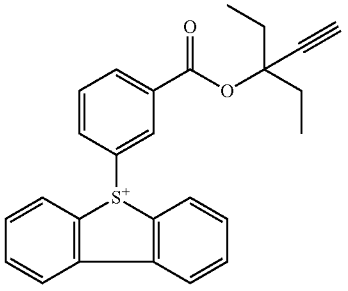

Mw = 8,400
Mw/Mn = 1.62

Synthesis Example 23

Synthesis of Polymer P-23

A 2-L flask was charged with 8.4 g of 1-methyl-1-cyclopentyl methacrylate, 4.8 g of 3-hydroxystyrene, 9.7 g of PM-23, and 40 g of THE solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-23 as white solid. The polymer was analyzed for composition by $^{13}C$— and $^{1}H$-NMR and for Mw and Mw/Mn by GPS, with the results shown below.

P-23

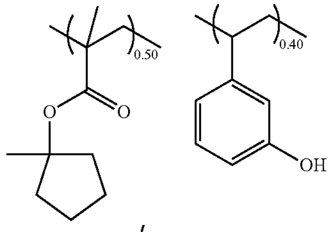

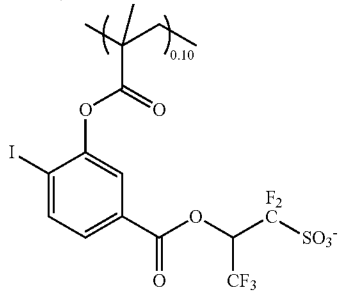

-continued

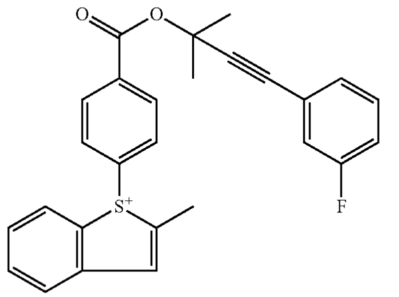

Mw = 8,600
Mw/Mn = 1.67

Synthesis Example 24

Synthesis of Polymer P-24

A 2-L flask was charged with 8.4 g of 1-methyl-1-cyclopentyl methacrylate, 4.8 g of 3-hydroxystyrene, 9.7 g of PM-24, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-24 as white solid. The polymer was analyzed for composition by $^{13}C$— and $^{1}H$-NMR and for Mw and Mw/Mn by GPS, with the results shown below.

P-24

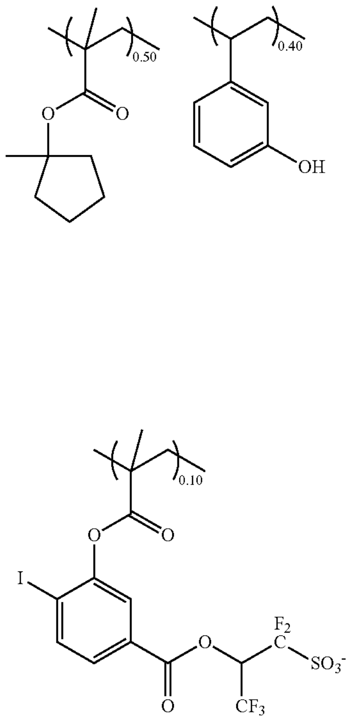

-continued

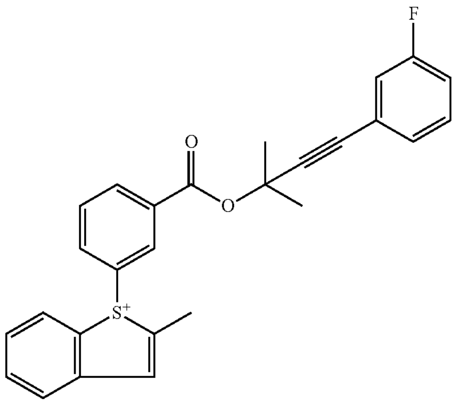

Mw = 8,400
Mw/Mn = 1.72

Synthesis Example 25

Synthesis of Polymer P-25

A 2-L flask was charged with 8.4 g of 1-methyl-1-cyclopentyl methacrylate, 4.8 g of 3-hydroxystyrene, 9.7 g of PM-25, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-25 as white solid. The polymer was analyzed for composition by $^{13}C$— and $^{1}H$-NMR and for Mw and Mw/Mn by GPS, with the results shown below.

P-23

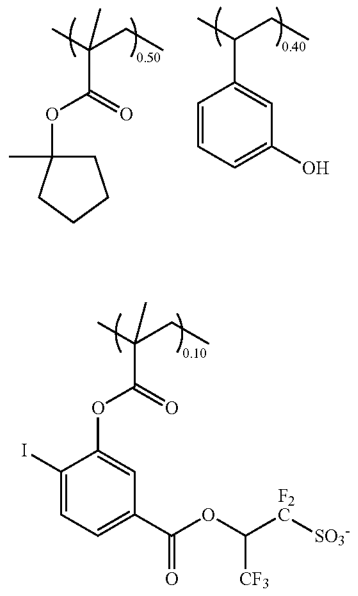

-continued

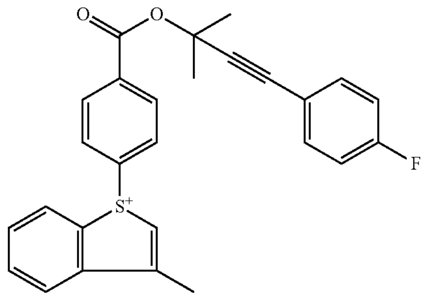

Mw = 8,500
Mw/Mn = 1.77

Synthesis Example 26

Synthesis of Polymer P-26

A 2-L flask was charged with 8.4 g of 1-methyl-1-cyclopentyl methacrylate, 4.8 g of 3-hydroxystyrene, 9.8 g of PM-26, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-26 as white solid. The polymer was analyzed for composition by $^{13}C$— and $^{1}H$-NMR and for Mw and Mw/Mn by GPS, with the results shown below.

P-26

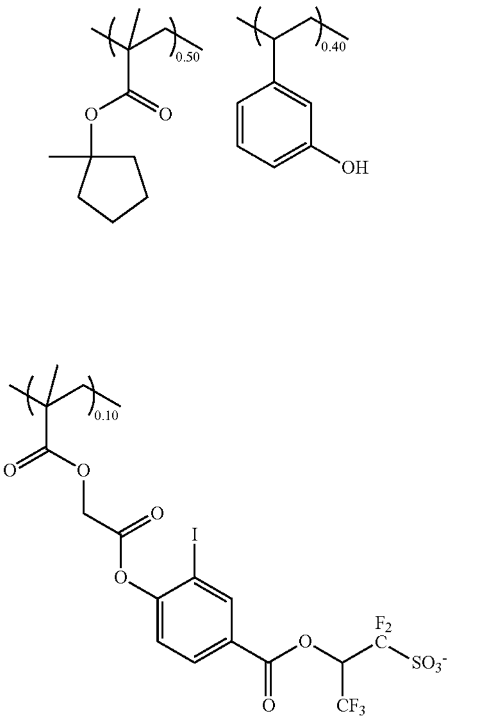

-continued

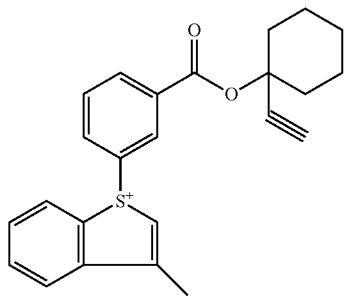

Mw = 8,900
Mw/Mn = 1.82

Synthesis Example 27

Synthesis of Polymer P-27

A 2-L flask was charged with 8.4 g of 1-methyl-1-cyclopentyl methacrylate, 4.8 g of 3-hydroxystyrene, 10.7 g of PM-27, and 40 g of THE solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-27 as white solid. The polymer was analyzed for composition by $^{13}C$— and $^{1}H$-NMR and for Mw and Mw/Mn by GPS, with the results shown below.

P-27

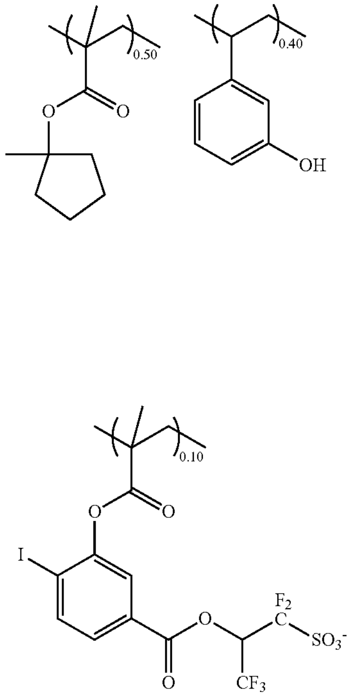

-continued

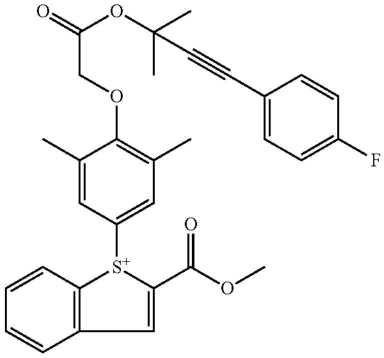

Mw = 8,400
Mw/Mn = 1.69

Synthesis Example 28

Synthesis of Polymer P-28

A 2-L flask was charged with 8.4 g of 1-methyl-1-cyclopentyl methacrylate, 4.8 g of 3-hydroxystyrene, 10.7 g of PM-28, and 40 g of THE solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-28 as white solid. The polymer was analyzed for composition by $^{13}C$— and $^{1}H$-NMR and for Mw and Mw/Mn by GPS, with the results shown below.

P-28

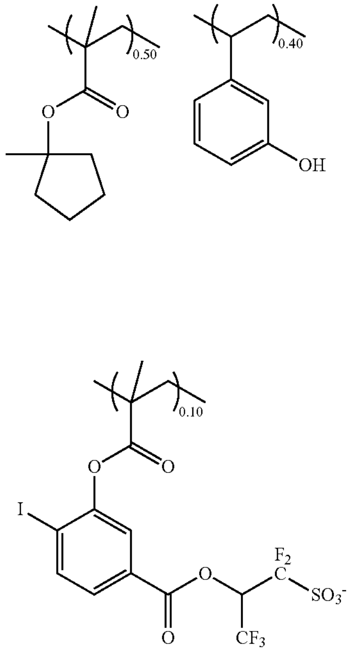

-continued

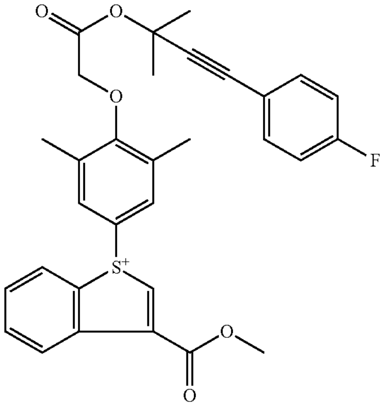

Mw = 8,200
Mw/Mn = 1.68

Synthesis Example 29

Synthesis of Polymer P-29

A 2-L flask was charged with 8.4 g of 1-methyl-1-cyclopentyl methacrylate, 4.8 g of 3-hydroxystyrene, 10.1 g of PM-29, and 40 g of THE solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-29 as white solid. The polymer was analyzed for composition by $^{13}C$— and $^{1}H$-NMR and for Mw and Mw/Mn by GPS, with the results shown below.

P-29

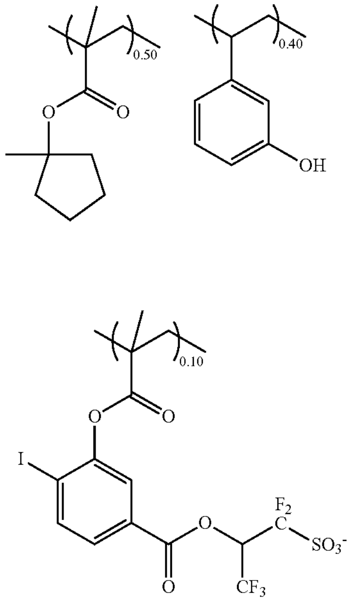

-continued

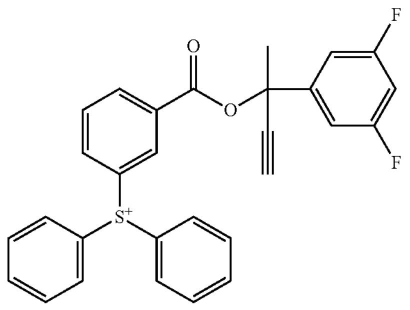

Mw = 8,300
Mw/Mn = 1.74

Synthesis Example 30

Synthesis of Polymer P-30

A 2-L flask was charged with 8.4 g of 1-methyl-1-cyclopentyl methacrylate, 4.8 g of 3-hydroxystyrene, 10.1 g of PM-30, and 40 g of THE solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-30 as white solid. The polymer was analyzed for composition by $^{13}C$— and $^{1}H$-NMR and for Mw and Mw/Mn by GPS, with the results shown below.

P-30

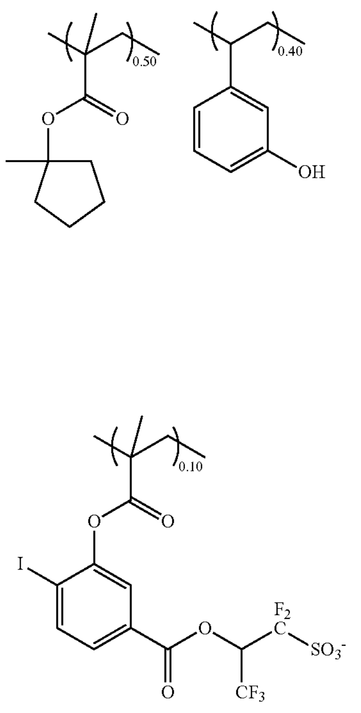

-continued

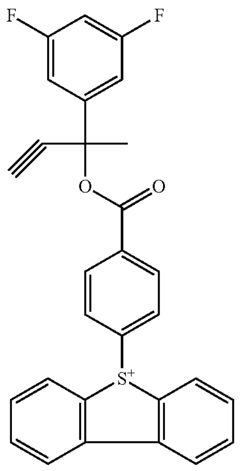

Mw = 8,400
Mw/Mn = 1.75

Synthesis Example 31

Synthesis of Polymer P-31

A 2-L flask was charged with 8.4 g of 1-methyl-1-cyclopentyl methacrylate, 4.8 g of 3-hydroxystyrene, 9.7 g of PM-31, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-31 as white solid. The polymer was analyzed for composition by $^{13}C$— and $^{1}H$-NMR and for Mw and Mw/Mn by GPS, with the results shown below.

P-31

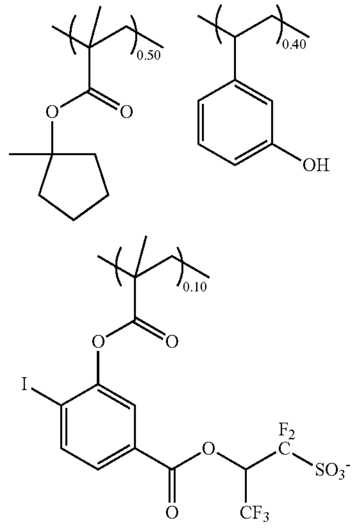

-continued

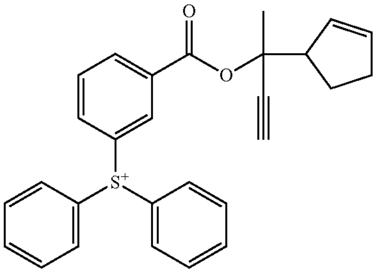

Mw = 8,600
Mw/Mn = 1.81

-continued

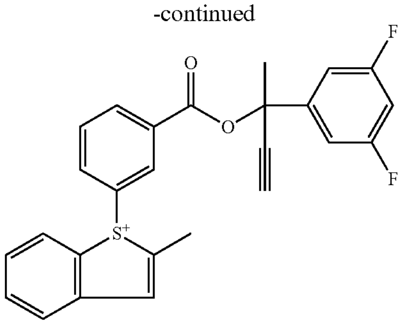

Mw = 8,500
Mw/Mn = 1.79

Synthesis Example 32

Synthesis of Polymer P-32

A 2-L flask was charged with 8.4 g of 1-methyl-1-cyclopentyl methacrylate, 4.8 g of 3-hydroxystyrene, 9.8 g of PM-32, and 40 g of THE solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of IPA for precipitation. The resulting white solid was collected by filtration and vacuum dried at 60° C., yielding Polymer P-32 as white solid. The polymer was analyzed for composition by $^{13}C$— and $^{1}H$-NMR and for Mw and Mw/Mn by GPS, with the results shown below.

P-32

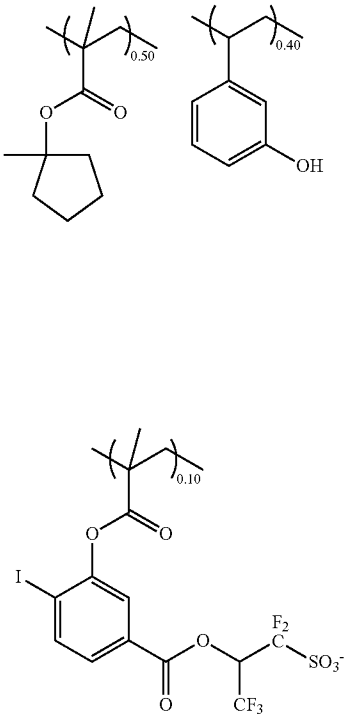

Comparative Synthesis Example 1

Synthesis of Comparative Polymer cP-1

Comparative Polymer cP-1 was synthesized by the same procedure as in Synthesis Example 1 aside from using cPM-1 instead of PM-1.

cP-1

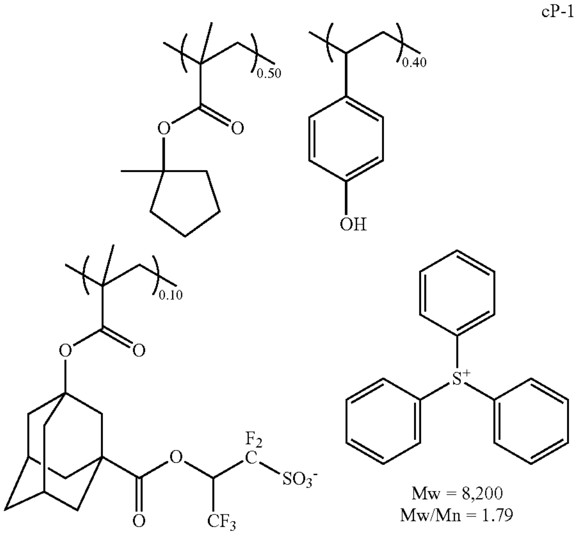

Mw = 8,200
Mw/Mn = 1.79

Comparative Synthesis Example 2

Synthesis of Comparative Polymer cP-2

Comparative Polymer cP-2 was synthesized by the same procedure as in Synthesis Example 1 aside from using cPM-2 instead of PM-1.

cP-2

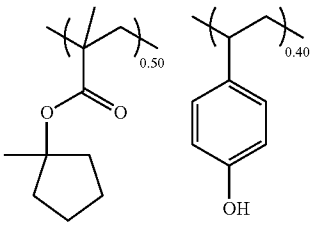

-continued

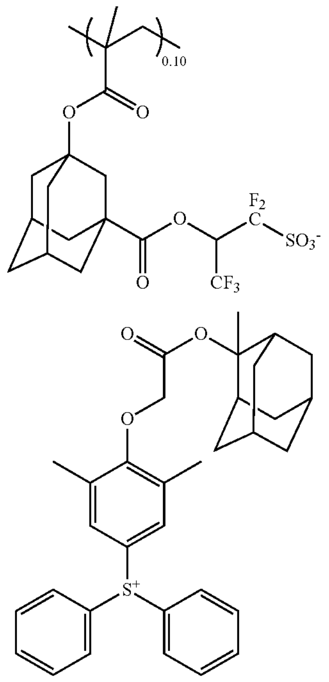

Mw = 8,600
Mw/Mn = 1.75

Comparative Synthesis Example 3

Synthesis of Comparative Polymer cP-3

Comparative Polymer cP-3 was synthesized by the same procedure as in Synthesis Example 1 aside from using cPM-3 instead of PM-1.

cP-3

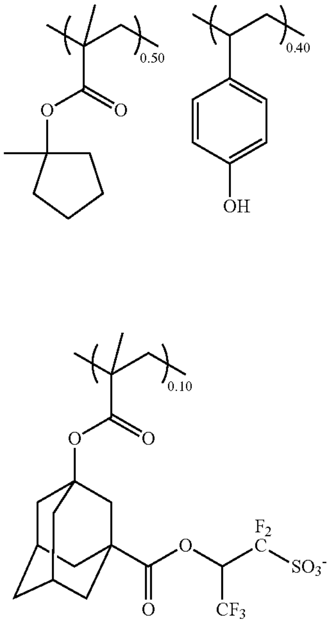

-continued

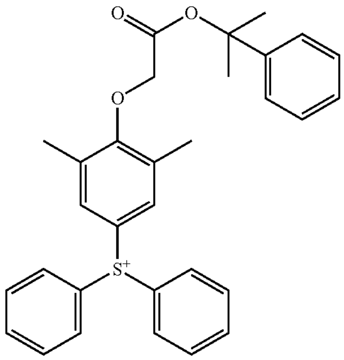

Mw = 8,200
Mw/Mn = 1.73

Examples 1 to 33 and Comparative Examples 1 to 3

Preparation and Evaluation of Resist Compositions (1) Preparation of Resist Compositions Resist compositions were prepared by dissolving components in a solvent in accordance with the recipe shown in Tables 1 to 3, and filtering the solution through a filter having a pore size of 0.2 μm. The solvent contained 100 ppm of surfactant Polyfox PF-636 (Omnova Solutions, Inc.).

The components in Tables 1 to 3 are identified below.

Organic Solvents:

PGMEA (propylene glycol monomethyl ether acetate)

EL (ethyl lactate)

DAA (diacetone alcohol)

Acid Generator: PAG-1

PAG-1

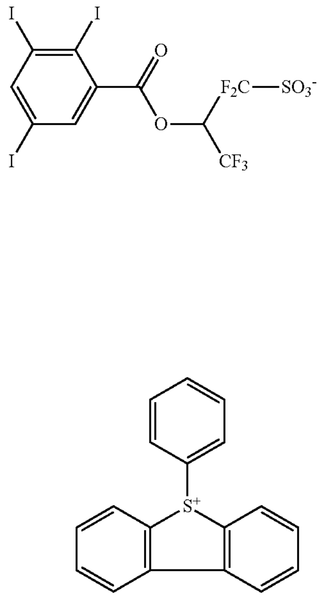

Quenchers: Q-1 to Q-3

Q-1

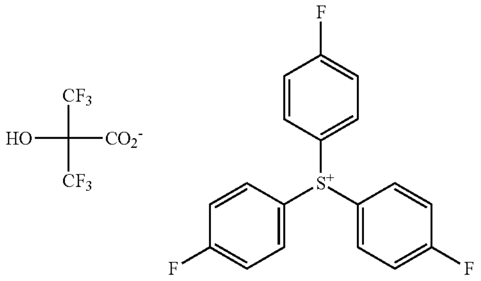

Q-2

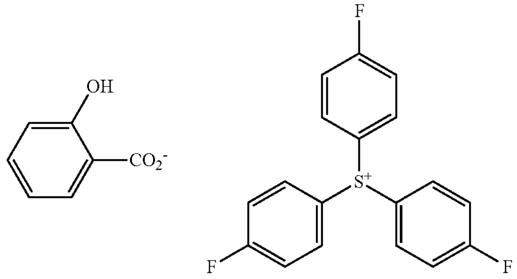

Q-3

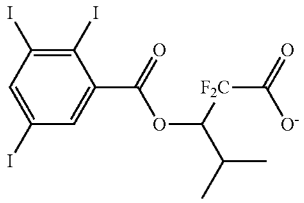

-continued

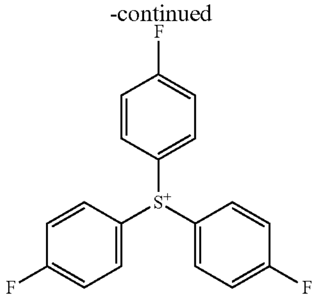

(2) EUV Lithography Test

Each of the resist compositions in Tables 1 to 3 was spin coated on a silicon substrate having a 20-nm coating of silicon-containing spin-on hard mask SHB-A940 (Shin-Etsu Chemical Co., Ltd., Si content 43 wt %) and prebaked on a hotplate at 105° C. for 60 seconds to form a resist film of 50 nm thick. Using an EUV scanner NXE3400 (ASML, NA 0.33, σ0.9/0.6, quadrupole illumination), the resist film was exposed to EUV through a mask bearing a hole pattern at a pitch 40 um (on-wafer size) and ±20% bias. The resist film was baked (PEB) on a hotplate at the temperature shown in Tables 1 to 3 for 60 seconds and developed in a 2.38 wt % TMAH aqueous solution for 30 seconds to form a hole pattern having a size of 20 mm.

The resist pattern was observed under CD-SEM (CG6300, Hitachi High-Technologies Corp.). The exposure dose that provides a hole pattern having a size of 20 nm is reported as sensitivity. The size of 50 boles printed at that dose was measured, from which a 3-fold value (3σ) of the standard deviation (c) was computed and reported as CDU.

The resist compositions are shown in Tables 1 to 3 together with the sensitivity and CDU of EUV lithography.

TABLE 1

| | | Polymer (pbw) | Acid generator (pbw) | Quencher (pbw) | Organic solvent (pbw) | PEB temp. (° C.) | Sensitivity (mJ/cm²) | CDU (nm) |
|---|---|---|---|---|---|---|---|---|
| Example | 1 | P-1 (100) | — | Q-1 (5.28) | PGMEA (500) EL (2,000) | 80 | 32 | 3.0 |
| | 2 | P-2 (100) | — | Q-1 (5.28) | PGMEA (500) EL (2,000) | 80 | 29 | 2.9 |
| | 3 | P-3 (100) | — | Q-1 (5.28) | PGMEA (500) EL (2,000) | 80 | 32 | 2.8 |
| | 4 | P-4 (100) | — | Q-1 (5.28) | PGMEA (2.000) DAA (500) | 80 | 33 | 2.7 |
| | 5 | P-5 (100) | — | Q-1 (5.28) | PGMEA (2,000) DAA (500) | 80 | 32 | 2.9 |
| | 6 | P-6 (100) | — | Q-1 (5.28) | PGMEA (2,000) DAA (500) | 80 | 30 | 2.9 |
| | 7 | P-7 (100) | — | Q-1 (5.28) | PGMEA (2,000) DAA (500) | 80 | 29 | 2.7 |
| | 8 | P-8 (100) | — | Q-2 (4.54) | PGMEA (2,000) DAA (500) | 80 | 30 | 2.7 |
| | 9 | P-9 (100) | — | Q-2 (4.54) | PGMEA (2,000) DAA (500) | 80 | 30 | 2.9 |
| | 10 | P-10 (100) | — | Q-3 (9.66) | PGMEA (2,000) DAA (500) | 80 | 31 | 2.8 |
| | 11 | P-11 (100) | — | Q-3 (9.66) | PGMEA (2,000) DAA (500) | 80 | 29 | 2.9 |
| | 12 | P-12 (100) | — | Q-3 (9.66) | PGMEA (2,000) DAA (500) | 80 | 30 | 2.8 |
| | 13 | P-13 (100) | — | Q-3 (9.66) | PGMEA (2,000) DAA (500) | 80 | 27 | 2.9 |
| | 14 | P-1 (100) | PAG-1 (5.0) | Q-1 (5.28) | PGMEA (2,000) DAA (500) | 80 | 27 | 3.0 |
| | 15 | P-14 (100) | — | Q-3 (9.66) | PGMEA (2,000) DAA (500) | 80 | 28 | 2.7 |
| | 16 | P-15 (100) | — | Q-3 (9.66) | PGMEA (2,000) DAA (500) | 80 | 26 | 2.8 |

TABLE 1-continued

| | Polymer (pbw) | Acid generator (pbw) | Quencher (pbw) | Organic solvent (pbw) | PEB temp. (° C.) | Sensitivity ($mJ/cm^2$) | CDU (nm) |
|---|---|---|---|---|---|---|---|
| 17 | P-16 (100) | — | Q-3 (9.66) | PGMEA (2,000) DAA (500) | 80 | 27 | 2.7 |
| 18 | P-17 (100) | — | Q-3 (9.66) | PGMEA (2,000) DAA (500) | 80 | 28 | 2.7 |

TABLE 2

| | Polymer (pbw) | Acid generator (pbw) | Quencher (pbw) | Organic solvent (pbw) | PEB temp. (° C.) | Sensitivity ($mJ/cm^2$) | CDU (nm) |
|---|---|---|---|---|---|---|---|
| Example 19 | P-18 (100) | — | Q-3 (9.66) | PGMEA (2,000) DAA (500) | 80 | 29 | 2.7 |
| 20 | P-19 (100) | — | Q-3 (9.66) | PGMEA (2,000) DAA (500) | 80 | 27 | 2.8 |
| 21 | P-20 (100) | — | Q-3 (9.66) | PGMEA (2,000) DAA (500) | 80 | 26 | 2.8 |
| 22 | P-21 (100) | — | Q-3 (9.66) | PGMEA (2,000) DAA (500) | 80 | 25 | 2.7 |
| 23 | P-22 (100) | — | Q-3 (9.66) | PGMEA (2,000) DAA (500) | 80 | 24 | 2.8 |
| 24 | P-23 (100) | — | Q-3 (9.66) | PGMEA (2,000) DAA (500) | 80 | 28 | 2.7 |
| 25 | P-24 (100) | — | Q-3 (9.66) | PGMEA (2,000) DAA (500) | 80 | 25 | 2.8 |
| 26 | P-25 (100) | — | Q-3 (9.66) | PGMEA (2,000) DAA (500) | 80 | 24 | 2.7 |
| 27 | P-26 (100) | — | Q-3 (9.66) | PGMEA (2,000) DAA (500) | 80 | 26 | 2.6 |
| 28 | P-27 (100) | — | Q-3 (9.66) | PGMEA (2,000) DAA (500) | 80 | 23 | 2.9 |
| 29 | P-28 (100) | — | Q-3 (9.66) | PGMEA (2,000) DAA (500) | 80 | 24 | 2.8 |
| 30 | P-29 (100) | — | Q-3 (9.66) | PGMEA (2,000) DAA (500) | 80 | 25 | 2.8 |
| 31 | P-30 (100) | — | Q-3 (9.66) | PGMEA (2,000) DAA (500) | 80 | 26 | 2.8 |
| 32 | P-31 (100) | — | Q-3 (9.66) | PGMEA (2,000) DAA (500) | 80 | 25 | 2.9 |
| 33 | P-32 (100) | — | Q-3 (9.66) | PGMEA (2,000) DAA (500) | 80 | 24 | 2.9 |

TABLE 3

| | Polymer (pbw) | Acid generator (pbw) | Quencher (pbw) | Organic solvent (pbw) | PEB temp. (° C.) | Sensitivity ($mJ/cm^2$) | CDU (nm) |
|---|---|---|---|---|---|---|---|
| Comparative Example 1 | cP-1 (100) | — | Q-1 (5.28) | PGMEA (2,000) DAA (500) | 80 | 35 | 3.6 |
| 2 | cP-2 (100) | — | Q-1 (5.28) | PGMEA (2,000) DAA (500) | 80 | 38 | 3.3 |
| 3 | cP-3 (100) | — | Q-1 (5.28) | PGMEA (2,000) DAA (500) | 80 | 33 | 3.2 |

It is demonstrated in Tables 1 to 3 that resist compositions comprising a base polymer comprising repeat units (a) having a sulfonium salt structure consisting of a sulfonic acid anion bonded to a polymer backbone and a sulfonium cation having an acid labile group of triple bond-bearing tertiary ester type as the acid generator offer a high sensitivity and excellent CDU.

Japanese Patent Application No. 2022-016260 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a base polymer comprising repeat units (a) having a salt structure consisting of a sulfonic acid anion bonded to a polymer backbone and a sulfonium cation having the formula (1):

(1)

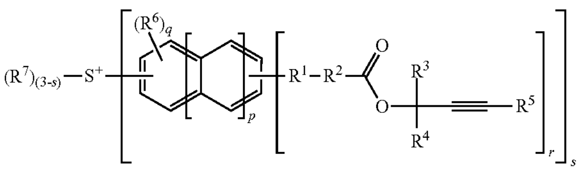

wherein p is 0 or 1, q is an integer of 0 to 4, r is 1 or 2, s is an integer of 1 to 3, $R^1$ is a single bond, ether bond, thioether bond or ester bond, $R^2$ is a single bond or a $C_1$-$C_{20}$ alkanediyl group which may contain fluorine or to hydroxy, $R^3$ and $R^4$ are each independently a $C_1$-$C_{12}$ saturated hydrocarbyl group, $C_2$-$C_8$ alkenyl group, $C_2$-$C_8$ alkynyl group or $C_6$-$C_{12}$ aryl group, which may contain oxygen or sulfur, $R^3$ and $R^4$ may bond together to form a ring with the carbon atom to which they are attached, $R^5$ is hydrogen, or a $C_1$-$C_{12}$, saturated hydrocarbyl group or $C_6$-$C_{18}$ aryl group, which may contain at least one moiety selected from hydroxy, $C_1$-$C_6$ saturated hydrocarbyloxy, $C_2$-$C_6$ saturated hydrocarbyloxycarbonyl, nitro, cyano, fluorine, chlorine, bromine, iodine, amino, trifluoromethyl, trifluoromethoxy, and trifluoronethylthio, with the proviso that $R^5$ is not hydrogen when $R_3$ is substituted or unsubstituted phenyl, $R^6$ is hydroxy, carboxy, nitro, cyano, fluorine, chlorine, bromine, iodine, amino, or a $C_1$-$C_{20}$ saturated hydrocarbyl group, $C_1$-$C_{20}$ saturated hydrocarbyloxy group, $C_2$-$C_{20}$ saturated hydrocarbylcarbonyloxy group, $C_2$-$C_{20}$ saturated hydrocarbyloxycarbonyl group, or $C_1$-$C_4$ saturated hydrocarbylsulfonyloxy group, which may contain at least one moiety selected from fluorine, chlorine, bromine, iodine, hydroxy, amino and ether bond, and $R^7$ is a $C_1$-$C_{20}$ hydrocarbyl group which may contain a heteroatom, in case of s=1, two groups R may be the same or different and may bond together to form a ring with the sulfur atom to which they are attached.

2. The resist composition of claim 1 wherein the repeat units (a) have the formula (a1) or (a2):

(a1)

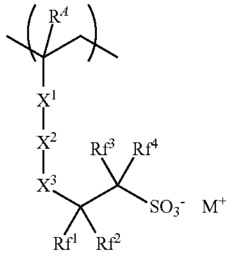

(a2)

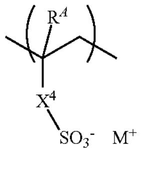

wherein $R^A$ is each independently hydrogen or methyl, $X^1$ is a single bond or ester bond, $X^2$ is a single bond, $-X^{21}—C(=O)—O—$ or $—X^{21}—O—$, wherein $X^{21}$ is a $C_1$-$C_{12}$ hydrocarbylene group, phenylene group or a $C_7$-$C_{18}$ group obtained by combining the foregoing, which may contain carbonyl, ester bond, ether bond, iodine or bromine, $X^3$ is a single bond, methylene or ethylene, $X^4$ is a single bond, methylene, ethylene, phenylene, methylphenylene, dimethylphenylene, fluorinated phenylene, trifluoromethyl-substituted phenylene, $—O—X^{41}—$, $—C(=O)—X^{41}—$ or $—C(=O)—NH—X^{41}—$ wherein $X^{41}$ is a $C_1$-$C_6$ aliphatic hydrocarbylene group, phenylene group, methylphenylene group, dimethylphenylene group, fluorinated phenylene group or trifluoromethyl-substituted phenylene group, which may contain carbonyl, ester bond, ether bond, hydroxy or halogen, $Rf^1$ to $Rf^4$ are each independently hydrogen, fluorine or trifluoromethyl at least one of $Rf^1$ to $Rf^4$ is fluorine or trifluoromethyl, $Rf^1$ and $Rf^4$ may together form a carbonyl group, $M^+$ is the sulfonium cation having formula (1).

3. The resist composition of claim 1, further comprising an organic solvent.

4. The resist composition of claim 1 wherein the base polymer further comprises repeat units having the formula (b1) or repeat units having the formula (b2):

(b1)

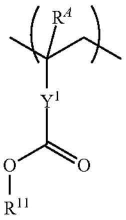

(b2)

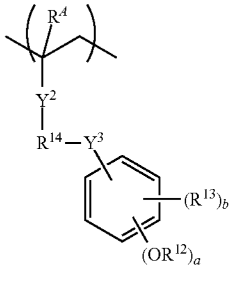

wherein $R^A$ is each independently hydrogen or methyl, $Y^1$ is a single bond, phenylene, naphthylene, or a $C_1$-$C_{12}$ linking group containing at least one moiety selected from an ester bond, ether bond and lactone ring, $Y^2$ is a single bond or ester bond, $Y^3$ is a single bond, ether bond or ester bond, $R^{11}$ and $R^{12}$ are each independently an acid labile group, $R^{13}$ is fluorine, trifluoromethyl, cyano, a $C_1$-$C_6$ saturated hydrocarbyl group, $C_1$-$C_6$ saturated hydrocarbyloxy group, $C_2$-$C_7$ saturated hvdrocarbylcarbonyl group, $C_2$-$C_7$ saturated hydrocarbylcarbonyloxy group, or $C_2$-$C_7$ saturated hydrocarbyloxycarbonyl group, $R^{14}$ is a single bond or a $C_1$-$C_6$ alkanediyl group in which some constituent —$CH_2$— may be replaced by an ether bond or ester bond, a is 1 or 2, b is an integer of 0 to 4, and a+b is from 1 to 5.

5. The resist composition of claim 4 which is a chemically amplified positive resist composition.

6. The resist composition of claim 1, further comprising a surfactant.

7. A pattern forming process comprising the steps of applying the resist composition of claim 1 onto a substrate to form a resist film thereon, exposing the resist film to high-energy radiation, and developing the exposed resist film in a developer.

8. The pattern forming process of claim 7 wherein the high-energy radiation is KrF excimer laser, ArF excimer laser, EB or EUV of wavelength 3 to 15 nm.

* * * * *